United States Patent
Gray et al.

(10) Patent No.: US 11,977,123 B2
(45) Date of Patent: May 7, 2024

(54) SENSING VOLTAGE USING MICRO-WATT SENSOR

(71) Applicant: SIGMASENSE, LLC., Wilmington, DE (US)

(72) Inventors: Patrick Troy Gray, Cedar Park, TX (US); Michael Shawn Gray, Dripping Springs, TX (US); Timothy W. Markison, Mesa, AZ (US); Shayne X. Short, College Station, TX (US)

(73) Assignee: SIGMASENSE, LLC., Austin, TX (US)

( * ) Notice: Subject to any disclaimer, the term of this patent is extended or adjusted under 35 U.S.C. 154(b) by 0 days.

(21) Appl. No.: 17/828,407

(22) Filed: May 31, 2022

(65) Prior Publication Data
US 2022/0381843 A1    Dec. 1, 2022

Related U.S. Application Data

(60) Provisional application No. 63/195,556, filed on Jun. 1, 2021.

(51) Int. Cl.
G01R 31/3835    (2019.01)
G01R 31/371     (2019.01)
(Continued)

(52) U.S. Cl.
CPC ....... *G01R 31/3835* (2019.01); *G01R 31/371* (2019.01); *G01R 31/3842* (2019.01); *H02J 7/0047* (2013.01); *H02J 7/0063* (2013.01)

(58) Field of Classification Search
None
See application file for complete search history.

(56) References Cited

U.S. PATENT DOCUMENTS

| 5,437,178 A | 8/1995 | Esin et al. |
| 6,133,712 A | 10/2000 | Yeon |

(Continued)

FOREIGN PATENT DOCUMENTS

| CN | 104536627 A | 4/2015 |
| CN | 107771273 A | 3/2018 |
| EP | 2284637 A1 | 2/2011 |

OTHER PUBLICATIONS

"P. Slepski", K. Darowicki, K. Andrearczyk, "On-line measurement of cell impedance during charging and discharging process", Jun. 30, 2008, Journal of Electroanalytical Chemistry 633 (2009) 121-126 (Year: 2009).

(Continued)

*Primary Examiner* — Jas A Sanghera
(74) *Attorney, Agent, or Firm* — Garlick & Markison; Timothy W. Markison; Shayne X. Short

(57) ABSTRACT

A voltage sensor includes a drive-sense circuit (DSC) and a reference load. The DSC is operably coupled to a point along a wire that is proximate to a battery terminal. The wire connects the battery terminal to a load. The DSC is configured to generate a signal based on a reference signal that is reference signal is based on an estimate of a voltage at the point along the wire. The DSC is also configured to generate an output signal that corresponds to a difference between the signal and the reference signal and to tune the reference signal until the signal compares favorably to the voltage at the point along the wire. The DSC also is configured to determine the voltage at the point along the wire based on the tuned reference signal. The reference load is operably coupled to the DSC and the point along a wire.

20 Claims, 72 Drawing Sheets

(51) Int. Cl.
*G01R 31/3842* (2019.01)
*H02J 7/00* (2006.01)

(56) References Cited

U.S. PATENT DOCUMENTS

| | | | |
|---|---|---|---|
| 6,218,972 B1 | 4/2001 | Groshong | |
| 6,665,013 B1 | 12/2003 | Fossum et al. | |
| 7,476,233 B1 | 1/2009 | Wiener et al. | |
| 7,528,755 B2 | 5/2009 | Hammerschmidt | |
| 8,031,094 B2 | 10/2011 | Hotelling | |
| 8,089,289 B1 | 1/2012 | Kremin et al. | |
| 8,279,180 B2 | 10/2012 | Hotelling et al. | |
| 8,547,114 B2 | 10/2013 | Kremin | |
| 8,625,726 B2 | 1/2014 | Kuan | |
| 9,201,547 B2 | 12/2015 | Elias | |
| 2003/0052657 A1 | 3/2003 | Koernle et al. | |
| 2004/0036620 A1 | 2/2004 | Herrmann et al. | |
| 2005/0235758 A1 | 10/2005 | Kowal et al. | |
| 2010/0177538 A1* | 7/2010 | Scherr | G01R 31/28 363/39 |
| 2011/0063154 A1 | 3/2011 | Hotelling et al. | |
| 2011/0298745 A1 | 12/2011 | Souchkov | |
| 2013/0278447 A1 | 10/2013 | Kremin | |
| 2014/0211516 A1 | 7/2014 | Kung et al. | |
| 2016/0188049 A1 | 6/2016 | Yang et al. | |
| 2017/0200994 A1 | 7/2017 | Kim | |
| 2017/0219660 A1 | 8/2017 | Christensen | |
| 2017/0242502 A1 | 8/2017 | Gray et al. | |
| 2017/0302088 A1 | 10/2017 | Tkachenko | |
| 2018/0157354 A1 | 6/2018 | Blondin et al. | |
| 2018/0275824 A1 | 9/2018 | Li | |

OTHER PUBLICATIONS

Baker; How delta-sigma ADCs work, Part 1; Analog Applications Journal; Oct. 1, 2011; 6 pgs.
Brian Pisani, "Digital Filter Types in Delta-Sigma ADCs", Application Report SBAA230, May 2017, pp. 1-8, Texas Instruments Incorporated, Dallas, Texas.
Diplom-Ingenieur (FH) Reinhold Koch, M. Sc, "On-line Electrochemical Impedance Spectroscopy for Lithium-Ion Battery Systems", Vorsitzender: Prof. Dr.-Ing. Hans-Georg Herzog, Prufende/-r der Dissertation: 1. Prof. Dr.-Ing. Andreas Jossen, 2. Prof. Dr.-Ing. Olfa Kanoun (TU Chemnitz), Die Dissertation . . . (Year: 2017).
International Searching Authority; International Search Report and Written Opinion; International Application No. PCT/US2020/034492; dated Aug. 6, 2020; 14 pgs.
M. Abedi Varnosfaderani and D. Strickland, "A Comparison of Online Electrochemical Spectroscopy Impedance Estimation of Batteries," in IEEE Access, vol. 6, pp. 23668-23677, 2018, doi: 10.1109/ACCESS.2018.2808412. (Year: (2018).
M.A. Vamosfaderani and D. Strickland, "Online impedance spectroscopy estimation of a dc-dc converter connected battery using a switched capacitor-based balancing circuit," in The Journal of Engineering, vol. 2019, No. 7, pp. 4681-4685, 7 2019, doi: 10.1049/joe.2018.8069. (Year: 2019).
European Patent Office; Extended European Search Report; Application No. 19853507.2; Jun. 13, 2023; 7 pgs.

\* cited by examiner computing device 12 computing device 14 computing device 18

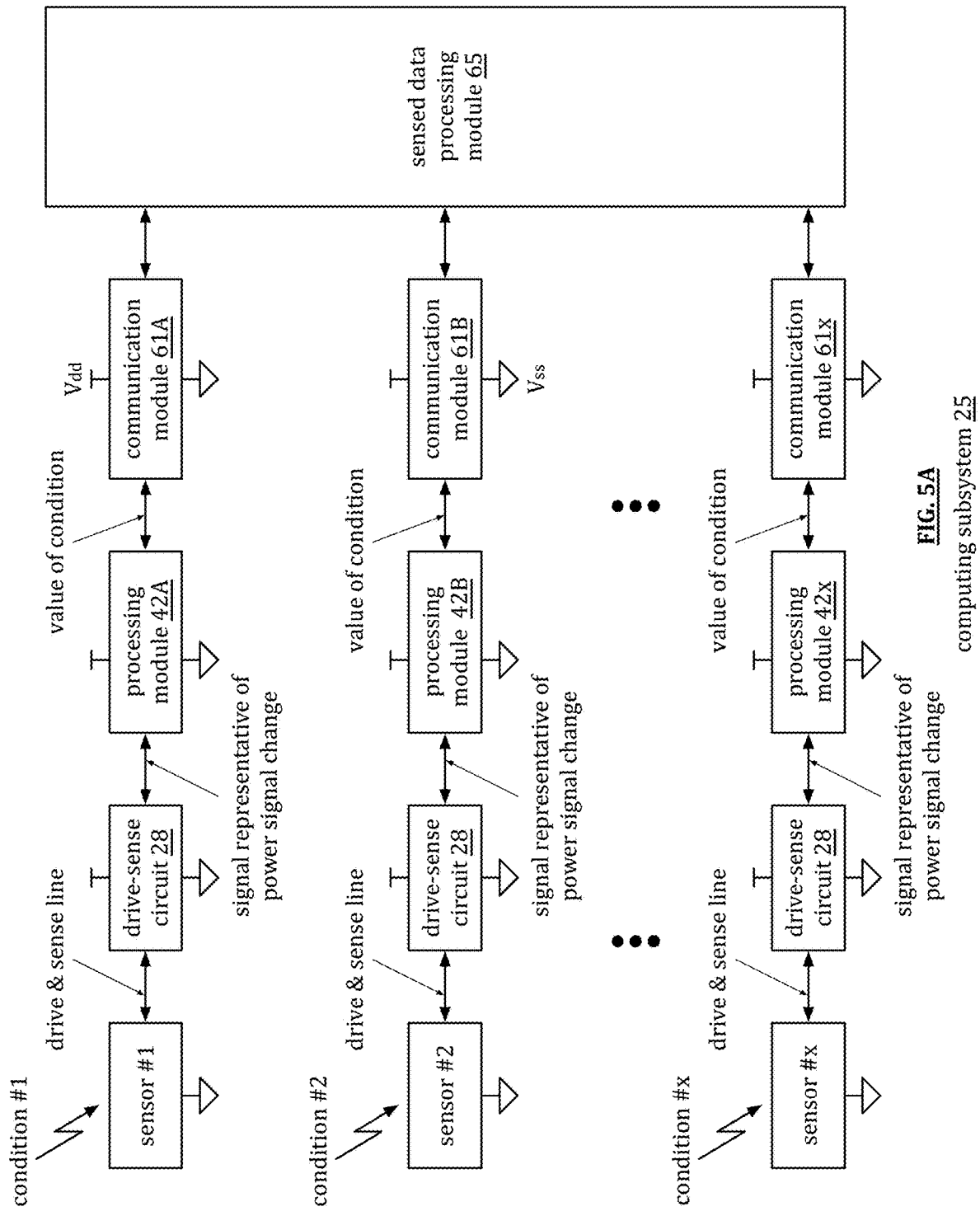

computing subsystem 25 computing subsystem 25

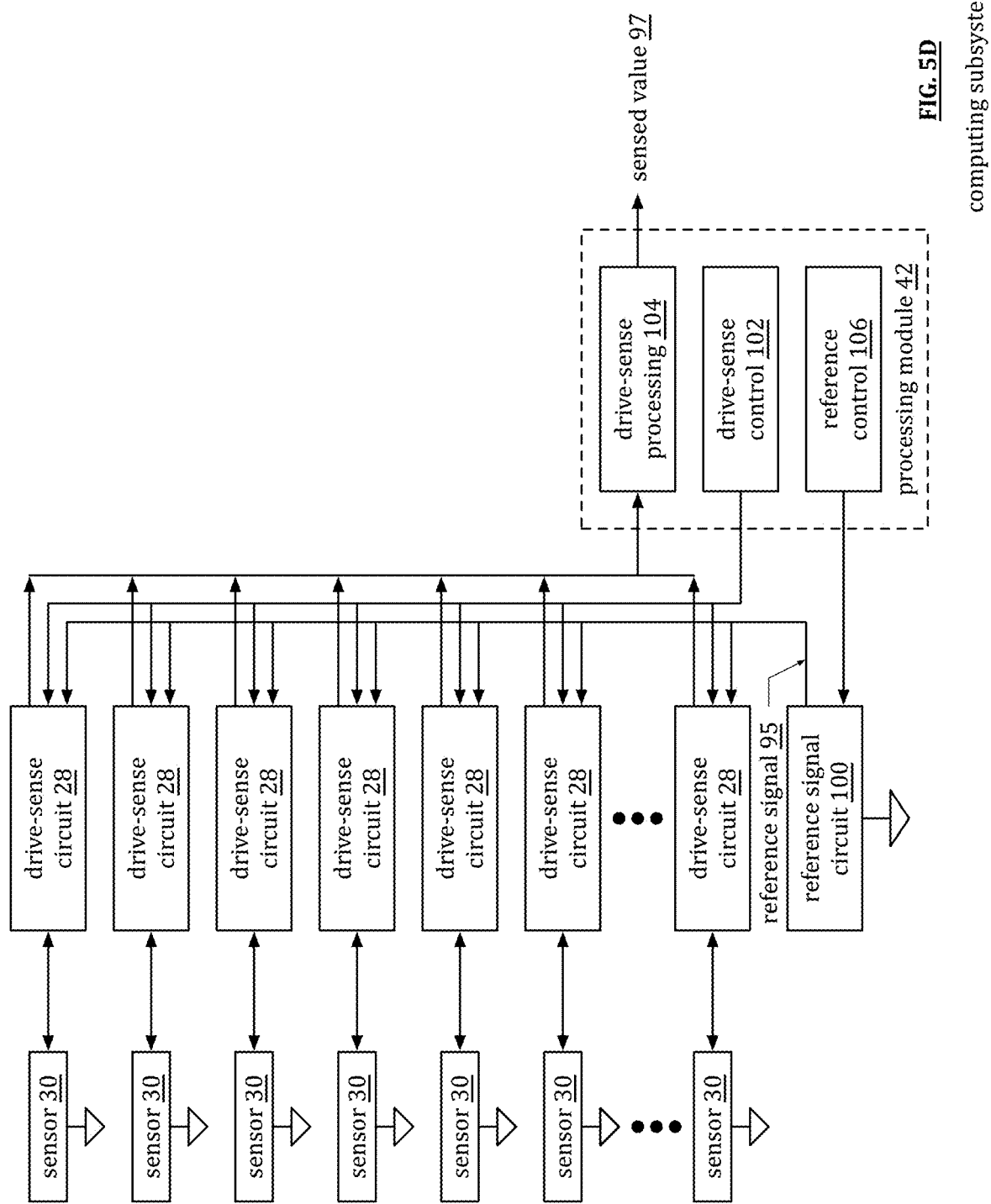

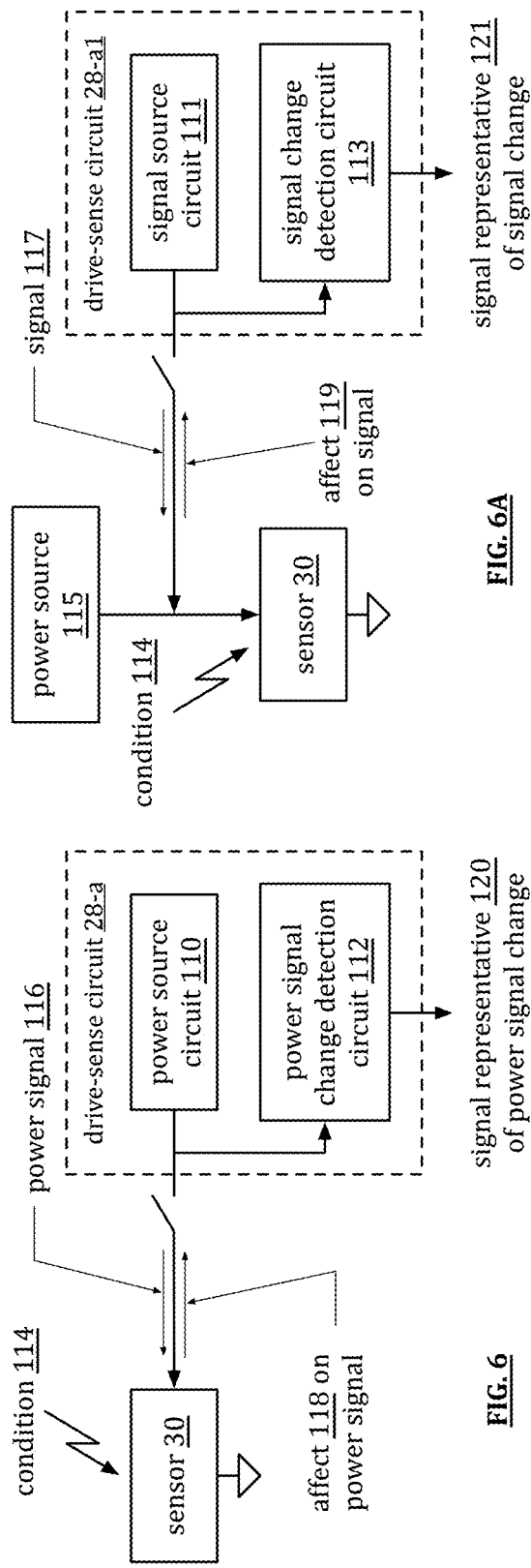
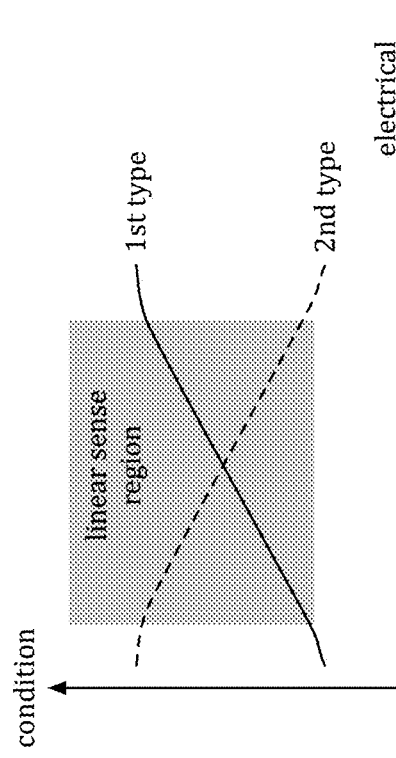
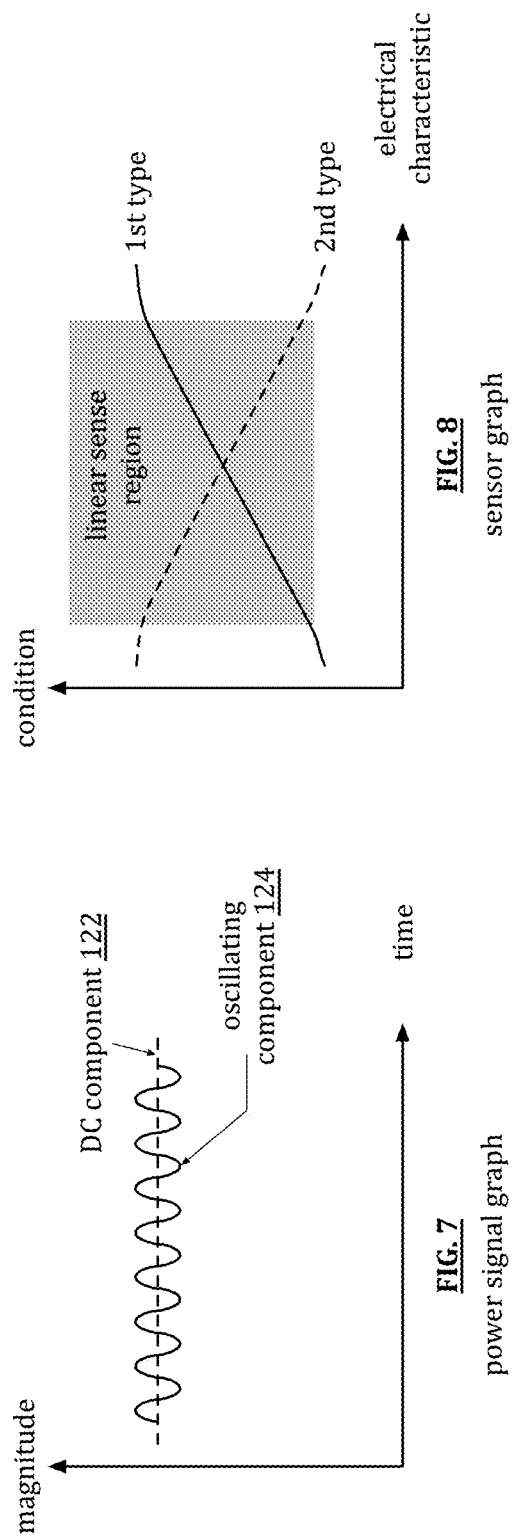

power signal graph power signal graph power signal graph power signal graph

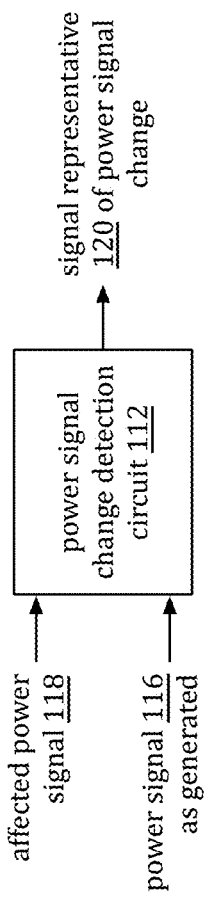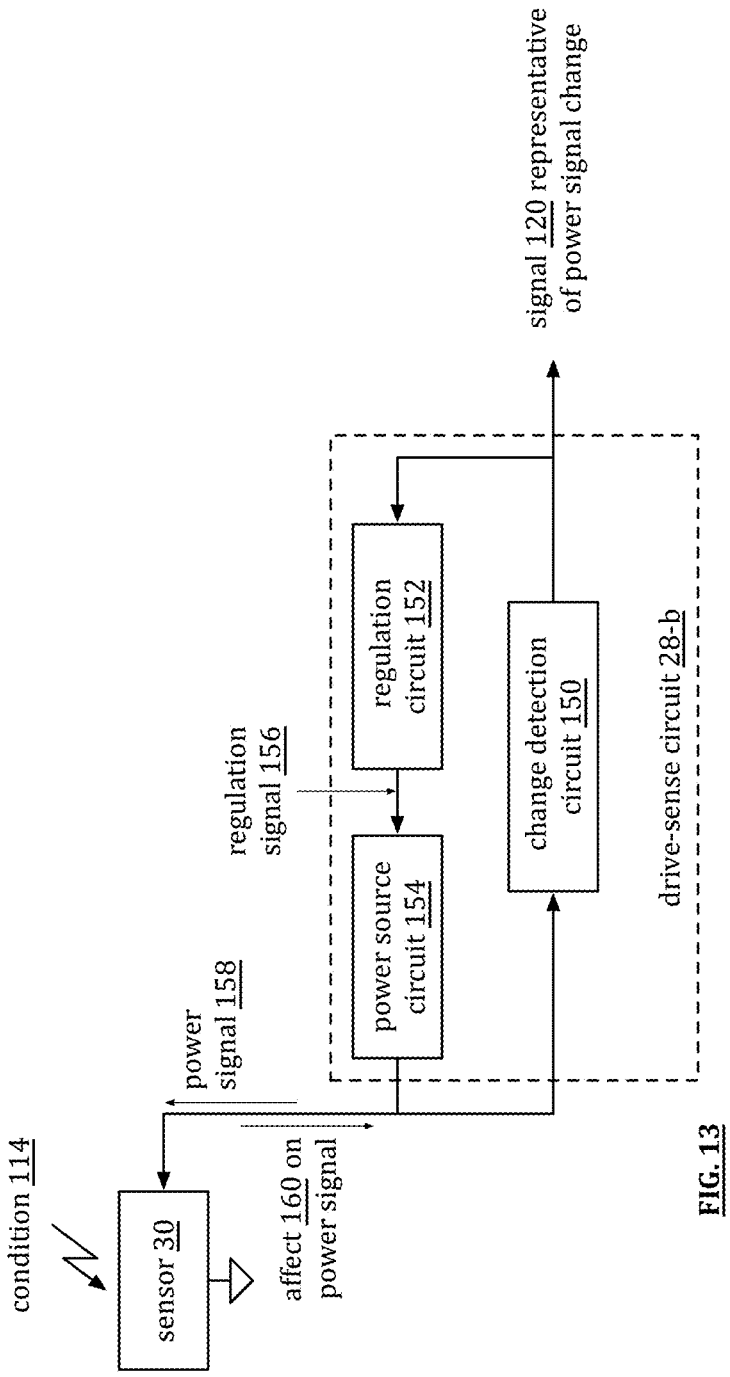

1400

1500

1601

1602

1700

1800

1901 zero-time-constant model $Vbatt = Voc - Rs \times Ibatt$ as $Rs \uparrow$, then for same $Voc$, $Vbatt \downarrow$

1902

RC network: transient response of battery charge/discharge one-time-constant model $Vbatt(t) = Voc - Ibatt \times (Rs + Rp) + (Ibatt \times Rp - Vp(t=0))\exp((-t/(Rp \times Cp)))$

1903 function of battery dynamics dual polarization (DP) model

2403

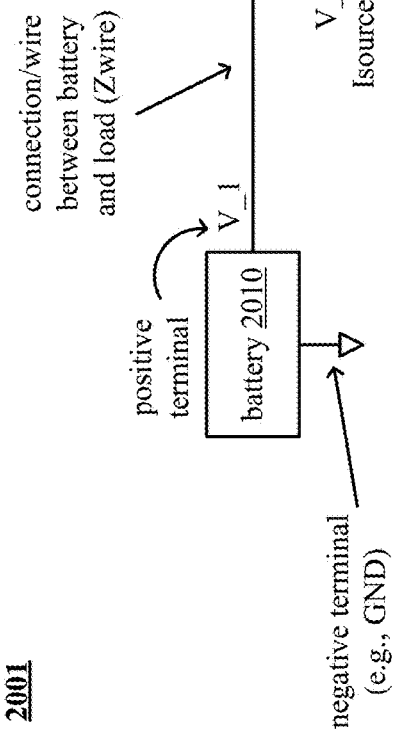
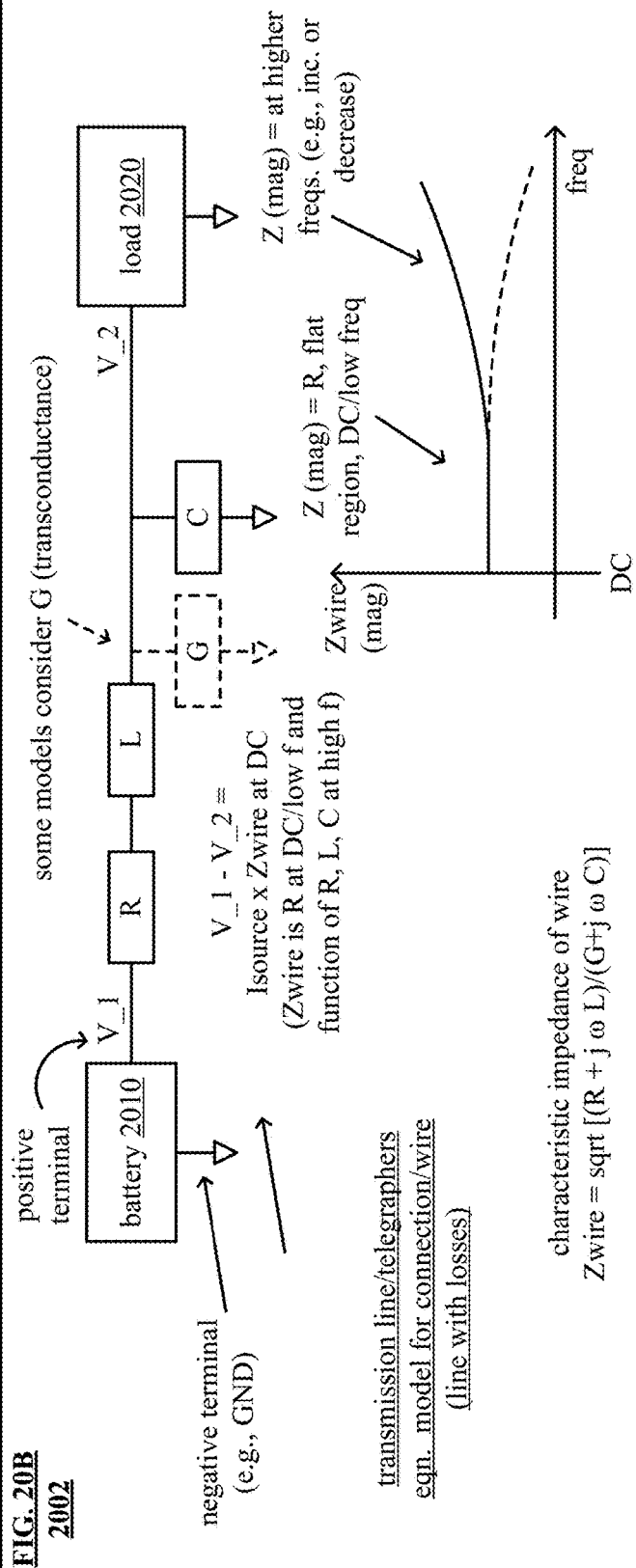
FIG. 20A
2001
FIG. 20B
2002

2101

2102

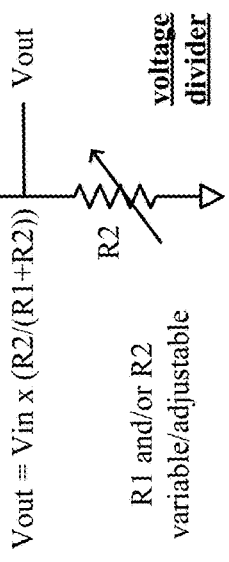

FIG. 21D
2104

(e.g., VGA, PGA, etc.)

gain control signal
(digital or analog)

Vout

Vout = f(Vin)
(e.g., Vout = k × Vin)

Vin amplifier

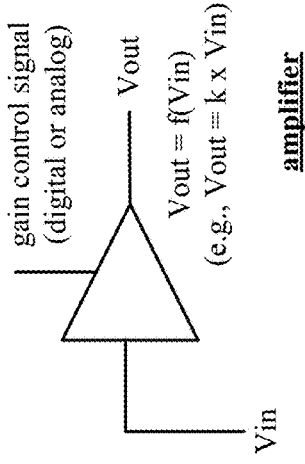

FIG. 21E
2105

Vin — R1 — Vout — R2

Vout = Vin × (R2/(R1+R2))

R1 and/or R2 variable/adjustable voltage divider

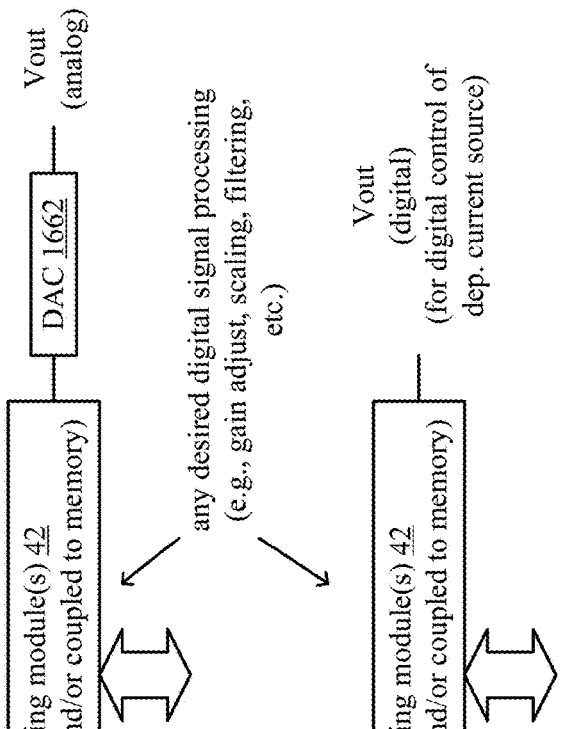

FIG. 21F
2106

Vin (analog) → ADC 1660 → processing module(s) 42 (incl. memory and/or coupled to memory) → DAC 1662 → Vout (analog)

any desired digital signal processing (e.g., gain adjust, scaling, filtering, etc.)

FIG. 21G
2107

Vin (analog) → ADC 1660 → processing module(s) 42 (incl. memory and/or coupled to memory) → Vout (digital) (for digital control of dep. current source)

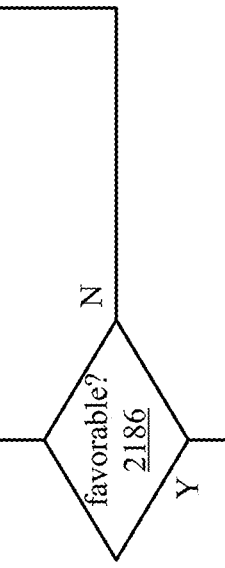

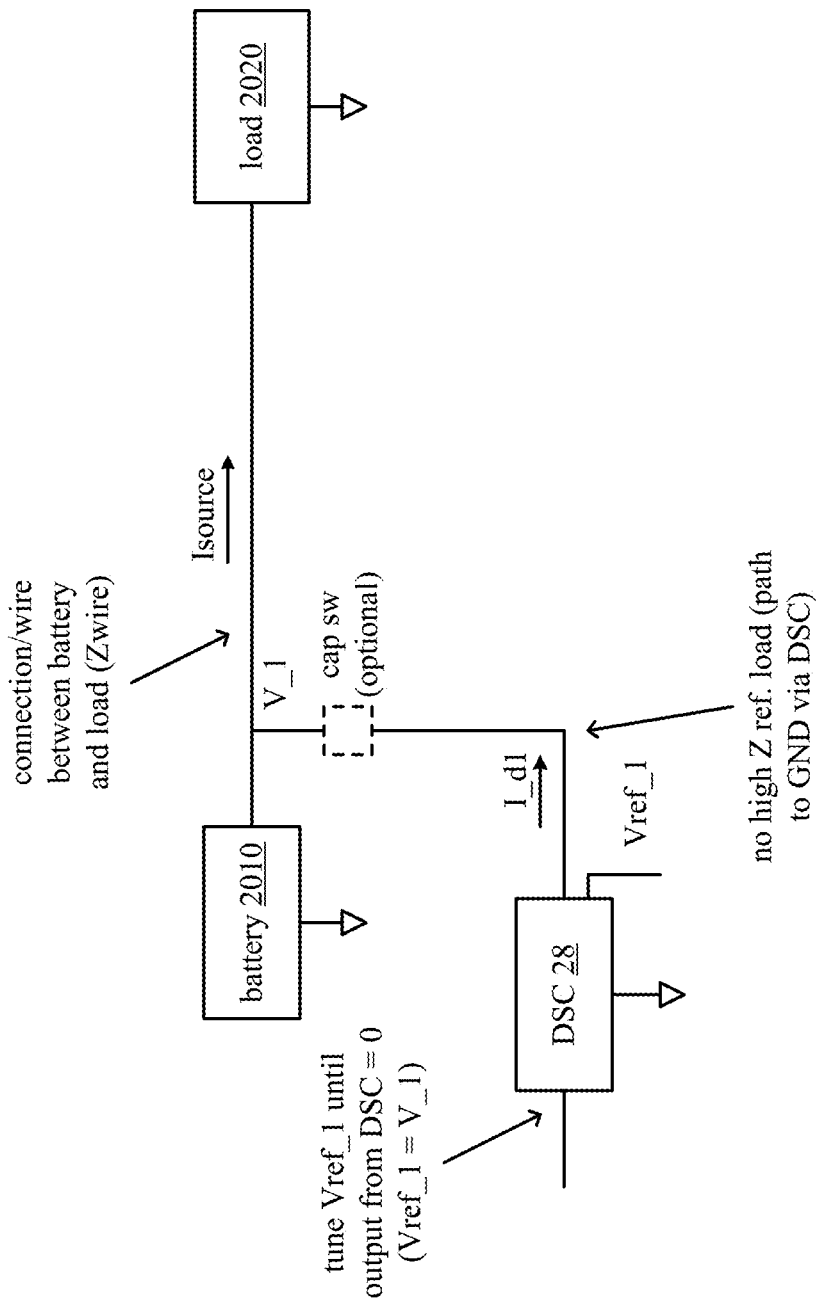

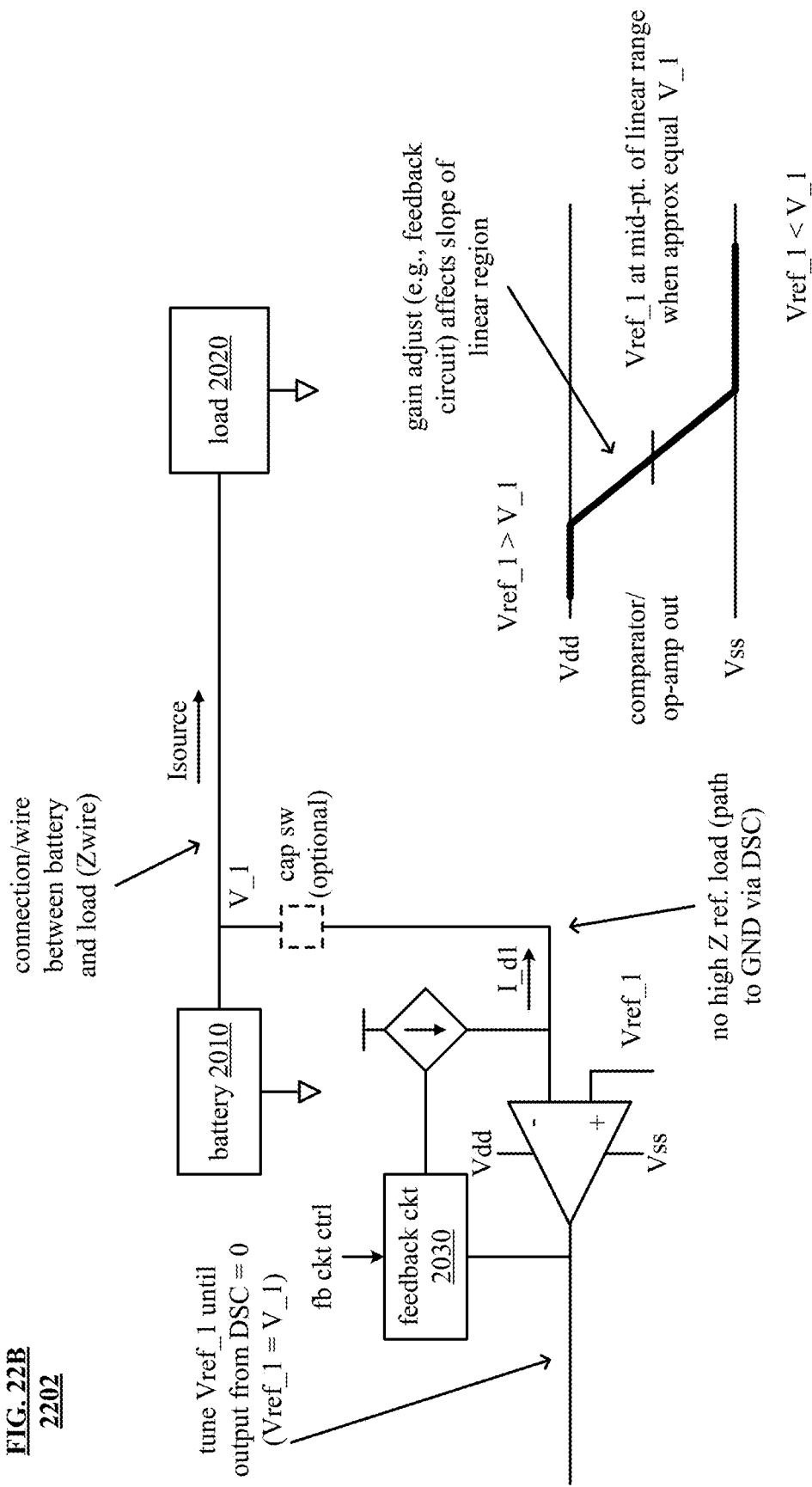

FIG. 22D
2204 start/continue → setting DSC reference voltage (Vref_1) to 1st value (e.g., estimated V of battery, est. of V_1) 2280

→ tuning Vref_1 to compare favorably with battery terminal voltage (V_1) based on being halfway point between power supply/voltage rails (e.g., halfway pt. between VDD and VSS, halfway pt. between VDD and GND, etc.) 2282

→ determining whether Vref_1 compares favorably with battery terminal voltage (V_1) based on being halfway point between power supply/voltage rails 2284

→ favorable? 2286 — N (loop back to 2282) / Y → determining V_1 (e.g., based on tuned value of Vref_1) 2288

→ end/continue

2301

2302

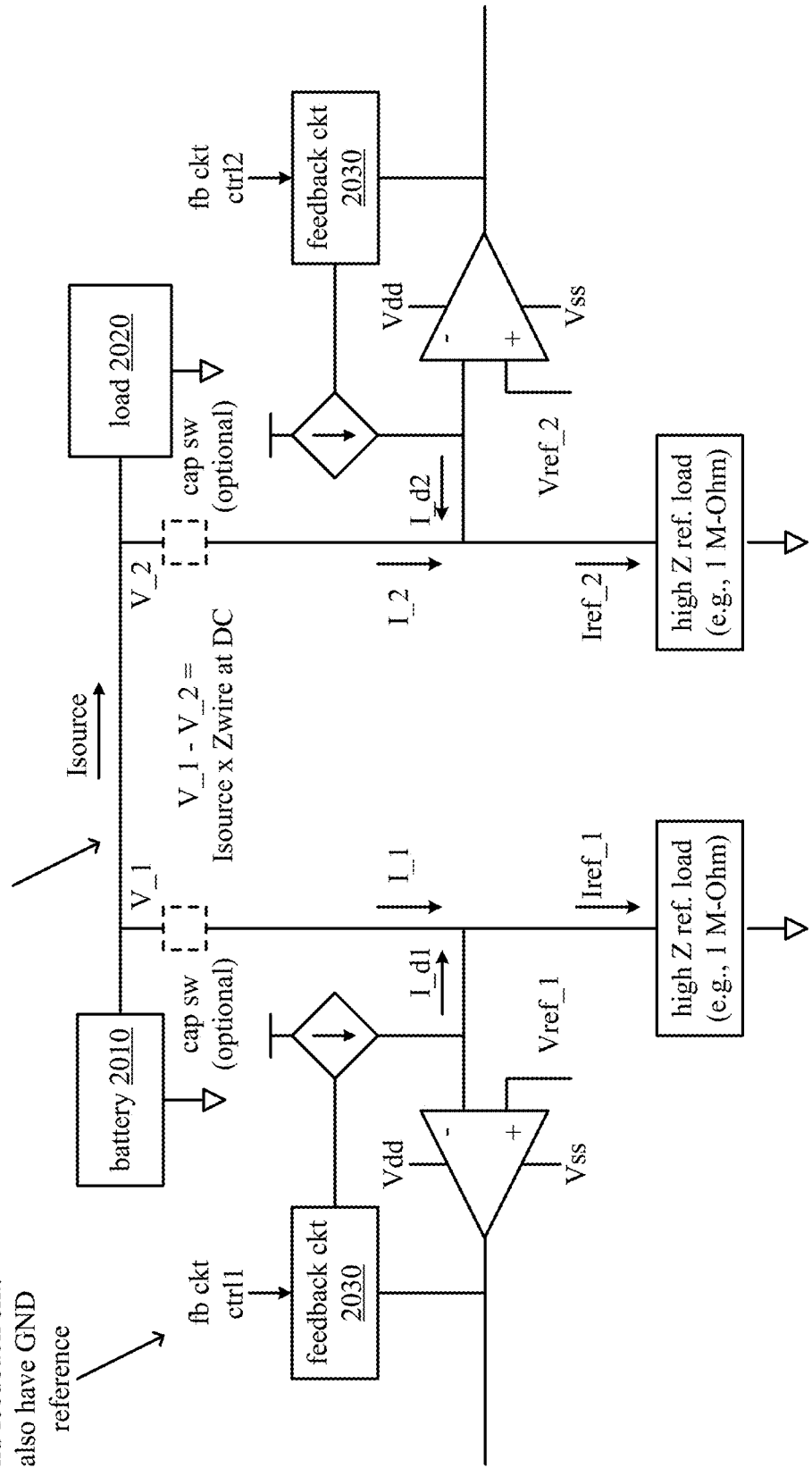

2304

2305

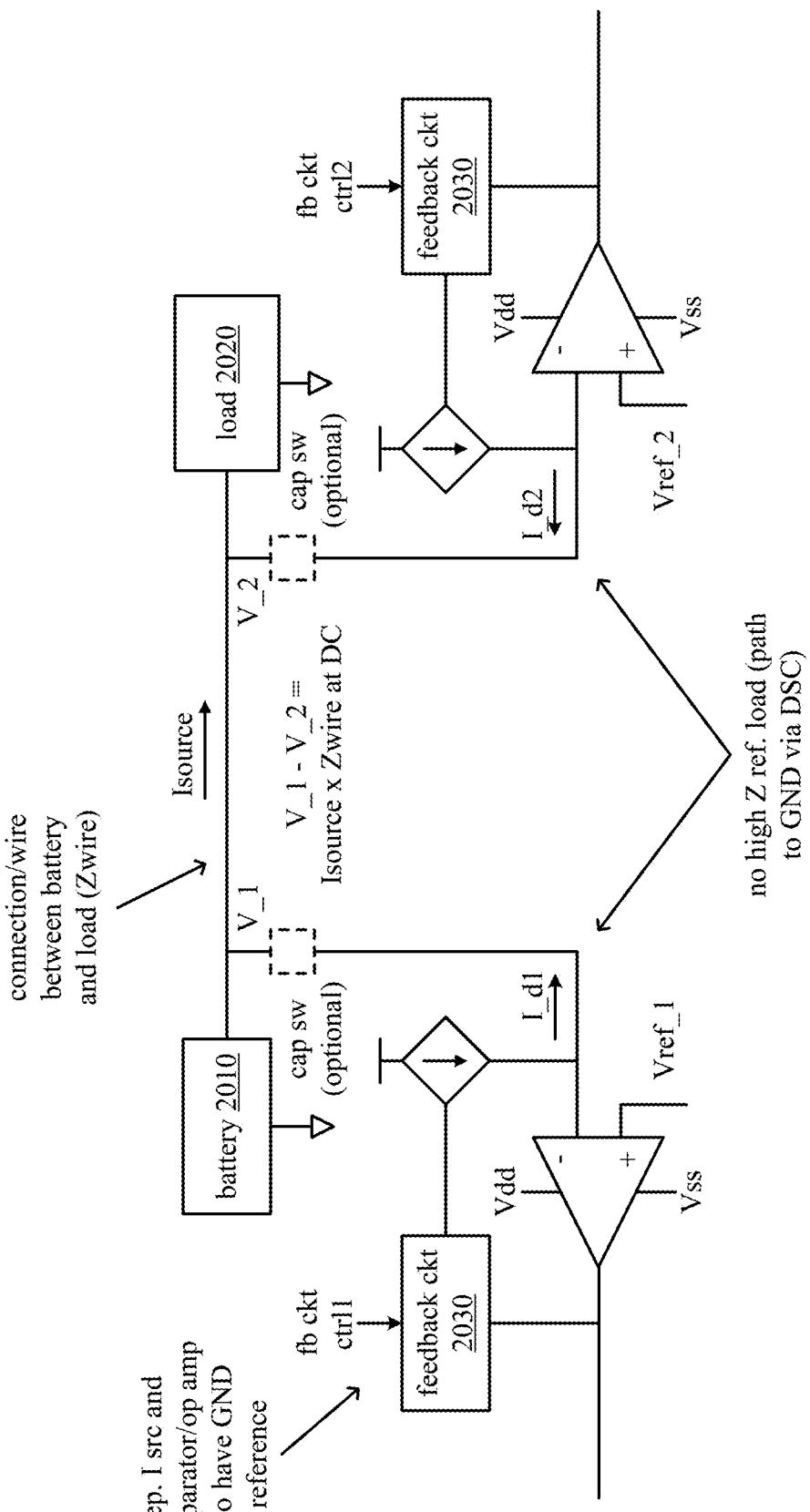

2307

2308

2309

2310

2311

2312

FIG. 23M
2313 start/continue

↓ setting first DSC reference voltage (Vref_1) to 1st value (e.g., estimated V of battery, est. of V_1) to produce a first reference current (Iref_1) 2180a

↓ tuning Vref_1 to compare favorably with battery terminal voltage (V_1) 2182a

↓ determining whether Vref_1 compares favorably to V_1 based on tuning (e.g., based on op amp or comparator output = 0, I_d1 = 0, other basis, etc.) 2184a

↓ favorable? 2186a
- N → (loops back to tuning 2182a)
- Y ↓ determining V_1 (e.g., based on tuned value of Vref_1, Iref1 = I_1) 2188a

↓ setting DSC reference voltage (Vref_2) to 1st value (e.g., estimated V of battery, est. of V_2) to produce a second reference current (Iref_2) 2180b

↓ tuning Vref_2 to compare favorably with load terminal voltage (V_2) 2182b

↓ determining whether Vref_2 compares favorably to V_2 based on tuning (e.g., based on op amp or comparator output = 0, I_d2 = 0, other basis, etc.) 2184b

↓ favorable? 2186b
- N → (loops back to tuning 2182b)
- Y ↓ determining V_2 (e.g., based on tuned value of Vref_2, Iref2 = I_2) 2188b

↓ end/continue

FIG. 23N
2314

```
  ┌─────────────┐
  │start/continue│
  └──────┬──────┘
         │
  ┌──────▼──────────────────────────────────────────────┐
  │ sweeping frequency of first reference voltage       │
  │ (Vref_1(AC) across a range of frequencies (e.g.,    │
  │ f1 thru fx)[Vref_1(DC) = V_1, then add Vref_1(AC)   │
  │ to Vref_1(DC)] 2370                                 │
  └──────┬──────────────────────────────────────────────┘
         │
  ┌──────▼──────────────────────────────────────────────┐
  │ determining load terminal voltages V_2(AC)          │
  │ corresponding to each of the respective             │
  │ frequencies of Vref_1(AC) [Isource(AC) = I_d1(AC)]  │
  │ 2372                                                │
  └──────┬──────────────────────────────────────────────┘
         │
  ┌──────▼──────────────────────────────────────────────┐
  │ determining Zwire(AC) values corresponding to each  │
  │ of the respective frequencies of Vref_1(AC) (based  │
  │ on Vref_1(AC) = V_1(AC), V_2(AC), Isource(AC),      │
  │ etc.) 2374                                          │
  │   ┌────────────────────────────────┐                │
  │   │ determining Zwire(AC) at f1 2374a │              │
  │   ├────────────────────────────────┤                │
  │   │ determining Zwire(AC) at fx 2374b │              │
  │   ├────────────────────────────────┤                │
  │   │         ...                    │                │
  │   ├────────────────────────────────┤                │
  │   │ determining Zwire(AC) at fx 2374x │              │
  │   └────────────────────────────────┘                │
  └──────┬──────────────────────────────────────────────┘
         │
  ┌──────▼──────────────────────────────────────────────┐
  │ determining Rwire (e.g., based on flat response of  │
  │ Zwire(AC) at lower frequencies, including DC) 2376  │
  └──────┬──────────────────────────────────────────────┘
         │
  ┌──────▼──────────────────────────────────────────────┐
  │ determining Isource(DC) (based on V_1(DC), V_2(DC), │
  │ and Rwire) 2378                                     │
  └──────┬──────────────────────────────────────────────┘
         │
  ┌──────▼──────┐
  │ end/continue │
  └─────────────┘
```

2401

2402

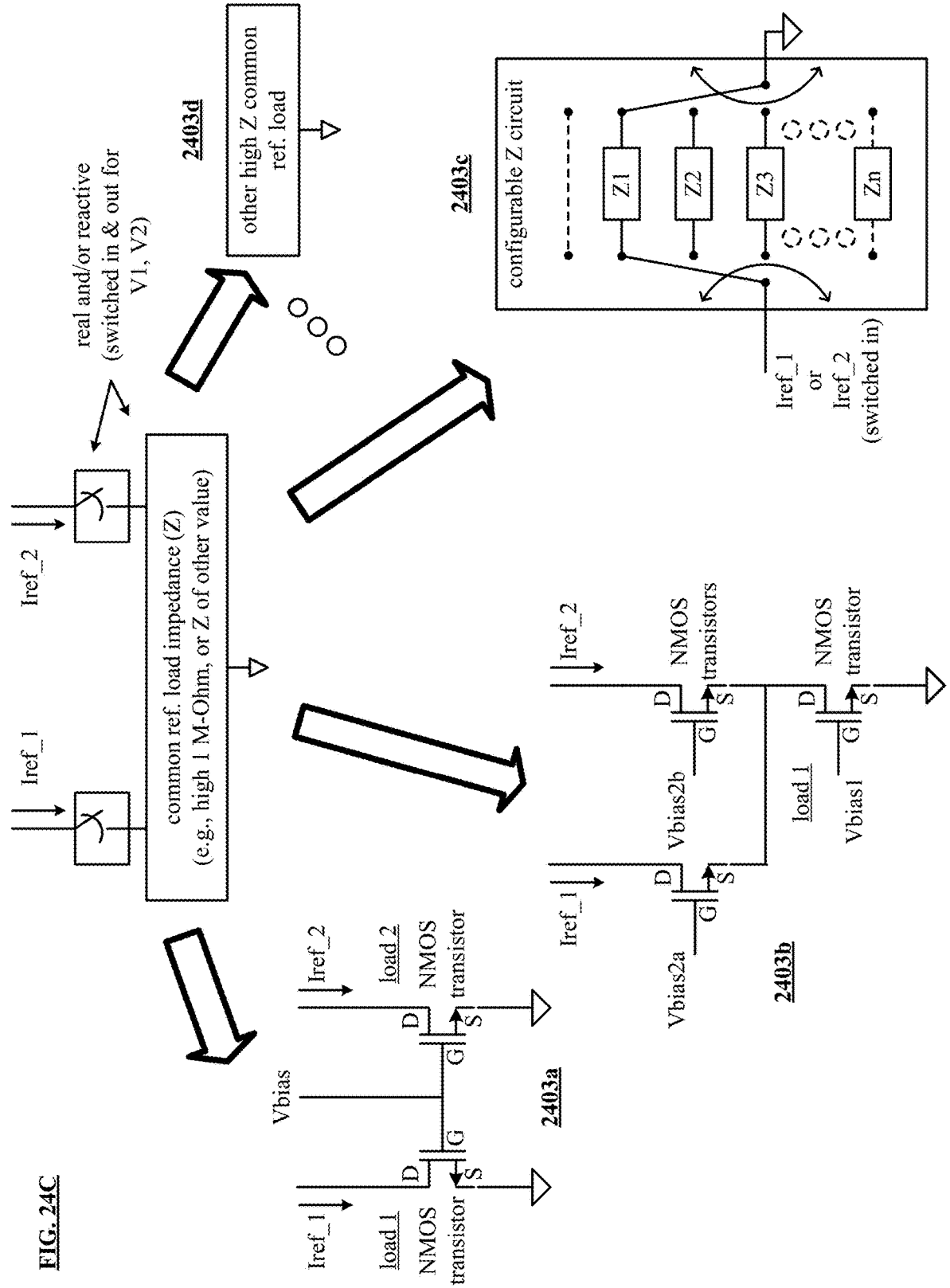

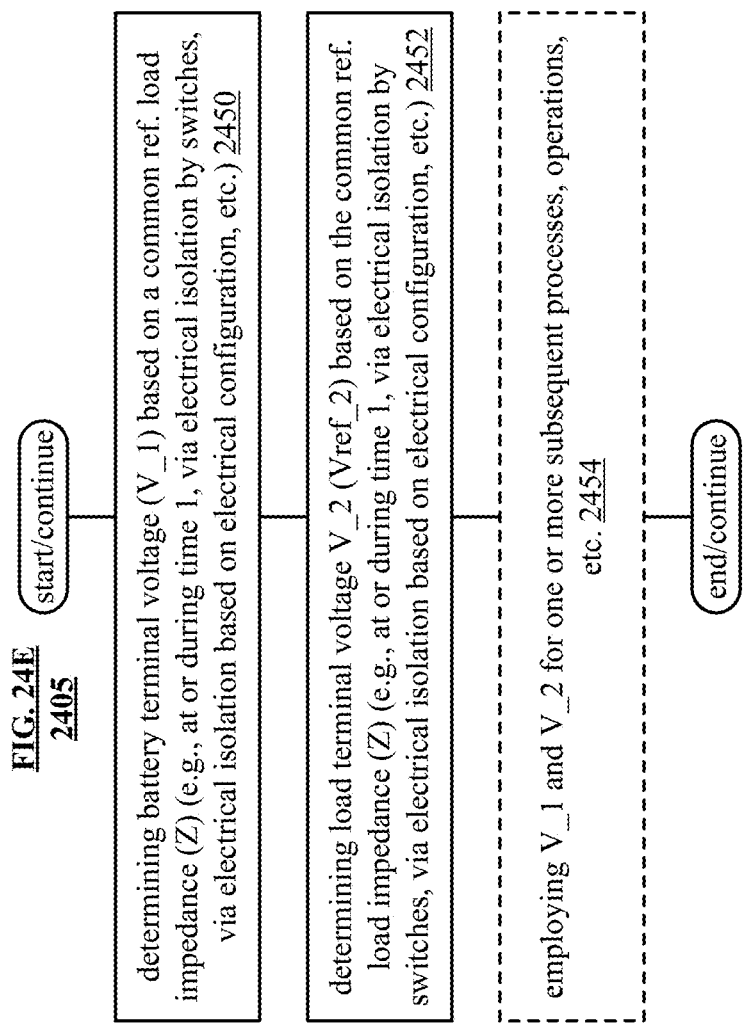

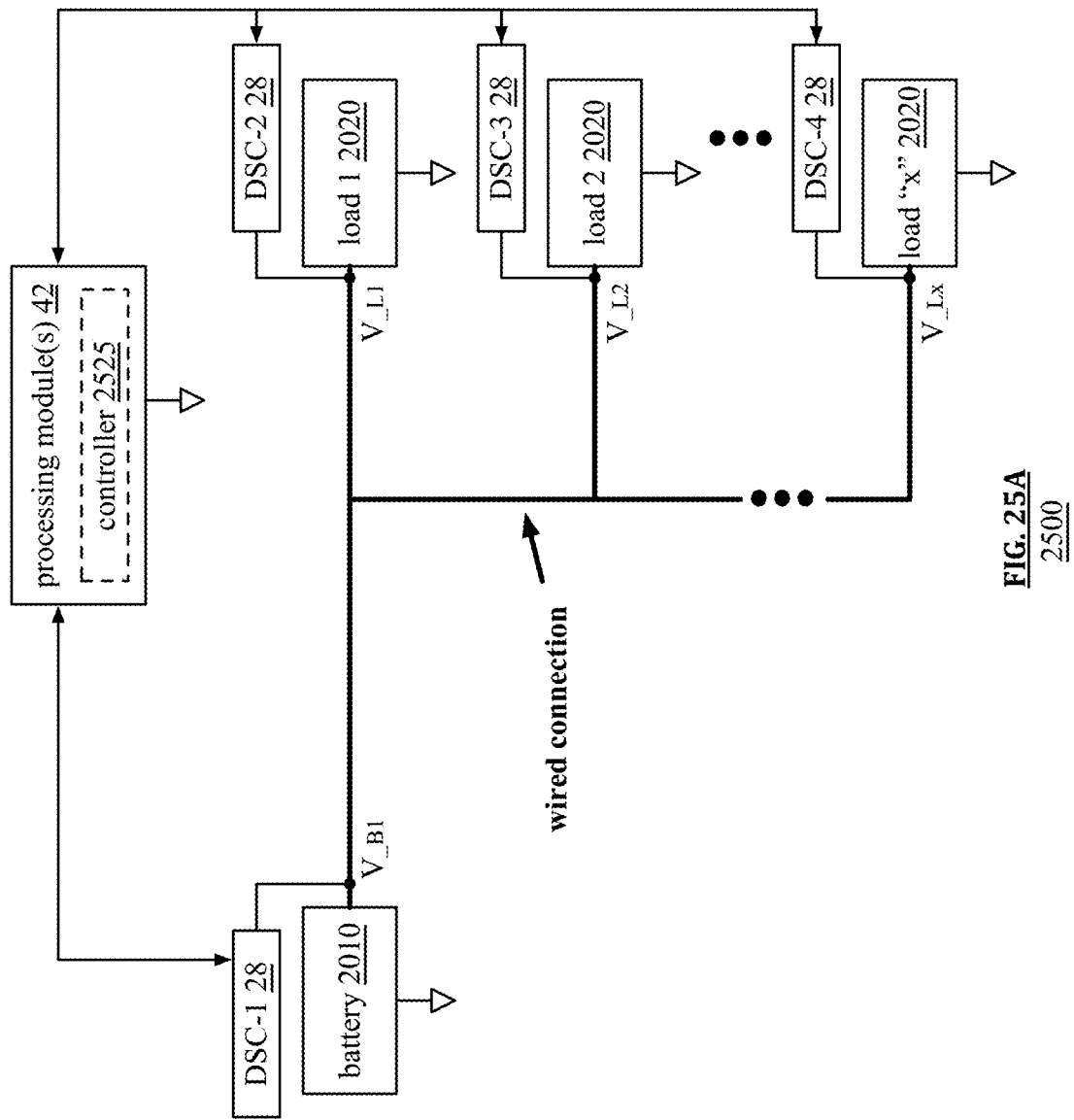

2501

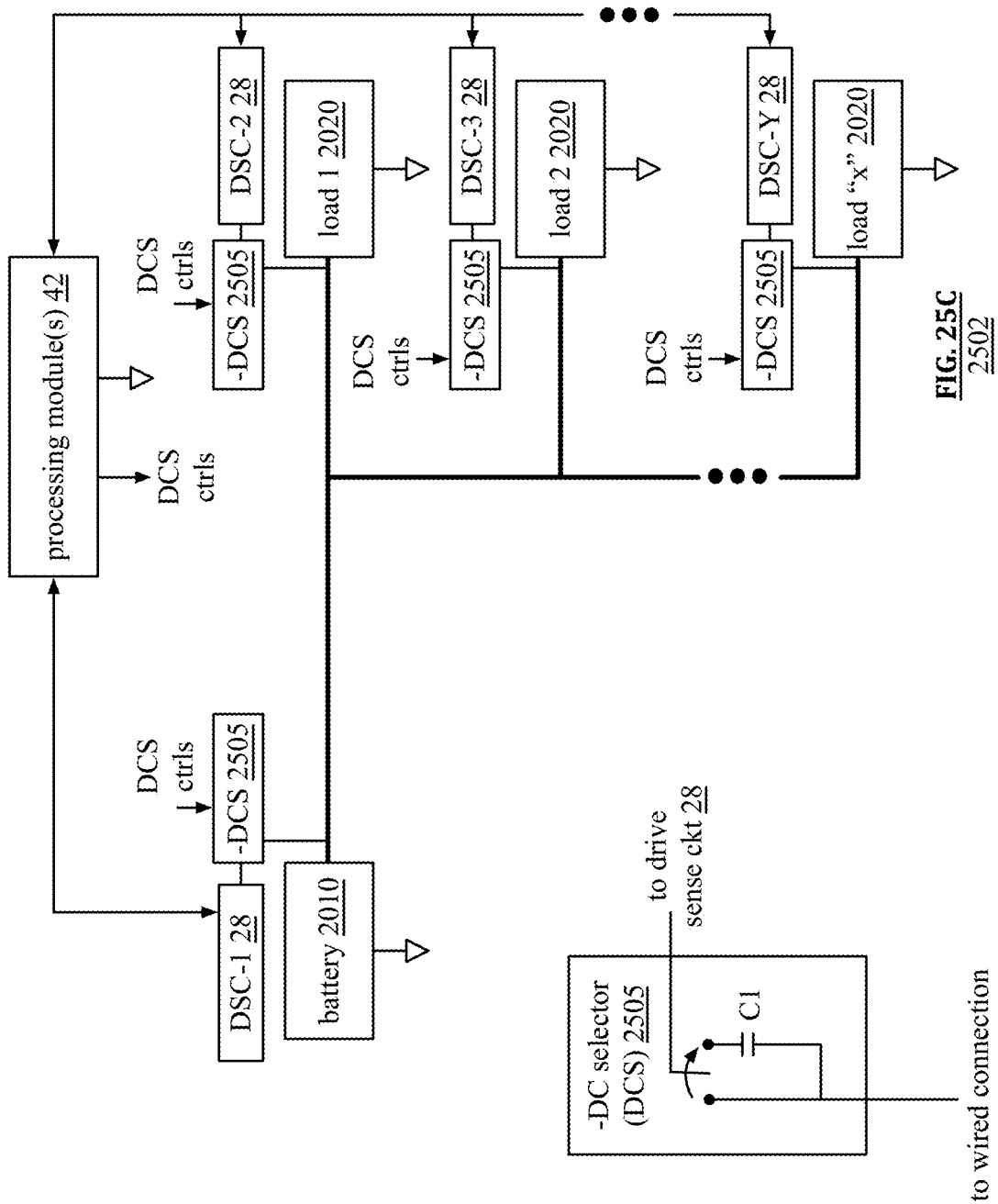

2601

2603

2605

2701

2703

2801

2803

2805

2807

2901

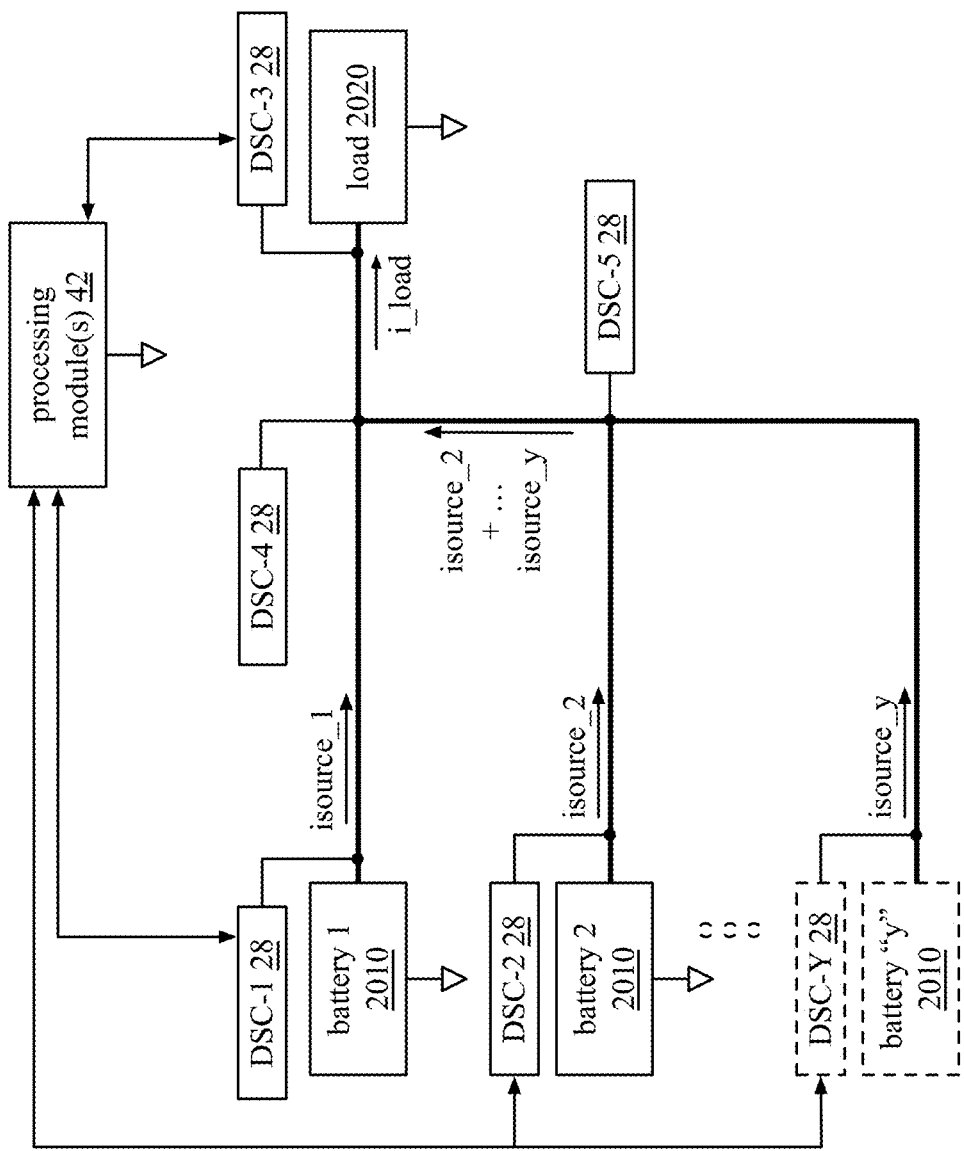

3001

3003

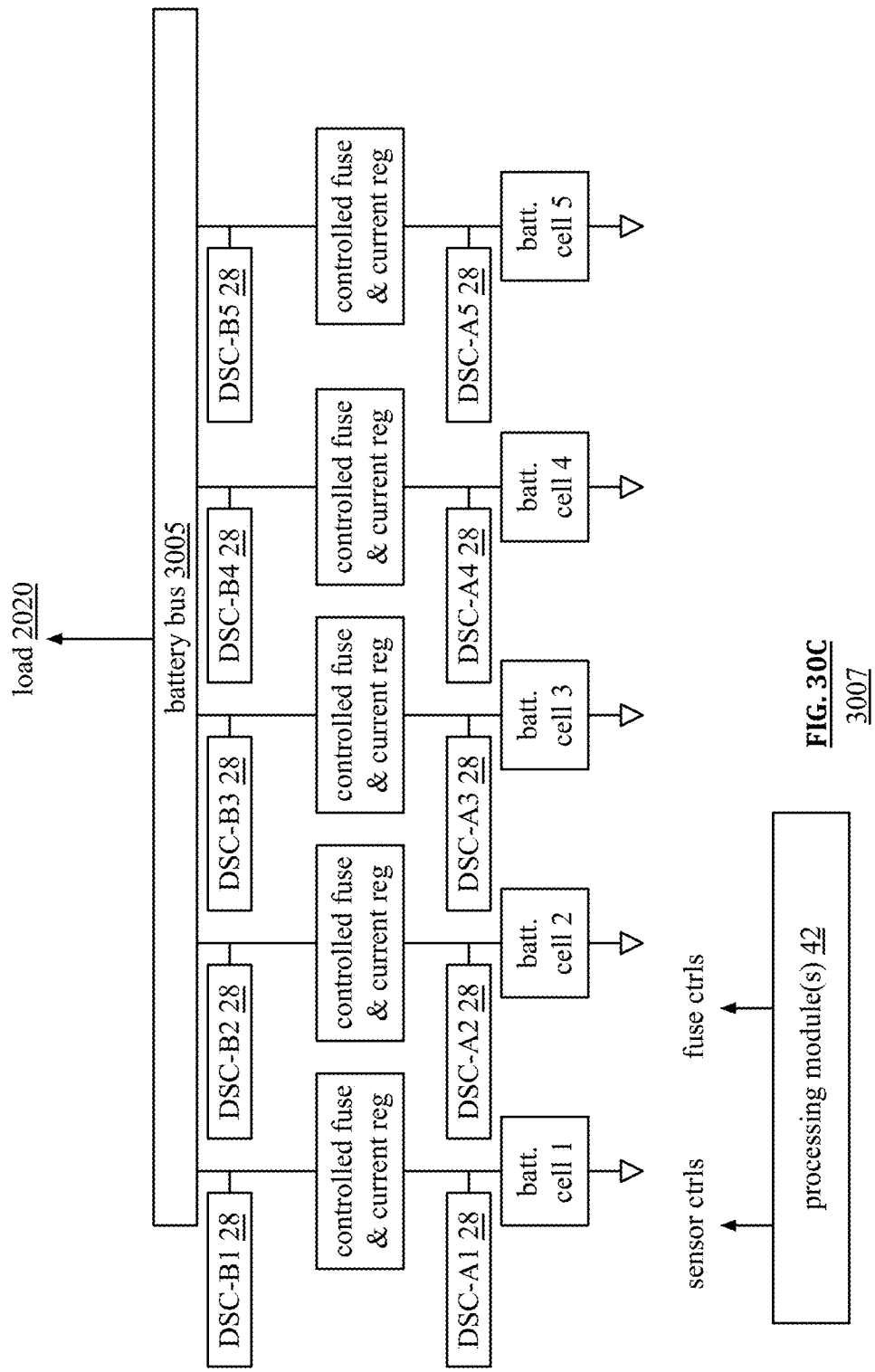

3011

3013

3015

SENSING VOLTAGE USING MICRO-WATT SENSOR

CROSS REFERENCE TO RELATED PATENTS/PATENT APPLICATIONS

The present U.S. Utility patent application claims priority pursuant to 35 U.S.C. § 119(e) to U.S. Provisional Application No. 63/195,556, entitled "Sensing voltage using micro-watt sensor,", filed Jun. 1, 2021, which is hereby incorporated herein by reference in its entirety and made part of the present U.S. Utility patent application for all purposes.

The U.S. Utility application Ser. No. 16/427,935, entitled "Battery monitoring and characterization during charging,", filed May 31, 2019, now issued as U.S. Pat. No. 11,131,714 on Sep. 28, 2021, is hereby incorporated herein by reference in its entirety and made part of the present U.S. Utility patent application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to data communication systems and more particularly to sensed data collection and/or communication.

Description of Related Art

Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touchscreens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is capacitor, a piezoelectric transducer, a piezoresistive transducer, a thermal transducer, a thermal-couple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touchscreen. As yet another example, the computing device processes the sensor signals to determine various data points in a production line of a product.

BRIEF DESCRIPTION OF THE SEVERAL VIEWS OF THE DRAWING(S)

FIG. 5A is a schematic plot diagram of a computing subsystem in accordance with the present disclosure;

FIG. 5D is a schematic block diagram of another embodiment of a computing subsystem in accordance with the present disclosure;

FIG. 6 is a schematic block diagram of a drive center circuit in accordance with the present disclosure;

FIG. 6A is a schematic block diagram of another embodiment of a drive sense circuit in accordance with the present disclosure;

FIG. 7 is an example of a power signal graph in accordance with the present disclosure;

FIG. 8 is an example of a sensor graph in accordance with the present disclosure;

FIG. 12 is a schematic block diagram of an embodiment of a power signal change detection circuit in accordance with the present disclosure;

FIG. 13 is a schematic block diagram of another embodiment of a drive-sense circuit in accordance with the present disclosure;

FIG. 20A is a schematic block diagram showing an embodiment of a battery that is connected or coupled to a load in accordance with the present disclosure;

FIG. 20B is a schematic block diagram showing an embodiment of a battery that is connected or coupled to a load, and an associated electrical model of that configuration, in accordance with the present disclosure;

Figure 22C:
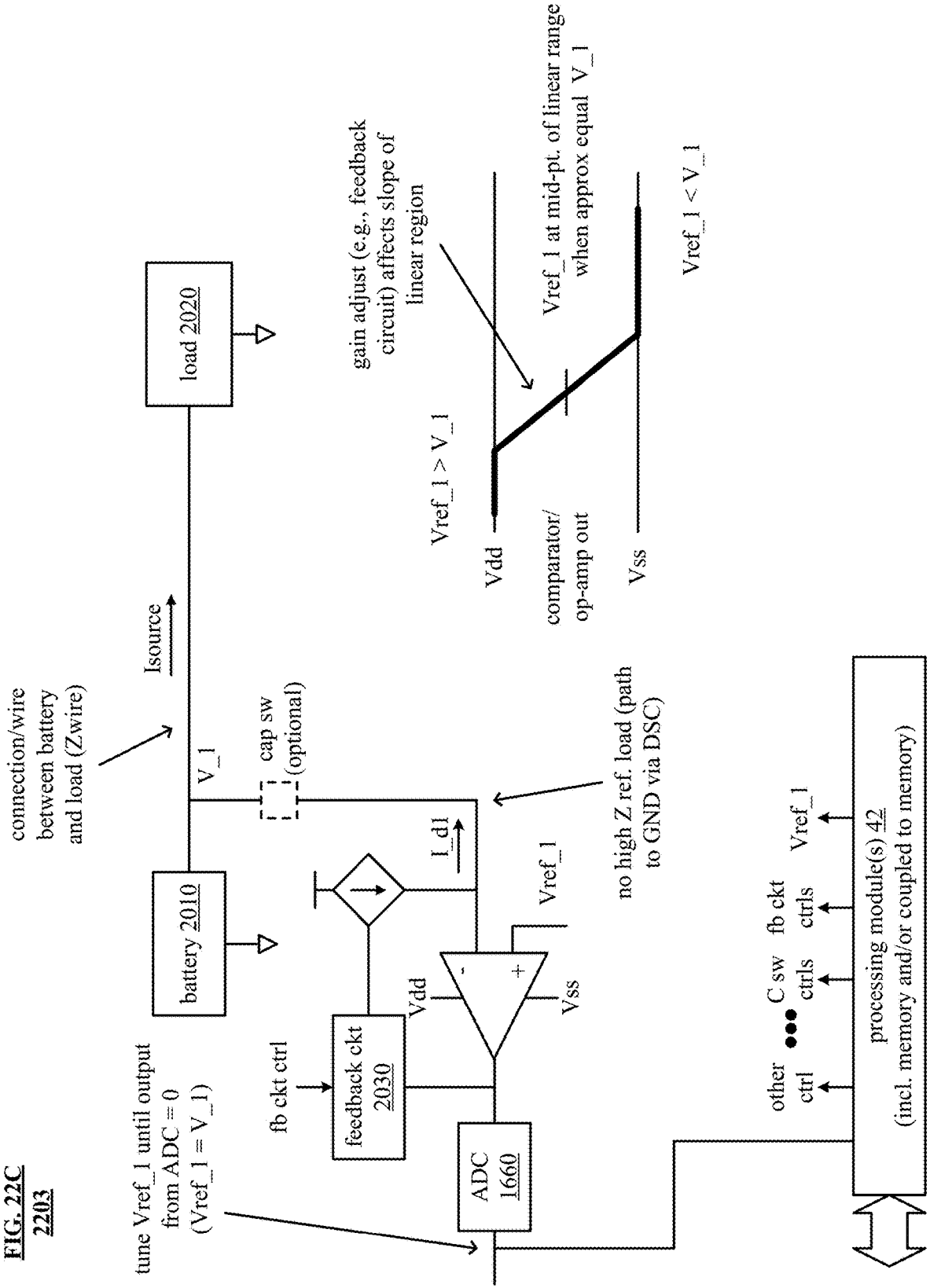
Figure 23A:
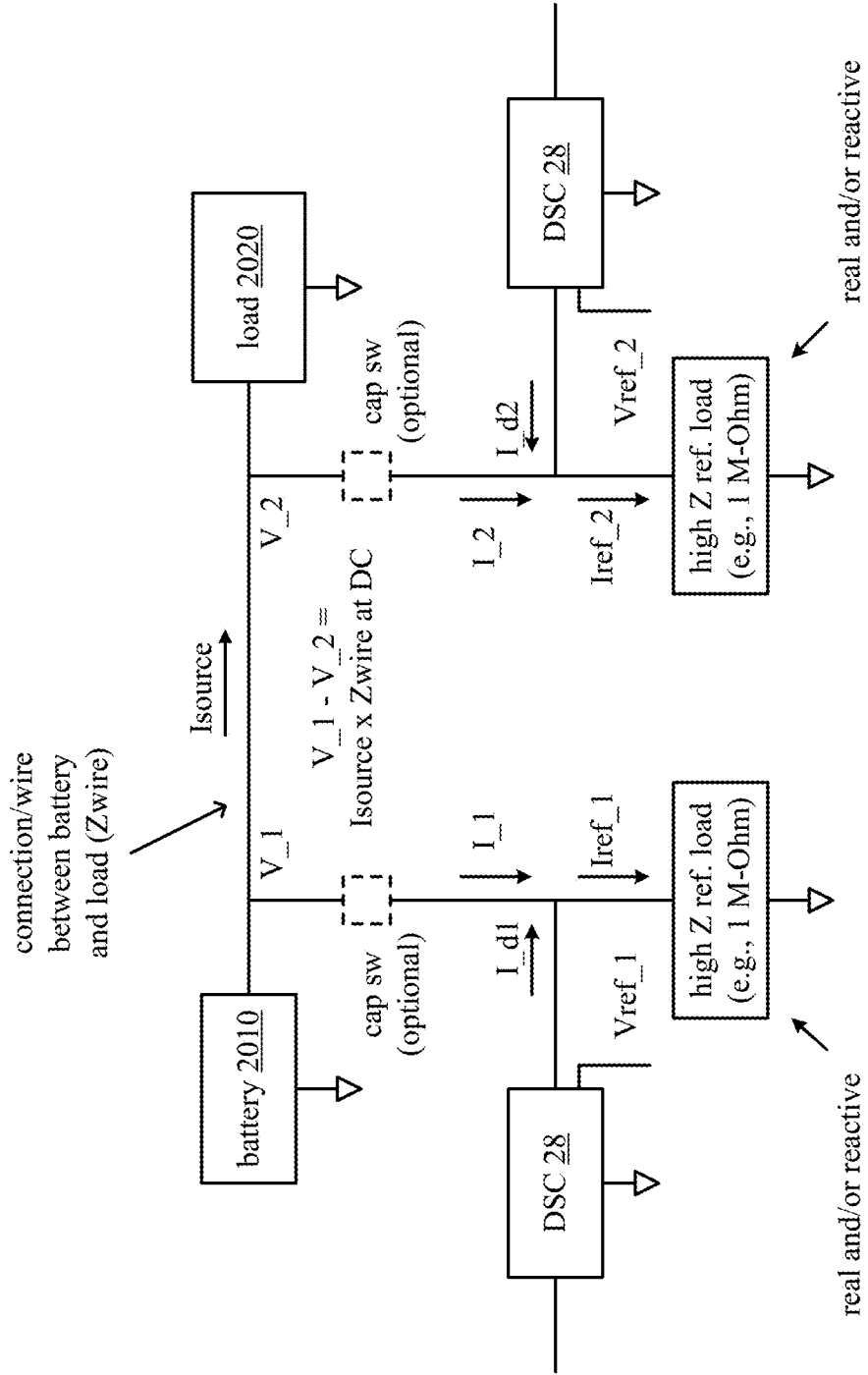
Figure 23B:
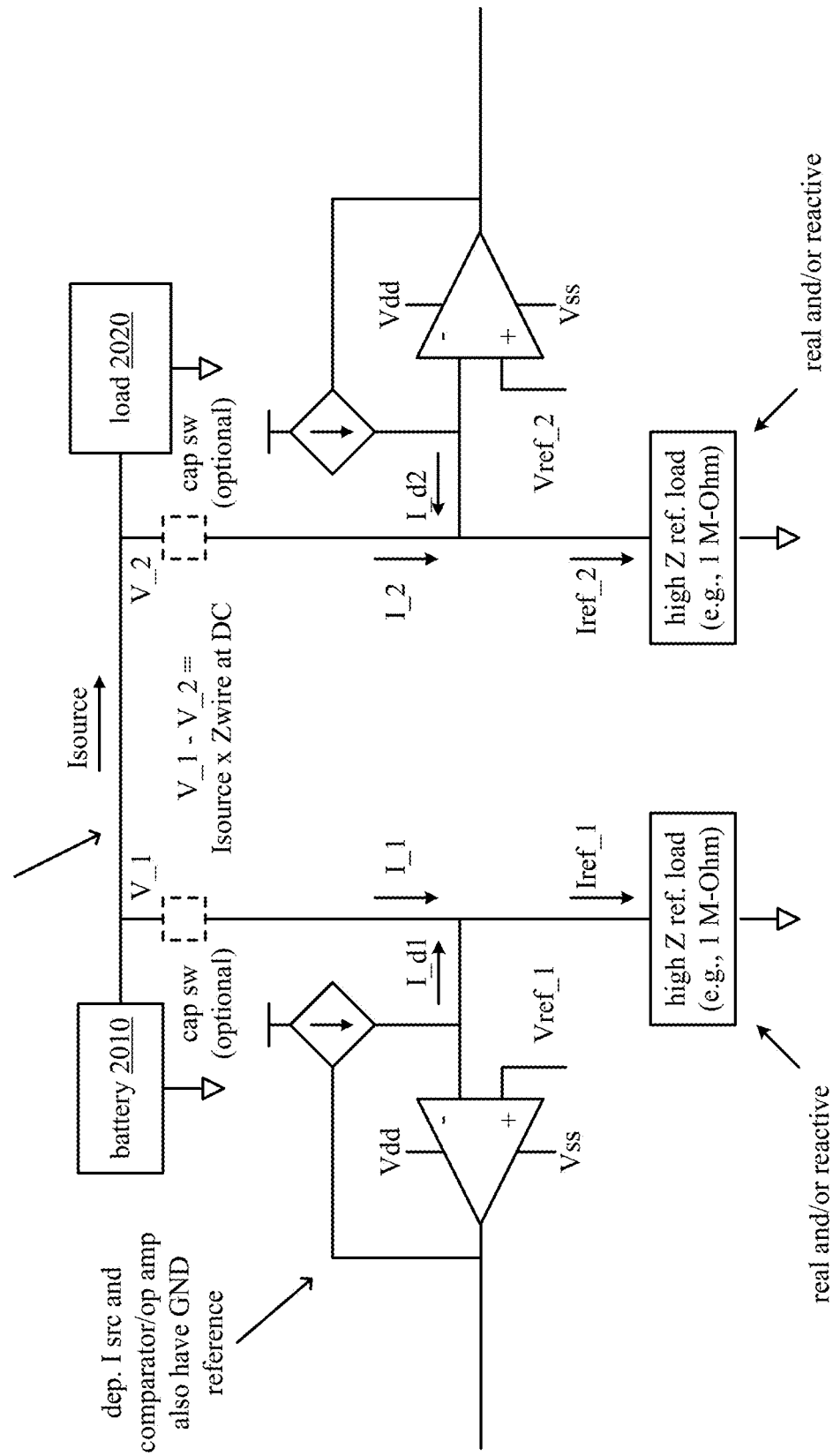
Figure 23D:
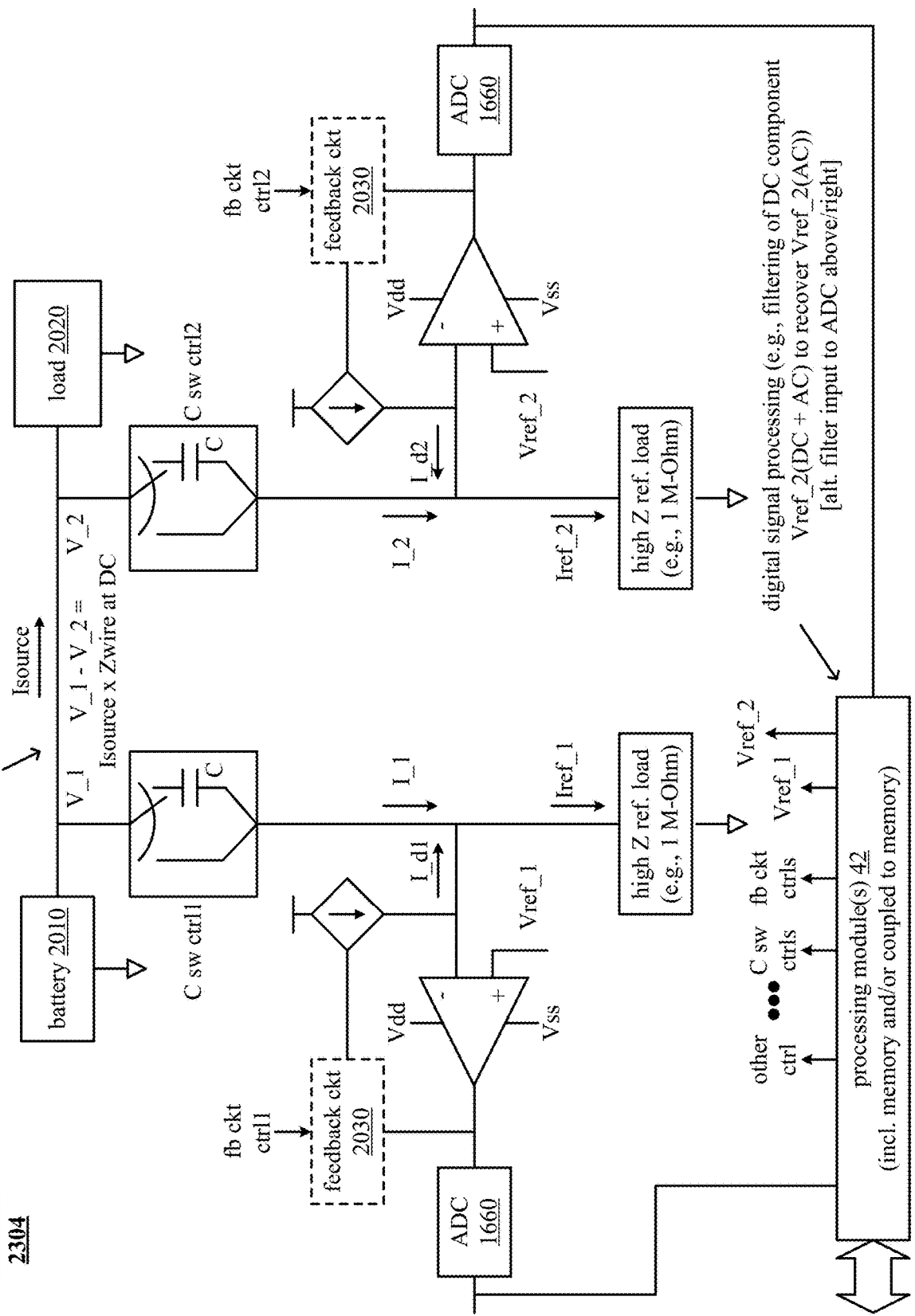
Figure 23E:
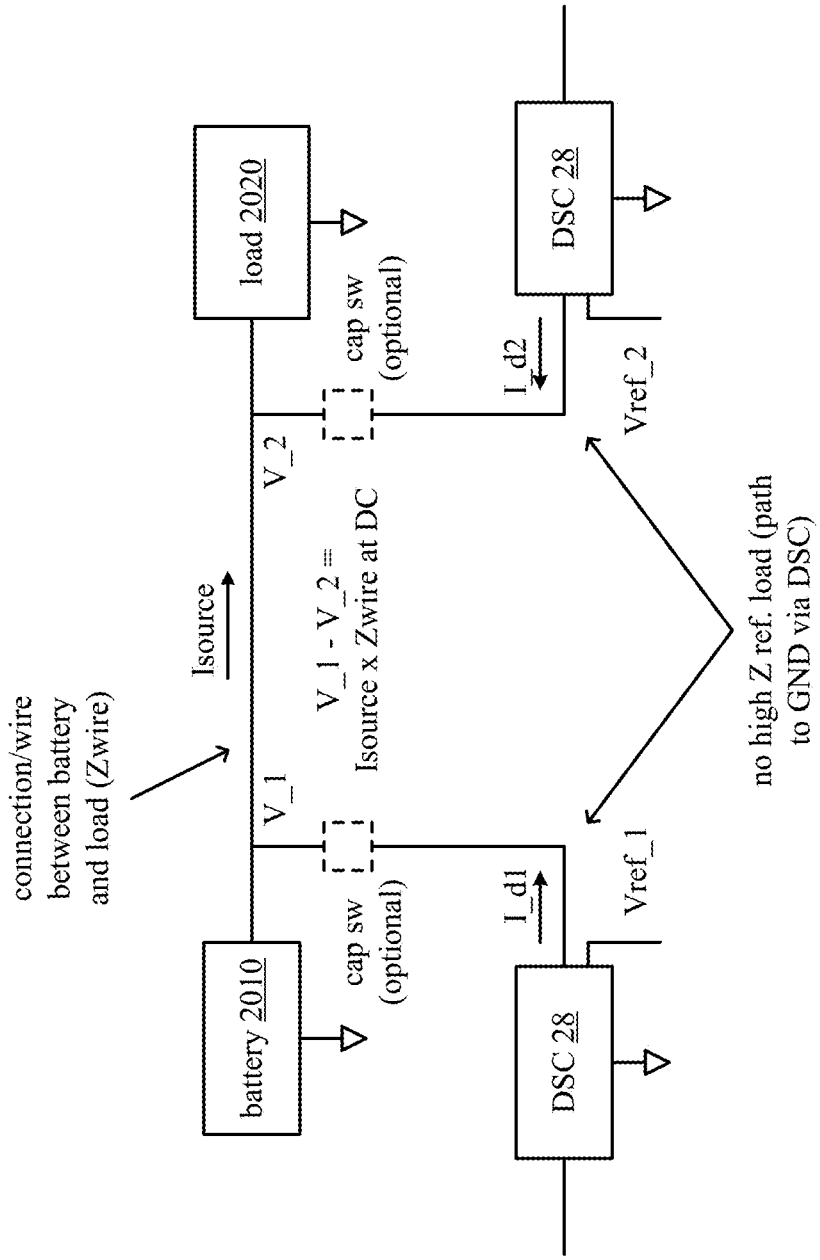
Figure 23G:
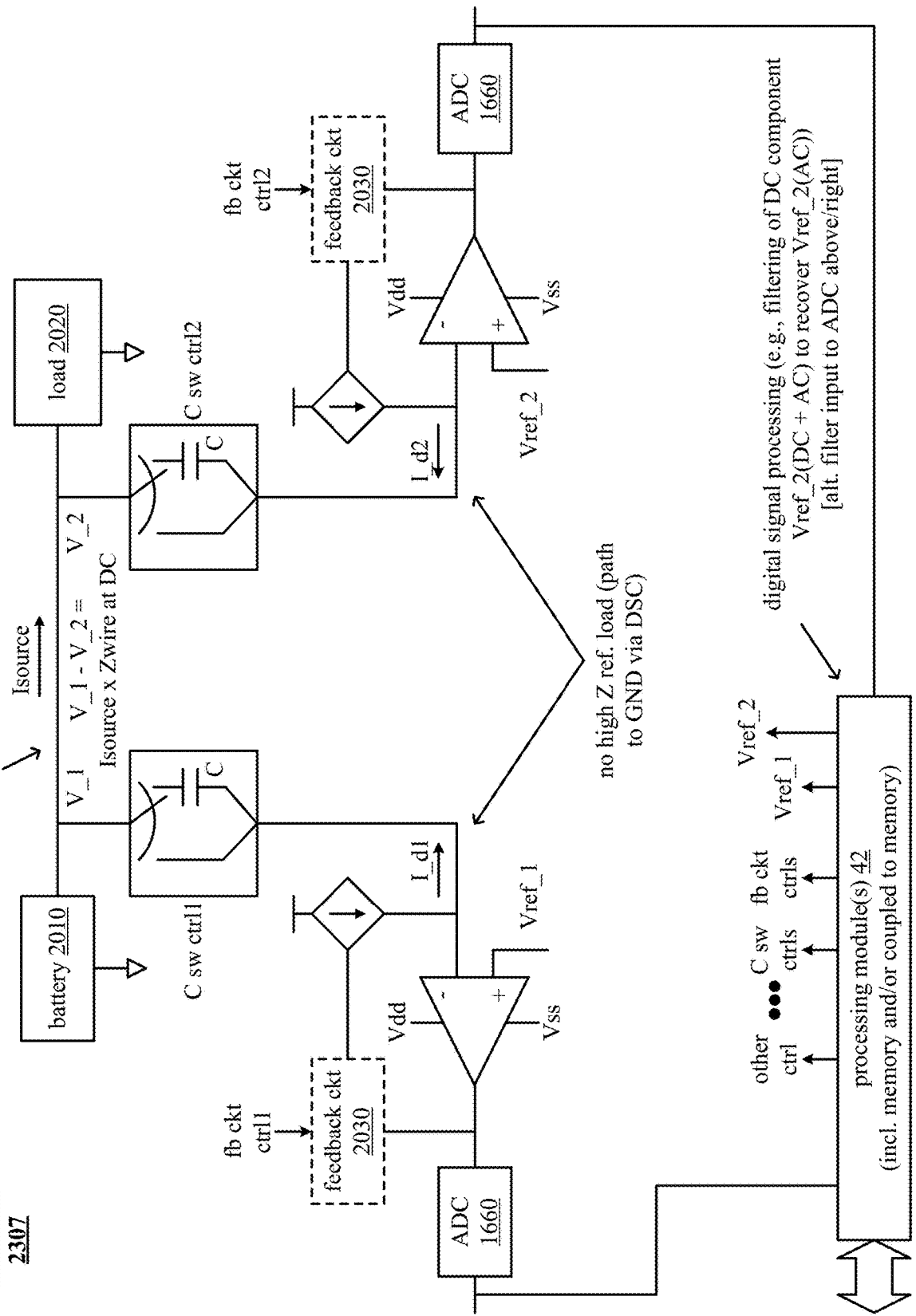
Figure 23H:
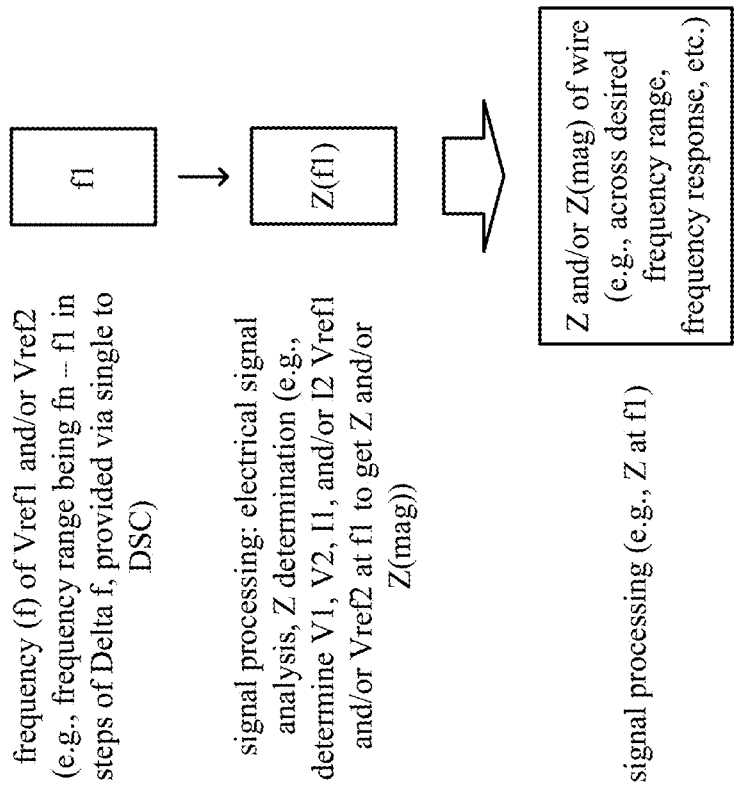
Figure 23I:
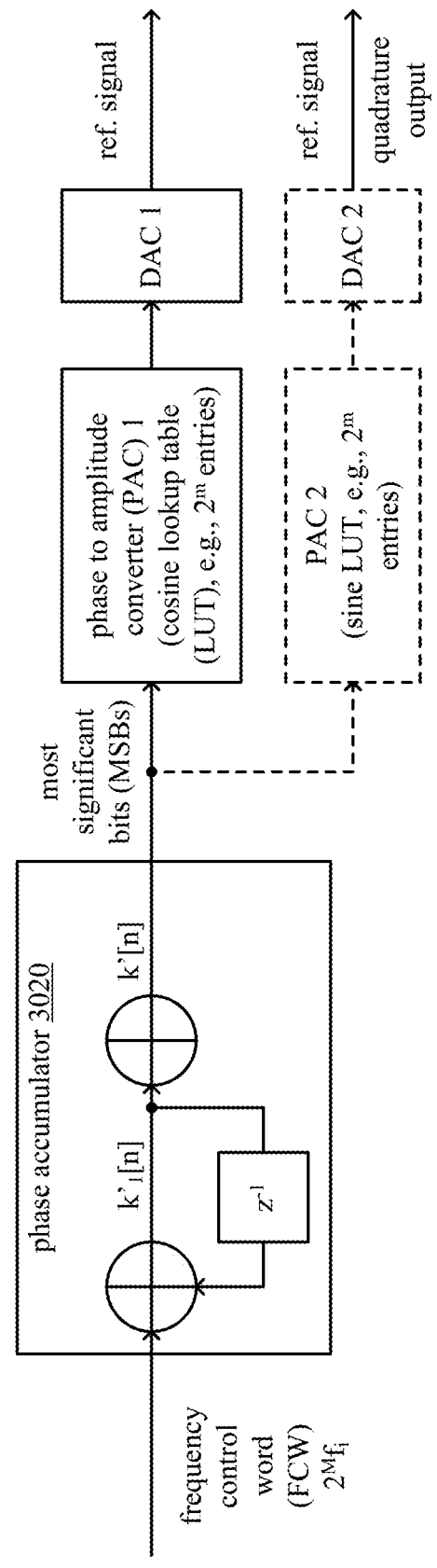
Figure 23J:
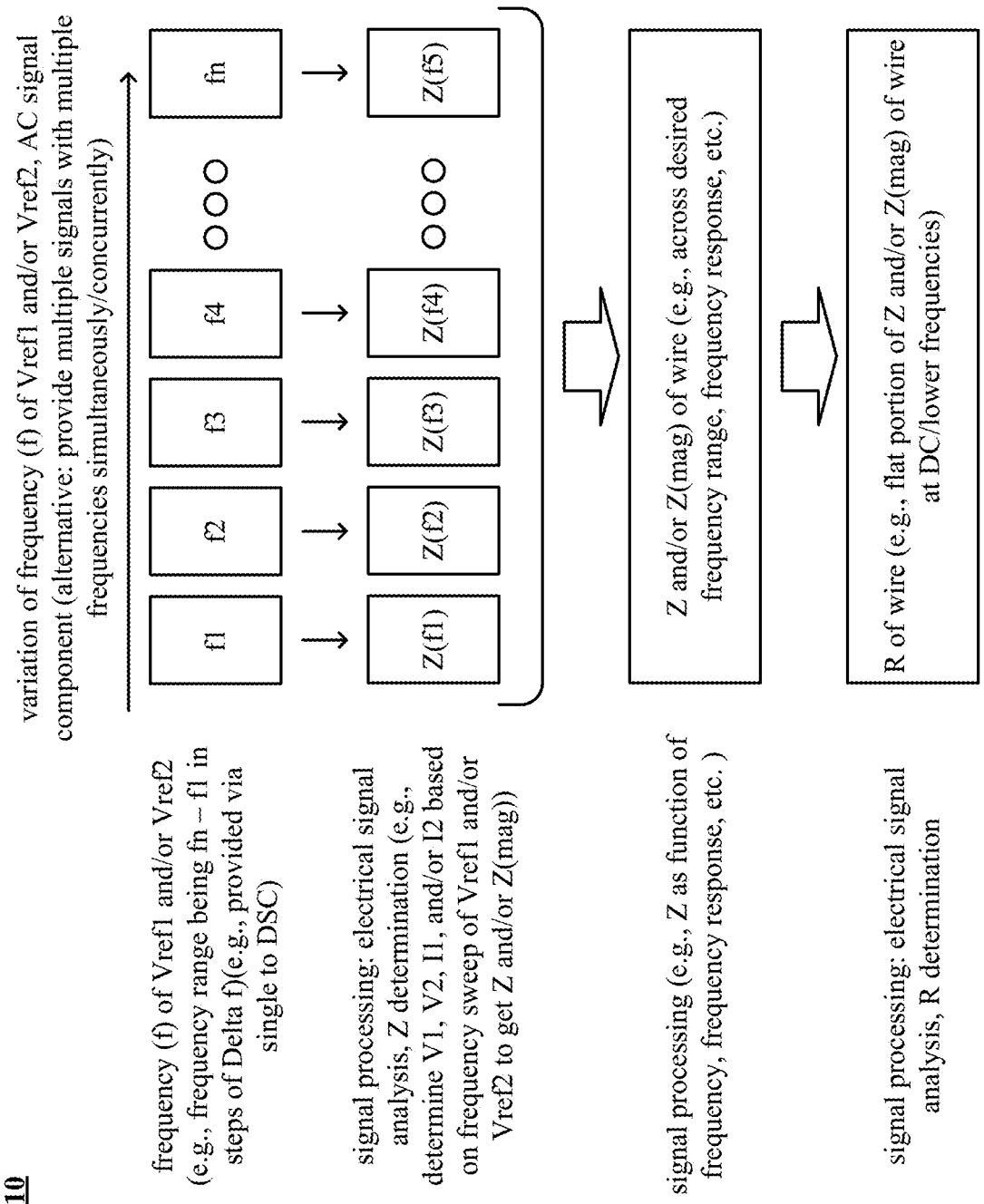
Figure 23K:
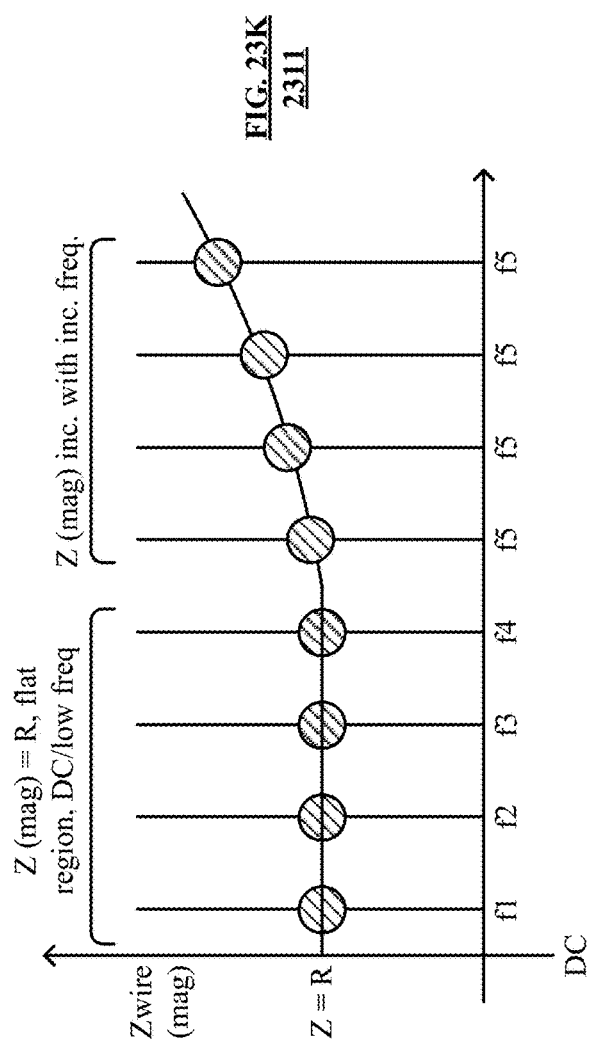
Figure 23L:
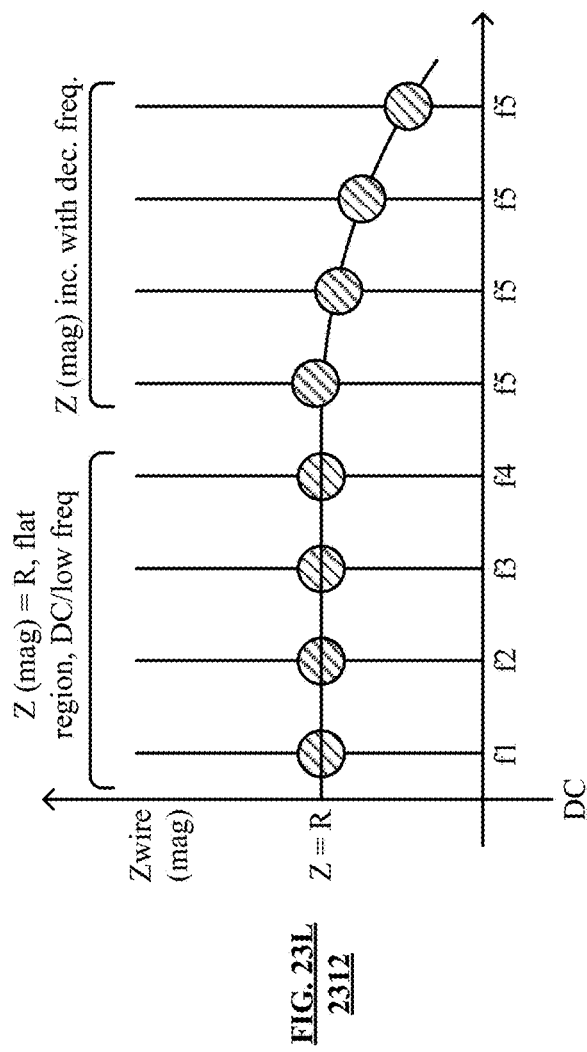
Figure 24A:
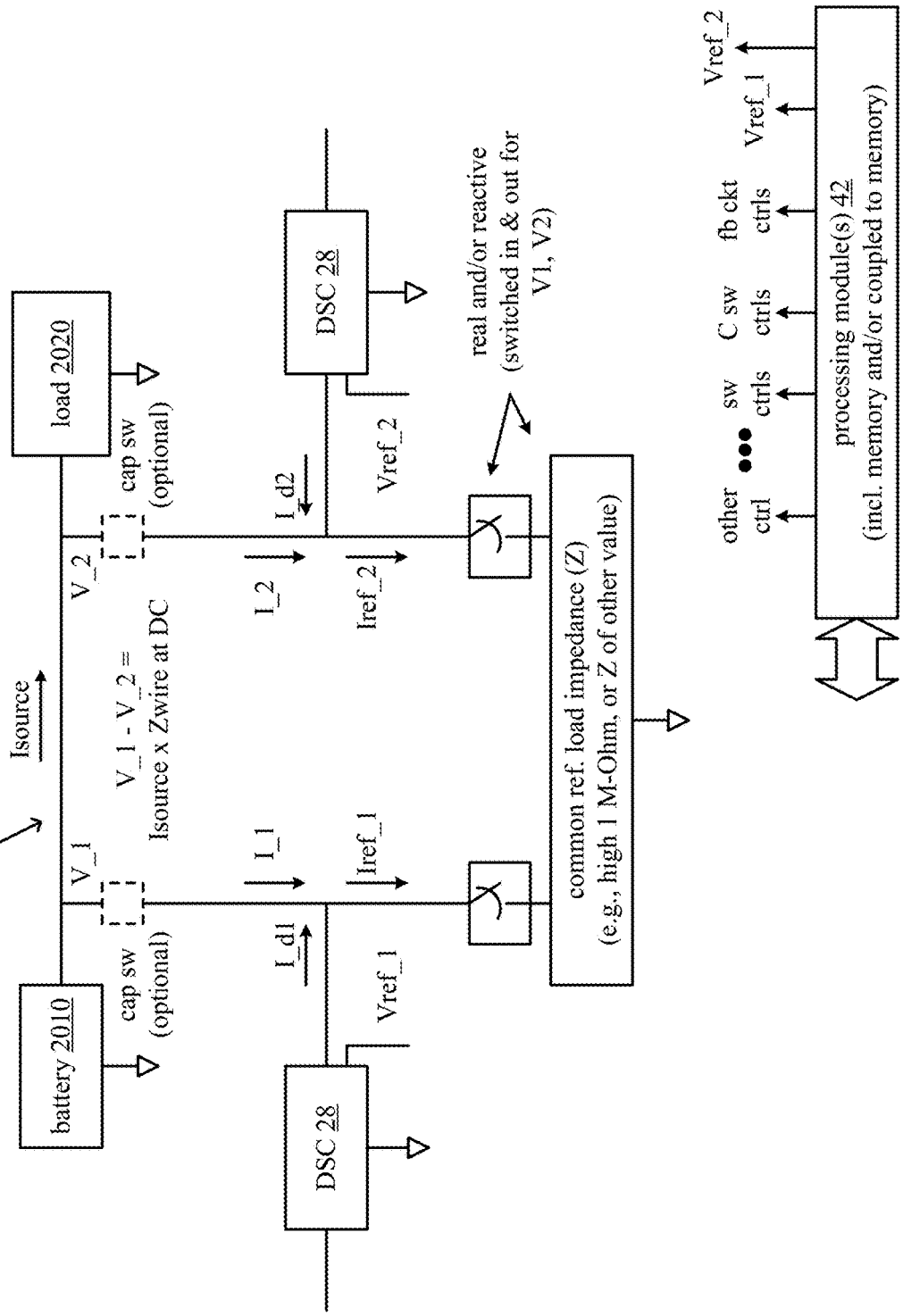
Figure 24B:
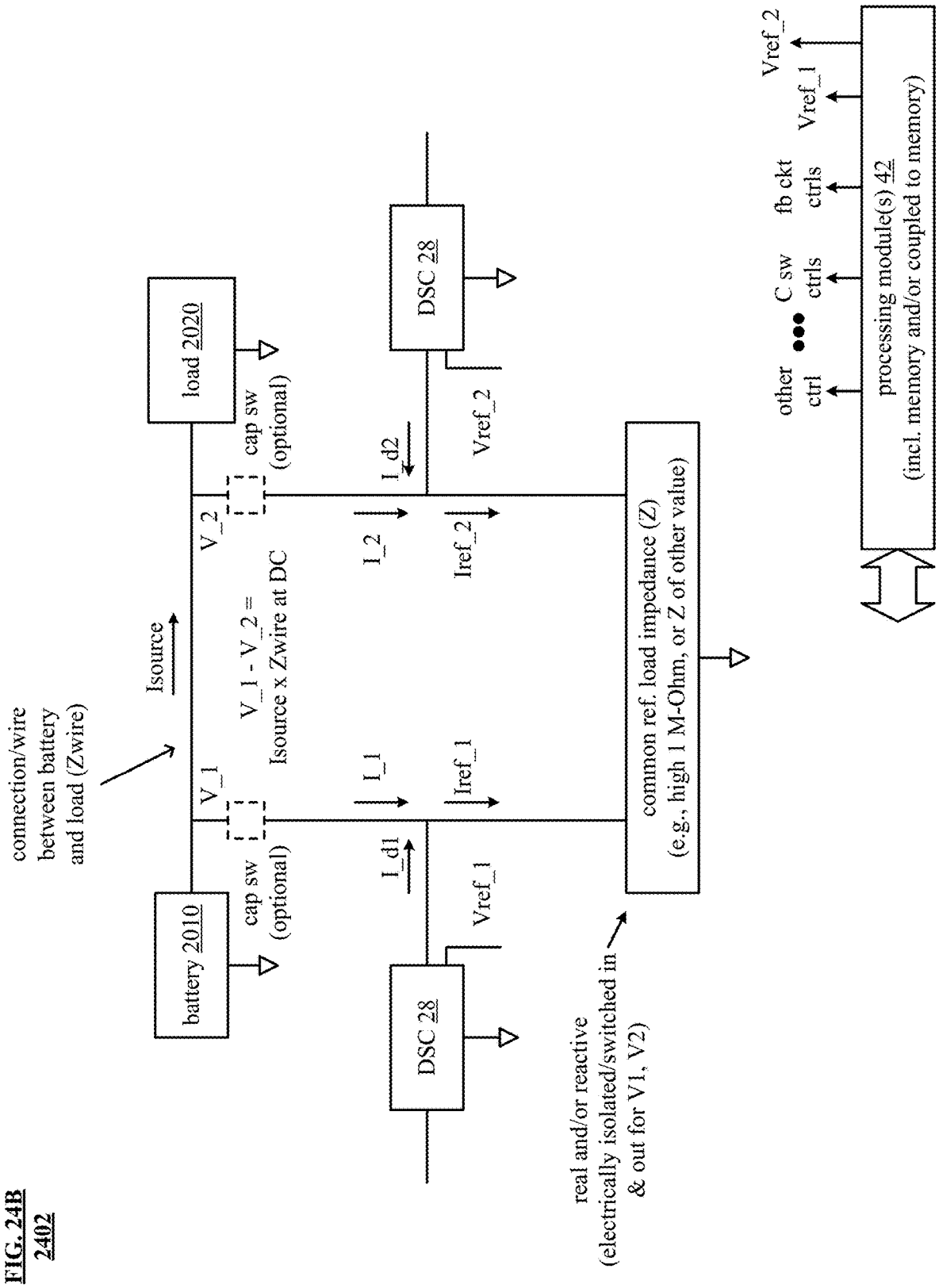
Figure 24D:
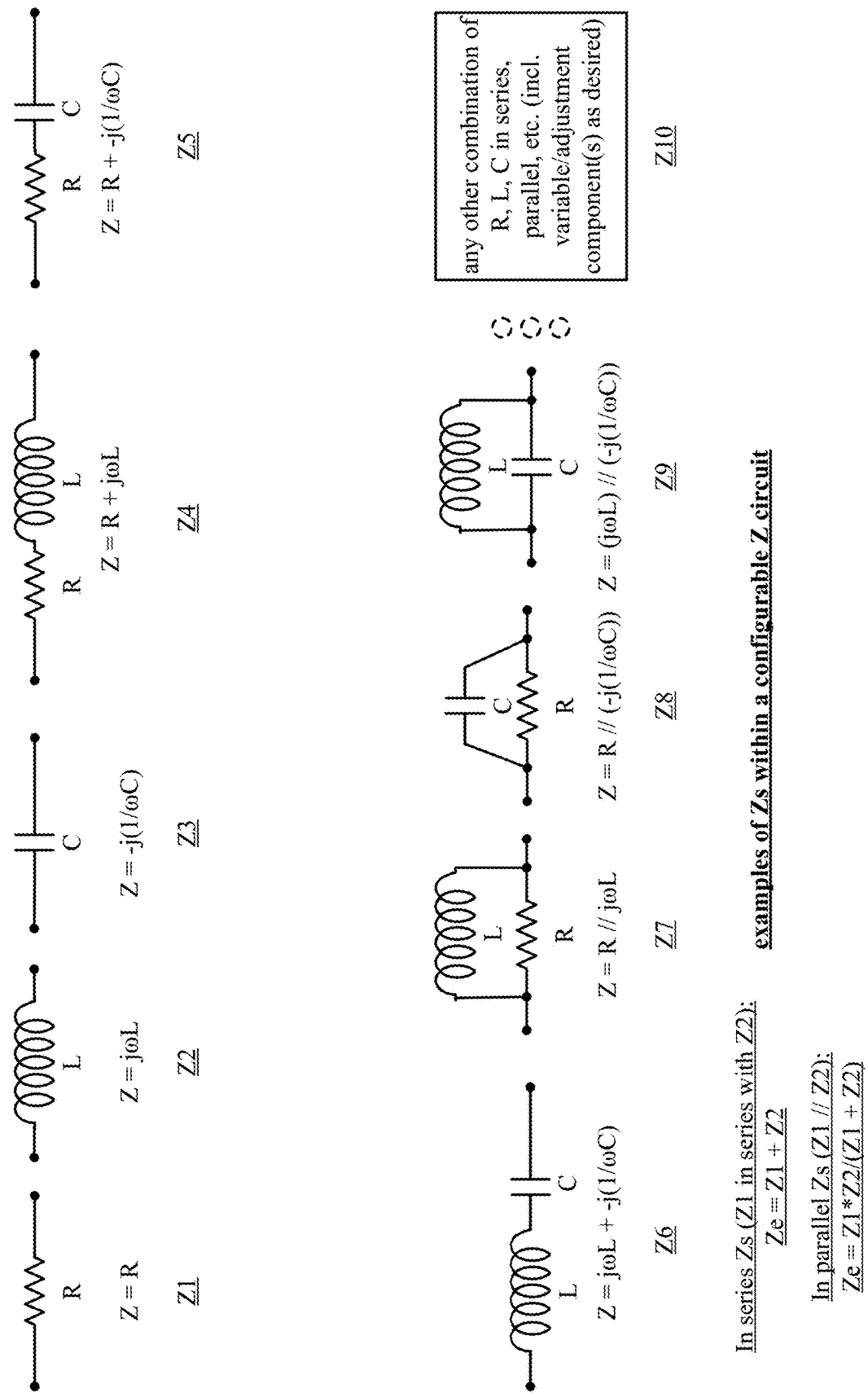
Figure 25B:
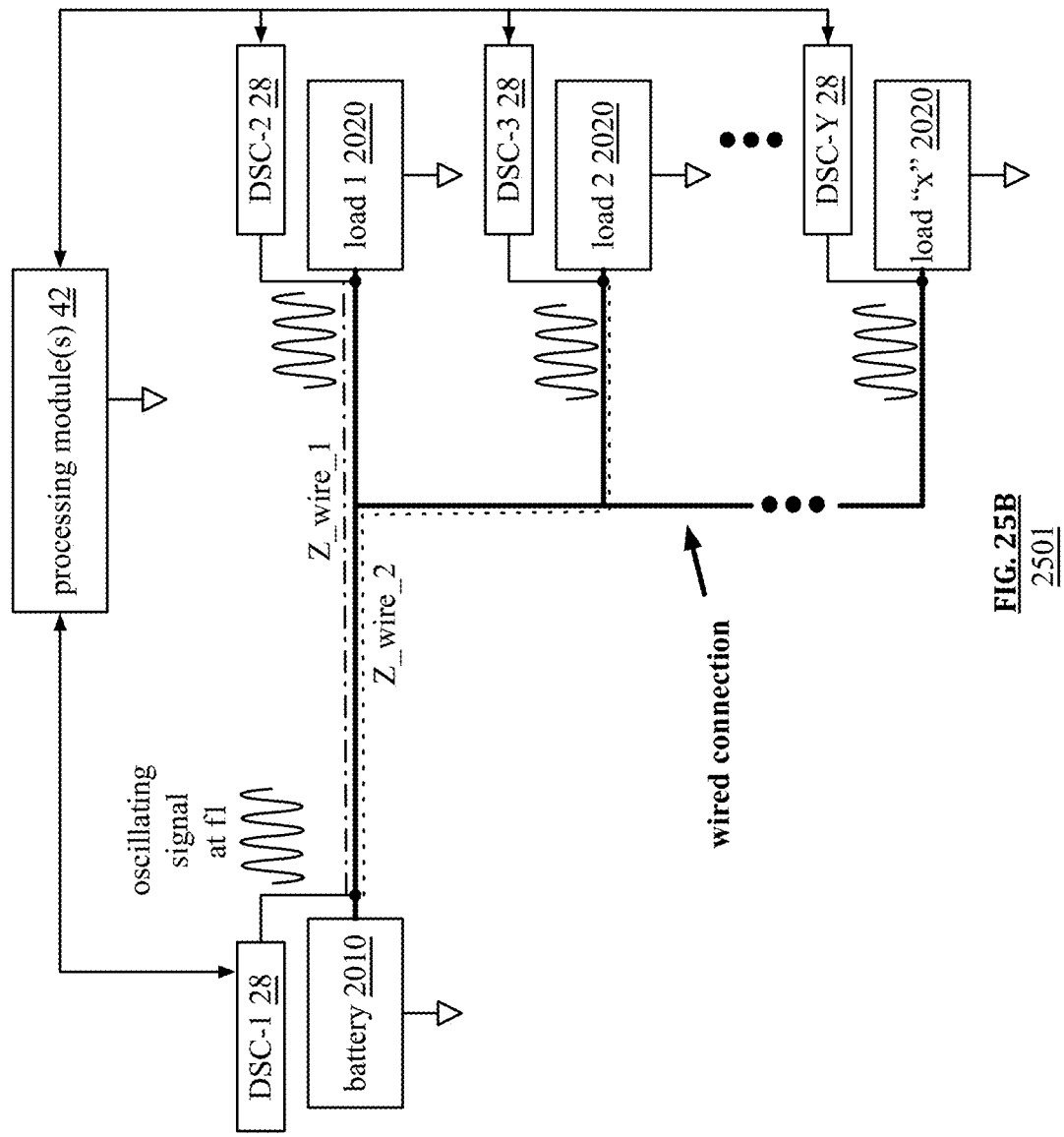
Figure 25E:
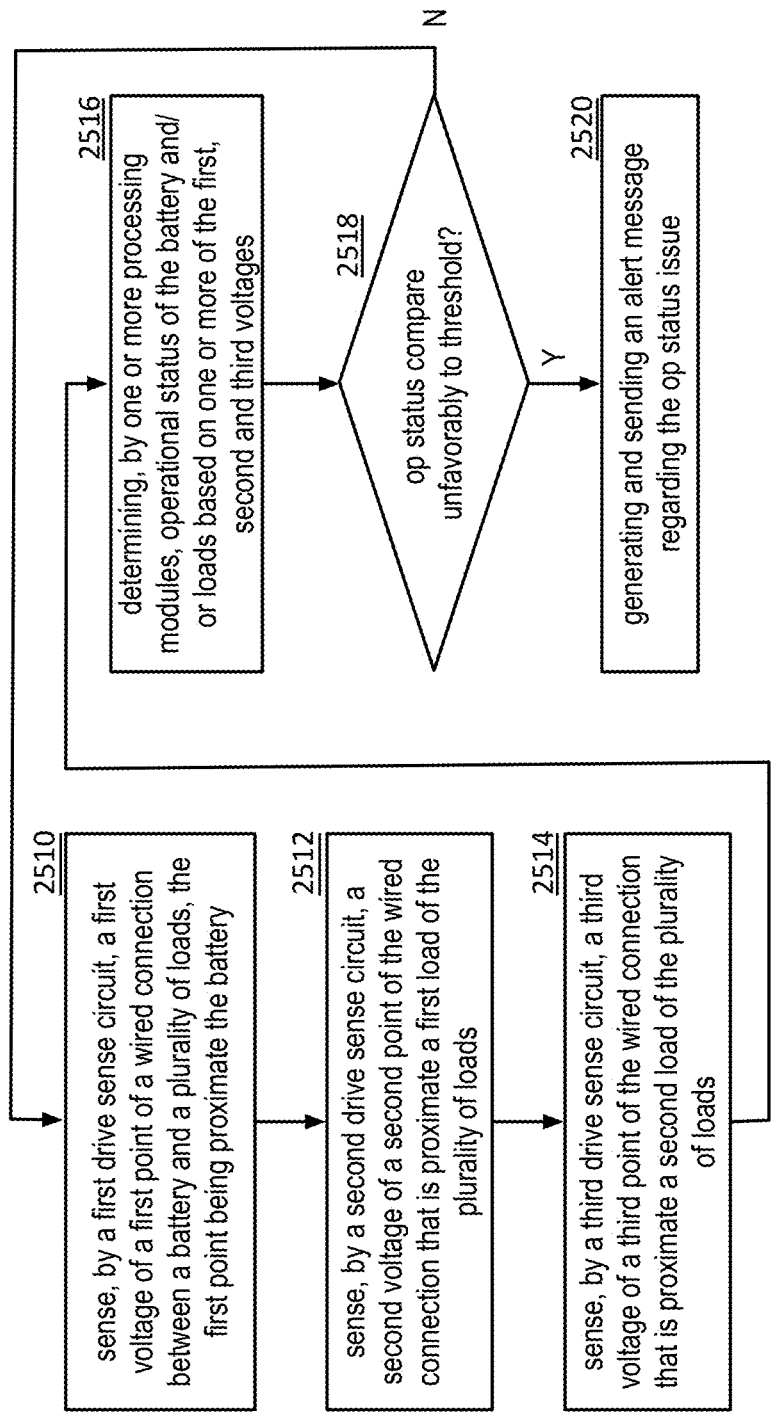
Figure 26A:
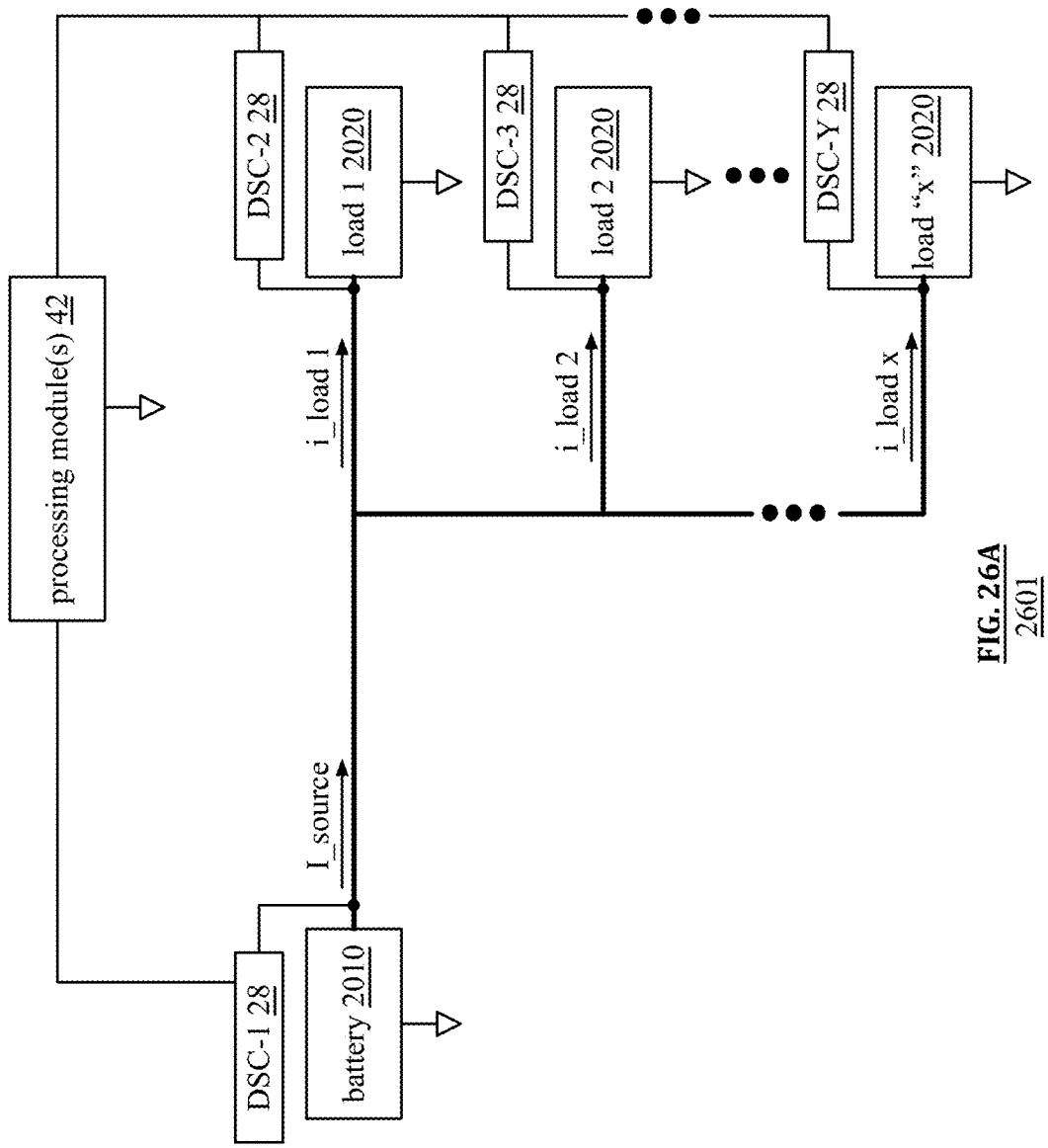
Figure 26B:
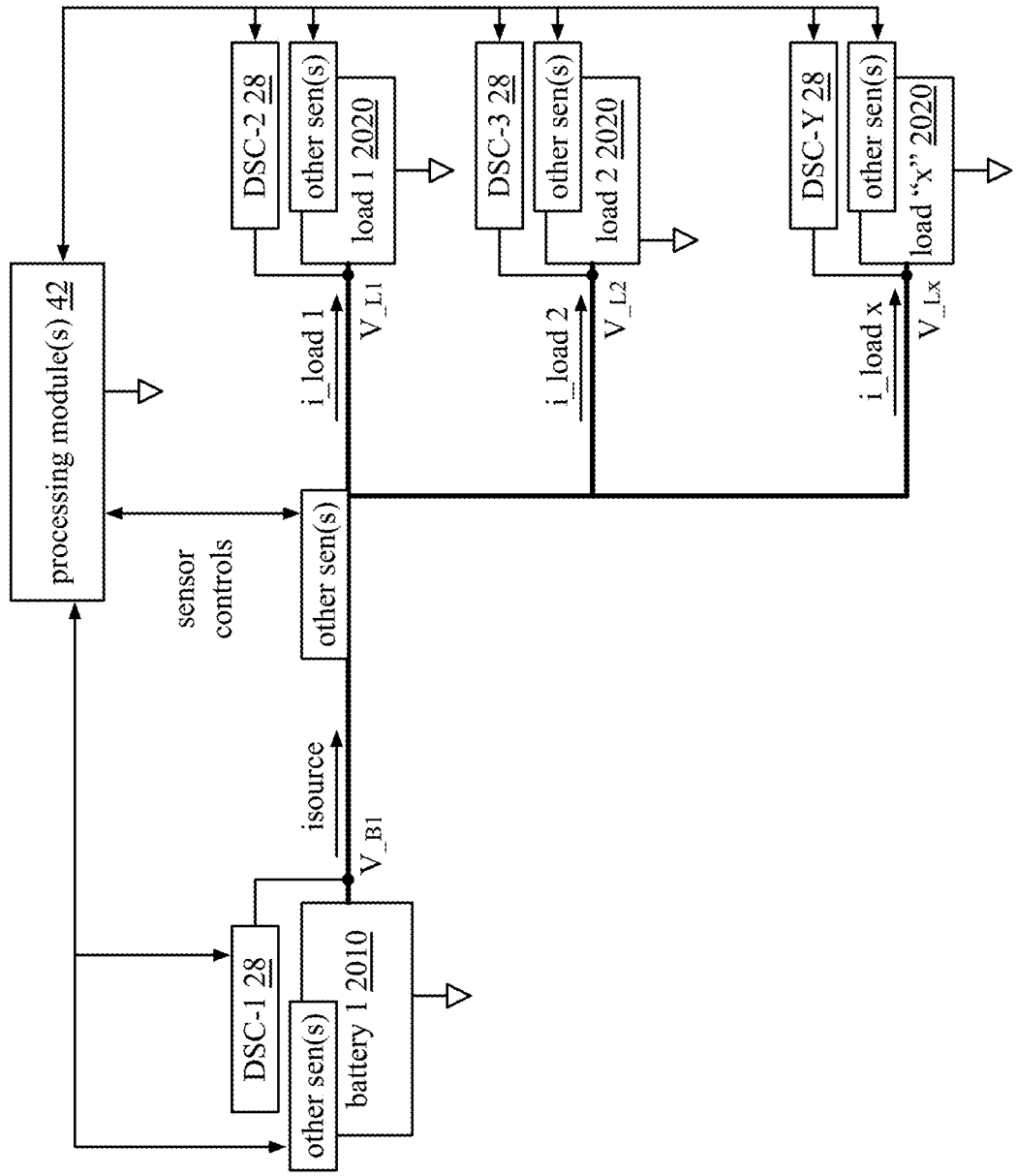
Figure 26C:
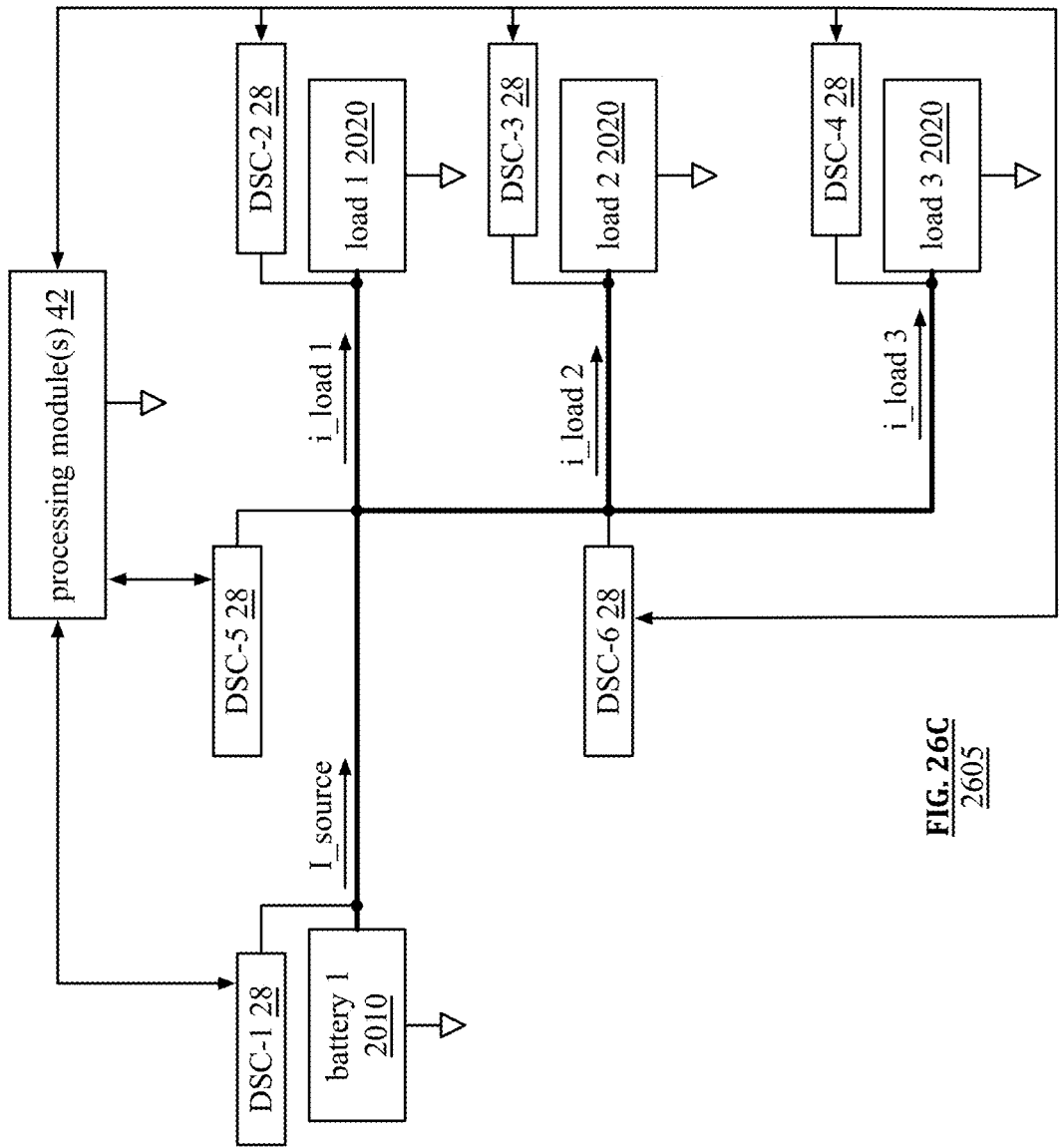
Figure 26D:
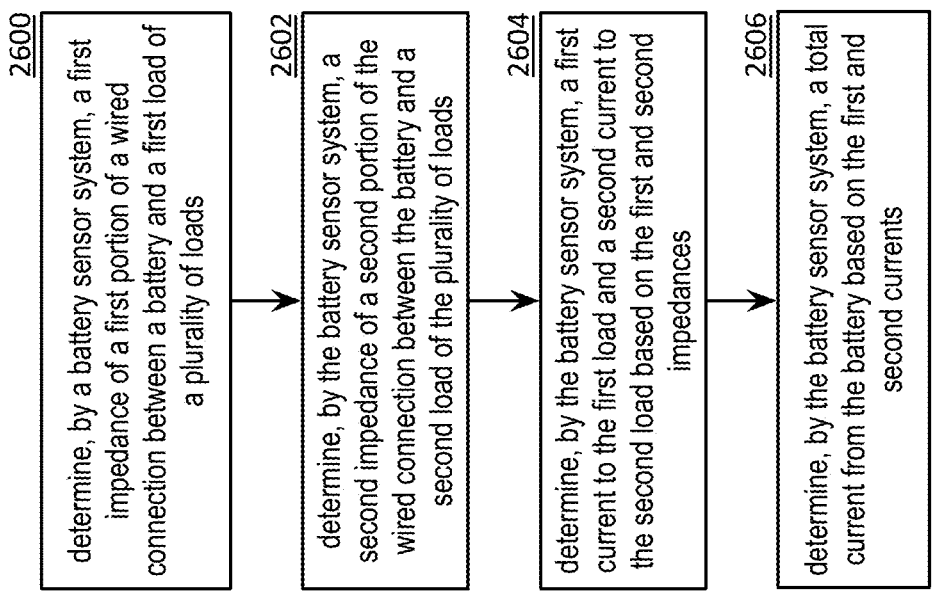
Figure 27A:
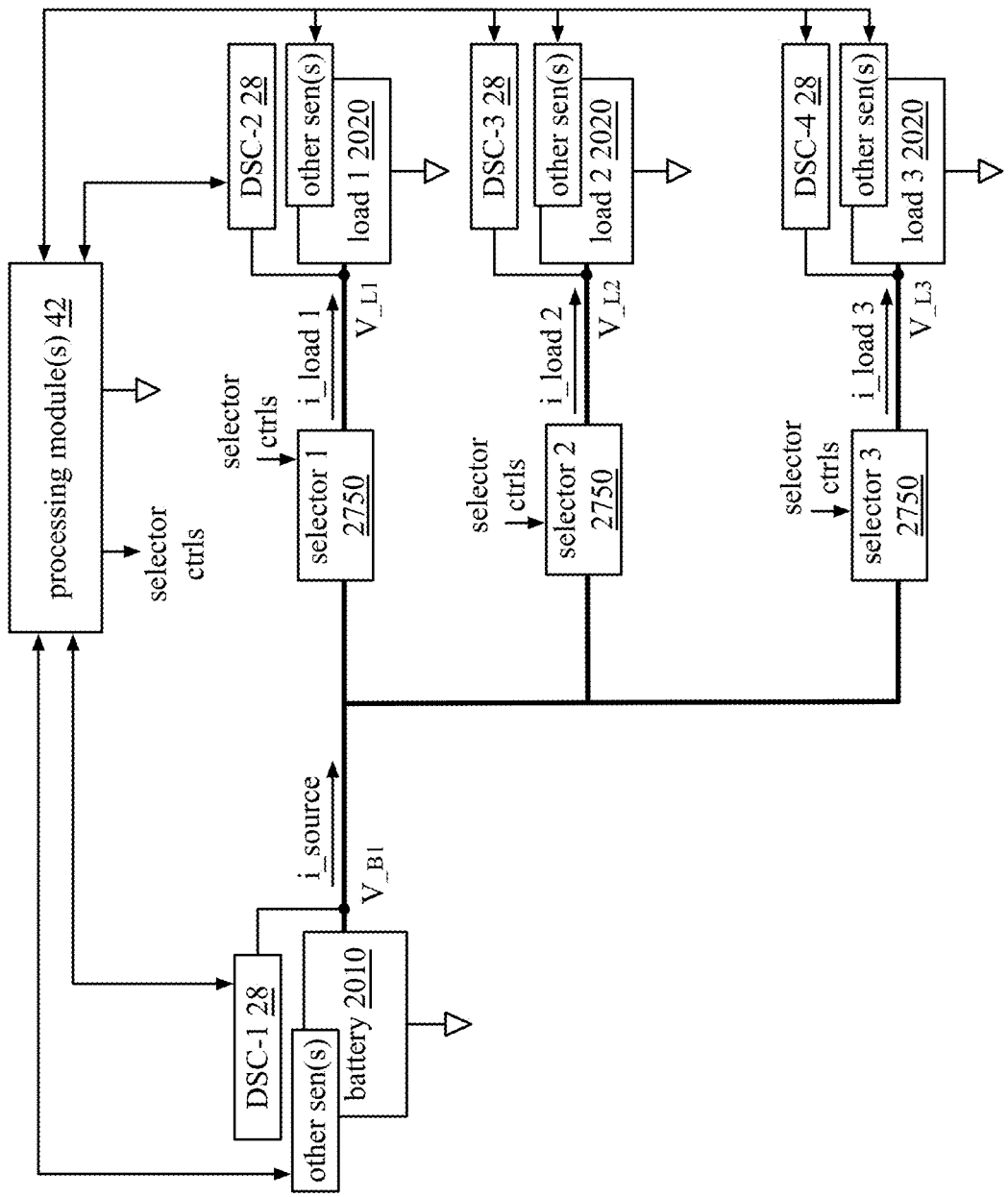
Figure 27B:
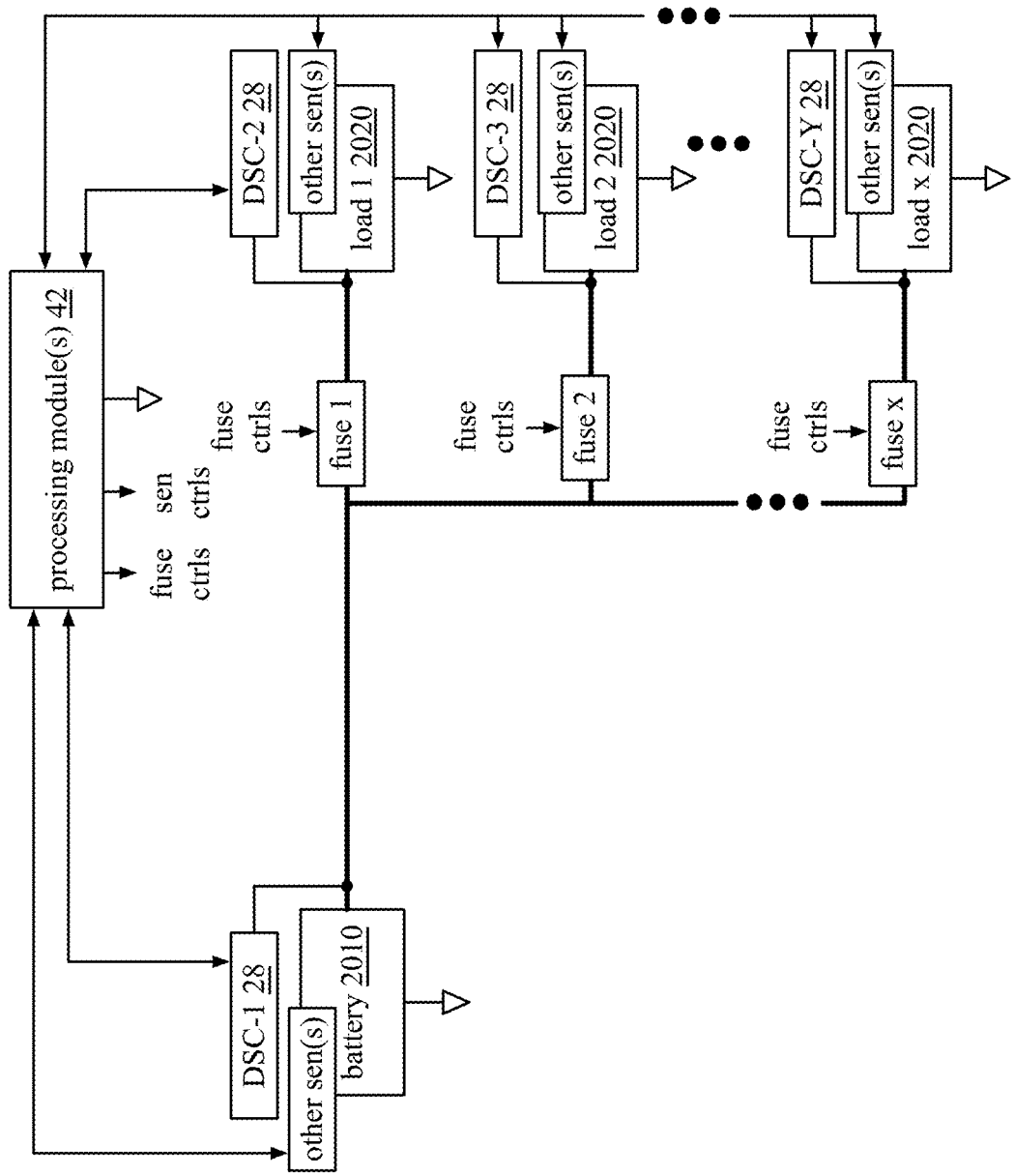
Figure 27C:
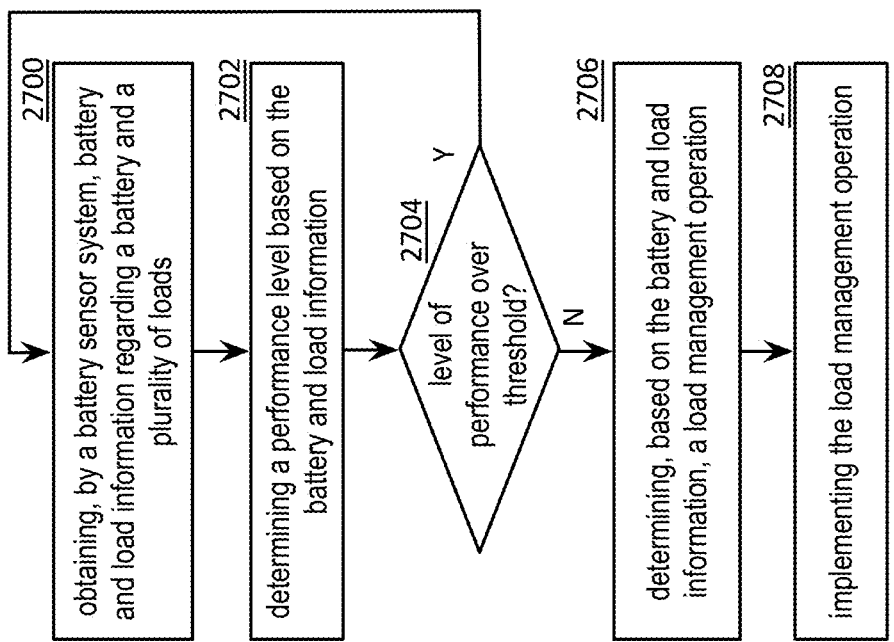
Figure 28A:
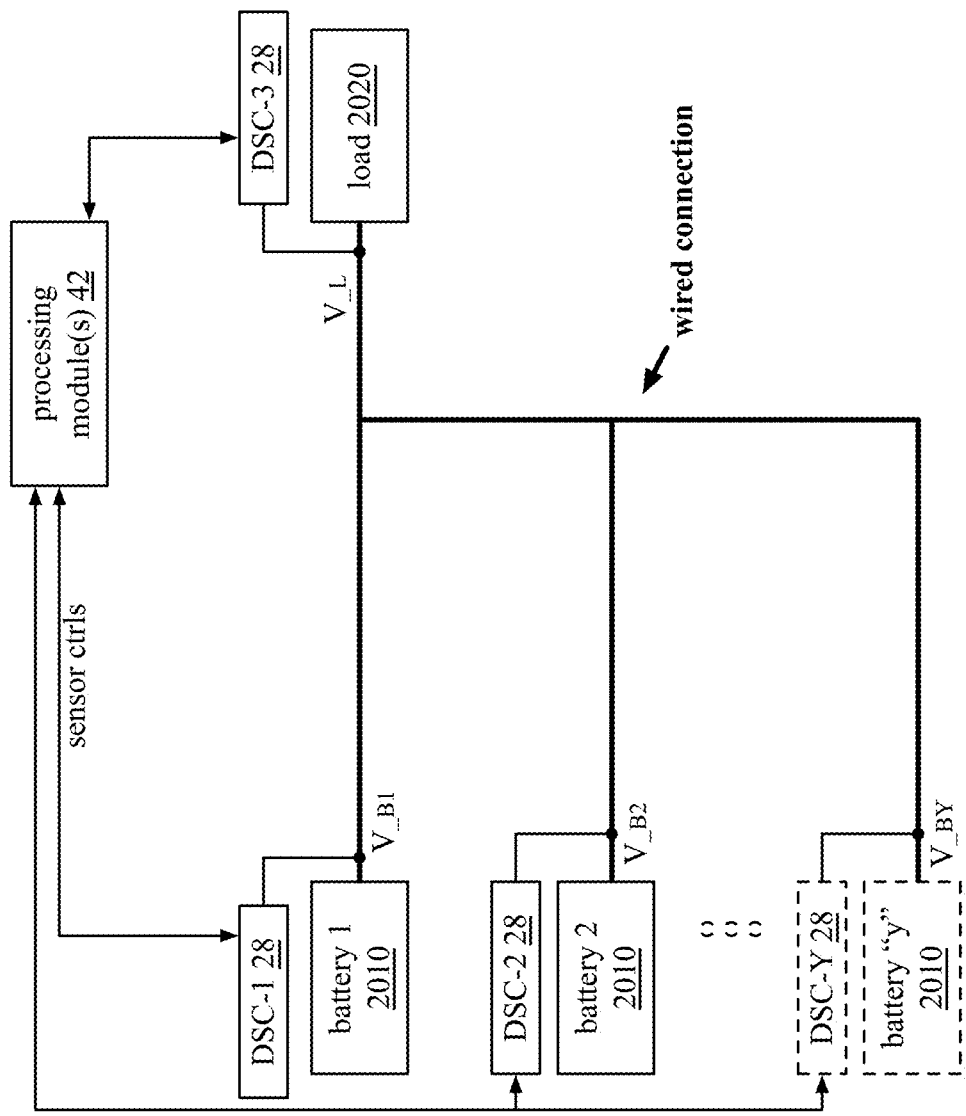
Figure 28B:
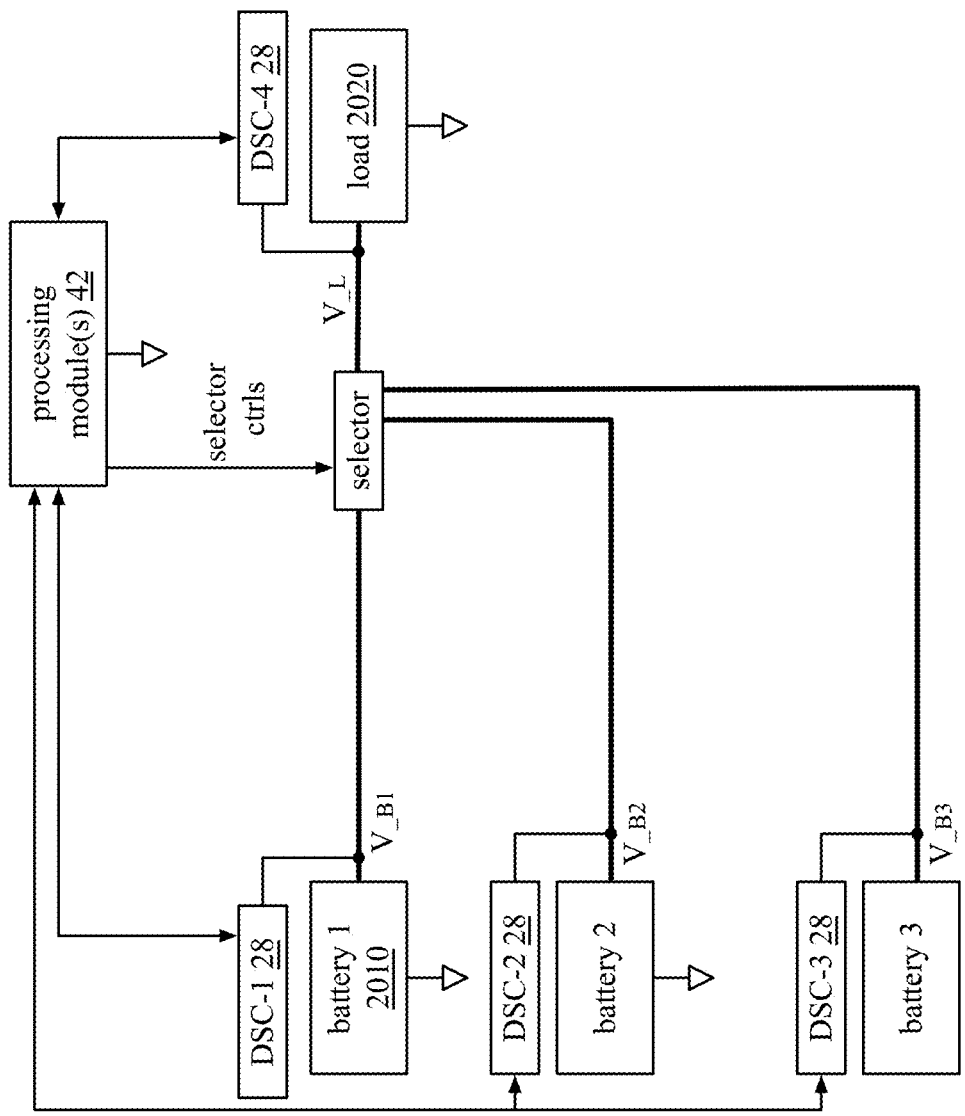
Figure 28C:
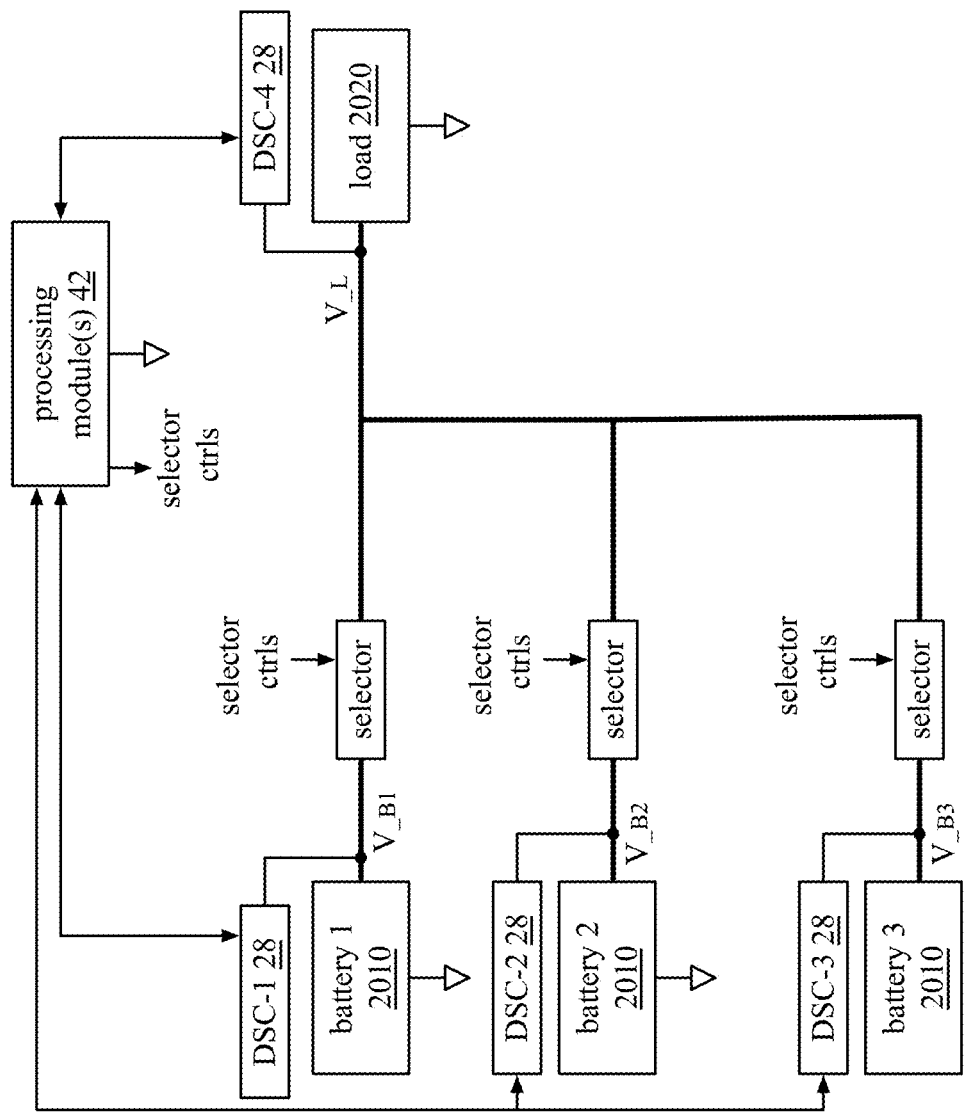
Figure 28D:
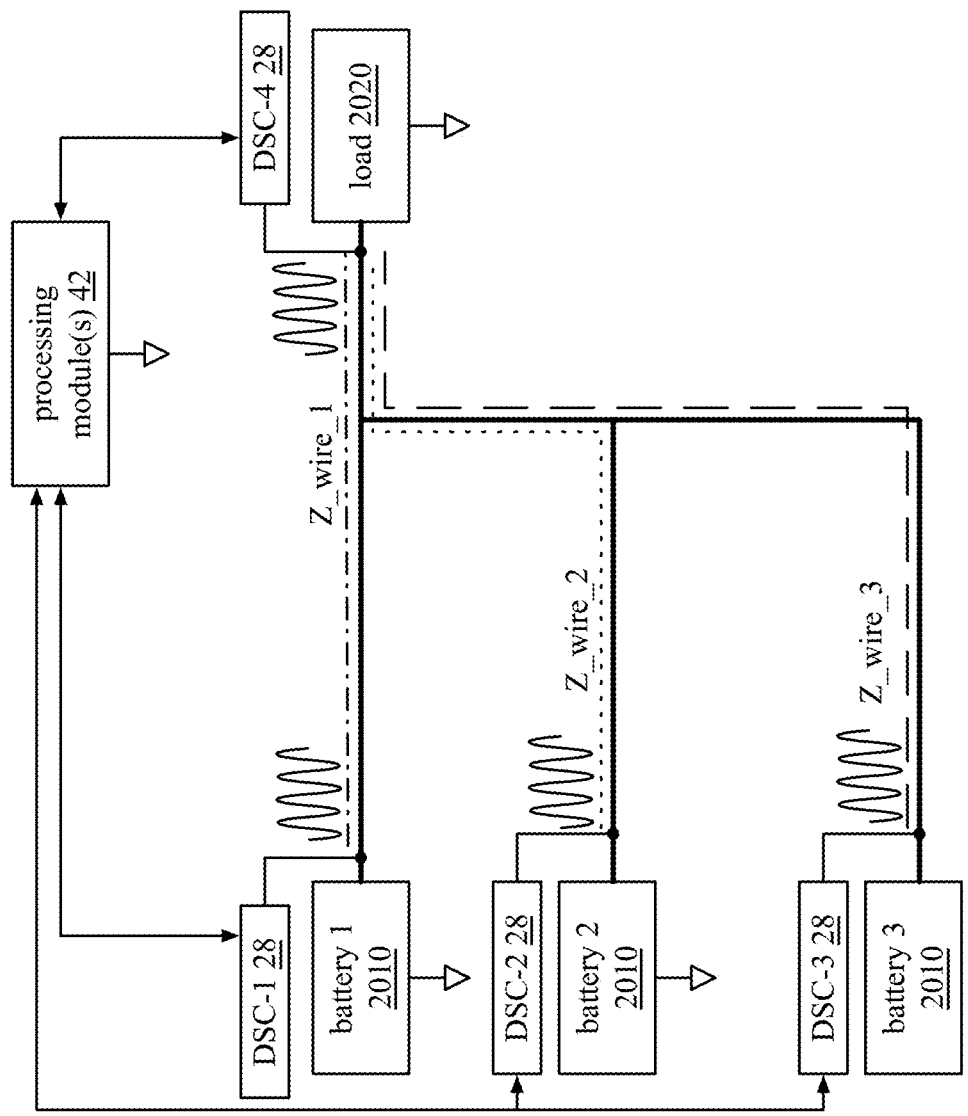
Figure 28E:
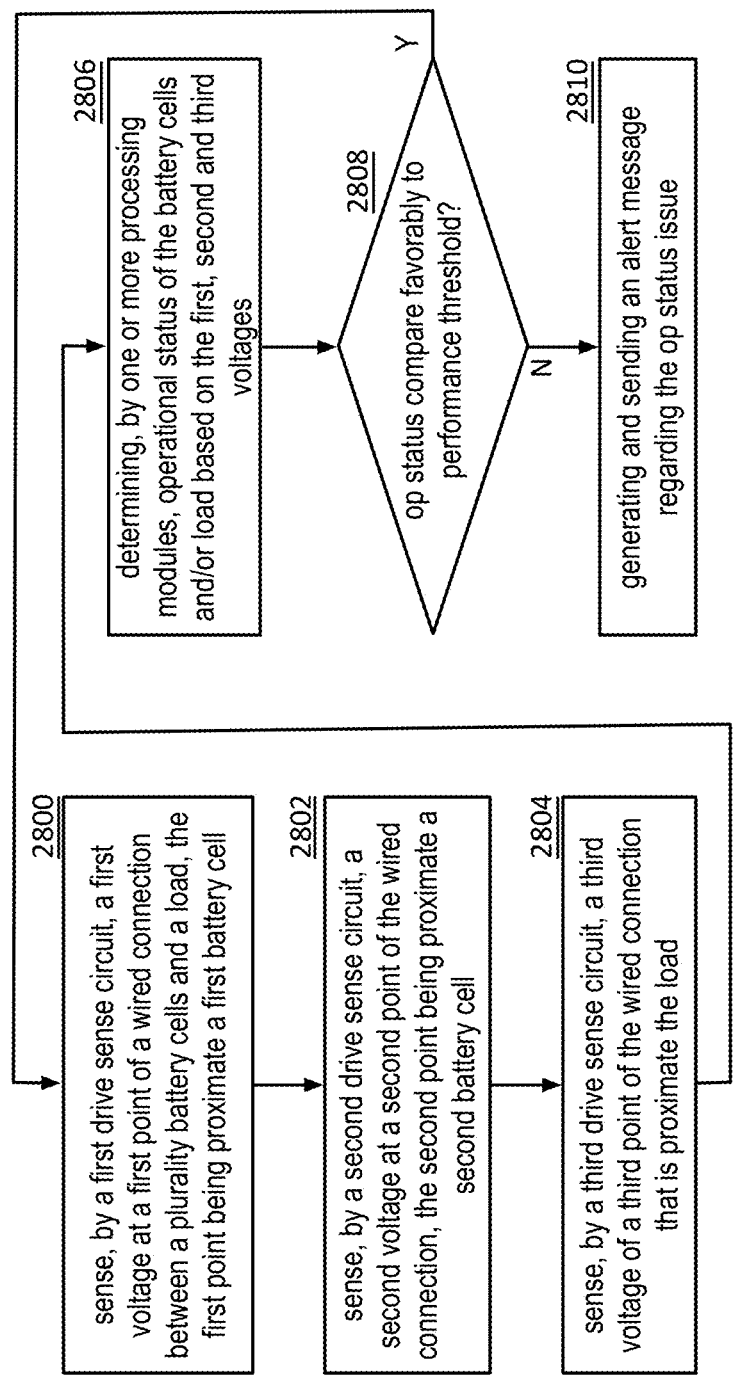
Figure 29A:
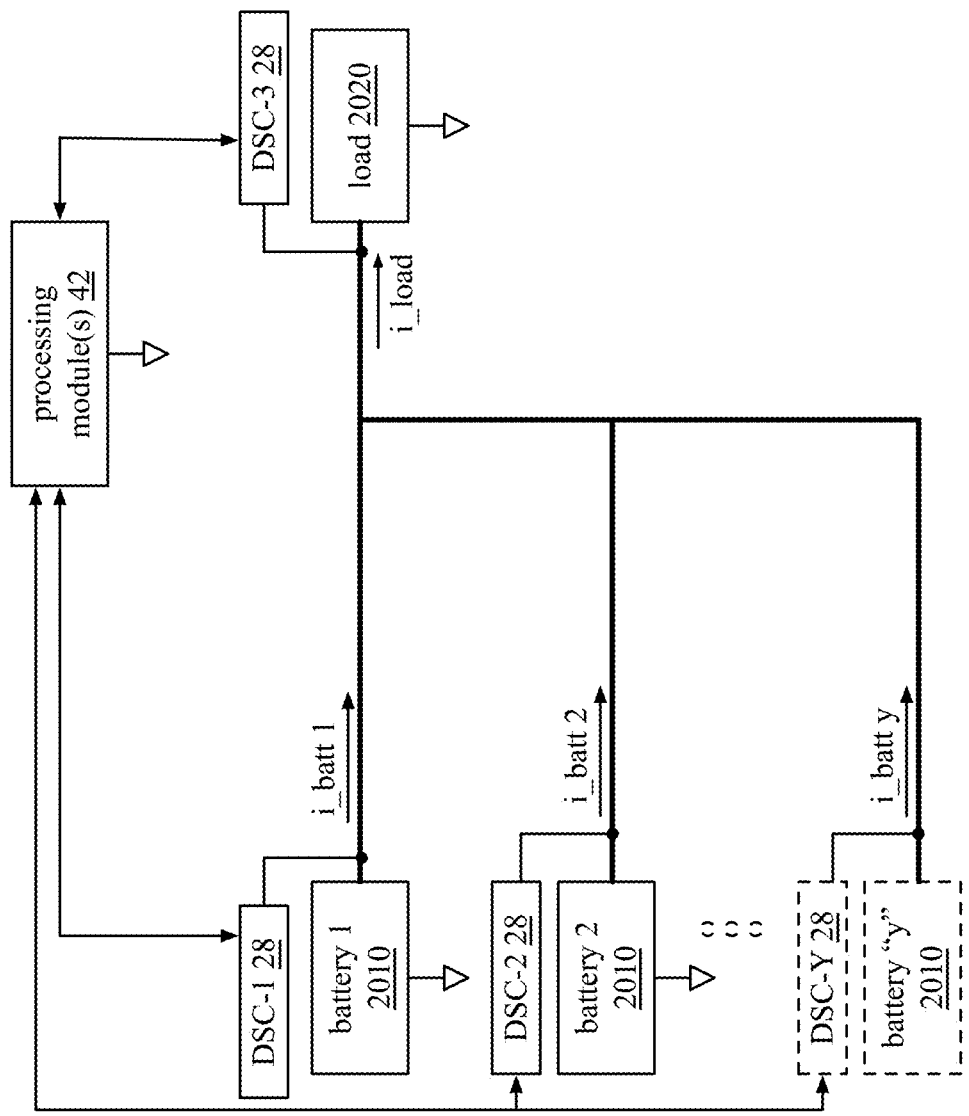
Figure 29C:
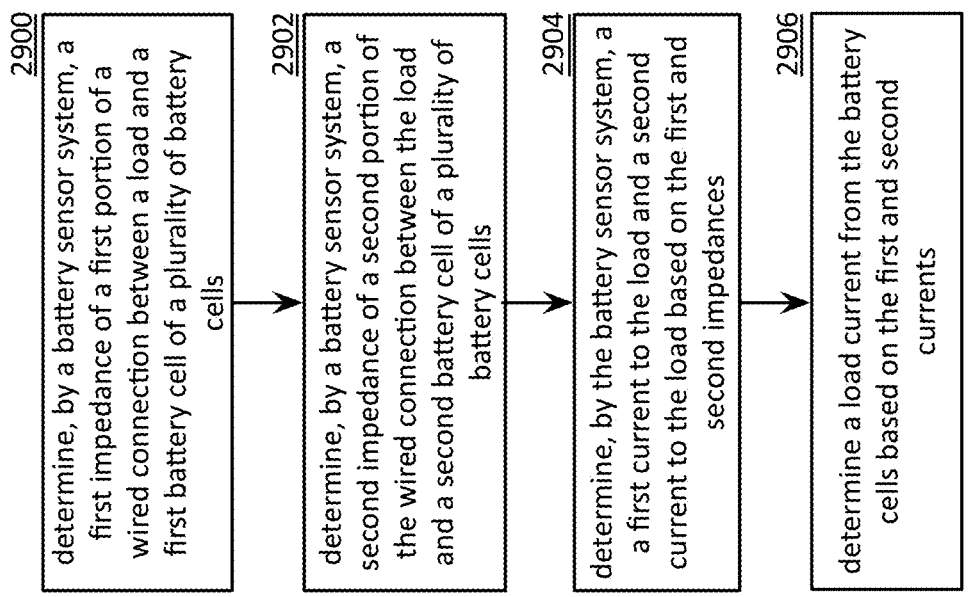
Figure 30A:
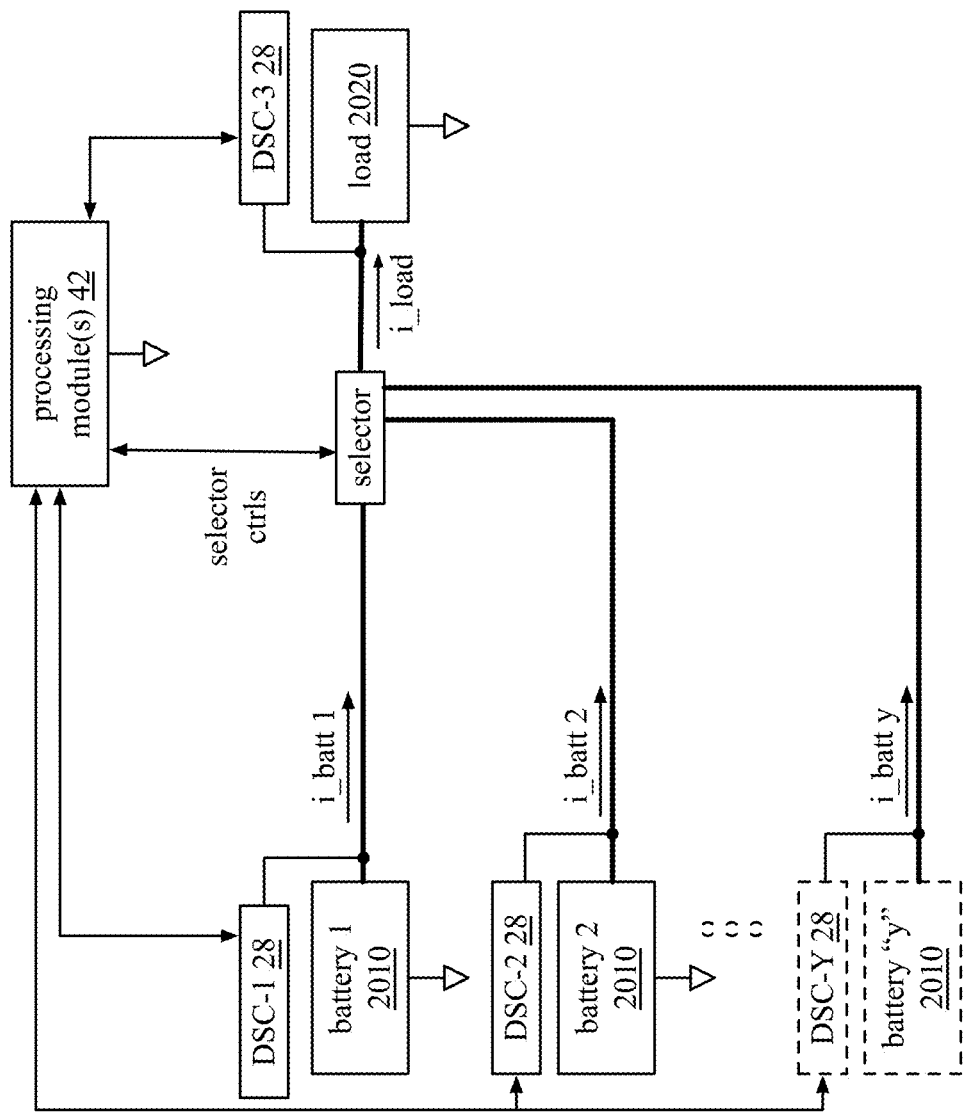
Figure 30B:
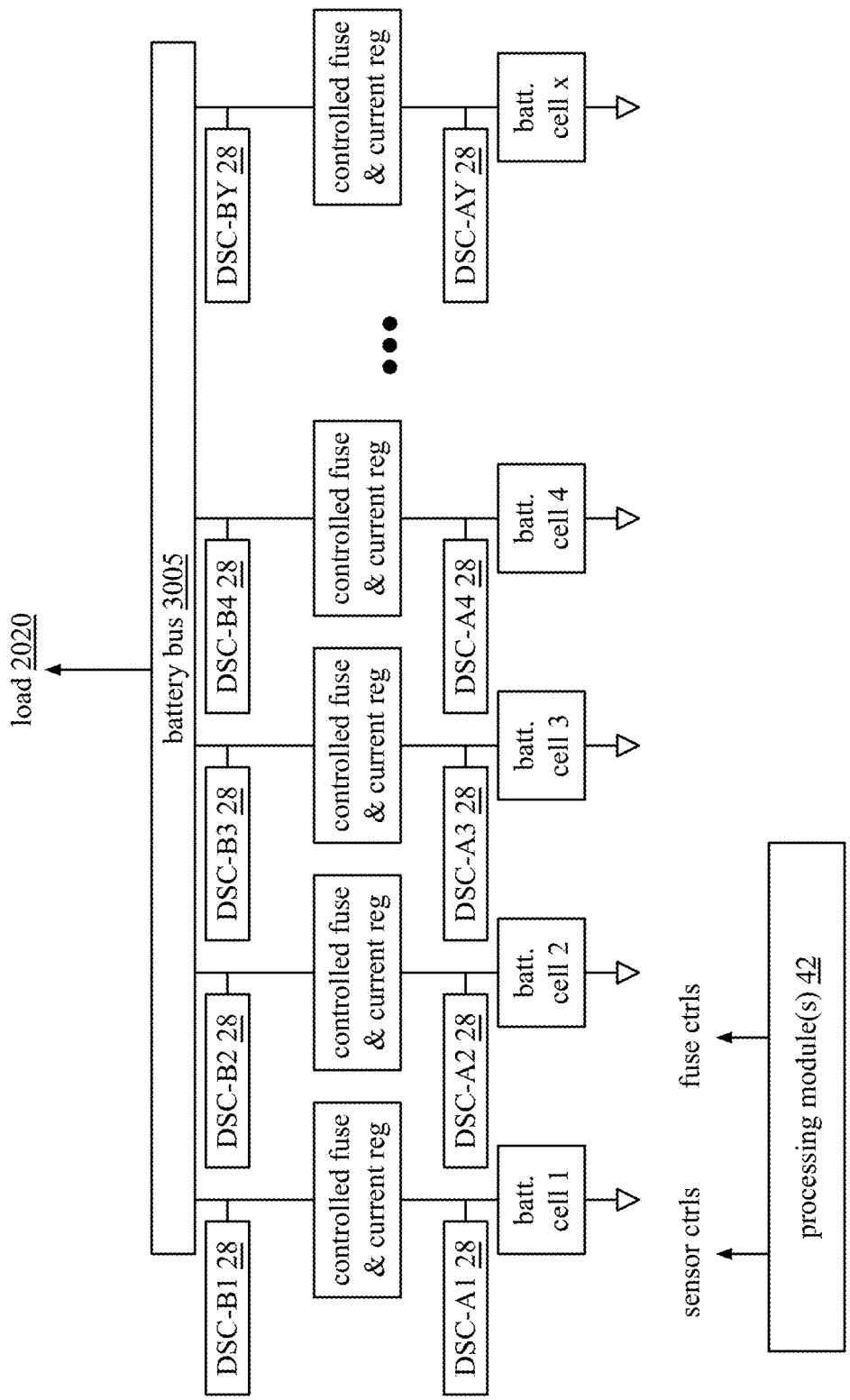
Figure 30D:
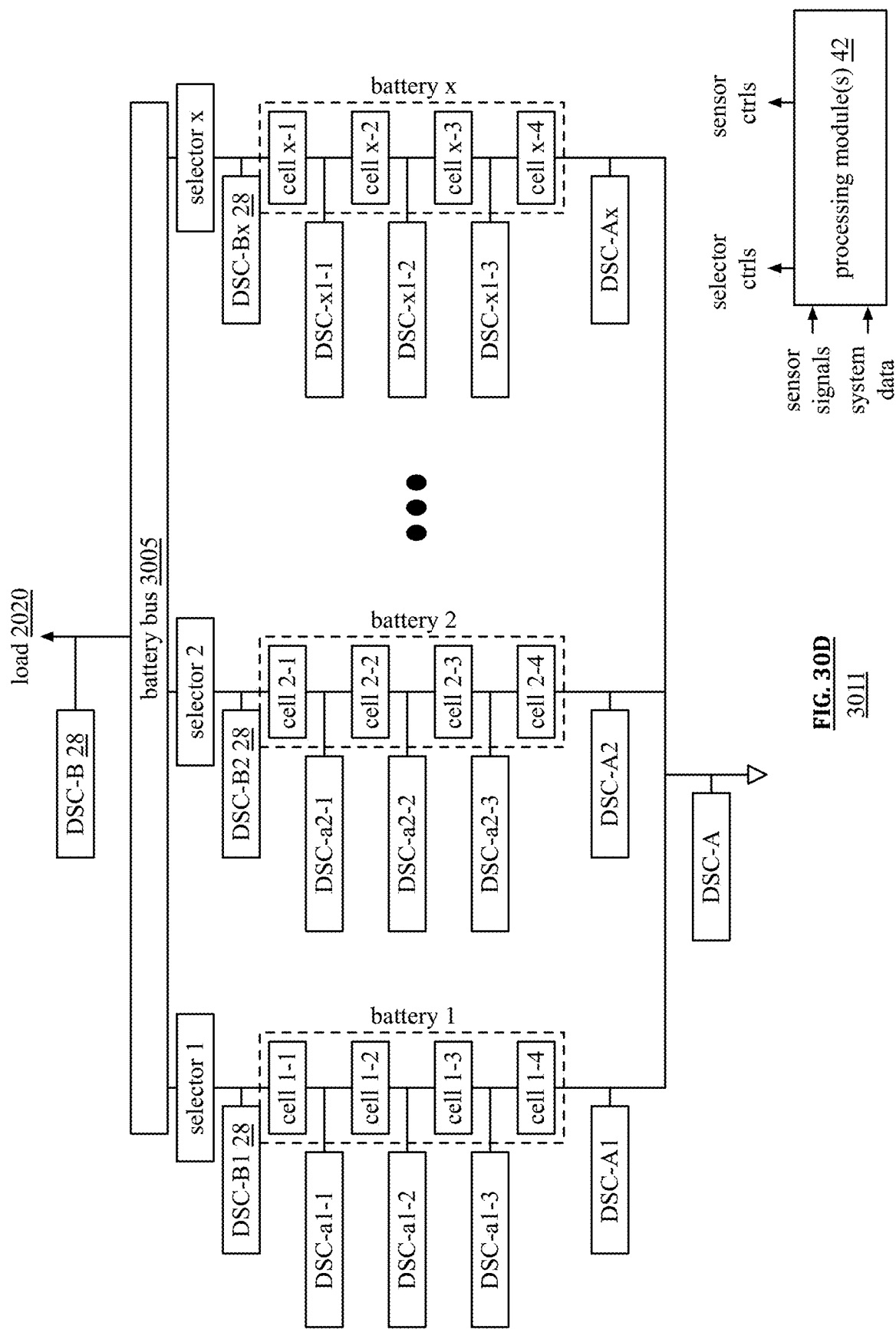
Figure 30E:
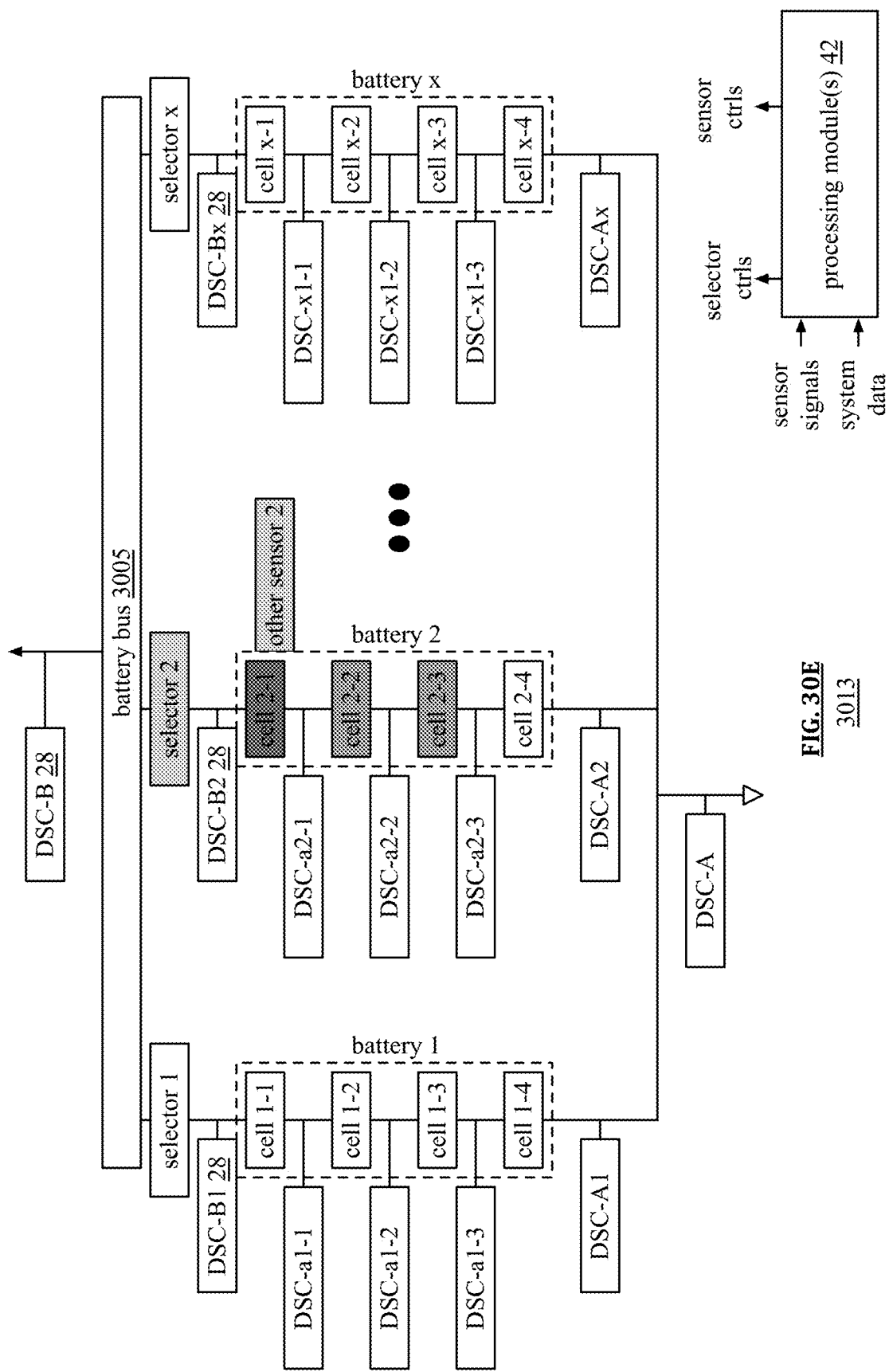
Figure 30F:
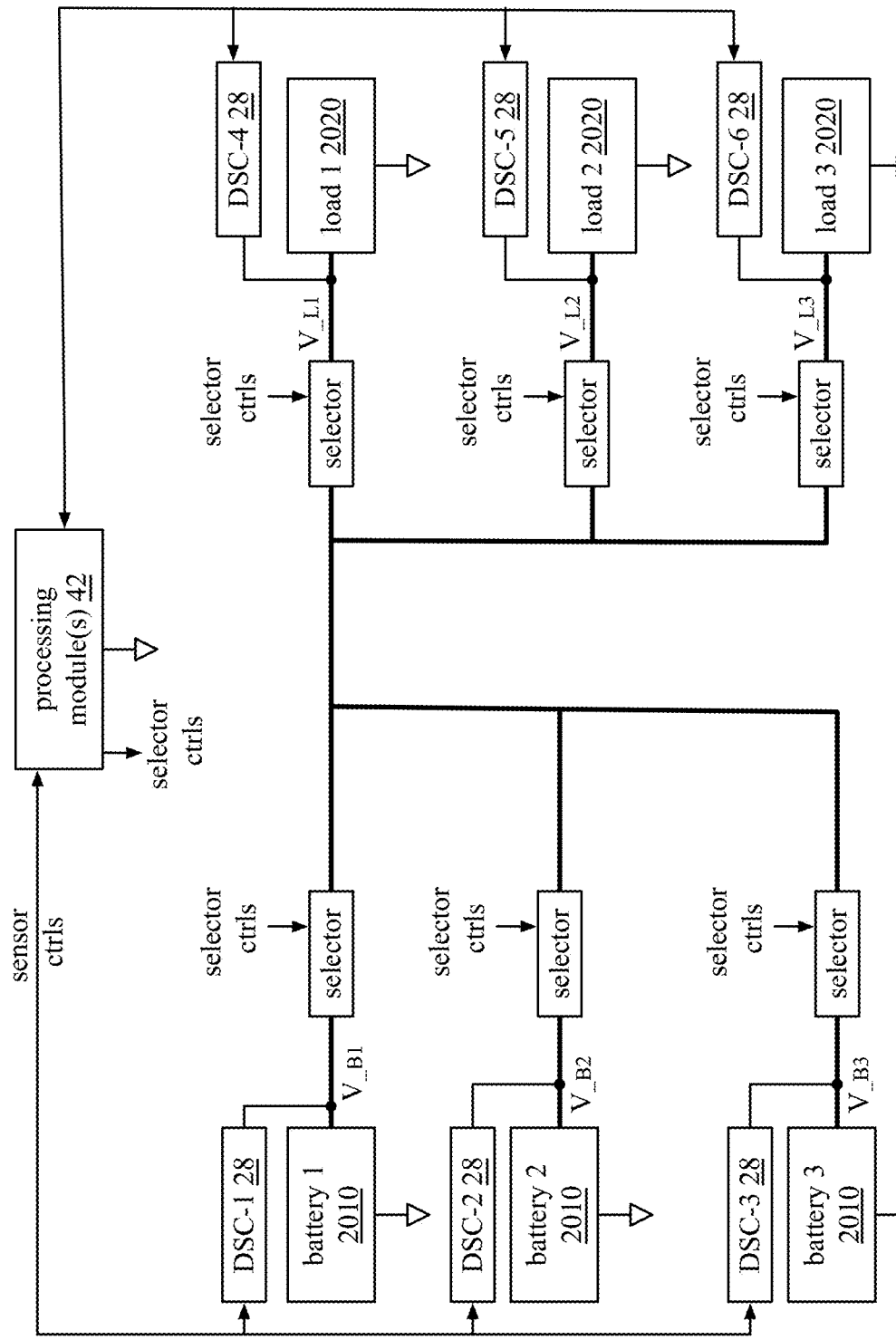
Figure 30G:
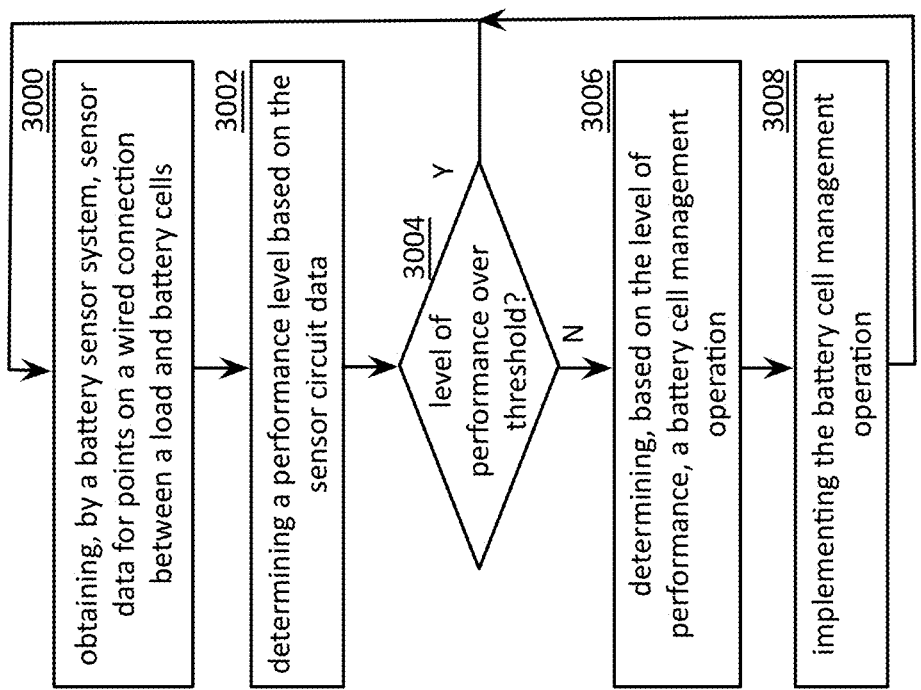

FIGS. 21D, 21E, 21F, and 21G are schematic block diagrams showing various embodiments of feedback circuits that may be implemented within a DSC in accordance with the present disclosure;

FIG. 21H is a schematic block diagram of an embodiment of a method for execution by one or more devices in accordance with the present disclosure;

FIG. 22A is a schematic block diagram showing an embodiment of a battery that is connected or coupled to a load and a DSC that is implemented to detect voltage without a high impedance (Z) reference load in accordance with the present disclosure;

FIGS. 22B and 22C are schematic block diagrams showing other embodiments of a battery that is connected or coupled to a load and a DSC that is implemented to detect voltage without a high impedance (Z) reference load in accordance with the present disclosure;

FIG. 22D is a schematic block diagram of an embodiment of a method for execution by one or more devices in accordance with the present disclosure;

FIG. 23A is a schematic block diagram showing an embodiment of a battery that is connected or coupled to a load and multiple DSCs that are implemented to detect voltages in conjunction with high impedance (Z) reference loads in accordance with the present disclosure;

FIGS. 23B, 23C, and 23D are schematic block diagrams showing other embodiments of a battery that is connected or coupled to a load and multiple DSCs that are implemented to detect voltages in conjunction with high impedance (Z) reference loads in accordance with the present disclosure;

FIG. 23E is a schematic block diagram showing an embodiment of a battery that is connected or coupled to a load and a DSC that is implemented to detect voltage without a high impedance (Z) reference load in accordance with the present disclosure;

FIGS. 23F and 23G are schematic block diagrams showing other embodiments of a battery that is connected or coupled to a load and multiple DSCs that are implemented to detect voltages without high impedance (Z) reference loads in accordance with the present disclosure;

FIG. 23H is a schematic block diagram showing an embodiment of operations as may be used to perform impedance (Z) characterization in accordance with the present invention;

FIG. 23I is a schematic block diagram showing an embodiment of a circuit configured to provide a reference signal having a desired frequency to a DSC in accordance with the present invention;

FIG. 23J is a schematic block diagram showing an embodiment of operations as may be used to perform impedance (Z) characterization across a number of different frequencies in accordance with the present invention;

FIGS. 23K and 23L are schematic block diagrams showing embodiments of impedance (Z) profiles across a number of different frequencies in accordance with the present invention;

FIGS. 23M and 23N are schematic block diagrams of embodiments of methods for execution by one or more devices in accordance with the present disclosure;

FIG. 24A is a schematic block diagram showing an embodiment of a battery that is connected or coupled to a load and multiple DSCs that are implemented to detect voltages in conjunction with a common reference load impedance (Z) in accordance with the present disclosure;

FIG. 24B is a schematic block diagram showing another embodiment of a battery that is connected or coupled to a load and multiple DSCs that are implemented to detect voltages in conjunction with a common reference load impedance (Z) in accordance with the present disclosure;

FIG. 24C includes schematic block diagrams showing various embodiments of common reference load impedances (Zs) that may be implemented in conjunction within multiple DSCs in accordance with the present disclosure;

FIG. 24D is a schematic block diagram of an embodiment of various examples of impedance (Zs) such as may be implemented within a configurable impedance (Z) circuit in accordance with the present disclosure;

FIG. 24E is a schematic block diagram of an embodiment of a method for execution by one or more devices in accordance with the present disclosure;

FIG. 25A is a schematic block diagram of an embodiment of a battery sensor system;

FIG. 25B is a schematic block diagram of another embodiment of a battery sensor system;

FIG. 25C is a schematic block diagram of another embodiment of a battery sensor system;

FIG. 25D is a schematic block diagram of an embodiment of a minus direct current (DC) selector circuit;

FIG. 25E is a flowchart illustrating an example of a method of determining operational status of a battery sensor system;

FIG. 26A is a schematic block diagram of another embodiment of a battery sensor system;

FIG. 26B is a schematic block diagram of another embodiment of a battery sensor system;

FIG. 26C is a schematic block diagram of another embodiment of a battery sensor system;

FIG. 26D is a flowchart illustrating an example of a method of determining currents on a wired connection of a battery sensor system;

FIG. 27A is a schematic block diagram of another embodiment of a battery sensor system;

FIG. 27B is a schematic block diagram of another embodiment of a battery sensor system;

FIG. 27C is a flowchart illustrating an example of a method of determining a load management operation;

FIG. 28A is a schematic block diagram of another embodiment of battery sensor system;

FIG. 28B is a schematic block diagram of another embodiment of a battery sensor system;

FIG. 28C is a schematic block diagram of another embodiment of a battery sensor system;

FIG. 28D is a schematic block diagram of another embodiment of a battery sensor system;

FIG. 28E is a flowchart illustrating an example of a method of determining operational status of a battery sensor system;

FIG. 29A is a schematic block diagram of another embodiment of a battery sensor system;

FIG. 29B is a schematic block diagram of another embodiment of a battery sensor system;

FIG. 29C is a flowchart illustrating an example of another method of determining currents on a wired connection of a battery sensor system;

FIG. 30A is a schematic block diagram of another embodiment of a battery sensor system;

FIG. 30B is a schematic block diagram of another embodiment of a battery sensor system;

FIG. 30C is a schematic block diagram of another embodiment of a battery sensor system;

FIG. 30D is a schematic block diagram of another embodiment of a battery sensor system;

FIG. 30E is a schematic block diagram of another embodiment of a battery sensor system;

FIG. 30F is a schematic block diagram of another embodiment of a battery sensor system; and FIG. 30G is a flowchart illustrating an example of a method of battery cell management utilizing a battery sensor system.

DETAILED DESCRIPTION OF THE INVENTION

Figure 1:
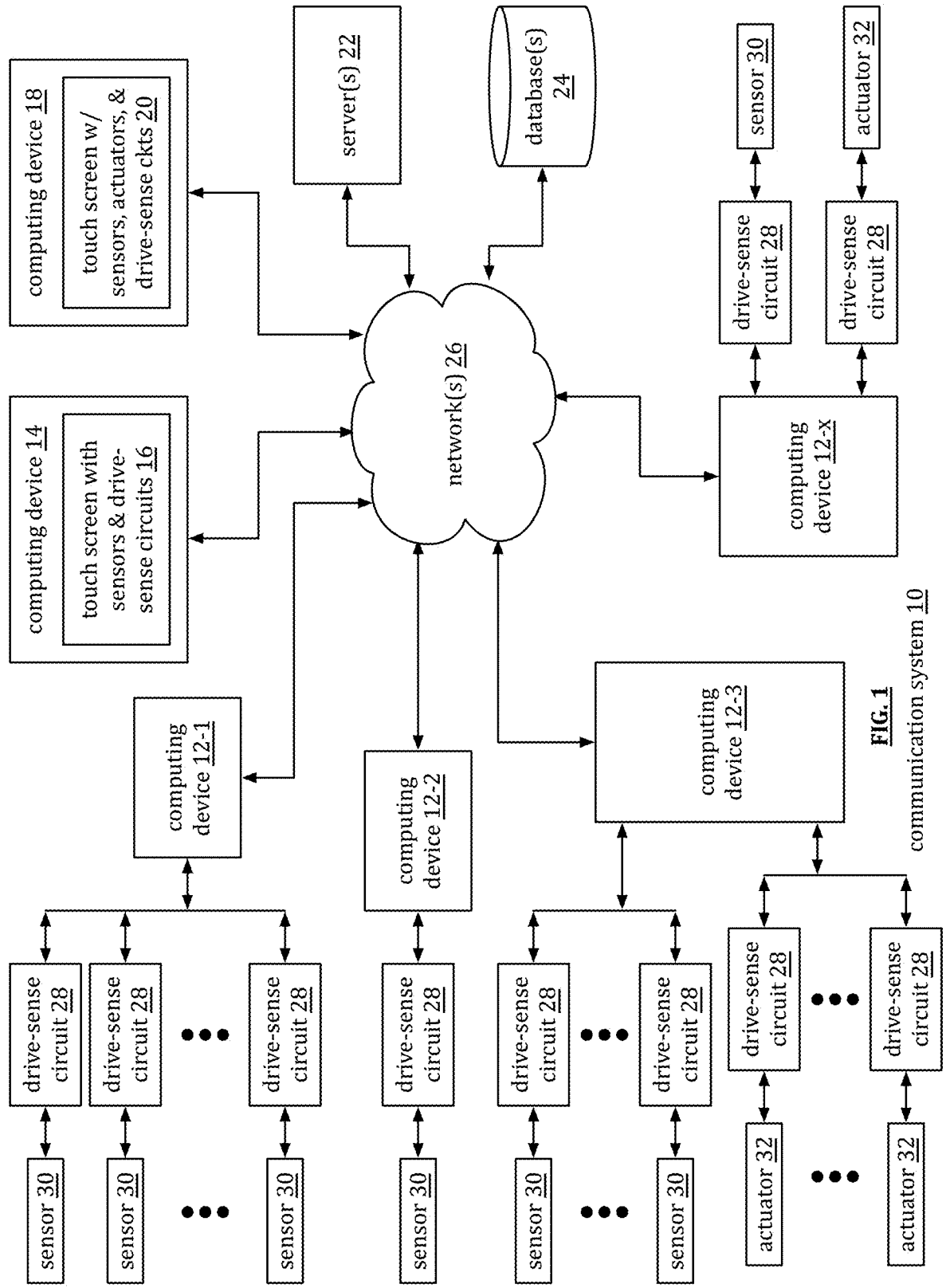
FIG. 1 is a schematic block diagram of an embodiment of a communication system in accordance with the present disclosure.

FIG. 1 is a schematic block diagram of an embodiment of a communication system 10 that includes a plurality of computing devices 12-10, one or more servers 22, one or more databases 24, one or more networks 26, a plurality of drive-sense circuits 28, a plurality of sensors 30, and a plurality of actuators 32. Computing devices 14 include a touchscreen 16 with sensors and drive-sense circuits and computing devices 18 include a touch & tactic screen 20 that includes sensors, actuators, and drive-sense circuits.

A sensor 30 functions to convert a physical input into an electrical output and/or an optical output. The physical input of a sensor may be one of a variety of physical input conditions. For example, the physical condition includes one or more of, but is not limited to, acoustic waves (e.g., amplitude, phase, polarization, spectrum, and/or wave velocity); a biological and/or chemical condition (e.g., fluid concentration, level, composition, etc.); an electric condition (e.g., charge, voltage, current, conductivity, permittivity, electric field, which includes amplitude, phase, and/or polarization); a magnetic condition (e.g., flux, permeability, magnetic field, which amplitude, phase, and/or polarization); an optical condition (e.g., refractive index, reflectivity, absorption, etc.); a thermal condition (e.g., temperature, flux, specific heat, thermal conductivity, etc.); and a mechanical condition (e.g., position, velocity, acceleration, force, strain, stress, pressure, torque, etc.). For example, piezoelectric sensor converts force or pressure into an electric signal. As another example, a microphone converts audible acoustic waves into electrical signals.

There are a variety of types of sensors to sense the various types of physical conditions. Sensor types include, but are not limited to, capacitor sensors, inductive sensors, accelerometers, piezoelectric sensors, light sensors, magnetic field sensors, ultrasonic sensors, temperature sensors, infrared (IR) sensors, touch sensors, proximity sensors, pressure sensors, level sensors, smoke sensors, and gas sensors. In many ways, sensors function as the interface between the physical world and the digital world by converting real world conditions into digital signals that are then processed by computing devices for a vast number of applications including, but not limited to, medical applications, production automation applications, home environment control, public safety, and so on.

The various types of sensors have a variety of sensor characteristics that are factors in providing power to the sensors, receiving signals from the sensors, and/or interpreting the signals from the sensors. The sensor characteristics include resistance, reactance, power requirements, sensitivity, range, stability, repeatability, linearity, error, response time, and/or frequency response. For example, the resistance, reactance, and/or power requirements are factors in determining drive circuit requirements. As another example, sensitivity, stability, and/or linear are factors for interpreting the measure of the physical condition based on the received electrical and/or optical signal (e.g., measure of temperature, pressure, etc.).

An actuator 32 converts an electrical input into a physical output. The physical output of an actuator may be one of a variety of physical output conditions. For example, the physical output condition includes one or more of, but is not limited to, acoustic waves (e.g., amplitude, phase, polarization, spectrum, and/or wave velocity); a magnetic condition (e.g., flux, permeability, magnetic field, which amplitude, phase, and/or polarization); a thermal condition (e.g., temperature, flux, specific heat, thermal conductivity, etc.); and a mechanical condition (e.g., position, velocity, acceleration, force, strain, stress, pressure, torque, etc.). As an example, a piezoelectric actuator converts voltage into force or pressure. As another example, a speaker converts electrical signals into audible acoustic waves.

An actuator 32 may be one of a variety of actuators. For example, an actuator 32 is one of a comb drive, a digital micro-mirror device, an electric motor, an electroactive polymer, a hydraulic cylinder, a piezoelectric actuator, a pneumatic actuator, a screw jack, a servomechanism, a solenoid, a stepper motor, a shape-memory allow, a thermal bimorph, and a hydraulic actuator.

The various types of actuators have a variety of actuators characteristics that are factors in providing power to the actuator and sending signals to the actuators for desired performance. The actuator characteristics include resistance, reactance, power requirements, sensitivity, range, stability, repeatability, linearity, error, response time, and/or frequency response. For example, the resistance, reactance, and power requirements are factors in determining drive circuit requirements. As another example, sensitivity, stability, and/or linear are factors for generating the signaling to send to the actuator to obtain the desired physical output condition.

The computing devices 12, 14, and 18 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. The computing devices 12, 14, and 18 will be discussed in greater detail with reference to one or more of FIGS. 2-4.

A server 22 is a special type of computing device that is optimized for processing large amounts of data requests in parallel. A server 22 includes similar components to that of the computing devices 12, 14, and/or 18 with more robust processing modules, more main memory, and/or more hard drive memory (e.g., solid state, hard drives, etc.). Further, a server 22 is typically accessed remotely; as such it does not generally include user input devices and/or user output devices. In addition, a server may be a standalone separate computing device and/or may be a cloud computing device.

A database 24 is a special type of computing device that is optimized for large scale data storage and retrieval. A database 24 includes similar components to that of the computing devices 12, 14, and/or 18 with more hard drive memory (e.g., solid state, hard drives, etc.) and potentially with more processing modules and/or main memory. Further, a database 24 is typically accessed remotely; as such it does not generally include user input devices and/or user output devices. In addition, a database 24 may be a standalone separate computing device and/or may be a cloud computing device.

The network 26 includes one more local area networks (LAN) and/or one or more wide area networks WAN), which may be a public network and/or a private network. A LAN may be a wireless-LAN (e.g., Wi-Fi access point, Bluetooth, ZigBee, etc.) and/or a wired network (e.g., Firewire, Ethernet, etc.). A WAN may be a wired and/or wireless WAN. For example, a LAN may be a personal home or business's wireless network and a WAN is the Internet, cellular telephone infrastructure, and/or satellite communication infrastructure.

In an example of operation, computing device 12-1 communicates with a plurality of drive-sense circuits 28, which, in turn, communicate with a plurality of sensors 30. The sensors 30 and/or the drive-sense circuits 28 are within the computing device 12-1 and/or external to it. For example, the sensors 30 may be external to the computing device 12-1 and the drive-sense circuits are within the computing device 12-1. As another example, both the sensors 30 and the drive-sense circuits 28 are external to the computing device 12-1. When the drive-sense circuits 28 are external to the computing device, they are coupled to the computing device 12-1 via wired and/or wireless communication links as will be discussed in greater detail with reference to one or more of FIGS. 5A-5C.

The computing device 12-1 communicates with the drive-sense circuits 28 to; (a) turn them on, (b) obtain data from the sensors (individually and/or collectively), (c) instruct the drive sense circuit on how to communicate the sensed data to the computing device 12-1, (d) provide signaling attributes (e.g., DC level, AC level, frequency, power level, regulated current signal, regulated voltage signal, regulation of an impedance, frequency patterns for various sensors, different frequencies for different sensing applications, etc.) to use with the sensors, and/or (e) provide other commands and/or instructions.

As a specific example, the sensors 30 are distributed along a pipeline to measure flow rate and/or pressure within a section of the pipeline. The drive-sense circuits 28 have their own power source (e.g., battery, power supply, etc.) and are proximally located to their respective sensors 30. At desired time intervals (milliseconds, seconds, minutes, hours, etc.), the drive-sense circuits 28 provide a regulated source signal or a power signal to the sensors 30. An electrical characteristic of the sensor 30 affects the regulated source signal or power signal, which is reflective of the condition (e.g., the flow rate and/or the pressure) that sensor is sensing.

The drive-sense circuits 28 detect the effects on the regulated source signal or power signals as a result of the electrical characteristics of the sensors. The drive-sense circuits 28 then generate signals representative of change to the regulated source signal or power signal based on the detected effects on the power signals. The changes to the regulated source signals or power signals are representative of the conditions being sensed by the sensors 30.

The drive-sense circuits 28 provide the representative signals of the conditions to the computing device 12-1. A representative signal may be an analog signal or a digital signal. In either case, the computing device 12-1 interprets the representative signals to determine the pressure and/or flow rate at each sensor location along the pipeline. The computing device may then provide this information to the server 22, the database 24, and/or to another computing device for storing and/or further processing.

As another example of operation, computing device 12-2 is coupled to a drive-sense circuit 28, which is, in turn, coupled to a senor 30. The sensor 30 and/or the drive-sense circuit 28 may be internal and/or external to the computing device 12-2. In this example, the sensor 30 is sensing a condition that is particular to the computing device 12-2. For example, the sensor 30 may be a temperature sensor, an ambient light sensor, an ambient noise sensor, etc. As described above, when instructed by the computing device 12-2 (which may be a default setting for continuous sensing or at regular intervals), the drive-sense circuit 28 provides the regulated source signal or power signal to the sensor 30 and detects an effect to the regulated source signal or power signal based on an electrical characteristic of the sensor. The drive-sense circuit generates a representative signal of the affect and sends it to the computing device 12-2.

In another example of operation, computing device 12-3 is coupled to a plurality of drive-sense circuits 28 that are coupled to a plurality of sensors 30 and is coupled to a plurality of drive-sense circuits 28 that are coupled to a plurality of actuators 32. The generally functionality of the drive-sense circuits 28 coupled to the sensors 30 in accordance with the above description.

Since an actuator 32 is essentially an inverse of a sensor in that an actuator converts an electrical signal into a physical condition, while a sensor converts a physical condition into an electrical signal, the drive-sense circuits 28 can be used to power actuators 32. Thus, in this example, the computing device 12-3 provides actuation signals to the drive-sense circuits 28 for the actuators 32. The drive-sense circuits modulate the actuation signals on to power signals or regulated control signals, which are provided to the actuators 32. The actuators 32 are powered from the power signals or regulated control signals and produce the desired physical condition from the modulated actuation signals.

As another example of operation, computing device 12-x is coupled to a drive-sense circuit 28 that is coupled to a sensor 30 and is coupled to a drive-sense circuit 28 that is coupled to an actuator 32. In this example, the sensor 30 and the actuator 32 are for use by the computing device 12-x. For example, the sensor 30 may be a piezoelectric microphone and the actuator 32 may be a piezoelectric speaker.

Figure 2:
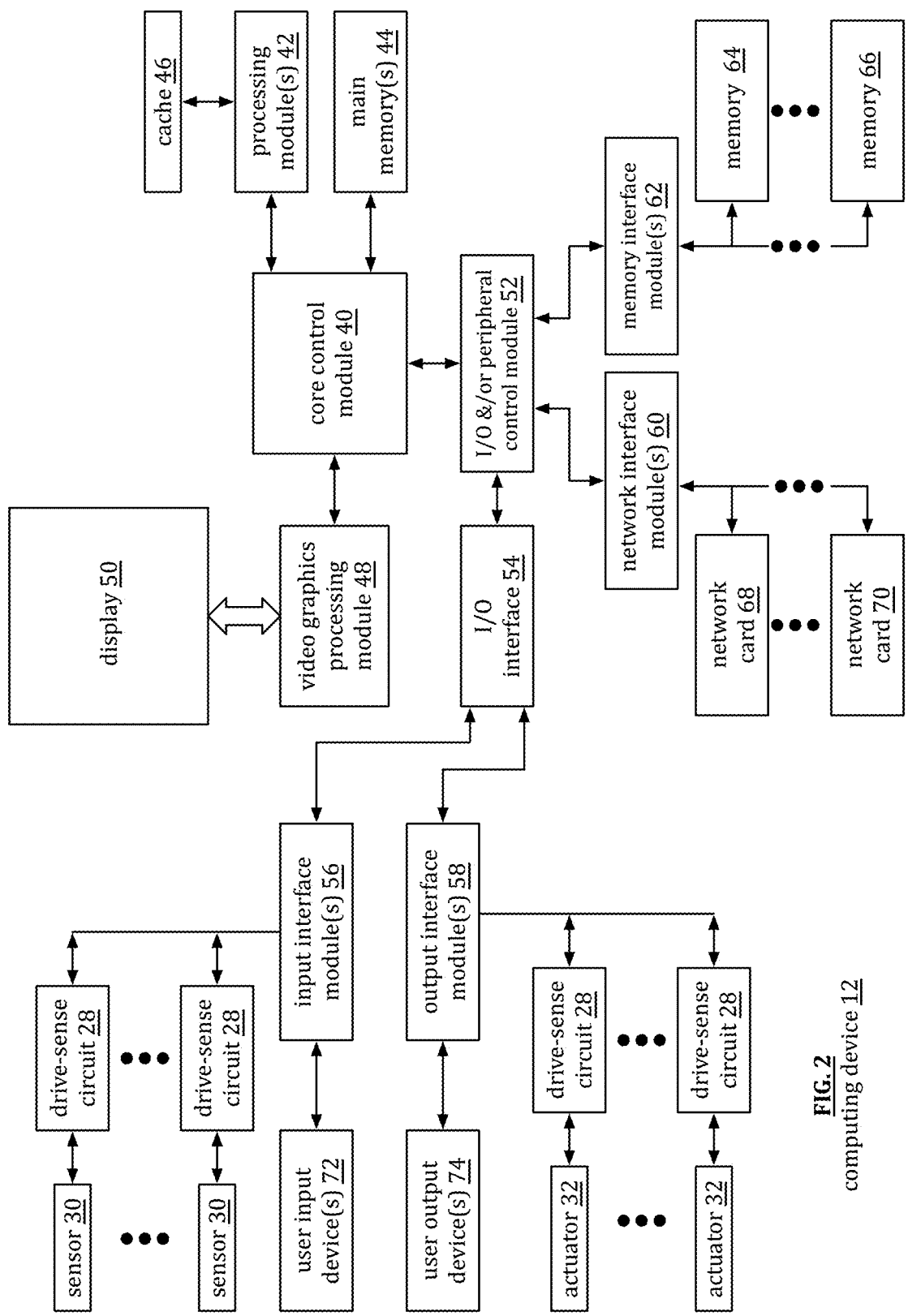
FIG. 2 is a schematic block diagram of an embodiment of a computing device in accordance with the present disclosure.

FIG. 2 is a schematic block diagram of an embodiment of a computing device 12 (e.g., any one of 12-1 through 12-x). The computing device 12 includes a core control module 40, one or more processing modules 42, one or more main memories 44, cache memory 46, a video graphics processing module 48, a display 50, an Input-Output (I/O) peripheral control module 52, one or more input interface modules 56, one or more output interface modules 58, one or more network interface modules 60, and one or more memory interface modules 62. A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 (4$^{th}$ generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and the network(s) 26 via the I/O and/or peripheral control module 52, the network interface module(s) 60, and a network card 68 or 70. A network card 68 or 70 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and input device(s) 72 via the input interface module(s) 56 and the I/O and/or peripheral control module 52. An input device 72 includes a keypad, a keyboard, control switches, a touchpad, a microphone, a camera, etc. An input interface module 56 includes a software driver and a hardware connector for coupling an input device to the I/O and/or peripheral control module 52. In an embodiment, an input interface module 56 is in accordance with one or more Universal Serial Bus (USB) protocols.

The core control module 40 coordinates data communications between the processing module(s) 42 and output device(s) 74 via the output interface module(s) 58 and the I/O and/or peripheral control module 52. An output device 74 includes a speaker, etc. An output interface module 58 includes a software driver and a hardware connector for coupling an output device to the I/O and/or peripheral control module 52. In an embodiment, an output interface module 56 is in accordance with one or more audio codec protocols.

The processing module 42 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50.

FIG. 2 further illustrates sensors 30 and actuators 32 coupled to drive-sense circuits 28, which are coupled to the input interface module 56 (e.g., USB port). Alternatively, one or more of the drive-sense circuits 28 is coupled to the computing device via a wireless network card (e.g., WLAN) or a wired network card (e.g., Gigabit LAN). While not shown, the computing device 12 further includes a BIOS (Basic Input Output System) memory coupled to the core control module 40.

Figure 3:
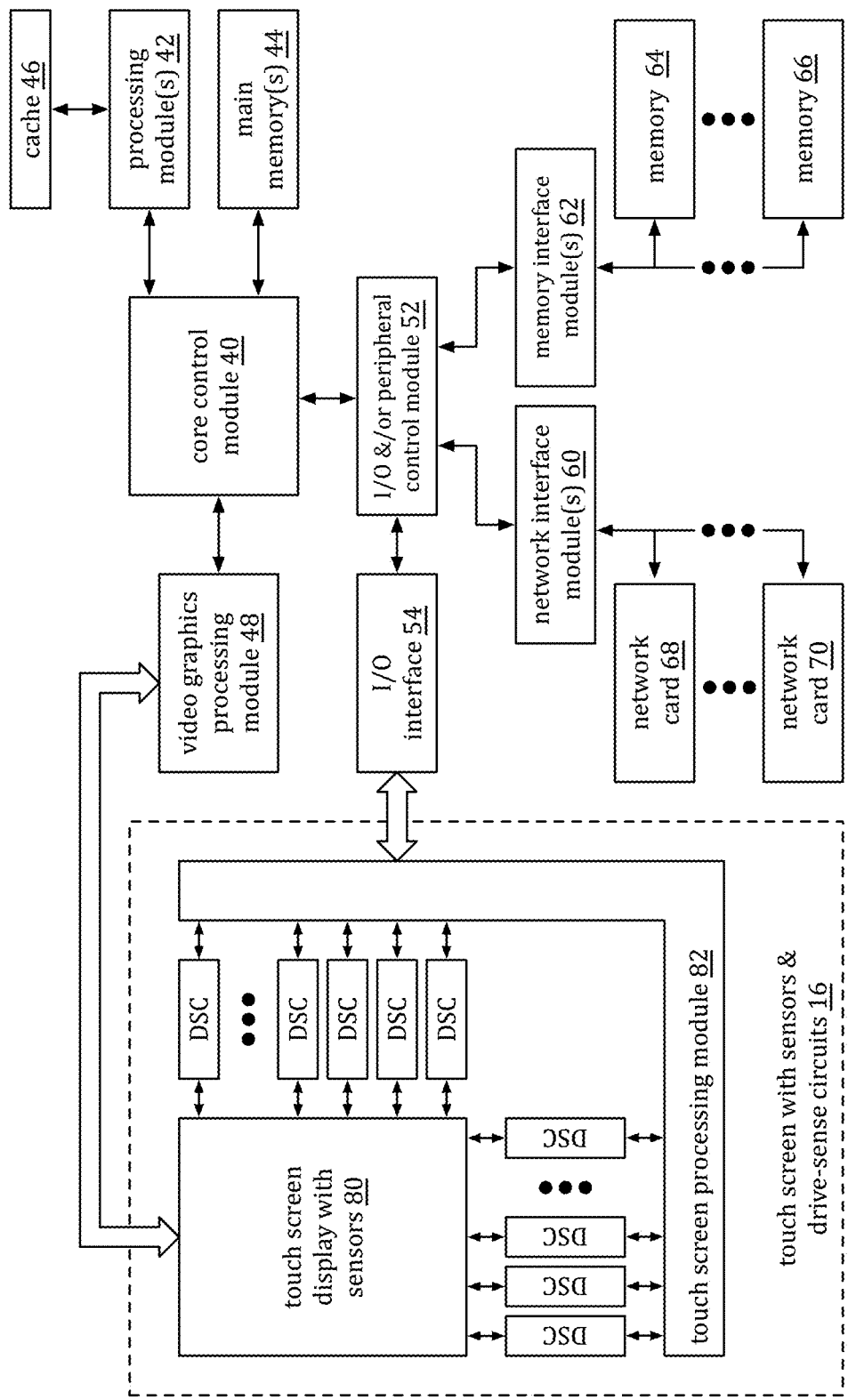
FIG. 3 is a schematic block diagram of another embodiment of a computing device in accordance with the present disclosure.

FIG. 3 is a schematic block diagram of another embodiment of a computing device 14 that includes a core control module 40, one or more processing modules 42, one or more main memories 44, cache memory 46, a video graphics processing module 48, a touchscreen 16, an Input-Output (I/O) peripheral control module 52, one or more input interface modules 56, one or more output interface modules 58, one or more network interface modules 60, and one or more memory interface modules 62. The touchscreen 16 includes a touchscreen display 80, a plurality of sensors 30, a plurality of drive-sense circuits (DSC), and a touchscreen processing module 82.

Computing device 14 operates similarly to computing device 12 of FIG. 2 with the addition of a touchscreen as an input device. The touchscreen includes a plurality of sensors (e.g., electrodes, capacitor sensing cells, capacitor sensors, inductive sensor, etc.) to detect a proximal touch of the screen. For example, when one or more fingers touches the screen, capacitance of sensors proximal to the touch(es) are affected (e.g., impedance changes). The drive-sense circuits (DSC) coupled to the affected sensors detect the change and provide a representation of the change to the touchscreen processing module 82, which may be a separate processing module or integrated into the processing module 42.

The touchscreen processing module 82 processes the representative signals from the drive-sense circuits (DSC) to determine the location of the touch(es). This information is inputted to the processing module 42 for processing as an input. For example, a touch represents a selection of a button on screen, a scroll function, a zoom in-out function, etc.

Figure 4:
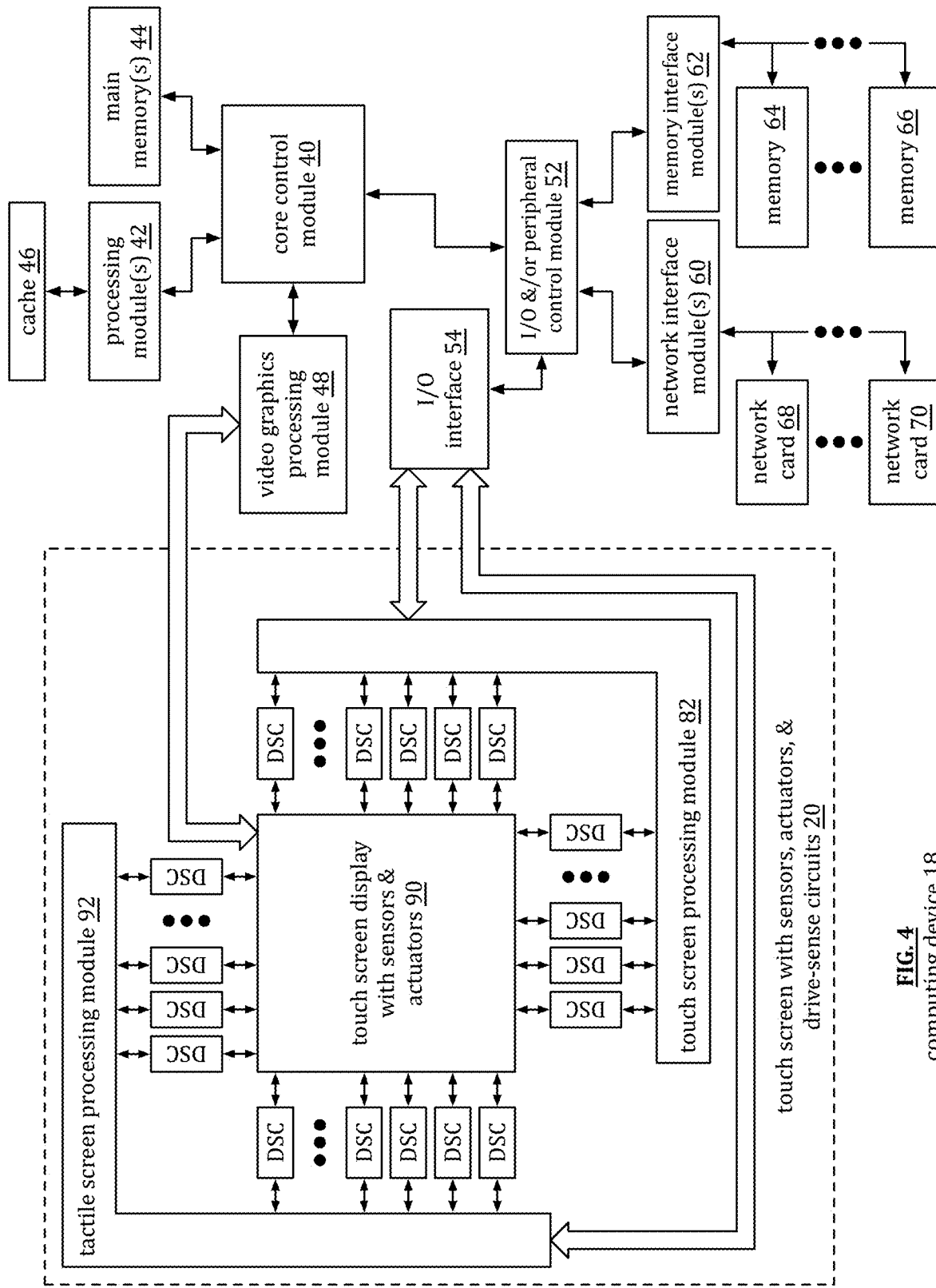
FIG. 4 is a schematic block diagram of another embodiment of a computing device in accordance with the present disclosure.

FIG. 4 is a schematic block diagram of another embodiment of a computing device 18 that includes a core control module 40, one or more processing modules 42, one or more main memories 44, cache memory 46, a video graphics processing module 48, a touch and tactile screen 20, an Input-Output (I/O) peripheral control module 52, one or more input interface modules 56, one or more output interface modules 58, one or more network interface modules 60, and one or more memory interface modules 62. The touch and tactile screen 20 includes a touch and tactile screen display 90, a plurality of sensors 30, a plurality of actuators 32, a plurality of drive-sense circuits (DSC), a touchscreen processing module 82, and a tactile screen processing module 92.

Computing device 18 operates similarly to computing device 14 of FIG. 3 with the addition of a tactile aspect to the screen 20 as an output device. The tactile portion of the screen 20 includes the plurality of actuators (e.g., piezoelectric transducers to create vibrations, solenoids to create movement, etc.) to provide a tactile feel to the screen 20. To do so, the processing module creates tactile data, which is provided to the appropriate drive-sense circuits (DSC) via the tactile screen processing module 92, which may be a stand-alone processing module or integrated into processing module 42. The drive-sense circuits (DSC) convert the tactile data into drive-actuate signals and provide them to the appropriate actuators to create the desired tactile feel on the screen 20.

FIG. 5A is a schematic plot diagram of a computing subsystem 25 that includes a sensed data processing module 65, a plurality of communication modules 61A-x, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one or more processing modules in one or more computing devices that are different than the computing devices in which processing modules 42A-x reside.

A drive-sense circuit 28 (or multiple drive-sense circuits), a processing module (e.g., 41A), and a communication module (e.g., 61A) are within a common computing device. Each grouping of a drive-sense circuit(s), processing module, and communication module is in a separate computing device. A communication module 61A-x is constructed in accordance with one or more wired communication protocol and/or one or more wireless communication protocols that is/are in accordance with the one or more of the Open System Interconnection (OSI) model, the Transmission Control Protocol/Internet Protocol (TCP/IP) model, and other communication protocol module.

In an example of operation, a processing module (e.g., 42A) provides a control signal to its corresponding drive-sense circuit 28. The processing module 42A may generate the control signal, receive it from the sensed data processing module 65, or receive an indication from the sensed data processing module 65 to generate the control signal. The control signal enables the drive-sense circuit 28 to provide a drive signal to its corresponding sensor. The control signal may further include a reference signal having one or more frequency components to facilitate creation of the drive signal and/or interpreting a sensed signal received from the sensor.

Based on the control signal, the drive-sense circuit 28 provides the drive signal to its corresponding sensor (e.g., 1) on a drive & sense line. While receiving the drive signal (e.g., a power signal, a regulated source signal, etc.), the sensor senses a physical condition 1-x (e.g., acoustic waves, a biological condition, a chemical condition, an electric condition, a magnetic condition, an optical condition, a thermal condition, and/or a mechanical condition). As a result of the physical condition, an electrical characteristic (e.g., impedance, voltage, current, capacitance, inductance, resistance, reactance, etc.) of the sensor changes, which affects the drive signal. Note that if the sensor is an optical sensor, it converts a sensed optical condition into an electrical characteristic.

The drive-sense circuit 28 detects the effect on the drive signal via the drive & sense line and processes the affect to produce a signal representative of power change, which may be an analog or digital signal. The processing module 42A receives the signal representative of power change, interprets it, and generates a value representing the sensed physical condition. For example, if the sensor is sensing pressure, the value representing the sensed physical condition is a measure of pressure (e.g., x PSI (pounds per square inch)).

In accordance with a sensed data process function (e.g., algorithm, application, etc.), the sensed data processing module 65 gathers the values representing the sensed physical conditions from the processing modules. Since the sensors 1-x may be the same type of sensor (e.g., a pressure sensor), may each be different sensors, or a combination thereof; the sensed physical conditions may be the same, may each be different, or a combination thereof. The sensed data processing module 65 processes the gathered values to produce one or more desired results. For example, if the computing subsystem 25 is monitoring pressure along a pipeline, the processing of the gathered values indicates that the pressures are all within normal limits or that one or more of the sensed pressures is not within normal limits.

As another example, if the computing subsystem 25 is used in a manufacturing facility, the sensors are sensing a variety of physical conditions, such as acoustic waves (e.g., for sound proofing, sound generation, ultrasound monitoring, etc.), a biological condition (e.g., a bacterial contamination, etc.) a chemical condition (e.g., composition, gas concentration, etc.), an electric condition (e.g., current levels, voltage levels, electro-magnetic interference, etc.), a magnetic condition (e.g., induced current, magnetic field strength, magnetic field orientation, etc.), an optical condition (e.g., ambient light, infrared, etc.), a thermal condition (e.g., temperature, etc.), and/or a mechanical condition (e.g., physical position, force, pressure, acceleration, etc.).

The computing subsystem 25 may further include one or more actuators in place of one or more of the sensors and/or in addition to the sensors. When the computing subsystem 25 includes an actuator, the corresponding processing module provides an actuation control signal to the corresponding drive-sense circuit 28. The actuation control signal enables the drive-sense circuit 28 to provide a drive signal to the actuator via a drive & actuate line (e.g., similar to the drive & sense line, but for the actuator). The drive signal includes one or more frequency components and/or amplitude components to facilitate a desired actuation of the actuator.

In addition, the computing subsystem 25 may include an actuator and sensor working in concert. For example, the sensor is sensing the physical condition of the actuator. In this example, a drive-sense circuit provides a drive signal to the actuator and another drive sense signal provides the same drive signal, or a scaled version of it, to the sensor. This allows the sensor to provide near immediate and continuous sensing of the actuator's physical condition. This further allows for the sensor to operate at a first frequency and the actuator to operate at a second frequency.

In an embodiment, the computing subsystem is a stand-alone system for a wide variety of applications (e.g., manufacturing, pipelines, testing, monitoring, security, etc.). In another embodiment, the computing subsystem 25 is one subsystem of a plurality of subsystems forming a larger system. For example, different subsystems are employed based on geographic location. As a specific example, the computing subsystem 25 is deployed in one section of a factory and another computing subsystem is deployed in another part of the factory. As another example, different subsystems are employed based function of the subsystems. As a specific example, one subsystem monitors a city's traffic light operation and another subsystem monitors the city's sewage treatment plants.

Regardless of the use and/or deployment of the computing system, the physical conditions it is sensing, and/or the physical conditions it is actuating, each sensor and each actuator (if included) is driven and sensed by a single line as opposed to separate drive and sense lines. This provides many advantages including, but not limited to, lower power requirements, better ability to drive high impedance sensors, lower line to line interference, and/or concurrent sensing functions.

Figure 5B:
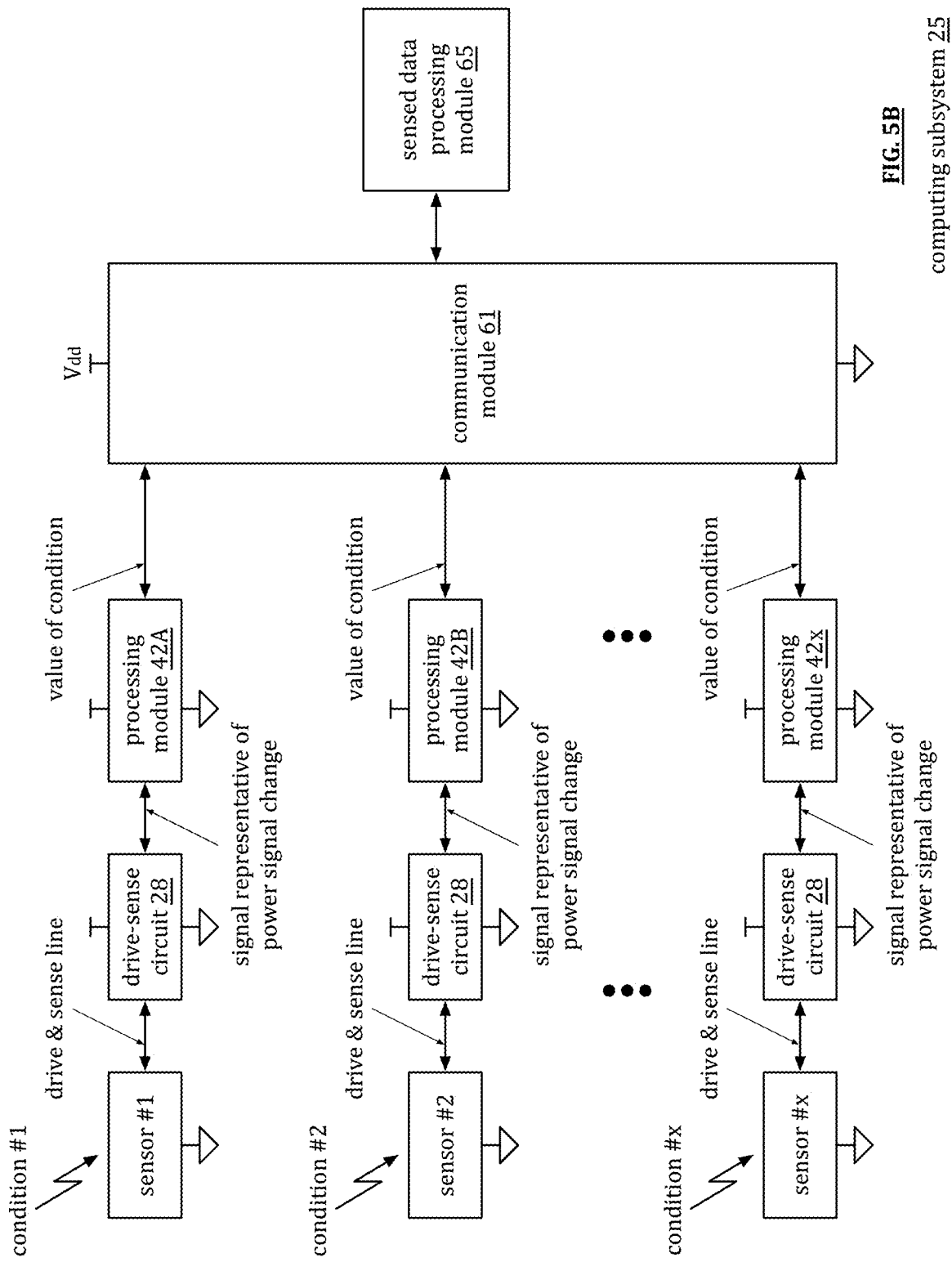
FIG. 5B is a schematic block diagram of another embodiment of a computing subsystem in accordance with the present disclosure.

FIG. 5B is a schematic block diagram of another embodiment of a computing subsystem 25 that includes a sensed data processing module 65, a communication module 61, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing device, devices, in which processing modules 42A-x reside.

In an embodiment, the drive-sense circuits 28, the processing modules, and the communication module are within a common computing device. For example, the computing device includes a central processing unit that includes a plurality of processing modules. The functionality and operation of the sensed data processing module 65, the communication module 61, the processing modules 42A-x, the drive sense circuits 28, and the sensors 1-x are as discussed with reference to FIG. 5A.

Figure 5C:
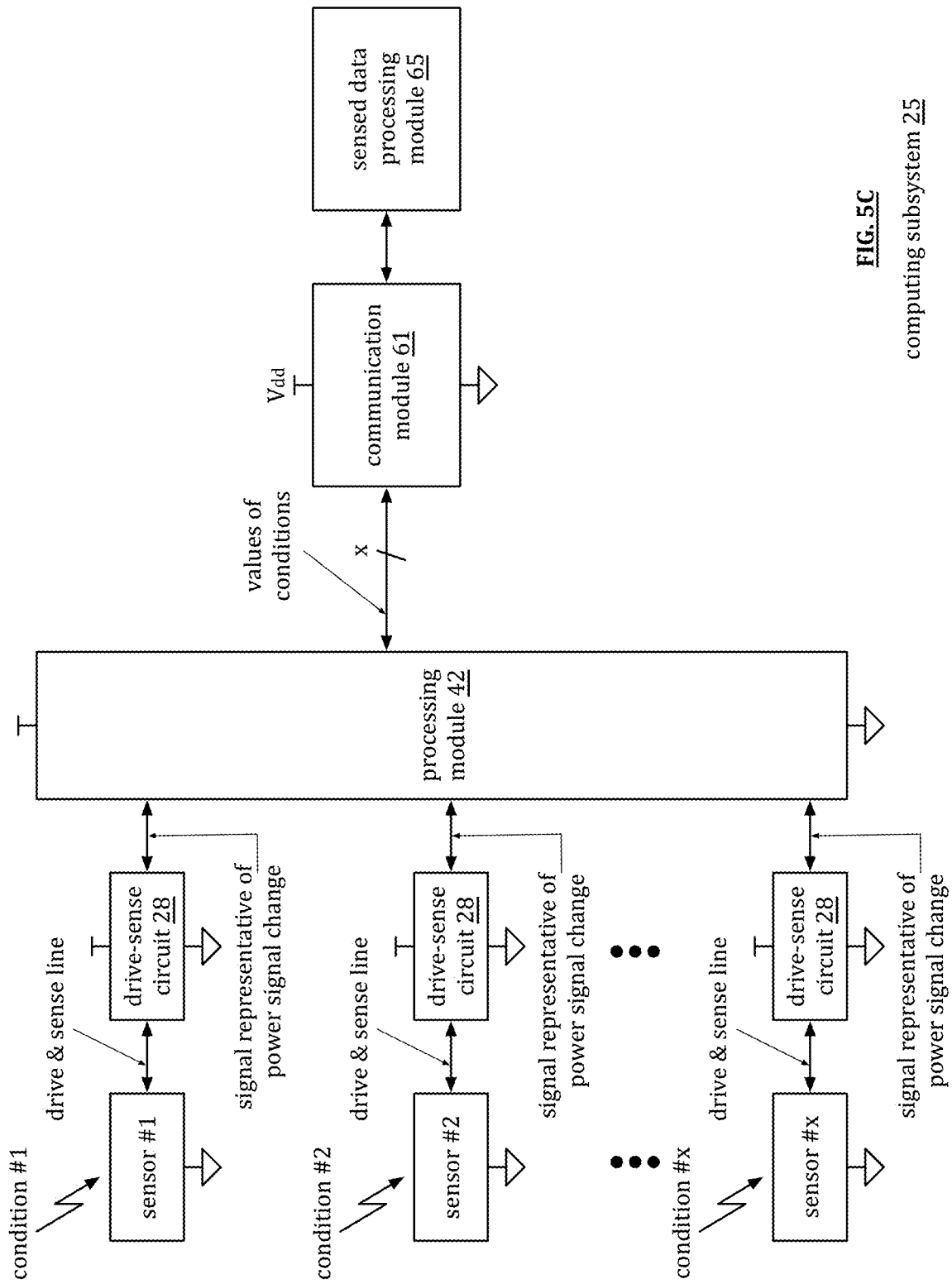
FIG. 5C is a schematic block diagram of another embodiment of a computing subsystem in accordance with the present disclosure.

FIG. 5C is a schematic block diagram of another embodiment of a computing subsystem 25 that includes a sensed data processing module 65, a communication module 61, a processing module 42, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing device in which the processing module 42 resides.

In an embodiment, the drive-sense circuits 28, the processing module, and the communication module are within a common computing device. The functionality and operation of the sensed data processing module 65, the communication module 61, the processing module 42, the drive sense circuits 28, and the sensors 1-x are as discussed with reference to FIG. 5A.

FIG. 5D is a schematic block diagram of another embodiment of a computing subsystem 25 that includes a processing module 42, a reference signal circuit 100, a plurality of drive sense circuits 28, and a plurality of sensors 30. The processing module 42 includes a drive-sense processing block 104, a drive-sense control block 102, and a reference control block 106. Each block 102-106 of the processing module 42 may be implemented via separate modules of the processing module, may be a combination of software and hardware within the processing module, and/or may be field programmable modules within the processing module 42.

In an example of operation, the drive-sense control block 104 generates one or more control signals to activate one or more of the drive-sense circuits 28. For example, the drive-sense control block 102 generates a control signal that enables of the drive-sense circuits 28 for a given period of time (e.g., 1 second, 1 minute, etc.). As another example, the drive-sense control block 102 generates control signals to sequentially enable the drive-sense circuits 28. As yet another example, the drive-sense control block 102 generates a series of control signals to periodically enable the drive-sense circuits 28 (e.g., enabled once every second, every minute, every hour, etc.).

Continuing with the example of operation, the reference control block 106 generates a reference control signal that it provides to the reference signal circuit 100. The reference signal circuit 100 generates, in accordance with the control signal, one or more reference signals for the drive-sense circuits 28. For example, the control signal is an enable signal, which, in response, the reference signal circuit 100 generates a pre-programmed reference signal that it provides to the drive-sense circuits 28. In another example, the reference signal circuit 100 generates a unique reference signal for each of the drive-sense circuits 28. In yet another example, the reference signal circuit 100 generates a first unique reference signal for each of the drive-sense circuits 28 in a first group and generates a second unique reference signal for each of the drive-sense circuits 28 in a second group.

The reference signal circuit 100 may be implemented in a variety of ways. For example, the reference signal circuit 100 includes a DC (direct current) voltage generator, an AC voltage generator, and a voltage combining circuit. The DC voltage generator generates a DC voltage at a first level and the AC voltage generator generates an AC voltage at a second level, which is less than or equal to the first level. The voltage combining circuit combines the DC and AC voltages to produce the reference signal. As examples, the reference signal circuit 100 generates a reference signal similar to the signals shown in FIG. 7, which will be subsequently discussed.

As another example, the reference signal circuit 100 includes a DC current generator, an AC current generator, and a current combining circuit. The DC current generator generates a DC current a first current level and the AC current generator generates an AC current at a second current level, which is less than or equal to the first current level. The current combining circuit combines the DC and AC currents to produce the reference signal.

Returning to the example of operation, the reference signal circuit 100 provides the reference signal, or signals, to the drive-sense circuits 28. When a drive-sense circuit 28 is enabled via a control signal from the drive sense control block 102, it provides a drive signal to its corresponding sensor 30. As a result of a physical condition, an electrical characteristic of the sensor is changed, which affects the drive signal. Based on the detected effect on the drive signal and the reference signal, the drive-sense circuit 28 generates a signal representative of the effect on the drive signal.

The drive-sense circuit provides the signal representative of the effect on the drive signal to the drive-sense processing block 104. The drive-sense processing block 104 processes the representative signal to produce a sensed value 97 of the physical condition (e.g., a digital value that represents a specific temperature, a specific pressure level, etc.). The processing module 42 provides the sensed value 97 to another application running on the computing device, to another computing device, and/or to a server 22.

Figure 5E:
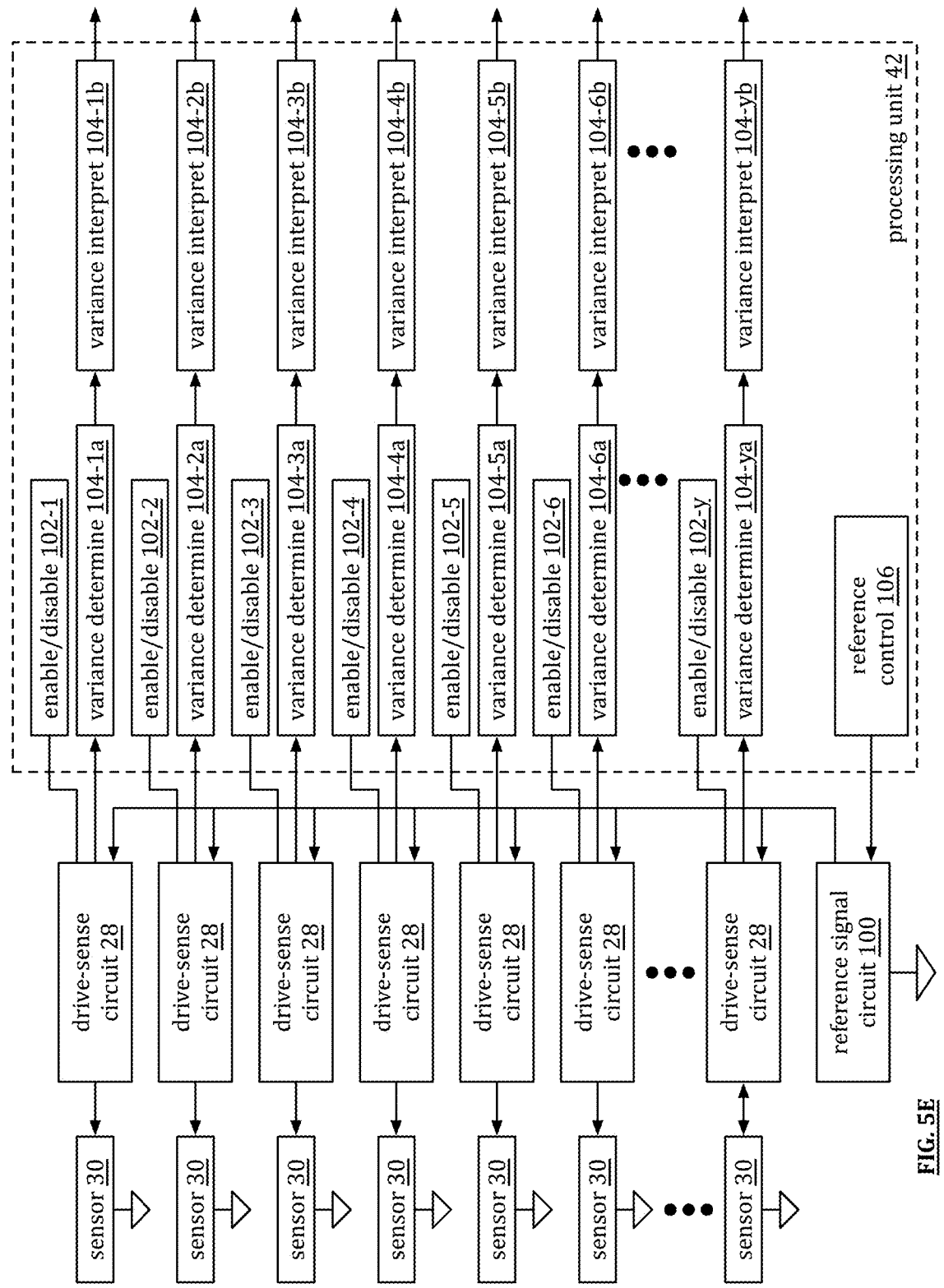
FIG. 5E is a schematic block diagram of another embodiment of a computing subsystem in accordance with the present disclosure.

FIG. 5E is a schematic block diagram of another embodiment of a computing subsystem 25 that includes a processing module 42, a plurality of drive sense circuits 28, and a plurality of sensors 30. This embodiment is similar to the embodiment of FIG. 5D with the functionality of the drive-sense processing block 104, a drive-sense control block 102, and a reference control block 106 shown in greater detail. For instance, the drive-sense control block 102 includes individual enable/disable blocks 102-1 through 102-y. An enable/disable block functions to enable or disable a corresponding drive-sense circuit in a manner as discussed above with reference to FIG. 5D.

The drive-sense processing block 104 includes variance determining modules 104-1a through y and variance interpreting modules 104-2a through y. For example, variance determining module 104-1a receives, from the corresponding drive-sense circuit 28, a signal representative of a physical condition sensed by a sensor. The variance determining module 104-1a functions to determine a difference from the signal representing the sensed physical condition with a signal representing a known, or reference, physical condition. The variance interpreting module 104-1b interprets the difference to determine a specific value for the sensed physical condition.

As a specific example, the variance determining module 104-1a receives a digital signal of 1001 0110 (150 in decimal) that is representative of a sensed physical condition (e.g., temperature) sensed by a sensor from the corresponding drive-sense circuit 28. With 8-bits, there are $2^8$ (256) possible signals representing the sensed physical condition. Assume that the units for temperature is Celsius and a digital value of 0100 0000 (64 in decimal) represents the known value for 25 degree Celsius. The variance determining module 104-b1 determines the difference between the digital signal representing the sensed value (e.g., 1001 0110, 150 in decimal) and the known signal value of (e.g., 0100 0000, 64 in decimal), which is 0011 0000 (86 in decimal). The variance determining module 104-b1 then determines the sensed value based on the difference and the known value. In this example, the sensed value equals 25+86*(100/256) =25+33.6=58.6 degrees Celsius.

FIG. 6 is a schematic block diagram of a drive center circuit 28-a coupled to a sensor 30. The drive sense-sense circuit 28 includes a power source circuit 110 and a power signal change detection circuit 112. The sensor 30 includes one or more transducers that have varying electrical characteristics (e.g., capacitance, inductance, impedance, current, voltage, etc.) based on varying physical conditions 114 (e.g., pressure, temperature, biological, chemical, etc.), or vice versa (e.g., an actuator).

The power source circuit 110 is operably coupled to the sensor 30 and, when enabled (e.g., from a control signal from the processing module 42, power is applied, a switch is closed, a reference signal is received, etc.) provides a power signal 116 to the sensor 30. The power source circuit 110 may be a voltage supply circuit (e.g., a battery, a linear regulator, an unregulated DC-to-DC converter, etc.) to produce a voltage-based power signal, a current supply circuit (e.g., a current source circuit, a current mirror circuit, etc.) to produce a current-based power signal, or a circuit that provide a desired power level to the sensor and substantially matches impedance of the sensor. The power source circuit 110 generates the power signal 116 to include a DC (direct current) component and/or an oscillating component.

When receiving the power signal 116 and when exposed to a condition 114, an electrical characteristic of the sensor affects 118 the power signal. When the power signal change detection circuit 112 is enabled, it detects the affect 118 on the power signal as a result of the electrical characteristic of the sensor. For example, the power signal is a 1.5 voltage signal and, under a first condition, the sensor draws 1 milliamp of current, which corresponds to an impedance of 1.5 K Ohms. Under a second conditions, the power signal remains at 1.5 volts and the current increases to 1.5 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

As another example, the power signal is a 1.5 voltage signal and, under a first condition, the sensor draws 1 milliamp of current, which corresponds to an impedance of 1.5 K Ohms. Under a second conditions, the power signal drops to 1.3 volts and the current increases to 1.3 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

The power signal 116 includes a DC component 122 and/or an oscillating component 124 as shown in FIG. 7. The oscillating component 124 includes a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component). Note that the power signal is shown without affect from the sensor as the result of a condition or changing condition.

In an embodiment, power generating circuit 110 varies frequency of the oscillating component 124 of the power signal 116 so that it can be tuned to the impedance of the sensor and/or to be off-set in frequency from other power signals in a system. For example, a capacitance sensor's impedance decreases with frequency. As such, if the frequency of the oscillating component is too high with respect to the capacitance, the capacitor looks like a short and variances in capacitances will be missed. Similarly, if the frequency of the oscillating component is too low with respect to the capacitance, the capacitor looks like an open and variances in capacitances will be missed.

In an embodiment, the power generating circuit 110 varies magnitude of the DC component 122 and/or the oscillating component 124 to improve resolution of sensing and/or to adjust power consumption of sensing. In addition, the power generating circuit 110 generates the drive signal 110 such that the magnitude of the oscillating component 124 is less than magnitude of the DC component 122.

FIG. 6A is a schematic block diagram of a drive center circuit 28-*a*1 coupled to a sensor 30. The drive sense-sense circuit 28-*a*1 includes a signal source circuit 111, a signal change detection circuit 113, and a power source 115. The power source 115 (e.g., a battery, a power supply, a current source, etc.) generates a voltage and/or current that is combined with a signal 117, which is produced by the signal source circuit 111. The combined signal is supplied to the sensor 30.

The signal source circuit 111 may be a voltage supply circuit (e.g., a battery, a linear regulator, an unregulated DC-to-DC converter, etc.) to produce a voltage-based signal 117, a current supply circuit (e.g., a current source circuit, a current mirror circuit, etc.) to produce a current-based signal 117, or a circuit that provide a desired power level to the sensor and substantially matches impedance of the sensor. The signal source circuit 111 generates the signal 117 to include a DC (direct current) component and/or an oscillating component.

When receiving the combined signal (e.g., signal 117 and power from the power source) and when exposed to a condition 114, an electrical characteristic of the sensor affects 119 the signal. When the signal change detection circuit 113 is enabled, it detects the affect 119 on the signal as a result of the electrical characteristic of the sensor.

FIG. 8 is an example of a sensor graph that plots an electrical characteristic versus a condition. The sensor has a substantially linear region in which an incremental change in a condition produces a corresponding incremental change in the electrical characteristic. The graph shows two types of electrical characteristics: one that increases as the condition increases and the other that decreases and the condition increases. As an example of the first type, impedance of a temperature sensor increases and the temperature increases.

As an example of a second type, a capacitance touch sensor decreases in capacitance as a touch is sensed.

Figure 9:
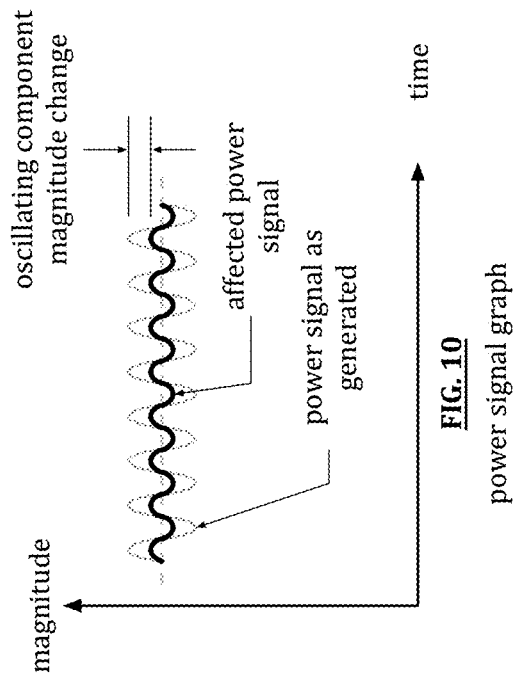
FIG. 9 is a schematic block diagram of another example of a power signal graph in accordance with the present disclosure.

FIG. 9 is a schematic block diagram of another example of a power signal graph in which the electrical characteristic or change in electrical characteristic of the sensor is affecting the power signal. In this example, the effect of the electrical characteristic or change in electrical characteristic of the sensor reduced the DC component but had little to no effect on the oscillating component. For example, the electrical characteristic is resistance. In this example, the resistance or change in resistance of the sensor decreased the power signal, inferring an increase in resistance for a relatively constant current.

Figure 10:
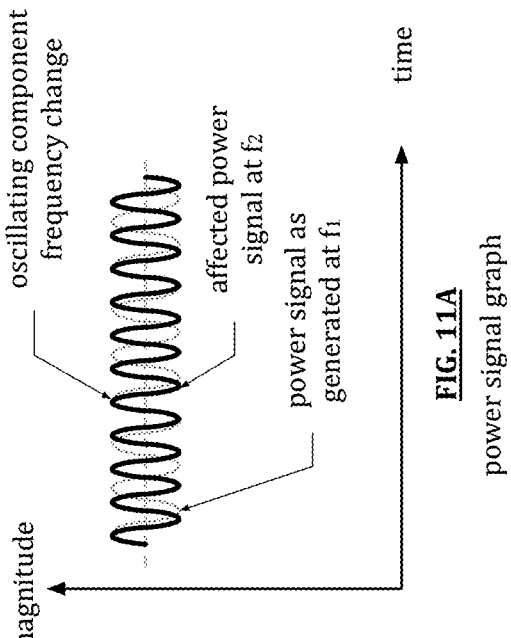
FIG. 10 is a schematic block diagram of another example of a power signal graph in accordance with the present disclosure.

FIG. 10 is a schematic block diagram of another example of a power signal graph in which the electrical characteristic or change in electrical characteristic of the sensor is affecting the power signal. In this example, the effect of the electrical characteristic or change in electrical characteristic of the sensor reduced magnitude of the oscillating component but had little to no effect on the DC component. For example, the electrical characteristic is impedance of a capacitor and/or an inductor. In this example, the impedance or change in impedance of the sensor decreased the magnitude of the oscillating signal component, inferring an increase in impedance for a relatively constant current.

Figure 11:
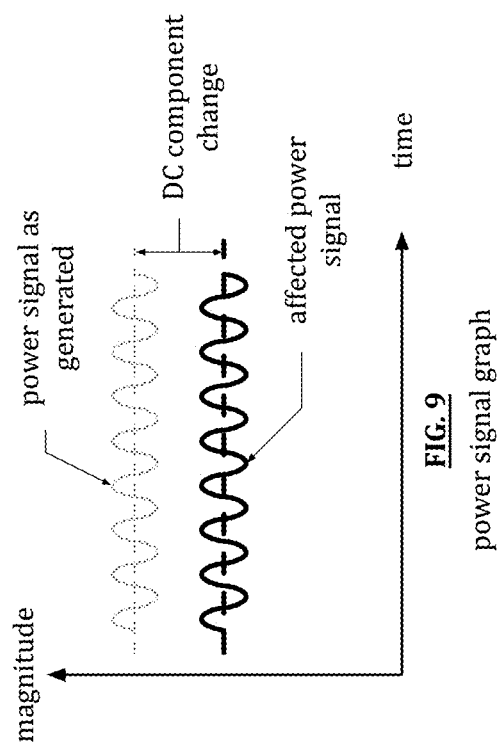
FIG. 11 is a schematic block diagram of another example of a power signal graph in accordance with the present disclosure.

FIG. 11 is a schematic block diagram of another example of a power signal graph in which the electrical characteristic or change in electrical characteristic of the sensor is affecting the power signal. In this example, the effect of the electrical characteristic or change in electrical characteristic of the sensor shifted frequency of the oscillating component but had little to no effect on the DC component. For example, the electrical characteristic is reactance of a capacitor and/or an inductor. In this example, the reactance or change in reactance of the sensor shifted frequency of the oscillating signal component, inferring an increase in reactance (e.g., sensor is functioning as an integrator or phase shift circuit).

Figure 11A:
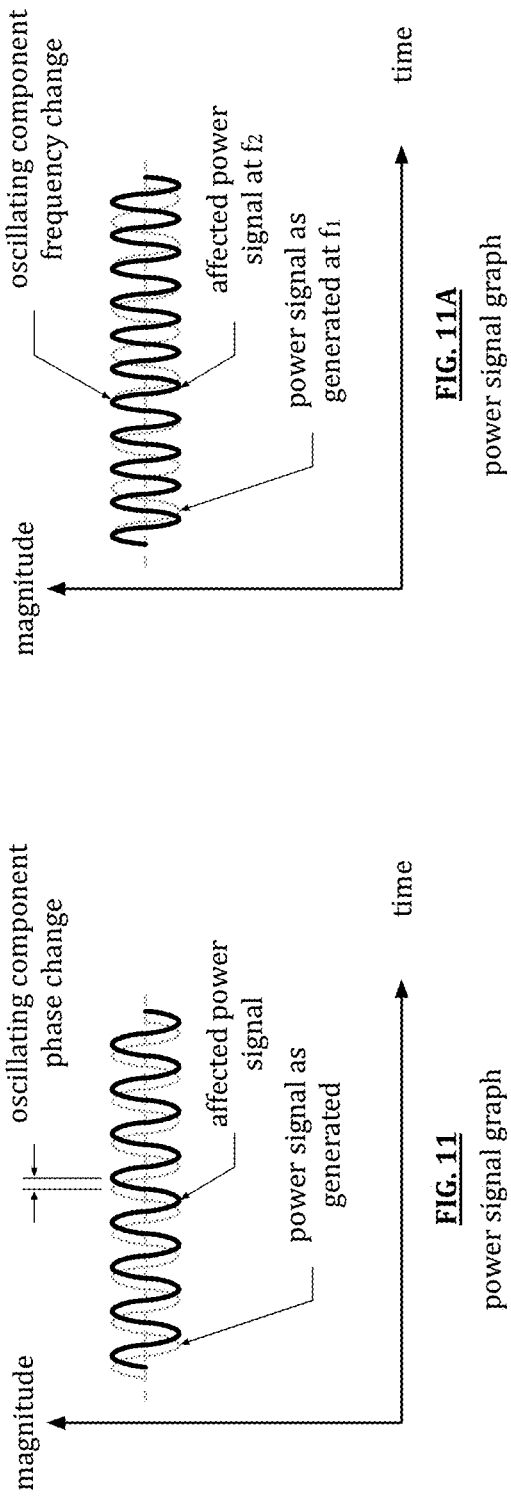
FIG. 11A is a schematic block diagram of another example of a power signal graph in accordance with the present disclosure.

FIG. 11A is a schematic block diagram of another example of a power signal graph in which the electrical characteristic or change in electrical characteristic of the sensor is affecting the power signal. In this example, the effect of the electrical characteristic or change in electrical characteristic of the sensor changes the frequency of the oscillating component but had little to no effect on the DC component. For example, the sensor includes two transducers that oscillate at different frequencies. The first transducer receives the power signal at a frequency of $f_1$ and converts it into a first physical condition. The second transducer is stimulated by the first physical condition to create an electrical signal at a different frequency $f_2$. In this example, the first and second transducers of the sensor change the frequency of the oscillating signal component, which allows for more granular sensing and/or a broader range of sensing.

FIG. 12 is a schematic block diagram of an embodiment of a power signal change detection circuit 112 receiving the affected power signal 118 and the power signal 116 as generated to produce, therefrom, the signal representative 120 of the power signal change. The affect 118 on the power signal is the result of an electrical characteristic and/or change in the electrical characteristic of a sensor; a few examples of the affects are shown in FIGS. 8-11A.

In an embodiment, the power signal change detection circuit 112 detect a change in the DC component 122 and/or the oscillating component 124 of the power signal 116. The power signal change detection circuit 112 then generates the signal representative 120 of the change to the power signal based on the change to the power signal. For example, the change to the power signal results from the impedance of the sensor and/or a change in impedance of the sensor. The representative signal 120 is reflective of the change in the power signal and/or in the change in the sensor's impedance.

In an embodiment, the power signal change detection circuit 112 is configured to detect a change to the oscillating component at a frequency, which may be a phase shift, frequency change, and/or change in magnitude of the oscillating component. The power signal change detection circuit 112 is also configured to generate the signal representative of the change to the power signal based on the change to the oscillating component at the frequency. The power signal change detection circuit 112 is further configured to provide feedback to the power source circuit 110 regarding the oscillating component. The feedback allows the power source circuit 110 to regulate the oscillating component at the desired frequency, phase, and/or magnitude.

FIG. 13 is a schematic block diagram of another embodiment of a drive sense circuit 28-b includes a change detection circuit 150, a regulation circuit 152, and a power source circuit 154. The drive-sense circuit 28-b is coupled to the sensor 30, which includes a transducer that has varying electrical characteristics (e.g., capacitance, inductance, impedance, current, voltage, etc.) based on varying physical conditions 114 (e.g., pressure, temperature, biological, chemical, etc.).

The power source circuit 154 is operably coupled to the sensor 30 and, when enabled (e.g., from a control signal from the processing module 42, power is applied, a switch is closed, a reference signal is received, etc.) provides a power signal 158 to the sensor 30. The power source circuit 154 may be a voltage supply circuit (e.g., a battery, a linear regulator, an unregulated DC-to-DC converter, etc.) to produce a voltage-based power signal or a current supply circuit (e.g., a current source circuit, a current mirror circuit, etc.) to produce a current-based power signal. The power source circuit 154 generates the power signal 158 to include a DC (direct current) component and an oscillating component.

When receiving the power signal 158 and when exposed to a condition 114, an electrical characteristic of the sensor affects 160 the power signal. When the change detection circuit 150 is enabled, it detects the affect 160 on the power signal as a result of the electrical characteristic of the sensor 30. The change detection circuit 150 is further configured to generate a signal 120 that is representative of change to the power signal based on the detected effect on the power signal.

The regulation circuit 152, when its enabled, generates regulation signal 156 to regulate the DC component to a desired DC level and/or regulate the oscillating component to a desired oscillating level (e.g., magnitude, phase, and/or frequency) based on the signal 120 that is representative of the change to the power signal. The power source circuit 154 utilizes the regulation signal 156 to keep the power signal at a desired setting 158 regardless of the electrical characteristic of the sensor. In this manner, the amount of regulation is indicative of the affect the electrical characteristic had on the power signal.

In an example, the power source circuit 158 is a DC-DC converter configured to provide a regulated power signal having DC and AC components. The change detection circuit 150 is a comparator and the regulation circuit 152 is a pulse width modulator to produce the regulation signal 156. The comparator compares the power signal 158, which is affected by the sensor, with a reference signal that includes DC and AC components. When the electrical characteristics is at a first level (e.g., a first impedance), the power signal is regulated to provide a voltage and current such that the power signal substantially resembles the reference signal.

When the electrical characteristics changes to a second level (e.g., a second impedance), the change detection circuit 150 detects a change in the DC and/or AC component of the power signal 158 and generates the representative signal 120, which indicates the changes. The regulation circuit 152 detects the change in the representative signal 120 and creates the regulation signal to substantially remove the effect on the power signal. The regulation of the power signal 158 may be done by regulating the magnitude of the DC and/or AC components, by adjusting the frequency of AC component, and/or by adjusting the phase of the AC component.

With respect to the operation of various drive-sense circuits as described herein and/or their equivalents, note that the operation of such a drive-sense circuit is operable simultaneously to drive and sense a signal via a single line. In comparison to switched, time-divided, time-multiplexed, etc. operation in which there is switching between driving and sensing (e.g., driving at first time, sensing at second time, etc.) of different respective signals at separate and distinct times, the drive-sense circuit is operable simultaneously to perform both driving and sensing of a signal. In some examples, such simultaneous driving and sensing is performed via a single line using a drive-sense circuit.

In addition, other alternative implementations of various drive-sense circuits (DSCs) are described in U.S. Utility patent application Ser. No. 16/113,379, entitled "DRIVE SENSE CIRCUIT WITH DRIVE-SENSE LINE,", filed Aug. 27, 2018, pending. Any instantiation of a drive-sense circuit as described herein may also be implemented using any of the various implementations of various drive-sense circuits (DSCs) described in U.S. Utility patent application Ser. No. 16/113,379.

In addition, note that the one or more signals provided from a drive-sense circuit (DSC) may be of any of a variety of types. For example, such a signal may be based on encoding of one or more bits to generate one or more coded bits used to generate modulation data (or generally, data). For example, a device is configured to perform forward error correction (FEC) and/or error checking and correction (ECC) code of one or more bits to generate one or more coded bits. Examples of FEC and/or ECC may include turbo code, convolutional code, trellis coded modulation (TCM), turbo trellis coded modulation (TTCM), low density parity check (LDPC) code, Reed-Solomon (RS) code, BCH (Bose and Ray-Chaudhuri, and Hocquenghem) code, binary convolutional code (BCC), Cyclic Redundancy Check (CRC), and/or any other type of ECC and/or FEC code and/or combination thereof, etc. Note that more than one type of ECC and/or FEC code may be used in any of various implementations including concatenation (e.g., first ECC and/or FEC code followed by second ECC and/or FEC code, etc. such as based on an inner code/outer code architecture, etc.), parallel architecture (e.g., such that first ECC and/or FEC code operates on first bits while second ECC and/or FEC code operates on second bits, etc.), and/or any combination thereof.

Also, the one or more coded bits may then undergo modulation or symbol mapping to generate modulation symbols (e.g., the modulation symbols may include data intended for one or more recipient devices, components, elements, etc.). Note that such modulation symbols may be generated using any of various types of modulation coding techniques. Examples of such modulation coding techniques may include binary phase shift keying (BPSK), quadrature phase shift keying (QPSK), 8-phase shift keying (PSK), 16 quadrature amplitude modulation (QAM), 32 amplitude and phase shift keying (APSK), etc., uncoded modulation, and/or any other desired types of modulation including higher ordered modulations that may include even greater number of constellation points (e.g., 1024 QAM, etc.).

In addition, note that a signal provided from a DSC may be of a unique frequency that is different from signals provided from other DSCs. Also, a signal provided from a DSC may include multiple frequencies independently or simultaneously. The frequency of the signal can be hopped on a pre-arranged pattern. In some examples, a handshake is established between one or more DSCs and one or more processing modules (e.g., one or more controllers) such that the one or more DSC is/are directed by the one or more processing modules regarding which frequency or frequencies and/or which other one or more characteristics of the one or more signals to use at one or more respective times and/or in one or more particular situations.

With respect to any signal that is driven and simultaneously detected by a DSC, note that any additional signal that is coupled into a line, a connection to an electrical node, an electrode, a touch sensor, a bus, a communication link, a battery, a load, an electrical coupling or connection, etc. associated with that DSC is also detectable. For example, a DSC that is associated with such a line, a connection to an electrical node, an electrode, a touch sensor, a bus, a communication link, a power source such as an AC power source or battery, a load, an electrical coupling or connection, etc. is configured to detect any signal from one or more other lines, connection to electrical nodes, electrodes, touch sensors, buses, communication links, loads, electrical couplings or connections, etc. that get coupled into that line, connection to an electrical node, electrode, touch sensor, bus, communication link, a power source such as an AC power source or battery, load, electrical coupling or connection, etc.

Note that the different respective signals that are driven and simultaneously sensed by one or more DSCs may be differentiated from one another. Appropriate filtering and processing can identify the various signals given their differentiation, orthogonality to one another, difference in frequency, etc. Other examples described herein and their equivalents operate using any of a number of different characteristics other than or in addition to frequency.

Moreover, with respect to any embodiment, diagram, example, etc. that includes more than one DSC, note that the DSCs may be implemented in a variety of manners. For example, all of the DSCs may be of the same type, implementation, configuration, etc. In another example, the first DSC may be of a first type, implementation, configuration, etc., and a second DSC may be of a second type, implementation, configuration, etc. that is different than the first DSC. Considering a specific example, a first DSC may be implemented to detect change of impedance associated with a line, a connection to an electrical node, an electrode, a touch sensor, a bus, a communication link, an electrical coupling or connection, etc. associated with that first DSC, while a second DSC may be implemented to detect change of voltage associated with a line, a connection to an electrical node, an electrode, a touch sensor, a bus, a communication link, an electrical coupling or connection, etc. associated with that second DSC. In addition, note that a third DSC may be implemented to detect change of a current associated with a line, a connection to an electrical node, an electrode, a touch sensor, a bus, a communication link, an electrical coupling or connection, etc. associated with that DSC. In general, while a common reference may be used generally to show a DSC or multiple instantiations of a DSC within a given embodiment, diagram, example, etc., note that any particular DSC may be implemented in accordance with any manner as described herein, such as described in U.S. Utility patent application Ser. No. 16/113,379, etc. and/or their equivalents.

Note that certain of the diagrams herein show a computing device (e.g., alternatively referred to as device; the terms computing device and device may be used interchangeably) that may include or be coupled to one or more processing modules. In certain instances, the one or more processing modules is configured to communicate with and interact with one or more other devices including one or more of DSCs, one or more components associated with a DSC, a battery, a load, a wire connection or coupling a battery to a load, one or more multiple wires connecting or coupling one or more batteries to one or more loads, etc.

Note that any such implementation of one or more processing modules may include integrated memory and/or be coupled to other memory. At least some of the memory stores operational instructions to be executed by the one or more processing modules. In addition, note that the one or more processing modules may interface with one or more other devices, components, elements, etc. via one or more communication links, networks, communication pathways, channels, etc. (e.g., such as via one or more communication interfaces of the device, such as may be integrated into the one or more processing modules or be implemented as a separate component, circuitry, etc.).

In addition, when a DSC is implemented to communicate with and interact with another element, the DSC is configured simultaneously to transmit and receive one or more signals with the element. For example, a DSC is configured simultaneously to sense (e.g., including to sense change of) and to drive one or more signals to the one element. During transmission of a signal from a DSC, that same DSC is configured simultaneously to sense the signal being transmitted from the DSC including any change thereof including any other signal may be coupled into the signal that is being transmitted from the DSC.

In addition, while many examples, embodiments, diagrams, etc. herein include one or more DSCs (e.g., coupled to one or more processing modules and one or more connection to electrical nodes including some implemented via a connection to an electrical node via a single line), note that any instantiation of a DSC may alternatively be implemented using a channel drive circuitry, an Analog Front End (AFE) that includes analog to digital and/or digital to analog conversion capability, etc. within alternative embodiments.

Figure 14:
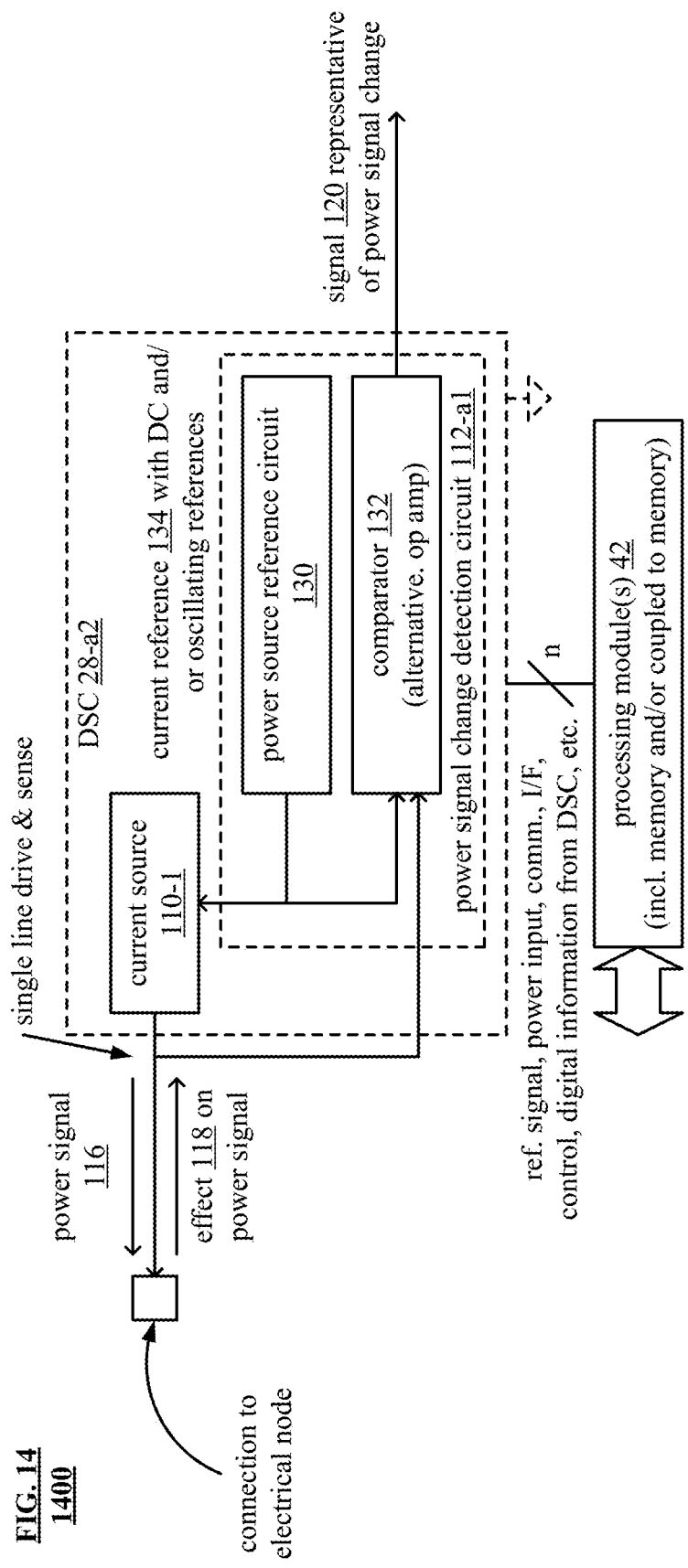
FIG. 14 is a schematic block diagram of an embodiment of a drive-sense circuit (DSC) that is interactive with a connection to an electrical node via a single line a connection to an electrical node via a single line in accordance with the present disclosure.

FIG. 14 is a schematic block diagram of an embodiment 1400 of a drive-sense circuit (DSC) that is interactive with a connection to an electrical node via a single line a connection to an electrical node via a single line in accordance with the present disclosure. Similar to other diagrams, examples, embodiments, etc. herein, the DSC 28-*a2* of this diagram is in communication with one or more processing modules 42. The DSC 28-*a2* is configured to provide a signal (e.g., a power signal, an electrode signal, transmit signal, a monitoring signal, etc.) to a connection to an electrical node via a single line and simultaneously to sense that signal via the single line. Note that the connection to an electrical node may be implemented in a variety of ways. For example, the DSC 28-*a2* is connected via a single line to the electrical node, and the electrical node is a point on another line at which the single line from the DSC 28-*a2* connects. Consider an example in which a battery terminal is connected to a load terminal via another line, and the DSC 28-*a* connects at a point along that other line at a first point in that is proximate to the battery terminal. Consider another example in which the battery terminal is connected to the load terminal via another line, and the DSC 28-*a* connects at another point along that other line at a second point in that is proximate to the load terminal. Generally speaking, such an electrical node may be viewed as any electrical contact point at which the DSC 28—as of this diagram or any other DSC described herein connects to another element (e.g., a line, a connection to an electrical node, an electrode, a touch sensor, a bus, a communication link, an electrical coupling or connection, etc.).

In some examples, sensing the signal includes detection of an electrical characteristic of the electrical node that is based on a response of the electrical node to that signal. Examples of such an electrical characteristic may include detection of an impedance of the electrical node such as a change of capacitance of the electrical node, detection of one or more signals coupled into the electrical node such as from one or more other electrodes, and/or other electrical characteristics.

This embodiment of a DSC 28-*a*2 includes a current source 110-1 and a power signal change detection circuit 112-*a*1. The power signal change detection circuit 112-*a*1 includes a power source reference circuit 130 and a comparator 132. In some examples, the comparator 132 is alternatively be implemented as an operational amplifier. The current source 110-1 may be an independent current source, a dependent current source, a current mirror circuit, etc.

In an example of operation, the power source reference circuit 130 provides a current reference 134 with DC and oscillating components to the current source 110-1. The current source generates a current as the power signal 116 based on the current reference 134. An electrical characteristic of the electrical node has an effect on the current power signal 116. For example, if the impedance of the electrical node decreases and the current power signal 116 remains substantially unchanged, the voltage across the electrical node is decreased.

The comparator 132 compares the current reference 134 with the affected power signal 118 to produce the signal 120 that is representative of the change to the power signal. For example, the current reference signal 134 corresponds to a given current (I) times a given impedance (Z). The current reference generates the power signal to produce the given current (I). If the impedance of the electrical node substantially matches the given impedance (Z), then the comparator's output is reflective of the impedances substantially matching. If the impedance of the electrical node is greater than the given impedance (Z), then the comparator's output is indicative of how much greater the impedance of the electrical node is than that of the given impedance (Z). If the impedance of the electrical node is less than the given impedance (Z), then the comparator's output is indicative of how much less the impedance of the electrical node is than that of the given impedance (Z).

Figure 15:
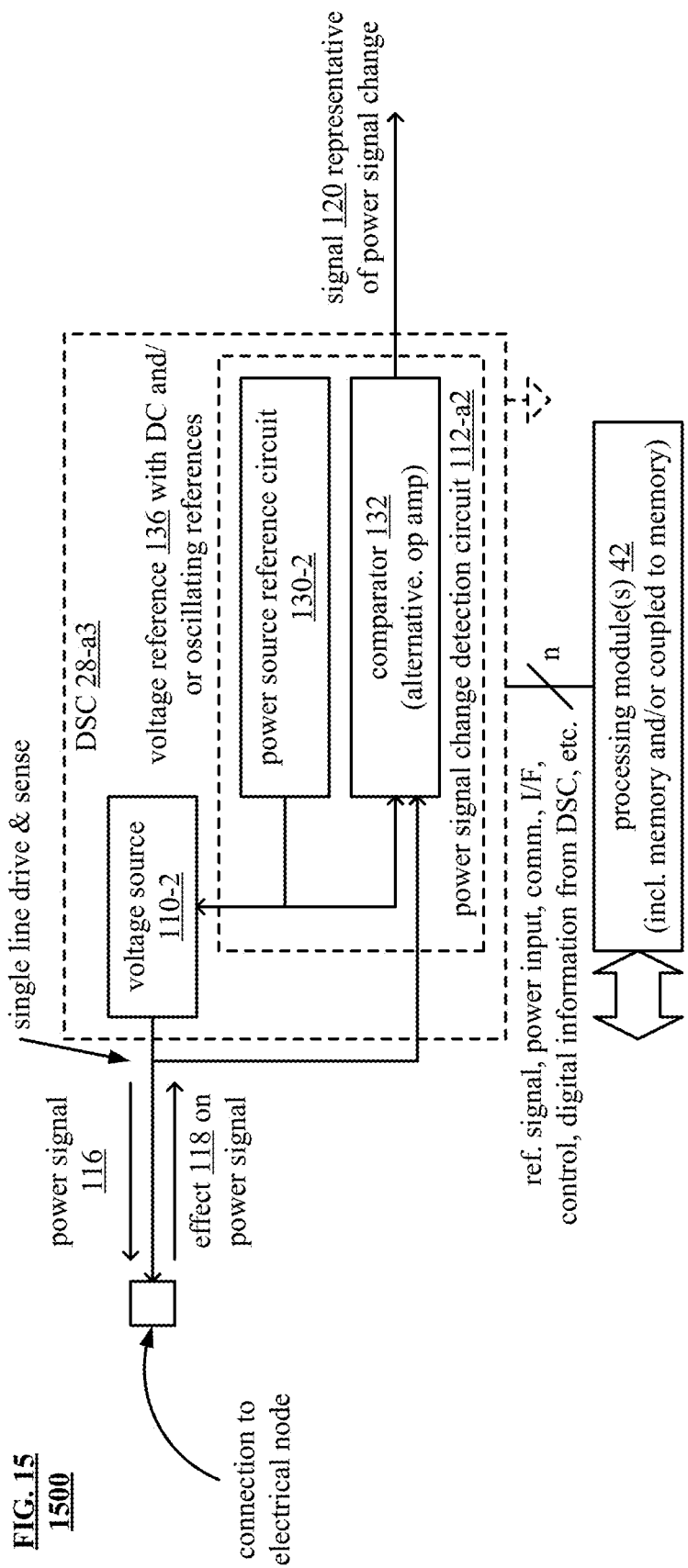
FIG. 15 is a schematic block diagram of another embodiment of a DSC that is interactive with a connection to an electrical node via a single line a connection to an electrical node via a single line in accordance with the present disclosure.

FIG. 15 is a schematic block diagram of another embodiment 1500 of a DSC that is interactive with a connection to an electrical node via a single line a connection to an electrical node via a single line in accordance with the present disclosure. Similar to other diagrams, examples, embodiments, etc. herein, the DSC 28-*a*3 of this diagram is in communication with one or more processing modules 42. Similar to the previous diagram, although providing a different embodiment of the DSC, the DSC 28-*a*3 is configured to provide a signal to the electrical node via a single line and simultaneously to sense that signal via the single line. In some examples, sensing the signal includes detection of an electrical characteristic of the electrical node that is based on a response of the electrical node to that signal. Examples of such an electrical characteristic may include detection of an impedance of the electrical node such as a change of capacitance of the electrical node, detection of one or more signals coupled into the electrical node such as from one or more other electrodes, and/or other electrical characteristics.

This embodiment of a DSC 28-*a*3 includes a voltage source 110-2 and a power signal change detection circuit 112-*a*2. The power signal change detection circuit 112-*a*2 includes a power source reference circuit 130-2 and a comparator 132-2. The voltage source 110-2 may be a battery, a linear regulator, a DC-DC converter, etc.

In an example of operation, the power source reference circuit 130-2 provides a voltage reference 136 with DC and oscillating components to the voltage source 110-2. The voltage source generates a voltage as the power signal 116 based on the voltage reference 136. An electrical characteristic of the electrical node has an effect on the voltage power signal 116. For example, if the impedance of the electrical node decreases and the voltage power signal 116 remains substantially unchanged, the current through the electrical node is increased.

The comparator 132 compares the voltage reference 136 with the affected power signal 118 to produce the signal 120 that is representative of the change to the power signal. For example, the voltage reference signal 134 corresponds to a given voltage (V) divided by a given impedance (Z). The voltage reference generates the power signal to produce the given voltage (V). If the impedance of the electrical node substantially matches the given impedance (Z), then the comparator's output is reflective of the impedances substantially matching. If the impedance of the electrical node is greater than the given impedance (Z), then the comparator's output is indicative of how much greater the impedance of the electrical node is than that of the given impedance (Z). If the impedance of the electrical node is less than the given impedance (Z), then the comparator's output is indicative of how much less the impedance of the electrical node is than that of the given impedance (Z).

In certain examples, the DSC is implemented by a power source circuit and a power source change detection circuit. The power source circuit is operably coupled via a single line to the electrical node. When enabled, the power source circuit is configured to provide an analog signal via the single line coupling to the electrical node. The analog signal includes a DC (direct current) component and/or an oscillating component. The power source change detection circuit is operably coupled to the power source circuit. When enabled, the power source change detection circuit is configured to detect an effect on the analog signal that is based on an electrical characteristic of the TSD electrode and to generate the digital signal that is representative of the change of impedance of the electrical node.

In even other examples, the power source circuit is implemented by a power source to source a voltage and/or a current via the single line to the electrical node. The power source change detection circuit includes a power source reference circuit configured to provide a voltage reference and/or a current reference. The power source change detection circuit also includes a comparator configured to compare the voltage and/or the current provided via the single line to the electrical node to the voltage reference and/or the current reference to produce the analog signal.

In another implementation, the DSC is implemented by a power source circuit and a power source change detection circuit. The power source circuit is operably coupled via a single line to the electrical node. When enabled, the power source circuit is configured to provide an analog signal via the single line coupling to the electrical node. The analog signal includes at least one of a DC (direct current) component or an oscillating component. The power source change detection circuit is operably coupled to the power source circuit. When enabled, the power source change detection circuit is configured to detect an effect on the analog signal that is based on an electrical characteristic of the electrical node and to generate the digital signal that is representative of the change of impedance of the electrical node.

In yet other examples, the power source circuit includes a power source to source at least one of a voltage or a current via the single line to the electrical node. The power source change detection circuit includes a power source reference circuit configured to provide at least one of a voltage reference or a current reference, and a comparator configured to compare the at least one of the voltage and the current provided via the single line to the electrical node to the at least one of the voltage reference and the current reference to produce the analog signal.

With respect to many of the following diagrams, one or more processing modules 42, which includes and/or is coupled to memory, is configured to communicate and interact with one or more DSCs 28 that are coupled to one or more electrodes of the panel or a touchscreen display such as may be implemented within a touch sensor device (TSD) (with or without display functionality). In many of the diagrams, the DSCs 28 are shown as interfacing with electrodes of the panel or touchscreen display (e.g., via interface 86 that couples to row electrodes and another interface 86 that couples to column electrodes). Note that the number of lines that coupled the one or more processing modules 42 to the respective one or more DSCs 28, and from the one or more DSCs 28 to the respective interfaces 86 may be varied (e.g., such as may be described by n and m, which are positive integers greater than or equal to 1). Note that the respective values may be the same or different within different respective embodiments and/or examples herein.

Note that the same and/or different respective signals may be driven simultaneously sensed by the respective one or more DSCs 28 that couple to the electrical nodes within any of the various embodiments and/or examples herein. In some examples, a common signal (e.g., having common one or more characteristics) is implemented and also different respective signals (e.g., different respective signals having one or more different characteristics) are implemented. For example, with respect to touchscreens, touchscreen displays, touch sensor devices, etc., a common signal (e.g., having common one or more characteristics) is implemented in accordance with self signaling on each electrode of a touchscreen, a touchscreen display, a touch sensor device, etc., and also different respective signals (e.g., different respective signals having one or more different characteristics) are implemented in accordance with mutual signal such that those mutual signals are provided to some of the electrodes of the touchscreen, the touchscreen display, the touch sensor device, etc., and are detected using even other of the electrodes of the touchscreen, the touchscreen display, the touch sensor device, etc. Again, as mentioned above, note that the different respective signals that are driven and simultaneously sensed via the electrical nodes may be differentiated from one another.

Figure 16A:
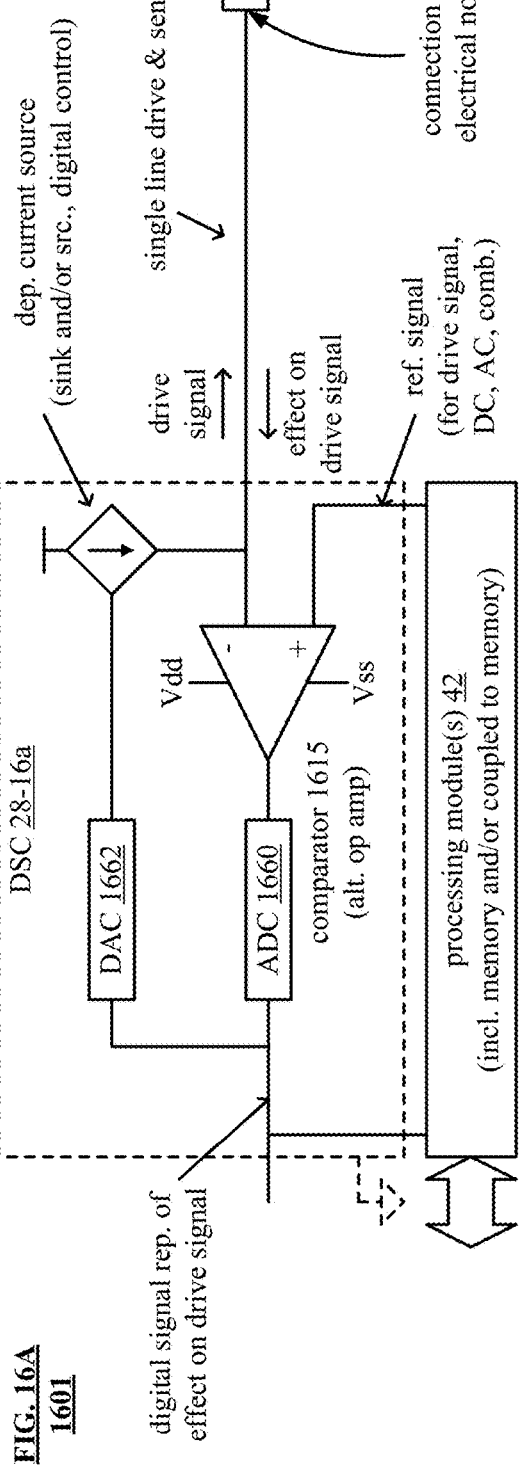
FIG. 16A is a schematic block diagram of another embodiment of a DSC configured simultaneously to drive and sense a drive signal to a connection to an electrical node via a single line in accordance with the present disclosure.

FIG. 16A is a schematic block diagram of another embodiment 1601 of a DSC configured simultaneously to drive and sense a drive signal to a connection to an electrical node via a single line in accordance with the present disclosure. In this diagram, one or more processing modules 42 is configured to communicate with and interact with a drive-sense circuit (DSC) 28-16a. The one or more processing modules 42 is coupled to a DSC 28-16a and is configured to provide control to and support communication with the DSC 28-16a. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In this diagram, the one or more processing module 42 is configured to provide a reference signal to one of the inputs of a comparator 1615. As with respect to other diagrams, embodiments, diagrams, etc., herein. Note that the comparator 1615 may alternatively be implemented as an operational amplifier. Note that the drive signal provided to the electrical node is implemented to track, follow, match, etc. the reference signal provided to the one of the inputs of the comparator 1615. As the drive signal provided to the electrical node may be affected based on one or more electrical characteristics of the electrical node including any change thereof, the DSC 28-16a is configured to adapt the drive signal to track, follow, match, etc. the reference signal. Note that the comparator 1615 may alternatively be implemented as an operational amplifier in certain embodiments. The other input of the comparator 1615 is coupled to provide a drive signal directly from the DSC 28-16a to the electrical node. The DSC 28-16a is configured to provide the drive signal to the electrical node and also simultaneously to sense the drive signal and to detect any effect on the drive signal including any change of the drive signal based on one or more electrical characteristics of the electrical node.

The output of the comparator 1615 is provided to an analog to digital converter (ADC) 1660 that is configured to generate a digital signal that is representative of the effect on the drive signal that is provided to the electrical node. In addition, the digital signal is output from the ADC 1660 is fed back via a digital to analog converter (DAC) 1662 to a dependent current source that is configured to generate the drive signal that is provided to the electrical node and also to the input of the comparator 1615 that is also coupled to the electrical node. In certain examples, note that the dependent current source is configured to source and/or sink current as may be needed to ensure the voltage at the electrical node tracks, follows, matches, etc. the reference signal. In this diagram, the dependent current source is operated based on digital control signaling from the DAC 1662. In addition, the digital signal that is representative of the effect on the drive signal, as generated by the ADC 1660, is also provided to the one or more processing modules 42. The one or more processing modules 42 is configured to provide control to and be in communication with the DSC 28-16a including to adapt the reference signal so as to adapt the drive signal is provided to the electrical node and also to the input of the comparator 1615 that is also coupled to the electrical node therein as desired to direct and control operation of the electrical node via the drive signal.

Figure 16B:
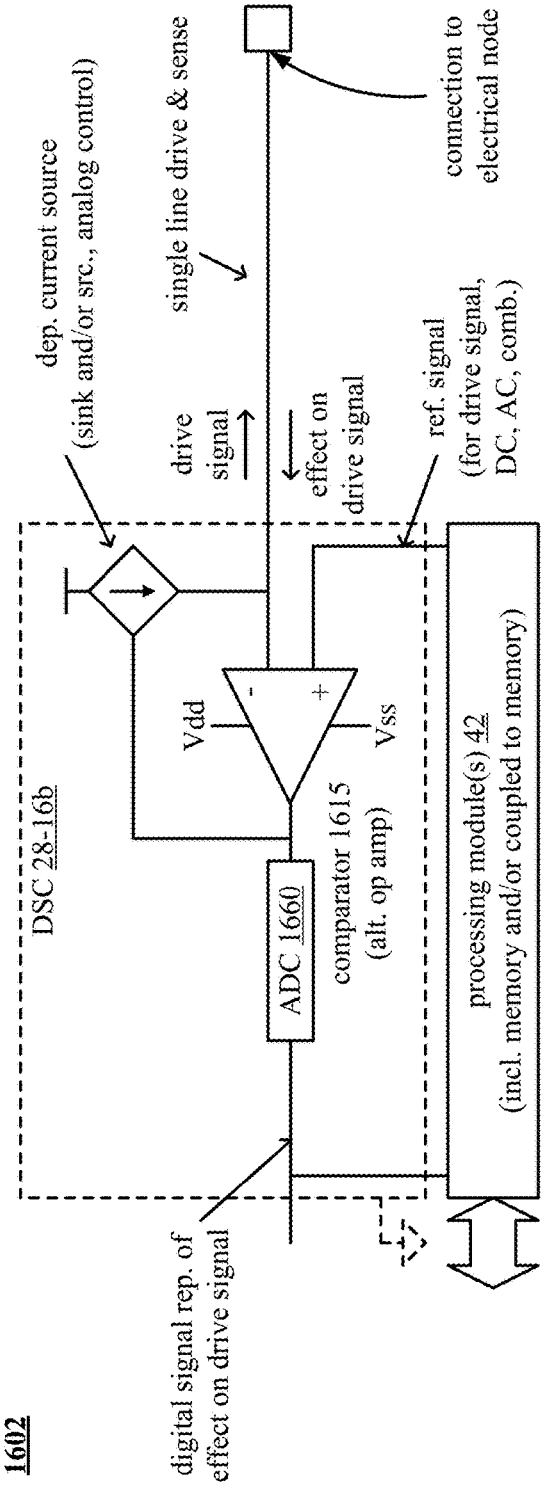
FIG. 16B is a schematic block diagram of another embodiment of a DSC configured simultaneously to drive and sense a drive signal to a connection to an electrical node via a single line in accordance with the present disclosure.

FIG. 16B is a schematic block diagram of another embodiment 1602 of a DSC configured simultaneously to drive and sense a drive signal to a connection to an electrical node via a single line in accordance with the present disclosure. In this diagram, one or more processing modules 42 is configured to communicate with and interact with a drive-sense circuit (DSC) 28-16b. The one or more processing modules 42 is coupled to a DSC 28-16b and is configured to provide control to and support communication with the DSC 28-16b. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

This diagram has some similarities to the previous diagram with at least one difference being that this diagram excludes the DAC 1662 of the prior diagram. In this diagram, within the DSC 28-16b the analog output signal from the comparator 1615 is fed back directly to the dependent current source that is configured to generate the drive signal that is provided to the electrical node and also to the input of the comparator 1615 thereby providing the drive signal (and simultaneously sensing the drive signal) that is provided to the electrical node by the DSC 28-16b. In this diagram, the dependent current source is operated based on analog control signaling from the analog output signal from the comparator 1615.

Figure 17:
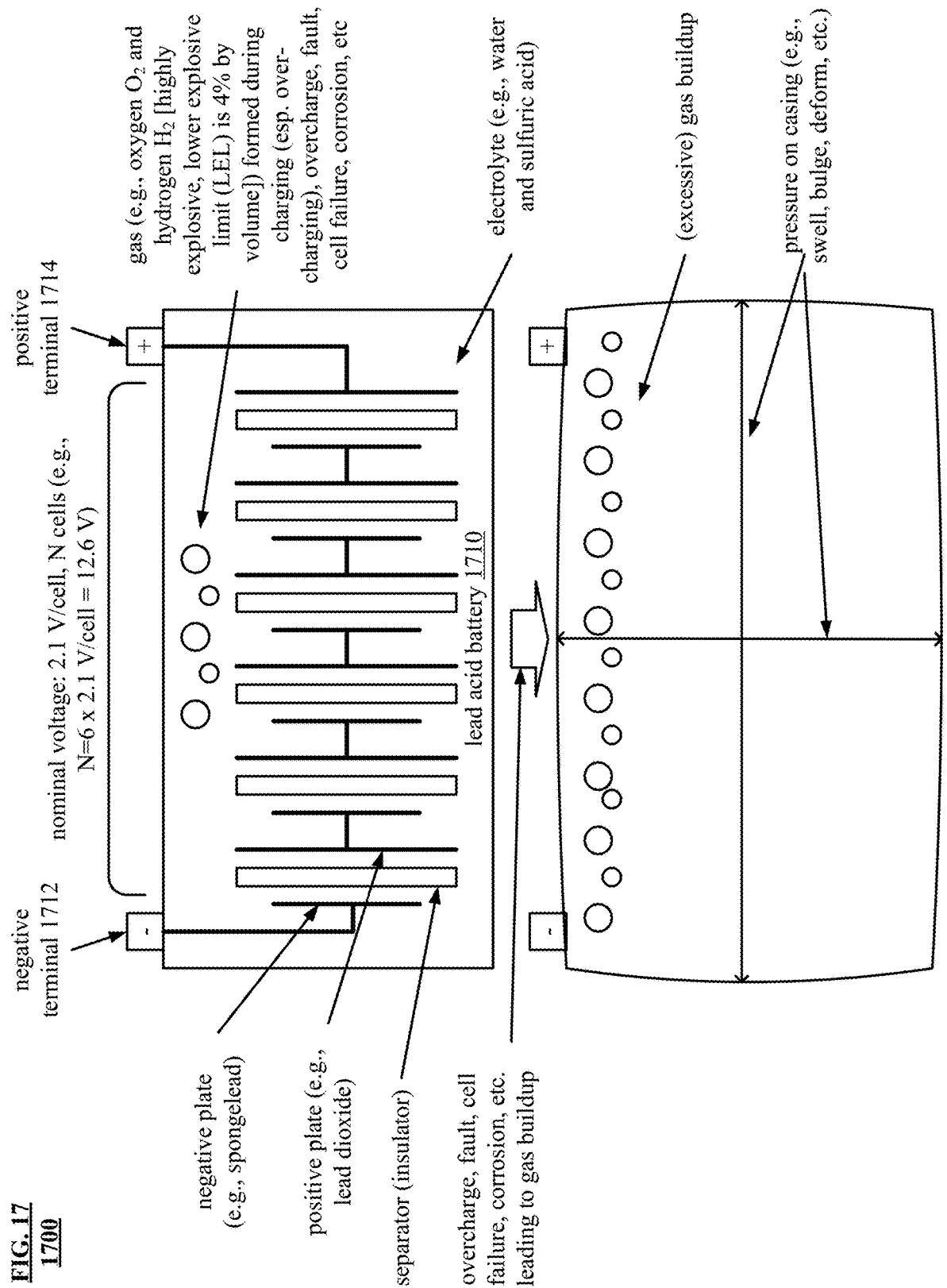
FIG. 17 is a schematic block diagram of an embodiment of a lead acid battery such as may be serviced using one or more DSCs in accordance with the present disclosure.

FIG. 17 is a schematic block diagram of an embodiment 1700 of a lead acid battery such as may be serviced using one or more DSCs in accordance with the present disclosure. Generally speaking, a lead acid battery 1710 includes a number of cells each having approximately a similar voltage per cell (e.g., often times cited as approximately 2.1 V per cell and including 6 respective cells providing a nominal voltage of 12.6 V). In some applications, 2 separate 6 V batteries are implemented within a given battery casing in series with one another to generate an output voltage of approximately 12 V. A nominal 6 V battery may be implemented using three separate single cells each of approximate 2.1 V per cell thereby providing an output voltage of approximately 6.3 V.

Each cell includes a respective negative plate (e.g., such as may be implemented using sponge lead, etc.) and a positive plate (e.g., lead dioxide, etc.). The lead acid battery 1710 also includes a negative terminal 1712 (e.g., anode) that is connected to a negative plate and a positive terminal 1714 (e.g., cathode) that is connected to a positive plate. Within each cell, the negative plate and the positive plate are separated by a separator or insulator. The respective cells are immersed within an electrolyte (e.g., often implemented using water and sulfuric acid).

During a charging cycle, or recharging process, a battery charger is connected to the positive terminal 1714 and the negative terminal 1712. During this process, as electricity flows through the water portion of the electrolyte, some of the water is converted to its basic elements of hydrogen and oxygen thereby producing gas within the casing of the lead acid battery 1710. Gassing of a battery can be problematic for a number of reasons including the fact that these gases are extremely flammable. In addition, the gassing can reduce the amount of water content of the electrolyte and dry out the battery. Some types of lead acid batteries operate such that they are vented to allow these gases to escape, but sealed lead acid batteries do not perform any such bending and keep such gases trapped within the battery casing. Ideally and preferably, when the such gases are trapped within the battery casing, they will recombine into the electrolyte are at however, there can be some instances in which this does not occur such as based on the battery being overcharged, based on the battery including an internal electrical failure of fault, based on an electrical failure or fault within one or more of the cells, based on corrosion within the battery or on the respective battery terminals, based on buildup of lead sulfate on certain plates of the battery, etc. among other possible adverse conditions that can adversely affect the health of a lead acid battery 1710.

With respect to the seriousness of the gases produced within a lead acid battery 1710 in these circumstances, note that oxygen and hydrogen are highly flammable and can even be explosive in certain situations. For example, while hydrogen is not particularly toxic, at high concentrations it is a highly explosive gas having a lower explosive limit (LEL) concentration of approximately 4% by volume. Not only does the buildup of gas within a lead acid battery 1710 can adversely affect the operation of the lead acid battery 1710 (e.g., adversely affecting the electrolyte, drying out the battery by reducing the amount of water within the electrolyte, etc.), but the buildup of such gases can be a potentially dangerous situation.

Gas buildup within the battery casing can generate pressure on the battery casing. For example, this can cause the surface of the battery to swell, bulge, deform, etc. Based on the excess of gas buildup inside. In addition, some non-sealed lead acid batteries include one or more ports via which one or more of the respective cells may be accessed such as to check electrolyte levels, add electrolyte, add water, etc. In such non-sealed lead acid batteries, excessive gas buildup within the battery casing will sometimes affect such ports before affecting other portions of the battery casing in terms of swelling, bulging, deformation, etc.

Figure 18:
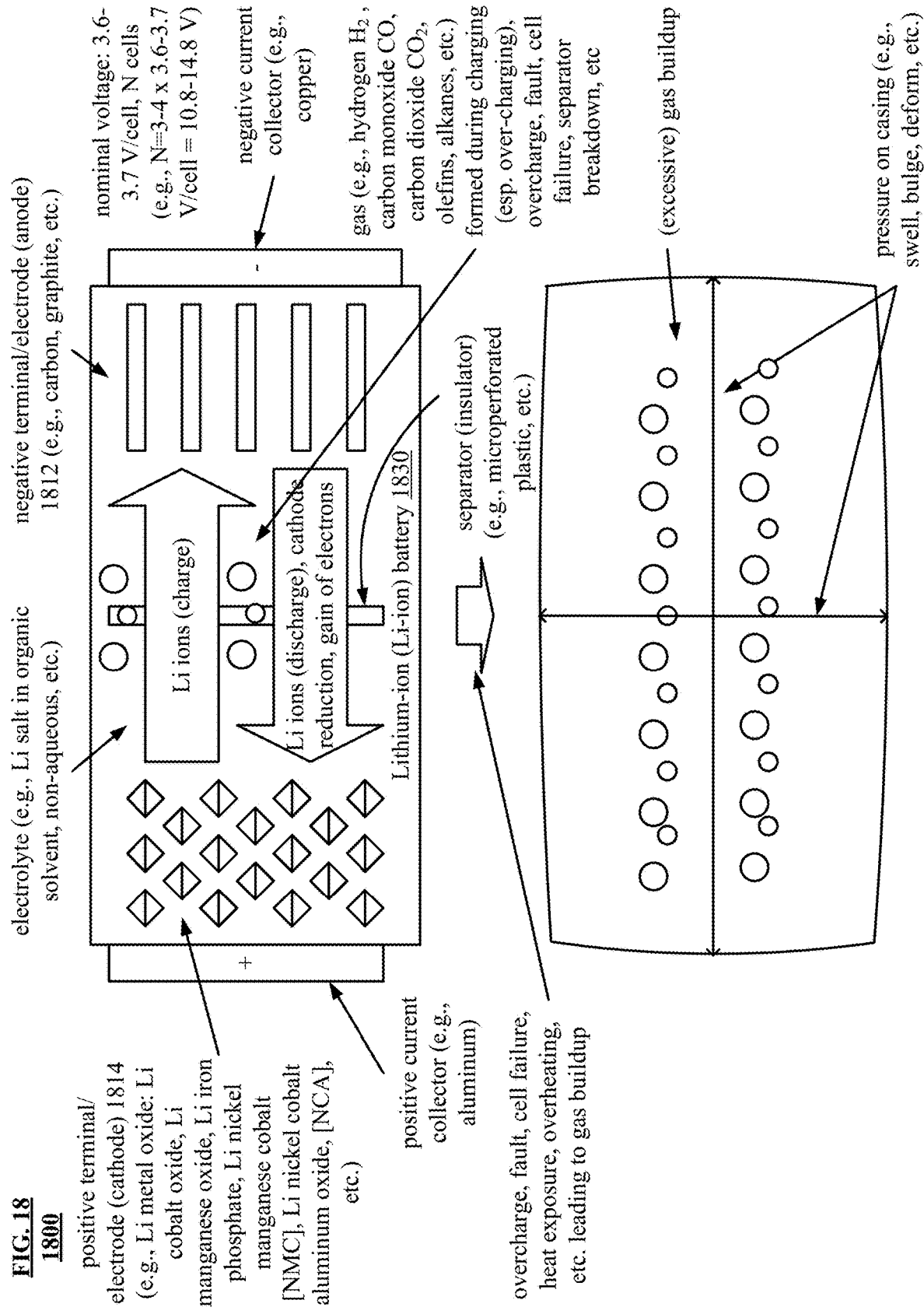
FIG. 18 is a schematic block diagram of an embodiment of a Lithium-ion battery such as may be serviced using one or more DSCs in accordance with the present disclosure.

FIG. 18 is a schematic block diagram of an embodiment 1800 of a Lithium-ion battery such as may be serviced using one or more DSCs in accordance with the present inv disclosure. Another type of battery is a Lithium-ion battery 1830, sometimes referred to as a Li-ion battery. Lithium-ion batteries are used in a variety of applications including portable and user devices such as laptop computers, cell phones, electronic pad devices, personal digital assistants, portable music devices, portable media players, etc. In addition, Lithium-ion batteries have found a great deal of acceptance and traction within electric vehicle applications. For example, Lithium-ion batteries are used in many plug-in hybrid and all-electric vehicles. With respect to an electric vehicle applications, some electric vehicles are powered by what are often referred to as wet Lithium ion batteries that use a liquid electrolytes. There has been significant interest in research efforts to develop Lithium-ion batteries that are implemented in solid-state such that they have cells that are made of solid and dry conductive material. Lithium-ion batteries have application to a wide variety of applications including power tools, electronics, electric vehicles, etc. among other possible applications.

Generally speaking, a Lithium-ion battery 1830 includes one or more cells each having approximately a similar voltage per cell (e.g., often times cited as approximately 3.6 to 3.7 V per cell). Considering one possible example, a Lithium-ion battery 1830 including 3-4 cells each having a nominal approximate voltage of 3.6 to 3.7 V per cell will be able to provide an output voltage within the range of 10.8-14.8 V.

This diagram shows a Lithium-ion battery 1830 that includes a positive current collector, such as made of aluminum, that is connected to a positive terminal/electrode 1814 (e.g., cathode). The positive terminal/electrode 1814 may be constructed of various materials such as Lithium metal oxide, Lithium cobalt oxide, Lithium manganese oxide, Lithium iron phosphate, Lithium nickel manganese cobalt (NMC), Lithium nickel cobalt aluminum oxide (NCA), etc., among other possible candidate materials. The Lithium ion battery 1830 also includes a negative current collector, such as made of copper, that is connected to a negative terminal/electrode 1812 (e.g., anode). The negative terminal/electrode 1812 may be constructed of various materials such as carbon, graphite, etc., among other possible candidate materials.

In addition, and electrolyte facilitates the transportation of Lithium-ion charge between the positive terminal/electrode 1814 in the negative terminal/electrode 1812. The electrolyte may be implemented as a variety of materials such as a Lithium salt in an organic solvent, a non-aqueducts material, etc., among other possible candidate materials. Often times a separator or insulator is implemented within the electrolyte. Such a separator or insulator may be constructed of various materials such as micro perforated plastic, among other possible candidate materials. Generally speaking, the separator or insulator operates to keep the positive terminal/electrode 1814 in the negative terminal/electrode 1812 separated while still facilitating the transportation of lithium ions between the positive terminal/electrode 1814 and the negative terminal/electrode 1812.

During the charging operation of the Lithium-ion battery 1830, Lithium ions are transported from the positive terminal/electrode 1814 to the negative terminal/electrode 1812. During discharge (e.g., such as during load servicing) of the Lithium-ion battery 1830, Lithium ions are transported in the opposite direction from the negative terminal/electrode 1812 to the positive terminal/electrode 1814.

Similar to the gas buildup situation that can occur within lead acid batteries, similar gassing problems may unfortunately occur within lithium ion batteries. For example, in some instances, Lithium-ion batteries have the ability to burst into flames. Generally speaking, the same problems of buildup of flammable or explosive gas that may unfortunately occur within lead acid batteries may unfortunately occur within Lithium-ion batteries and generally batteries of many or most types. Given the prevalence of Lithium-ion batteries in so many applications, even a very percentage of failure can be catastrophic in certain situations. For example, consider the number of products carried by passengers on commercial aircraft that include one or more lithium ion batteries. Even a very small percentage of failure of such batteries that may lead to a potentially hazardous condition or unfortunately a failure such as flaming, bursting into flames, exploding can be catastrophic.

Some examples of the types of gases that may unfortunately build up within a lithium ion battery may include any one or more of hydrogen, carbon monoxide, carbon dioxide, olefins, alkanes, etc., among other types of gases. Such gases may unfortunately be formed during charging, especially during overcharging, by a fault in the battery, cell failure, separator breakdown, overheating, over-use, abuse conditions, etc.

Within Lithium-ion batteries, similar to lead acid batteries, gas buildup within the battery casing can generate pressure on the battery casing. For example, this can cause the surface of the battery to swell, bulge, deform, etc. Various aspects, embodiments, and/or examples of the disclosure (and/or their equivalents) described herein provide various means to facilitate improvement of the operation of the battery, monitoring of the battery, determining the health of the battery, etc. including avoiding one or more unsafe conditions that may unfortunately occur with a battery such as flaming, bursting into flames, exploding, etc.

Figure 19A:
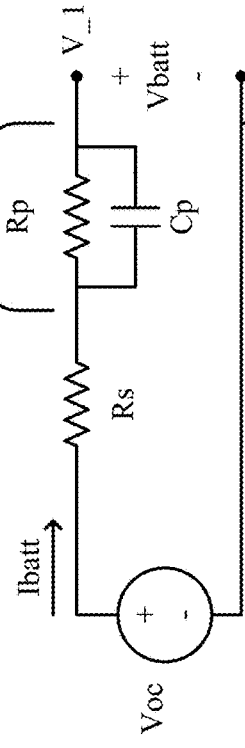
FIG. 19A is a schematic block diagram showing an embodiment of a zero-time-constant model of an equivalent circuit of a battery in accordance with the present disclosure.

FIG. 19A is a schematic block diagram showing an embodiment 1901 of a zero-time-constant model of an equivalent circuit of a battery in accordance with the present invention. This diagram shows an equivalent circuit representation of a battery that includes a voltage source, Voc, corresponding to the open circuit voltage of the battery when no load is connected and a singular resistor, Rs, sometimes characterized as corresponding to the resistance of the electrodes and the electrolyte of the battery, through which the current battery, Ibatt, flows to the terminal of the battery that provides an output voltage, Vbatt, when connected to one or more loads. With respect to this equivalent circuit representation of the battery, the relationship between the various parameters is as follows: Vbatt=Voc−Rs×Ibatt. In some examples, in this diagram and others herein, note that a terminal of the battery that serves as the positive end of Vbatt may be viewed as V_1 such as with respect to various other diagrams herein (e.g., V_1 corresponding to the voltage at a point that is proximate to a terminal of the battery, such as close to the terminal of the battery.

As can be seen with respect to this diagram, the internal impedance of the battery is shown solely as a singular resistor, Rs. There are many other possible equivalent circuit representations of the battery including those described below that provide representation of reactance components of the impedance of the battery including characterizing that impedance using capacitive and/or inductive components showing variation of that impedance as a function of frequency. Such an equivalent circuit model of the battery in accordance with this diagram may be used for various battery types including lead acid and Lithium-ion.

Figure 19B:
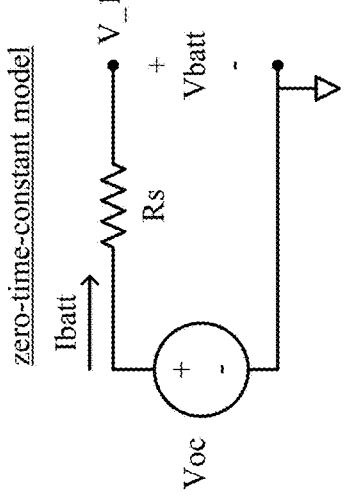
FIG. 19B is a schematic block diagram showing an embodiment of a one-time-constant model of an equivalent circuit of a battery in accordance with the present disclosure.

FIG. 19B is a schematic block diagram showing an embodiment 1902 of a one-time-constant model of an equivalent circuit of a battery in accordance with the present invention. This diagram shows an alternative equivalent circuit representation of a battery that includes a voltage source, Voc, corresponding to the open circuit voltage of the battery when no load is connected, an in-line resistor, Rs, sometimes characterized as corresponding to the resistance of the electrodes and the electrolyte of the battery, and also a RC network including a resistor, Rp, and a capacitor, Cp, implemented in parallel and corresponding to the transient response of the battery charge/discharge profile, through which the current battery, Ibatt, flows to the terminal of the battery that provides an output voltage, Vbatt, when connected to one or more loads. The resistor, Rp, and the capacitor, Cp, may be viewed as corresponding to the charge transfer resistance that is encountered upon charge transfer from electrode to electrolyte (Rp) and the double layer capacitance of the battery (Cp).

With respect to this equivalent circuit representation of the battery, the relationship between the various parameters is as follows:

$$V\text{batt}(t)=V\text{oc}-I\text{batt}\times(Rs+Rp)+(I\text{batt}\times Rp-Vp(t=0))\exp((-t/(Rp\times Cp)))$$

Note that at time, t=0, Vp(t=0)=Voc−Ibatt×(Rs)−Vbatt (t=0).

Note that some alternative equivalent circuit models operate by adding additional RC elements in the chain of the top half of the equivalent circuit model. In some modeling, the addition of a chain of RC elements is used to represent the diffusion impedance of the battery, such as with respect to a Lithium-ion battery.

Note that there are other equivalent circuit models that may alternatively be used to represent the characteristics of a battery. For example, some alternative equivalent circuit models of a Lithium-ion battery include more than two RC networks each including a respective resistor and a respective fastener, as well as one or more in-line capacitors connecting between the final RC network in the chain and the terminal of the battery. For example, one possible alternative equivalent circuit model is a dual polarization (DP) model as described below.

Figure 19C:
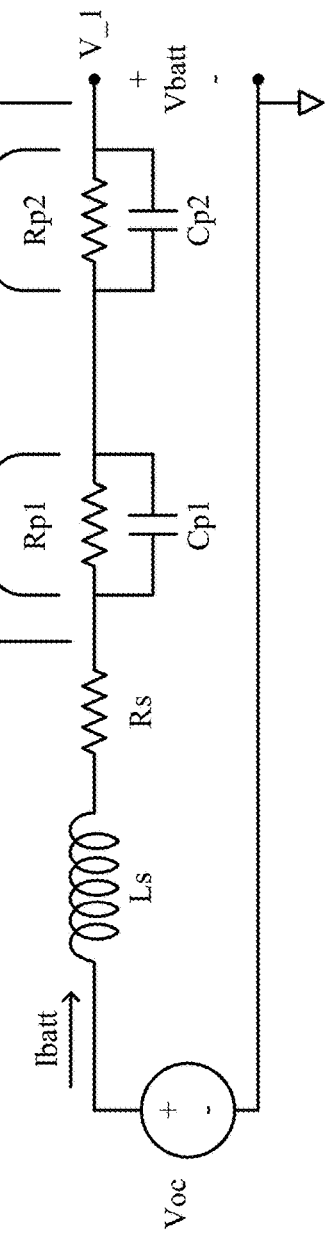
FIG. 19C is a schematic block diagram showing an embodiment of a dual polarization (DP) model of an equivalent circuit of a battery in accordance with the present disclosure.

FIG. 19C is a schematic block diagram showing an embodiment 1903 of a dual polarization (DP) model of an equivalent circuit of a battery in accordance with the present invention. This diagram shows yet another alternative equivalent circuit representation of a battery that includes a voltage source, Voc, corresponding to the open circuit voltage of the battery when no load is connected, an in-line inductor used to model inductive behavior of the battery at very high frequencies, Ls, an in-line resistor, Rs, sometimes characterized as corresponding to the resistance of the electrodes and the electrolyte of the battery, and also multiple RC networks each including a respective resistor, Rp1 and Rp2, and a respective capacitor, Cp1 and Cp2, each respectively implemented in parallel and corresponding to the transient response of the battery charge/discharge profile as well as representing the diffusion impedance of the battery, through which the current battery, Ibatt, flows to the terminal of the battery that provides an output voltage, Vbatt, when connected to one or more loads.

FIG. 20A is a schematic block diagram showing an embodiment 2001 of a battery that is connected or coupled to a load in accordance with the present disclosure. Referring to embodiment 2001, a battery 2010 is connected to a load 2020 via a wire. The voltage at a first point along the wire that is proximate to a first terminal of the battery is shown as V_1 (e.g., the positive terminal of battery). A second terminal of the battery (e.g., the negative terminal of the battery) is connected to electrical ground, GND. The voltage at a second point along the wire that is proximate to a terminal of the load 2020 is shown as V_2.

Because of the impedance (Z) of the wire that connects the battery 2010 to the load 2020, as current (Isource) flows from the battery 2010 to the load 2020, there is a slight voltage difference between V_1 and V_2. In certain examples, both voltages V_1 and V_2 are DC voltages. The difference between the two voltages, V_1 and V_2, is a product of the current flowing through the wire and the impedance of the wire. For example, V_1−V_2=Isource× Zwire. In other examples, one or more AC signals is applied to one or both of the first point and the second point along the wire that are respectively proximate to the first terminal of the battery 2010 and the terminal of the load 2020. For example, with respect to other embodiments herein, an AC signal is applied to the first point along the wire that is proximate to the first terminal of the battery 2010. In even other examples, an AC signal is applied to the second point along the wire that is proximate to the terminal of the load 2020.

FIG. 20B is a schematic block diagram showing an embodiment 2002 of a battery that is connected or coupled to a load, and an associated electrical model of that configuration, in accordance with the present disclosure. This diagram is similar to the previous diagram but shows the schematic representation of the components used to model a transmission line. For example, a resistive element, R, and an inductive element, L, are shown to be connected in series with one another between the first terminal of the battery 2010 and the terminal of the load 2020. In addition, a capacitive element, C, is shown as a shunt capacitor connected from the wire to ground. In certain examples, a conductance, G, is also included as being connected from the wire to ground. The characteristic impedance of the wire, Zwire, is as follows:

$$Zwire = sqrt(R+j\omega L)/(G+j\omega C)],$$

where $\omega = 2\pi f$, where f is frequency in Hz

At lower frequencies including at DC, the inductive and capacitive components contribute very little to the characteristic impedance of the wire, Zwire. As frequency increases, the characteristic impedance of the wire, Zwire, increases as the inductive and capacitive components contribute more significantly. On the lower right-hand portion of the diagram, a diagram showing the magnitude of the characteristic impedance of the wire, Zwire (mag), as a function of frequency. At lower frequencies including DC, the characteristic impedance of the wire is predominantly R. As frequency increases, the other components including the inductive and capacitive components can change the magnitude of the characteristic impedance of the wire, Zwire (mag), which may increase or decrease as a function of increasing frequency.

Figure 21A:
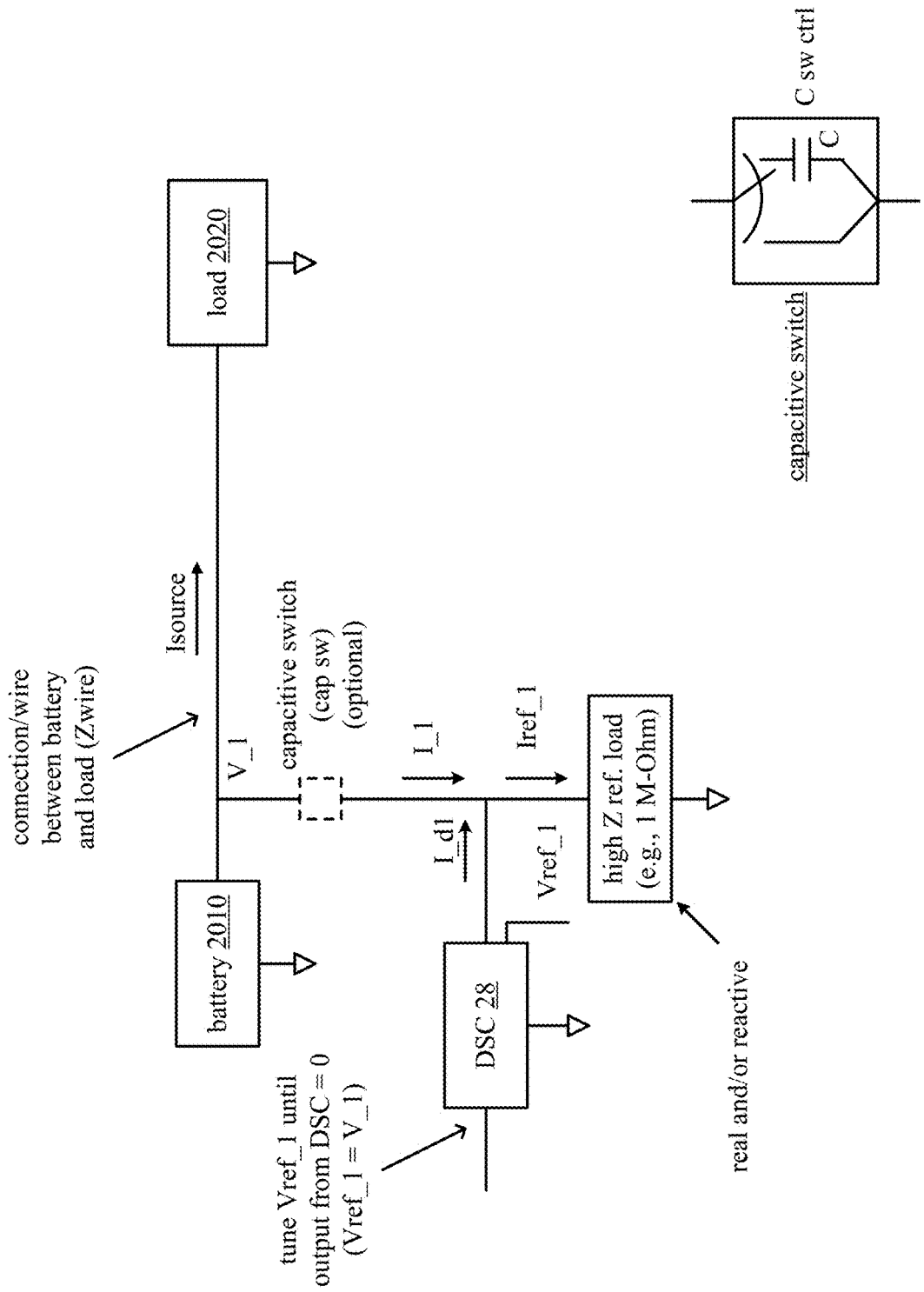
FIG. 21A is a schematic block diagram showing an embodiment of a battery that is connected or coupled to a load and a DSC that is implemented to detect voltage in conjunction with a high impedance (Z) reference load in accordance with the present disclosure.

FIG. 21A is a schematic block diagram showing an embodiment 2101 of a battery that is connected or coupled to a load and a DSC that is implemented to detect voltage in conjunction with a high impedance (Z) reference load in accordance with the present disclosure. This diagram shows a DSC 28 that is connected or coupled to a point of the wire that is proximate to a first terminal of the battery 2010. The voltage at this point along the wire shown as V_1. A high impedance (Z) reference load is shunted to ground from the point of the wire this proximate to the first terminal of the battery 2010. By using a high impedance (Z) reference load, any effect to the system provided by the DSC 28 that is configured to determine the voltage at the point of the wire that is proximate to the first terminal of the battery 2010 is minimal. By using a high impedance (Z) reference load, a very small amount of current, I_1, will flow from the point of the wire that is proximate to the first terminal of the battery 2010.

Generally speaking, the high impedance (Z) may be real (e.g., purely resistive) and/or reactive (e.g., also inductive and/or capacitive) in nature. In addition, note that the high impedance (Z) reference load may be of a very high impedance (e.g., 1 Mega-Ohms or more). Because the DSC 28 is configured to detect such small voltages (e.g., including values within milli-volts, micro-volts, nano-volts, pico-volts, and even smaller values), a very high impedance (Z) reference load may be used. Because the DSC 28 is configured to detect voltages with such precision, different respective DSCs 28 may be configured to detect voltages at different points along the wire connecting a first terminal of the battery 2010 to a terminal of the load 2020 and to detect even very small differences between those voltages e.g., including values within milli-volts, micro-volts, nano-volts, pico-volts, and even smaller values).

In an example of operation and implementation, the reference voltage of the DSC, Vref_1, is set to a first value. In certain examples, the reference voltage of the DSC, Vref_1, is initially set to an estimated voltage of the battery, such as an estimate of the voltage that is at the point along the wire that is proximate to the first terminal of the battery 2010, namely, V_1. For example, consider that the battery is rated as a 12 V battery, then reference voltage of the DSC, Vref_1, is initially set to 12 V. Alternatively, consider that the battery is rated as a 3.5 V battery, then reference voltage of the DSC, Vref_1, is initially set to 3.5 V.

Then, the reference voltage of the DSC 28, Vref_1, is tuned until it compares favorably with the voltage, V_1, at the point along the wire that is proximate to the first terminal of the battery 2010. When Vref_1 and V_1 compare favorably, the voltage, V_1, at the point along the wire that is proximate to the first terminal of the battery 2010 is known. For example, the DSC 28 will not output any current I_d1 (I_d1=0) when Vref_1=V_1, and the current Iref_1 will then be equal to I_1 (Iref_1=I_1).

The reference voltage of the DSC 28, Vref_1, is known, and when the DSC 28 is no longer outputting any current I_d1 (I_d1=0), then it is known that Vref_1=V_1. The DSC 28 is configured to determine the voltage, V_1, at the point along the wire that is proximate to the first terminal of the battery 2010.

Considering an example in which the voltage, V_1, at the point along the wire that is proximate to the first terminal of the battery 2010 is 12 V, and considering a high impedance (Z) reference load of 1 mega-ohms, then based on the reference voltage of the DSC, Vref_1, being tuned so that Vref_1=V_1, then DSC 28 does not output any current I_d1 (I_d1=0), and the current Iref_1 will then be equal to I_1 (Iref_1=I_1). V_1=I_1×Z, and I_1=V_1/Z. In this particular example, considering V_1=12 V, and Z=1 mega-ohms, then I_1=Iref_1=0.000012 or 12 micro-amps (µA). Alternatively, consider an example that voltage, V_1, at the point along the wire that is proximate to the first terminal of the battery 2010 is 4 V, then based on reference voltage of the DSC, Vref_1, being tuned so that Vref_1=V_1, considering V_1=4 V, and Z=1 mega-ohms, then I_1=Iref_1=0.000004 or 4 micro-amps (µA).

This implementation and others described herein facilitates the measuring of a voltage at any desired point along the wire connecting the battery to the load. In some examples, the point along the wire is proximate to the first terminal of the battery 2010. In other examples, the point along the wire is proximate to the terminal of the load 2020. Generally speaking, the point along the wire may be anywhere along the wire. In addition, other embodiments, examples, etc. operate to include two or more such circuits to facilitate the determination of two or more voltages at two or more points along the wire. Because of the high resolution and extremely small signals that may be detected using a DSC as described herein, a determination of the difference of these voltages at different points along the wire may be made based on the inherent impedance (Z) of the wire including to determine even very small differences of voltages at different respective points along the wire.

Figure 21B:
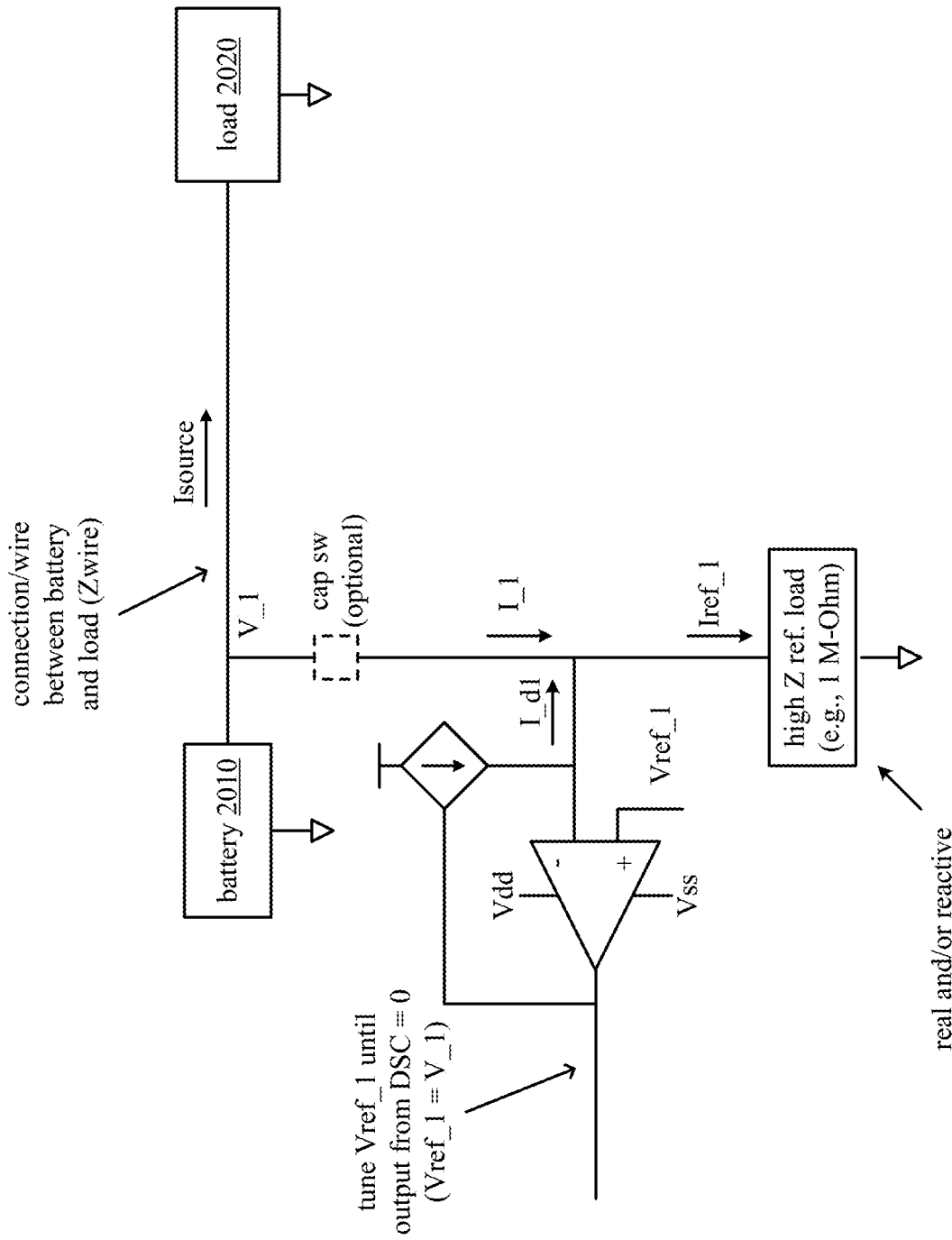
FIGS. 21B and 21C are schematic block diagrams showing other embodiments of a battery that is connected or coupled to a load and a DSC that is implemented to detect voltage in conjunction with a high impedance (Z) reference load in accordance with the present disclosure.
Figure 21C:
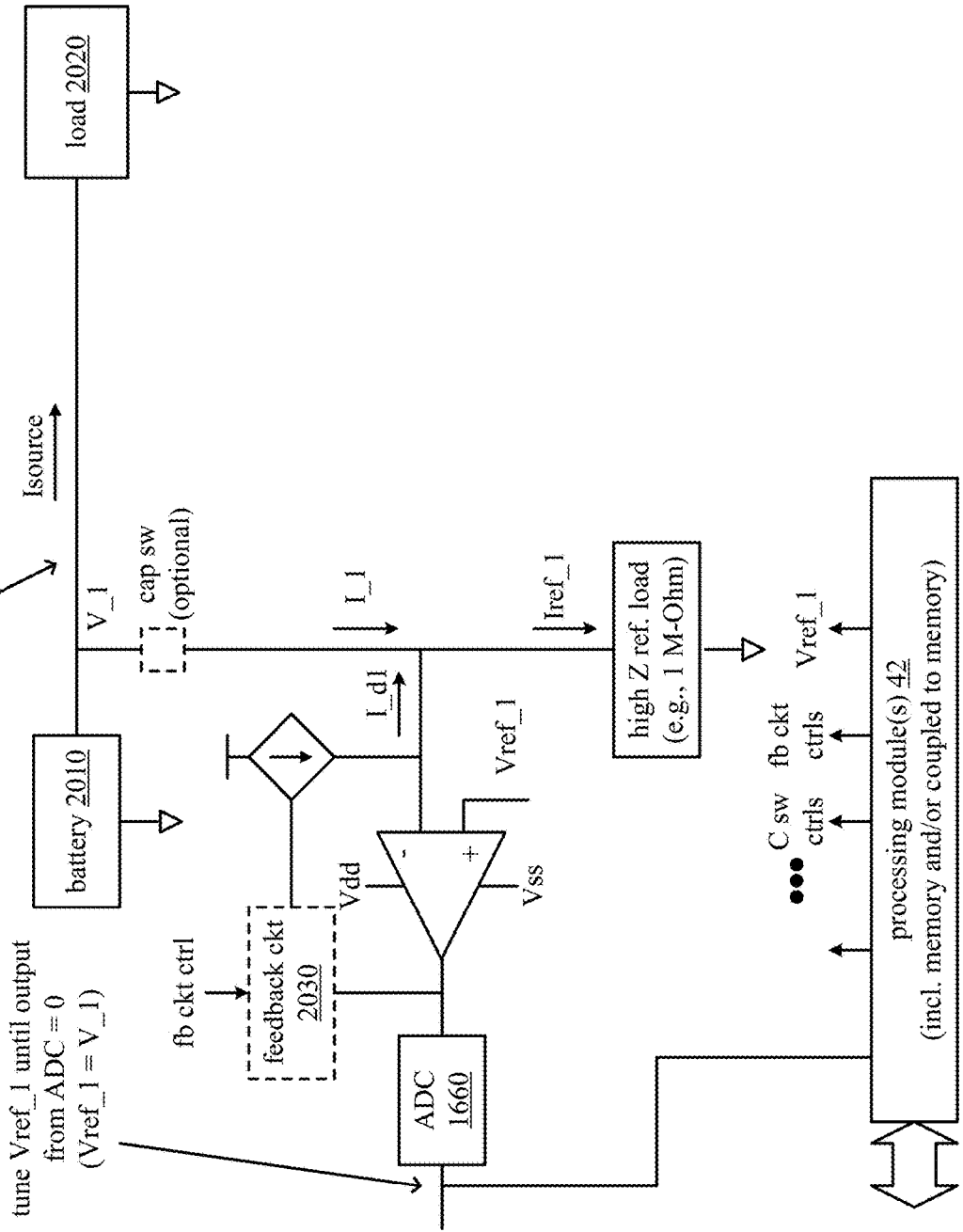

FIGS. 21B and 21C are schematic block diagram showing other embodiments 2102 and 2103 of a battery that is connected or coupled to a load and a DSC that is implemented to detect voltage in conjunction with a high impedance (Z) reference load in accordance with the present disclosure.

Referring to embodiment 2102, this diagram has some similarities to the previous diagram and shows an implementation of a DSC in more detail. The DSC includes a comparator or operational amplifier that receives a reference voltage, Vref_1, at one of its input terminals, and that has the other of one of its input terminals connected to the line that connects to the point along the wire that is proximate to the first terminal of the battery 2010. The output of the comparator or operational amplifier provides the control signal to a dependent current source that is configured to supply a current I_d1 that combines with the current that is provided from the point along the wire that is proximate to the first terminal of the battery, I_1, to generate the reference current, Iref_1, that flows through the high impedance (Z) reference load. Note that the dependent current source is configured to source and/or sink current as may be needed to ensure the voltage at the electrical node tracks, follows, matches, etc. the reference voltage, Vref_1. The comparator or operational amplifier is connected to a power supply voltage (e.g., Vdd and Vss, such as Vdd being the positive supply voltage, and Vss being the ground voltage or 0 V).

In an example of operation and implementation, the reference voltage of the DSC, Vref_1, is set to a first value. In certain examples, the reference voltage of the DSC, Vref_1, is initially set to an estimated voltage of the battery, such as an estimate of the voltage that is at the point along the wire that is proximate to the first terminal of the battery 2010, namely, V_1. Then, the reference voltage of the DSC, Vref_1, is tuned until it compares favorably with the voltage, V_1, at the point along the wire that is proximate to the first terminal of the battery 2010. When Vref_1 and V_1 compare favorably, the voltage at the voltage, V_1, at the point along the wire that is proximate to the first terminal of the battery 2010 is known. For example, the DSC will not output any current I_d1 (I_d1=0) when Vref_1=V_1, and the current Iref_1 will then be equal to I_1 (Iref_1=I_1). The determination that Vref_1 and V_1 compares favorably may be made based on the output of the comparator or operational amplifier being zero, the dependent current source no longer supplying the current I_d1, etc. When Vref_1 and V_1 compare favorably, the voltage, V_1, at the point along the wire that is proximate to the first terminal of the battery 2010 is known. For example, the DSC will not output any current I_d1 (I_d1=0) when Vref_1=V_1, and the current Iref_1 will then be equal to I_1 (Iref_1=I_1).

Referring to embodiment 2103, this diagram is similar to the previous diagram and also includes an analog to digital converter (ADC) 1660 that is configured to process the output signal of the comparator or operational amplifier to generate a digital signal. The output signal of the comparator or operational amplifier is representative of any difference between the reference voltage, Vref_1, and the voltage, V_1, at the point along the wire that is proximate to the first terminal of the battery 2010.

In addition, in certain examples, a feedback circuit 2030 is configured to process the output signal of the comparator or operational amplifier to generate the control signaling for the dependent current source. In certain examples, the feedback circuit 2030 is configured to scale (e.g., amplify or divide) the output signal of the comparator or operational amplifier to provide a scaled version of the output signal of the comparator or operational amplifier as the control signaling for the dependent current source. Generally speaking, the feedback circuit 2030 is configured to perform any desired processing to the output signal of the comparator or operational amplifier to generate a processed version of the output signal of the comparator or operational amplifier as the control signaling for the dependent current source.

In addition, this diagram includes one or more processing modules 42. The one or more processing modules 42 includes memory and/or is coupled to memory that stores operational instructions. The one or more processing modules 42 is configured to execute the operational instructions to facilitate operation of the DSC. In some examples, the one or more processing modules 42 is configured to provide the reference voltage, Vref_1, that is provided to one of the input terminals of the comparator or operational amplifier. In addition, the one or more processing modules 42 is configured to direct the operation of the feedback circuit 2030, when such a feedback circuit 2030 is implemented. A feedback circuit control signal (fb ckt ctrl) is provided to the feedback circuit 2030 to direct the manner in which feedback circuit 2030 is to process the output signal the comparator or operational amplifier generate the control signaling for the dependent current source. In addition, any other control may be provided from the one or more processing modules 42 to facilitate operation of the DSC to determine the voltage, V_1, at the point along the wire that is proximate to the first terminal of the battery 2010.

FIGS. 21D, 21E, 21F, and 21G are schematic block diagrams showing various embodiments 2104, 2105, 2106, and 2107 of feedback circuits that may be implemented within a DSC in accordance with the present disclosure.

Referring to embodiment 2104, this diagram shows an amplifier that is configured to process an input signal, Vin, to generate an output signal, Vout. For example, consider the input signal, Vin, to be the output signal of the comparator or operational amplifier of a DSC and the output signal, Vout, to be the control signaling for the dependent current source of the DSC. Note that the amplifier may be implemented in a variety of different ways, such as a variable gain amplifier (VGA), a programmable gain amplifier (PGA), etc. Note that the gain control signaling of the amplifier may be provided via digital or analog signaling depending on the particular implementation. Generally speaking, the output signal, Vout, is a function of the input signal, Vin, such as Vout=f(Vin). Consider the scaling factor of the amplifier to be k, then Vout=k×Vin.

Referring to embodiment 2105, this diagram shows a voltage divider that includes two resistors, R1 and R2. In certain examples, at least one of the resistors is variable/adjustable. The voltage at the node connecting the two resistors, R1 and R2, is Vout and is a function of the two resistors, R1 and R2, and the input voltage, Vin.

$$Vout=Vin \times (R2/(R1+R2)).$$

For example, consider the input signal, Vin, to be the output signal of the comparator or operational amplifier of a DSC and the output signal, Vout, to be the control signaling for the dependent current source of the DSC. This diagram shows one possible implementation by which the output signal of the comparator or operational amplifier of a DSC may be scaled to provide a scaled version of the output signal of the comparator or operational amplifier as the control signaling for the dependent current source of the DSC. For example, consider the input signal, Vin (analog), to be the output signal of the comparator or operational amplifier of a DSC and the output signal, Vout (analog), to be the control signaling for the dependent current source of the DSC.

Referring to embodiment 2106, this diagram shows an analog to digital converter (ADC) 1660 that is configured to process an input signal, Vin, to generate a digital signal representative of the input signal, Vin. One or more processing modules 42, which include memory and/or are coupled to memory that stores operational instructions, is configured to perform any desired digital signal processing on the digital signal representative of the input signal, Vin, to generate a digital version of an output signal, Vout. A digital to analog converter (DAC) 1662 that is configured to process the digital signal representative of an output signal, Vout, to generate the output signal, Vout, in analog form.

Note that the digital signal processing is performed by the one or more processing modules may include any type of digital signal processing, which may include gain adjust, scaling, filtering, etc.

Referring to embodiment 2107, this diagram is similar to the previous diagram with at least one difference being that digital version of an output signal, Vout, is provided for digital control. For example, consider a dependent current source within the DSC that is operative based on a digital control signal, then a digital version of an output signal, Vout, may be used to provide the control signaling for that dependent current source within the DSC. For example, consider the input signal, Vin (analog), to be the output signal of the comparator or operational amplifier of a DSC and the output signal, Vout (digital), to be the control signaling for the dependent current source of the DSC.

FIG. 21H is a schematic block diagram of an embodiment of a method 2108 for execution by one or more devices in accordance with the present disclosure.

The method 2108 operates in step 2180 by setting a first DSC reference voltage, Vref_1, to a first value to produce a first reference current, Iref_1. For example, the first value of the DSC reference voltage, Vref_1, may be set to an estimated voltage of a battery (e.g., an estimate of V_1). The voltage, V_1, is at a point that is proximate to a terminal of the battery along a wire connecting the terminal of the battery to a terminal of a load.

The method 2108 also operates in step 2182 by tuning the DSC reference voltage, Vref_1, to compare favorably with the voltage, V_1, at the point along the wire that is proximate to the terminal of the battery. The method 2108 also operates in step 2184 by determining whether the DSC reference voltage, Vref_1, to compare favorably with the voltage, V_1, based on the tuning. For example, this may be determined based on the operational amplifier or comparator output being zero, the dependent current source of a DSC not needing to provide any current, I_d1, or some other basis, etc.

Based on the DSC reference voltage, Vref_1, comparing favorably with the voltage, V_1, based on the tuning, as determined in step 2186, the method 2108 branches to step 2188 operates by determining with the voltage, V_1. This is determined based on the tuned value of the DSC reference voltage, Vref_1. Referring back to certain of the previous diagrams, this corresponds to the situation that the output of the comparator or operational amplifier is zero, DSC reference voltage, Vref_1, is equal to V_1 (Vref_1=V_1), the dependent current source of a DSC no longer provides any current, I_d1, such that I_d1=0 and Iref_1=I_1. The value of the DSC reference voltage, Vref_1, is known, and therefore V_1 is also known based on Vref_1=V_1.

Alternatively, based on the DSC reference voltage, Vref_1, comparing unfavorably with the voltage, V_1, as determined in step 2186, the method 2108 branches back to step 2182 and continues to perform tuning of the DSC reference voltage, Vref_1. The tuning continues until the DSC reference voltage, Vref_1, compares favorably with the voltage, V_1, which facilitates the determination of voltage, V_1.

FIG. 22A is a schematic block diagram showing an embodiment 2201 of a battery that is connected or coupled to a load and a DSC that is implemented to detect voltage without a high impedance (Z) reference load in accordance with the present disclosure. This diagram has some similarities to FIG. 21A yet does not include a high impedance (Z) reference load. In this diagram, the path to ground is within the DSC 28. The DSC reference voltage, Vref_1, is tuned until the output of the DSC is zero, based on Vref_1=V_1, so that the voltage, V_1, at the point along the wire that is proximate to the terminal of the battery 2010 is determined. In this diagram, the DSC 28 itself serves as a high impedance component connecting or coupling to ground. The DSC 28 minimally affects the circuit that includes the battery 2010 that is connected to the load 2020 via the wire.

FIGS. 22B and 22C are schematic block diagrams showing other embodiments 2202 and 2203 of a battery that is connected or coupled to a load and a DSC that is implemented to detect voltage without a high impedance (Z) reference load in accordance with the present disclosure.

Referring to embodiment 2202, this diagram has similarities to many of the previous diagrams including a battery 2010 that is connected to a load 2020 and the wire. The DSC is coupled or connected to a point along the wire that is proximate to a terminal of the battery and is configured to determine the voltage, V_1, at that point. The DSC includes a comparator or operational amplifier that receives DSC reference voltage, Vref_1, at one of its inputs and has its other input connected to the output of a dependent current source and also to that point along the wire that is proximate to the terminal of the battery. The output of the comparator or operational amplifier is provided via a feedback circuit 2030 that is configured to generate the control signaling for the dependent current source. The dependent current source is configured to source and/or sink current as may be needed to ensure the voltage, V_1, at the electrical node tracks, follows, matches, etc. the DSC reference voltage, Vref_1. The comparator or operational amplifier is connected to a power supply voltage (e.g., Vdd and Vss, such as Vdd being the positive supply voltage, and Vss being the ground voltage or 0 V).

The feedback circuit 2030 is configured to perform any desired processing on the output of the comparator or operational amplifier to generate the control signaling for the dependent current source. In an example of operation and implementation, the feedback circuit 2030 is configured to scale the output signal of the comparator or operational amplifier. The gain adjustment of the feedback circuit 2030 is configured to affect the slope of the linear region of operation of the comparator or operational amplifier between the rails of the power supply. For example, consider the rails of the power supply voltage to be Vdd and Vss, then the output of the comparator or operational amplifier will be linear when the DSC reference voltage, Vref_1, is within that range between Vdd and Vss. Particularly, when the DSC reference voltage, Vref_1, it at the midpoint between these rails of the power supply voltage, at the midpoint of the linear region of operation of the comparator or operational amplifier, then the DSC reference voltage, Vref_1, is equal to the voltage, V_1.

Referring to embodiment 2203, this diagram is similar to the previous diagram and also includes an analog to digital converter (ADC) 1660 that is configured to process the output signal of the comparator or operational amplifier to generate a digital signal. that is representative of any difference between the reference voltage, Vref_1, and the voltage, V_1, at the point along the wire that is proximate to the first terminal of the battery 2010.

In addition, in certain examples, a feedback circuit 2030 is configured to process the output signal of the comparator or operational amplifier to generate the control signaling for the dependent current source. In certain examples, the feedback circuit 2030 is configured to scale (e.g., amplified or divide) the output signal of the comparator or operational amplifier to provide a scaled version of the output signal of the comparator or operational amplifier as the control signaling for the dependent current source. Generally speaking, the feedback circuit 2030 is configured to perform any desired processing to the output signal of the comparator or operational amplifier to generate a process to version of the output signal of the comparator or operational amplifier as the control signaling for the dependent current source.

In addition, this diagram includes one or more processing modules 42. The one or more processing modules 42 includes memory and/or is coupled to memory that stores operational instructions. The one or more processing modules 42 is configured to execute the operational instructions to facilitate operation of the DSC. In some examples, the one or more processing modules 42 is configured to provide the reference voltage, Vref_1, that is provided to one of the input terminals of the comparator or operational amplifier. In addition, the one or more processing modules 42 is configured to direct the operation of the feedback circuit 2030, when such a feedback circuit 2030 is implemented. A feedback circuit control signal (fb ckt ctrl) is provided to the feedback circuit 2030 to direct the manner in which feedback circuit 2030 is to process the output signal the comparator or operational amplifier generate the control signaling for the dependent current source. In addition, any other control may be provided from the one or more processing modules 42 to facilitate operation of the DSC to determine the voltage, V_1, at the point along the wire that is proximate to the first terminal of the battery 2010.

FIG. 22D is a schematic block diagram of an embodiment of a method 2204 for execution by one or more devices in accordance with the present disclosure. The method 2204 operates in step 2280 by setting a DSC reference voltage, Vref_1, to a first value. For example, DSC reference voltage, Vref_1, is set to an estimated voltage of the terminal of the battery. the voltage, V_1, is the voltage at a point along the wire that is proximate to the first terminal of the battery.

The method 2204 also operates in step 2282 by tuning the DSC reference voltage, Vref_1, to compare favorably with the voltage, V_1, that is the voltage at the point along the wire that is proximate to the first terminal of the battery.

The method 2204 also operates in step 2284 by determining whether the DSC reference voltage, Vref_1, compares favorably with the voltage, V_1. Favorable comparison of the DSC reference voltage, Vref_1, and the voltage, V_1, is based on the DSC reference voltage, Vref_1, being at the halfway point between the rails of the voltage power supply. For example, this may be viewed as a halfway point between Vdd and Vss, or between Vdd and ground (GND).

Based on the DSC reference voltage, Vref_1, comparing favorably with the voltage, V_1, based on the tuning, as determined in step 2286, the method 2204 branches to step 2288 operates by determining with the voltage, V_1. This is determined based on the tunes value of the DSC reference voltage, Vref_1. Referring back to certain of the previous diagrams, this corresponds to the situation that the output of the comparator or operational amplifier is zero, DSC reference voltage, Vref_1, is equal to V_1 (Vref_1=V_1), the dependent current source of a DSC no longer provides any current, I_d1, such that I_d1=0 and Iref_1=I_1. The value of the DSC reference voltage, Vref_1, is known, and therefore V_1 is also known based on Vref_1=V_1.

Alternatively, based on the DSC reference voltage, Vref_1, comparing unfavorably with the voltage, V_1, as determined in step 2286, the method 2204 branches back to step 2282 and continues to perform tuning of the DSC reference voltage, Vref_1. The tuning continues until the DSC reference voltage, Vref_1, compares favorably with the voltage, V_1, which facilitates the determination of voltage, V_1.

FIG. 23A is a schematic block diagram showing an embodiment 2301 of a battery that is connected or coupled to a load and multiple DSCs that are implemented to detect voltages in conjunction with high impedance (Z) reference loads in accordance with the present disclosure. This diagram also includes a battery 2010 that is coupled or connected to a load 2020 via a wire. In this diagram, the first DSC 28 is configured to determine a voltage, V_1, at a first point along the wire that is proximate to a first terminal of the battery 2010, and a second DSC 28 is configured to determine a voltage, V_2, of a second point along the wire that is proximate to a terminal of the load 2020. In addition, a respective high impedance (Z) reference load is connected from the first point along the wire and the second point along the wire to ground.

Each of the DSCs operates as described above with respect to FIG. 21A to determine the voltage, V_1, at the first point along the wire that is proximate to a first terminal of the battery 2010 and the voltage, V_2, of the second point along the wire that is proximate to a terminal of the load 2020.

In an example of operation and implementation, the reference voltage of the first DSC, Vref_1, is set to a first value. Then, the reference voltage of the first DSC 28, Vref_1, is tuned until it compares favorably with the voltage, V_1, at the point along the wire that is proximate to the first terminal of the battery 2010. When Vref_1 and V_1 compare favorably, the voltage, V_1, at the point along the wire that is proximate to the first terminal of the battery 2010 is known. For example, the first DSC 28 will not output any current I_d1 (I_d1=0) when Vref_1=V_1, and the current Iref_1 will then be equal to I_1 (Iref_1=I_1).

The reference voltage of the first DSC 28, Vref_1, is known, and when the first DSC 28 is no longer outputting any current I_d1 (I_d1=0), then it is known that Vref_1=V_1. The DSC 28 is configured to determine the voltage, V_1, at the point along the wire that is proximate to the first terminal of the battery 2010.

In an example of operation and implementation, the reference voltage of the second DSC, Vref_2, is set to a first value. Then, the reference voltage of the second DSC 28, Vref_2, is tuned until it compares favorably with the voltage, V_2, at the point along the wire that is proximate to the terminal of the load 2020. When Vref_2 and V_2 compare favorably, the voltage, V_2, at the point along the wire that is proximate to the terminal of the load 2020 is known. For example, the second DSC 28 will not output any current I_d2 (I_d2=0) when Vref_2=V_2, and the current Iref_2 will then be equal to I_2 (Iref_2=I_2).

The reference voltage of the second DSC 28, Vref_2, is known, and when the second DSC 28 is no longer outputting any current I_d2 (I_d2=0), then it is known that Vref_2=V_2. The DSC 28 is configured to determine the voltage, V_2, at the point along the wire that is proximate to the terminal of the load 2020.

In another example of operation and implementation, the reference voltage of the first DSC 28, Vref_1, is provided as an AC signal and is varied across a desired frequency range. Similarly, reference voltage of the second DSC 28, Vref_2, is provided as an AC signal and is varied across a desired frequency range. This will provide AC voltage signals at each of the first point, V_1, along the wire that is proximate to the terminal of the battery 2010 and also at the second point, V_2, along the wire that is proximate to the terminal of the load 2020. By operating the AC domain, and by sweeping across a range of frequencies, the impedance (Z) of the wire may be determined as a function of frequency. When such an impedance (Z) profile of the wire is determined as a function of frequency, identification of a flat portion of the impedance (Z) profile at lower frequencies can be used to determine the resistive portion of the wire. For example, at DC and lower frequencies, the wire will exhibit characteristics that are primarily resistive. As frequency increases, the wire may exhibit characteristics that are also inductive and capacitive. By providing a range of AC signals at the first point, V_1, along the wire that is proximate to the terminal of the battery 2010 and measuring those AC signals at the second point, the DC resistance of the wire can be determined by a desired slope (e.g., substantially flat, less than threshold slope between two or more points, etc.) of the measured frequency response values of the range of AC signals. and also at the second point, V_2, along the wire that is proximate to the terminal of the load 2020, and by sweeping across a desired frequency range, the DC resistance of the wire can be determined.

For example, based on providing the reference voltages of the first DSC 28, Vref_1, and the second DSC 28, Vref_2, as AC signals, and monitoring the response of them as a function of frequency, and by identifying the flat portion of the impedance (Z) profile at lower frequency, the resistance, R, the wire may be determined. Note that the AC signaling that is provided the first point, V_1, along the wire that is proximate to the terminal of the battery 2010 and also at the second point, V_2, along the wire that is proximate to the terminal of the load 2020 may be provided via capacitive coupling by appropriately placed capacitors that couple were connect the DSCs to the first and second points along the wire. As may be desired, capacitive switches may be implemented such that the coupling or connection between the DSCs and the first and second points along the wire may be made via a direct connection or via capacitive coupling through respective capacitors.

FIGS. 23B, 23C, and 23D are schematic block diagrams showing other embodiments 2302, 2303, and 2304 of a battery that is connected or coupled to a load and multiple DSCs that are implemented to detect voltages in conjunction with high impedance (Z) reference loads in accordance with the present disclosure.

Referring to embodiment 2302, this diagram has some similarities to the previous diagram and shows an implementation of a first DSC and a second DSC in more detail. Each DSC includes a comparator or operational amplifier that receives a reference voltage, Vref_1 or Vref_2, at one of its input terminals, and that has the other of one of its input terminals connected to the line that connects to the first point along the wire that is proximate to the first terminal of the battery 2010 or the second point along the wire that is proximate to the terminal of the load 2020, respectively.

Considering the DSC on the left-hand side of the diagram, the output of the comparator or operational amplifier provides the control signal to a dependent current source that is configured to supply a current I_d1 that combines with the current that is provided from the point along the wire that is proximate to the first terminal of the battery, I_1, to generate the reference current, Iref_1, that flows through that respective high impedance (Z) reference load. Note that the dependent current source is configured to source and/or sink current as may be needed to ensure the voltage at the electrical node tracks, follows, matches, etc. the reference voltage, Vref_1. The comparator or operational amplifier is connected to a power supply voltage (e.g., Vdd and Vss, such as Vdd being the positive supply voltage, and Vss being the ground voltage or 0 V).

Considering the DSC on the right-hand side of the diagram, the output of the comparator or operational amplifier provides the control signal to a dependent current source that is configured to supply a current I_d2 that combines with the current that is provided from the point along the wire that is proximate to the terminal of the load, I_2, to generate the reference current, Iref_2, that flows through that respective high impedance (Z) reference load. Note that the dependent current source is configured to source and/or sink current as may be needed to ensure the voltage at the electrical node tracks, follows, matches, etc. the reference voltage, Vref_2. Similarly, the comparator or operational amplifier is connected to a power supply voltage (e.g., Vdd and Vss, such as Vdd being the positive supply voltage, and Vss being the ground voltage or 0 V).

In an example of operation and implementation, the reference voltage of the first DSC, Vref_1, is set to a first value. In certain examples, the reference voltage of the first DSC, Vref_1, is initially set to an estimated voltage of the battery, such as an estimate of the voltage that is at the point along the wire that is proximate to the first terminal of the battery 2010, namely, V_1. Then, the reference voltage of the first DSC, Vref_1, is tuned until it compares favorably with the voltage, V_1, at the point along the wire that is proximate to the first terminal of the battery 2010. When Vref_1 and V_1 compare favorably, the voltage at the voltage, V_1, at the point along the wire that is proximate to the first terminal of the battery 2010 is known. For example, the first DSC will not output any current I_d1 (I_d1=0) when Vref_1=V_1, and the current Iref_1 will then be equal to I_1 (Iref_1=I_1). The determination that Vref_1 and V_1 compares favorably may be made based on the output of the comparator or operational amplifier being zero, the dependent current source no longer supplying the current I_d1, etc. When Vref_1 and V_1 compare favorably, the voltage, V_1, at the point along the wire that is proximate to the first terminal of the battery 2010 is known. For example, the first DSC will not output any current I_d1 (I_d1=0) when Vref_1=V_1, and the current Iref_1 will then be equal to I_1 (Iref_1=I_1).

In an example of operation and implementation, the reference voltage of the second DSC, Vref_2, is set to a first value. In certain examples, the reference voltage of the second DSC, Vref_2, is initially set to an estimated voltage of the load 2020, such as an estimate of the voltage that is at the point along the wire that is proximate to the terminal of the load 2020, namely, V_2. Then, the reference voltage of the second DSC, Vref_2, is tuned until it compares favorably with the voltage, V_2, at the point along the wire that is proximate to the terminal of the load 2020. When Vref_2 and V_2 compare favorably, the voltage at the voltage, V_2, at the point along the wire that is proximate to the terminal of the load 2020 is known. For example, the second DSC will not output any current I_d2 (I_d2=0) when Vref_2=V_2, and the current Iref_2 will then be equal to I_2 (Iref_2=I_2). The determination that Vref_2 and V_2 compares favorably may be made based on the output of the comparator or operational amplifier being zero, the dependent current source no longer supplying the current I_d2, etc. When Vref_2 and V_2 compare favorably, the voltage, V_2, at the point along the wire that is proximate to the terminal of the load 2020 is known. For example, the second DSC will not output any current I_d2 (I_d2=0) when Vref_2=V_2, and the current Iref_2 will then be equal to I_2 (Iref_2=I_2).

Referring to embodiment 2303, this diagram is similar to the previous diagram but also includes feedback circuits 2030 implemented within each of the first DSC on the left-hand side of the diagram and the second DSC on the right-hand side of the diagram. The feedback circuit 2030 is implemented to perform any desired processing on the respective output signal from the perspective comparator or operational amplifier to generate the control signaling for the respective dependent current source within each DSC.

Referring to embodiment 2304, this diagram is similar to the previous diagram but also includes capacitive switches that couple or connect to the respective DSCs that couple or connect to the first point along the wire that is proximate to the first terminal of the battery 2010 and the second point along the wire that is proximate to the terminal of the load 2020, respectively. For example, a capacitive switch may be configured to provide a direct connection through the capacitive switch for may be configured to provide a connection via a capacitor to facilitate AC coupling and DC blocking. For example, at DC, a capacitor will operate as an open circuit. However, AC signals will couple through the capacitor.

This diagram also includes a respective analog to digital converter (ADC) 1660 within each of the DSCs that is configured to process the output signal of the comparator or operational amplifier to generate a digital signal. The output signal of the comparator or operational amplifier is representative of any difference between the reference voltage, Vref_1, and the voltage, V_1, at the point along the wire that is proximate to the first terminal of the battery 2010.

In addition, in certain examples, within each of the DSCs, a feedback circuit 2030 is configured to process the output signal of the comparator or operational amplifier to generate the control signaling for the dependent current source. In certain examples, the feedback circuit 2030 is configured to scale (e.g., amplify or divide) the output signal of the comparator or operational amplifier to provide a scaled version of the output signal of the comparator or operational amplifier as the control signaling for the dependent current source. Generally speaking, the feedback circuit 2030 is configured to perform any desired processing to the output signal of the comparator or operational amplifier to generate a processed version of the output signal of the comparator or operational amplifier as the control signaling for the dependent current source.

In addition, this diagram includes one or more processing modules 42. The one or more processing modules 42 includes memory and/or is coupled to memory that stores operational instructions. The one or more processing modules 42 is configured to execute the operational instructions to facilitate operation of the DSC. In some examples, the one or more processing modules 42 is configured to provide the reference voltages, Vref_1 and Vref_2, that are respectively provided to one of the input terminals of the comparator or operational amplifier in each DSC. In addition, the one or more processing modules 42 is configured to direct the operation of the feedback circuits 2030, when such feedback circuits 2030 are implemented. Respective feedback circuit control signals (fb ckt ctrls) are provided to the feedback circuits 2030 to direct the manner in which feedback circuits 2030 is to process the output signal the comparator or operational amplifier within the DSCs generate the respective control signaling for the dependent current sources within the DSCs. In addition, the one or more processing modules 42 is configured to direct the operation of the capacitive switches. Respective capacitive switch control signals (C sw ctrls) are provided to the capacitive switches to direct their manner of connectivity, whether a straight connection or via capacitive coupling to the points along the wire that couples or connects the battery 2010 to the load 2020. In addition, any other control may be provided from one or more processing modules 42 to facilitate operation of the first DSC to determine the voltage, V_1, at the point along the wire that is proximate to the first terminal of the battery 2010 and also to facilitate operation of the second DSC to determine the voltage, V_2, at the point along the wire that is proximate to the terminal of the load 2020.

Note that such capacitive switches may also be implemented within any other embodiment, diagram, etc. herein to facilitate either direct connection or via capacitive coupling to a point along the wire that couples or connects the battery 2010 to the load 2020.

FIG. 23E is a schematic block diagram showing an embodiment 2305 of a battery that is connected or coupled to a load and a DSC that is implemented to detect voltage without a high impedance (Z) reference load in accordance with the present disclosure.

This diagram also includes a battery 2010 that is coupled or connected to a load 2020 via a wire. In this diagram, a first DSC 28 is configured to determine a voltage, V_1, at a first point along the wire that is proximate to a first terminal of the battery 2010, and a second DSC 28 is configured to determine a voltage, V_2, of a second point along the wire that is proximate to a terminal of the load 2020.

Each of the DSCs operates as described above with respect to FIG. 22A to determine the voltage, V_1, at the first point along the wire that is proximate to a first terminal of the battery 2010 and the voltage, V_2, of the second point along the wire that is proximate to a terminal of the load 2020. Note that neither of the DSCs includes a high impedance (Z) reference load.

In this diagram, the path to ground is within the first DSC 28 and the second DSC 28. The first DSC reference voltage, Vref_1, is tuned until the output of the first DSC is zero, based on Vref_1=V_1, so that the voltage, V_1, at the point along the wire that is proximate to the terminal of the battery 2010 is determined. Similarly, the second DSC reference voltage, Vref_2, is tuned until the output of the second DSC is zero, based on Vref_2=V_2, so that the voltage, V21, at the point along the wire that is proximate to the terminal of the load 2020 is determined.

In this diagram, the first DSC 28 and the second DSC 28 themselves serve as the high impedance components connecting or coupling to ground. The first DSC 28 and the second DSC 28 minimally affect the circuit that includes the battery 2010 that is connected to the load 2020 via the wire.

FIGS. 23F and 23G are schematic block diagrams showing other embodiments 2306 and 2307 of a battery that is connected or coupled to a load and multiple DSCs that are implemented to detect voltages without high impedance (Z) reference loads in accordance with the present disclosure.

Referring to embodiment 2306, this diagram has similarities to many of the previous diagrams including a battery 2010 that is connected to a load 2020 and the wire. Two respective DSCs are coupled or connected to point along the wire. A first point is proximate to a terminal of the battery and is configured to determine the voltage, V_1, at that point. A second point is proximate to a terminal of the load and is configured to determine the voltage, V_2, at that point. Each DSC includes a comparator or operational amplifier that receives DSC reference voltage, Vref_1 or Vref_2, at one of its inputs and has its other input connected to the output of a dependent current source and also to a respective point along the wire (e.g., proximate to the terminal of the battery or proximate to the terminal of the load). The output of the respective comparator or operational amplifier is provided via a respective feedback circuit 2030 that is configured to generate the control signaling for the respective dependent current source. The respective dependent current source is configured to source and/or sink current as may be needed to ensure the voltage, V_1 or Vref_2, at the electrical node tracks, follows, matches, etc. the first DSC reference voltage, Vref_1, or the second DSC reference voltage, Vref_2. The comparator or operational amplifiers are connected to a power supply voltage (e.g., Vdd and Vss, such as Vdd being the positive supply voltage, and Vss being the ground voltage or 0 V).

As with respect to other embodiments, the respective feedback circuits 2030 are configured to perform any desired processing on the outputs of the respective comparators or operational amplifiers to generate the control signaling for the respective dependent current sources. In an example of operation and implementation, the feedback circuit 2030 is configured to scale the output signal of the comparator or operational amplifier. The gain adjustment of the feedback circuit 2030 is configured to affect the slope of the linear region of operation of the comparator or operational amplifier between the rails of the power supply. For example, consider the rails of the power supply voltage to be Vdd and Vss, then the output of the comparator or operational amplifier will be linear when the DSC reference voltage, Vref_1, is within that range between Vdd and Vss. Particularly, when the first DSC reference voltage, Vref_1, it at the midpoint between these rails of the power supply voltage, at the midpoint of the linear region of operation of the comparator or operational amplifier, then the first DSC reference voltage, Vref_1, is equal to the voltage, V_1. Similarly, when the second DSC reference voltage, Vref_2, it at the midpoint between these rails of the power supply voltage, at the midpoint of the linear region of operation of the comparator or operational amplifier, then the second DSC reference voltage, Vref_2, is equal to the voltage, V_2.

In an example of operation and implementation, the first DSC is coupled or connected to a first point along the wire that is proximate to a terminal of the battery and is configured to determine the voltage, V_1, at that point. The first DSC includes a comparator or operational amplifier that receives the first DSC reference voltage, Vref_1, at one of its inputs and has its other input connected to the output of a dependent current source and also to that point along the wire that is proximate to the terminal of the battery. The output of the comparator or operational amplifier is provided via a feedback circuit 2030 that is configured to generate the control signaling for the dependent current source. The dependent current source is configured to source and/or sink current as may be needed to ensure the voltage, V_1, at the electrical node tracks, follows, matches, etc. the DSC reference voltage, Vref_1. The comparator or operational amplifier is connected to a power supply voltage (e.g., Vdd and Vss, such as Vdd being the positive supply voltage, and Vss being the ground voltage or 0 V).

The feedback circuit 2030 is configured to perform any desired processing on the output of the comparator or operational amplifier to generate the control signaling for the dependent current source. In an example of operation and implementation, the feedback circuit 2030 within the first DSC is configured to scale the output signal of the comparator or operational amplifier. The gain adjustment of the feedback circuit 2030 within the first DSC is configured to affect the slope of the linear region of operation of the comparator or operational amplifier between the rails of the power supply. For example, consider the rails of the power supply voltage to be Vdd and Vss, then the output of the comparator or operational amplifier will be linear when the first DSC reference voltage, Vref_1, is within that range between Vdd and Vss. Particularly, when the first DSC reference voltage, Vref_1, it at the midpoint between these rails of the power supply voltage, at the midpoint of the linear region of operation of the comparator or operational amplifier, then the first DSC reference voltage, Vref_1, is equal to the voltage, V_1.

In an example of operation and implementation, the second DSC is coupled or connected to a second point along the wire that is proximate to a terminal of the load and is configured to determine the voltage, V_2, at that point. The second DSC includes a comparator or operational amplifier that receives the second DSC reference voltage, Vref_2, at one of its inputs and has its other input connected to the output of a dependent current source and also to that point along the wire that is proximate to the terminal of the load. The output of the comparator or operational amplifier is provided via a feedback circuit 2030 that is configured to generate the control signaling for the dependent current source. The dependent current source is configured to source and/or sink current as may be needed to ensure the voltage, V_2, at the electrical node tracks, follows, matches, etc. the DSC reference voltage, Vref_2. The comparator or operational amplifier is connected to a power supply voltage (e.g., Vdd and Vss, such as Vdd being the positive supply voltage, and Vss being the ground voltage or 0 V).

The feedback circuit 2030 is configured to perform any desired processing on the output of the comparator or operational amplifier to generate the control signaling for the dependent current source. In an example of operation and implementation, the feedback circuit 2030 within the second DSC is configured to scale the output signal of the comparator or operational amplifier. The gain adjustment of the feedback circuit 2030 within the second DSC is configured to affect the slope of the linear region of operation of the comparator or operational amplifier between the rails of the power supply. For example, consider the rails of the power supply voltage to be Vdd and Vss, then the output of the comparator or operational amplifier will be linear when the second DSC reference voltage, Vref_2, is within that range between Vdd and Vss. Particularly, when the second DSC reference voltage, Vref_2, it at the midpoint between these rails of the power supply voltage, at the midpoint of the linear region of operation of the comparator or operational amplifier, then the second DSC reference voltage, Vref_2, is equal to the voltage, V_2.

Referring to embodiment 2307, this diagram is similar to the previous diagram but also includes capacitive switches that couple or connect to the respective DSCs that couple or connect to the first point along the wire that is proximate to the first terminal of the battery 2010 and the second point along the wire that is proximate to the terminal of the load 2020, respectively. For example, a capacitive switch may be configured to provide a direct connection through the capacitive switch for may be configured to provide a connection via a capacitor to facilitate AC coupling and DC blocking. For example, at DC, a capacitor will operate as an open circuit. However, AC signals will couple through the capacitor.

This diagram also includes a respective analog to digital converter (ADC) 1660 within each of the DSCs that is configured to process the output signal of the comparator or operational amplifier to generate a digital signal. The output signal of the comparator or operational amplifier is representative of any difference between the reference voltage, Vref_1, and the voltage, V_1, at the point along the wire that is proximate to the first terminal of the battery 2010.

In addition, in certain examples, within each of the DSCs, a feedback circuit 2030 is configured to process the output signal of the comparator or operational amplifier to generate the control signaling for the dependent current source. In certain examples, the feedback circuit 2030 is configured to scale (e.g., amplified or divide) the output signal of the comparator or operational amplifier to provide a scaled version of the output signal of the comparator or operational amplifier as the control signaling for the dependent current source. Generally speaking, the feedback circuit 2030 is configured to perform any desired processing to the output signal of the comparator or operational amplifier to generate a process to version of the output signal of the comparator or operational amplifier as the control signaling for the dependent current source.

In addition, this diagram includes one or more processing modules 42. The one or more processing modules 42 includes memory and/or is coupled to memory that stores operational instructions. The one or more processing modules 42 is configured to execute the operational instructions to facilitate operation of the DSC. In some examples, the one or more processing modules 42 is configured to provide the reference voltages, Vref_1 and Vref_2, that are respectively provided to one of the input terminals of the comparator or operational amplifier in each DSC. In addition, the one or more processing modules 42 is configured to direct the operation of the feedback circuits 2030, when such feedback circuits 2030 are implemented. Respective feedback circuit control signals (fb ckt ctrls) are provided to the feedback circuits 2030 to direct the manner in which feedback circuits 2030 is to process the output signal the comparator or operational amplifier within the DSCs generate the respective control signaling for the dependent current sources within the DSCs. In addition, the one or more processing modules 42 is configured to direct the operation of the capacitive switches. Respective capacitive switch control signals (C sw ctrls) are provided to the capacitive switches to direct their manner of connectivity, whether a straight connection or via capacitive coupling to the points along the wire that couples or connects the battery 2010 to the load 2020. In addition, any other control may be provided from the one or more processing modules 42 to facilitate operation of the first DSC to determine the voltage, V_1, at the point along the wire that is proximate to the first terminal of the battery 2010 and also to facilitate operation of the second DSC to determine the voltage, V_2, at the point along the wire that is proximate to the terminal of the load 2020.

FIG. 23H is a schematic block diagram showing an embodiment 2308 of operations as may be used to perform impedance (Z) characterization in accordance with the present disclosure. This diagram shows impedance (Z) characterization based on a reference signal having an AC component with frequency, f. Based on reference signal, a DSC is configured to generate a signal having AC component with that frequency, f. Note that a signal having both AC and DC components may alternatively be provided from the DSC. Alternatively, a signal having only AC components may be provided from the DSC.

Based on the response of the element to which the signal is provided, the DSC generates a digital signal that is representative of one or more electrical characteristics of that element. For example, the impedance of the element, Z(f), at the frequency, f, may be determined based on one or more processing modules interpreting the digital signal that is provided from the DSC based on the response of the element to the signal from the DSC. Generally speaking, signal processing is performed to determine one or more electrical characteristics of the element. For example, based on a change of the signal that is provided to the element from the DSC, the DSC is configured to generate a digital signal representative of that change.

Consider an example in which a signal from the DSC is a current signal. As such a signal (e.g., current signal in this example) is provided to the element, then based on the impedance of the element, Z(f), one or more characteristics of the signal (current signal) will be changed in response to the impedance of the element, Z(f). In one example, the impedance of the element, Z(f), or voltage of the element may be determined based on a change of the signal (current signal).

In another example, consider a signal from the DSC is a voltage signal. As such a signal (voltage signal) is provided to the element, then based on the impedance of the element, Z(f), one or more characteristics of the signal (voltage signal) will be changed in response to the impedance of the element, Z(f). In one example, the impedance of the element, Z(f), or current drawn by the element may be determined based on a change of the signal (voltage signal).

One or more processing modules is configured to perform signal processing of the digital signal provided from the DSC to determine one or more electrical characteristics of the element. Note that such one or more electrical characteristics of the element may include any one or more of spectrum analysis (SA) information, a frequency response of the element to the charge or monitoring signal, determination of the impedance of the element, Z(f), at the frequency, f, etc. such determination may be used to estimate one or more equivalent circuit parameters of the element (e.g., the element being a battery and using an equivalent circuit model of the battery).

In an example of operation and implementation, spectrum analysis (SA) information is generated by measuring the magnitude of the signal that is detected/sensed by the DSC in response to a signal that is provided to the element as a function of frequency within a desired frequency range. Generally speaking, SA information corresponds to measuring where the power or energy of the signal lies as a function of frequency. Such SA information also provides information of the frequency response of the element, in that, comparison of the signal to the detected/sensed signal provides information regarding the electrical characteristics of the element and how it responds to the signal. Such SA information includes information regarding the spectral components of the detected/sensed signal including a dominant frequency (if present), power including distribution of where the power within the detected/sensed signal may lie as a function of frequency, harmonics, bandwidth, etc.

There are a variety of ways in which spectrum analysis (SA) information may be acquired. In some examples, one or more processing modules is configured to perform a Fourier transform operation in accordance with digital signal processing (e.g., discrete Fourier transform (DFT)) on the digital signal that is provided from the DSC. For example, based on the signal that is output from an ADC of the DSC that provides a digital signal, the one or more processing modules is configured to perform such a Fourier transform operation to determine the spectrum of the detected/sensed signal and where the energy of the signal is located as a function of frequency.

In other examples, a spectrum analyzer using the heterodyne principle may be used such that an input signal undergoes some initial filtering (e.g., often times attenuation, low pass filtering, etc.), then is passed through a frequency mixer to perform frequency conversion to a desired frequency, an intermediate frequency (IF), for which the spectrum analyzer is specifically designed to process, then subsequent filtering, and/or amplification, attenuation is performed on the signal before providing it to an envelope detector that is operative to detect the amount of energy within the frequency of interest. Over time, the operation of the frequency mixer is adapted to sweep across a desired frequency range so that analysis of the detected/sensed signal may be performed at a number of different frequencies within a frequency range of interest.

Such SA information may also include the power spectral density (PSD) of the detected/sensed signal that corresponds to the spectral energy distribution of the signal as a function of per unit time. Such SA information may also include the energy spectral density of the detected/sensed signal that corresponds to the spectral energy distribution of the signal. Generally speaking, a spectrum analyzer is operative to determine the signal level of the detected/sensed signal at each of a number of desired frequencies within a desired frequency range.

As described herein, a separately implemented digital spectrum analysis (SA) circuit may be implemented to perform such spectrum analysis, or the one or more processing modules may be configured to perform digital signal processing of a digital signal provided from a DSC in accordance with such spectrum analysis. The DSC is operative to provide a digital signal to such a digital SA circuit or one or more processing modules that may undergo any subsequent desired processing including determination of SA information associated with the detected/sensed signal.

Modifying the frequency of an AC component of a reference signal is provided to a DSC to be used in the generation of a signal may be performed in a variety of ways. In some examples, one or more processing modules includes functionality and capability to generate signals having different frequencies. For example, one or more processing modules may include a voltage controlled oscillator (VCO) that is operative to generate a signal having a frequency that is a function of the voltage applied thereto.

FIG. 23I is a schematic block diagram showing an embodiment 2309 of a circuit configured to provide a reference signal having a desired frequency to a DSC in accordance with the present disclosure. This diagram shows one possible implementation of a numerically controlled oscillator (NCO) that may be used to generate a reference signal to be provided to the DSC having a desired frequency. The NCO includes a phase accumulator 3020 and at least one phase to amplitude converter (PAC). This diagram shows the PAC 1 followed by a DAC 1 that are operative to generate a reference signal and a PAC 2 followed by a DAC 2 that are operative to generate another reference signal (e.g., a quadrature output of the reference signal generated by the PAC 1 followed by a DAC 1).

The phase accumulator 3020 receives a frequency control word (FCW) that is used to specify the frequency of the signal is to be generated by the NCO. For example, phase accumulation is performed (e.g., using an M-bit integer register). In operation and when the NCO is clocked, the phase accumulator 3020 accumulates or adds to its currently held value at each clock cycle. The PAC uses the output from the phase accumulator 3020 which may be viewed as a phase word (e.g., sometimes using the most significant bits (MSBs) of that phase word, such as in accordance with truncation of the phase were), as the index to locate an appropriate value within a lookup table (LUT) (e.g., a cosine LUT including $2^m$ entries, where m is a positive integer) to provide an output signal having the corresponding desired amplitude. This output signal from the PAC is provided to a DAC to generate the reference signal. In this diagram, a quadrature output may be generated using a second PAC (e.g., a sine LUT including $2^m$ entries, where m is a positive integer).

Generally speaking, in operation, the phase accumulator 3020 creates a sawtooth waveform that is processed by the PAC to generate the respective samples of an oscillating signal, such as a sinusoidal signal. Those respective samples are provided to the DAC to perform digital to analog conversion thereby generating the reference signal that may be provided to the DSC.

Note that such an NCO may be implemented within one or more processing modules that is implemented to provide a reference signal to a DSC. Alternatively, an NCO may be implemented in between the one or more processing modules and the DSC and is operative to generate the reference signal to be provided to the DSC based on input from the one or more processing modules.

FIG. 23J is a schematic block diagram showing an embodiment 2310 of operations as may be used to perform impedance (Z) characterization across a number of different frequencies in accordance with the present disclosure.

Signal processing and electrical signal analysis may be performed on the digital signal provided from a DSC that is operative to sense/detect the response of the signal that is provided to the element. As such, impedance (Z) characterization may be performed not only based on the response of the element to an AC component of the signal having a singular frequency, but based on response of the element to the AC component of the signal across any desired frequency range.

FIGS. 23K and 23L are schematic block diagrams showing embodiments 2311 and 2312 of impedance (Z) profiles across a number of different frequencies in accordance with the present invention.

Referring to embodiment 2311, this diagram shows an impedance (Z) profile that exhibits primarily resistive characteristics at DC and low frequencies and has a magnitude that increases with increasing frequency.

Referring to embodiment 2312, this diagram shows an impedance (Z) profile that exhibits primarily resistive characteristics at DC and low frequencies and has a magnitude that decreases with increasing frequency.

Note that these diagrams of impedance (Z) profiles across a number of different frequencies are not exhaustive and merely examples showing variation of impedance as a function of frequency. When modeling a wire, such as a wire connecting a terminal of the battery to a terminal of a load, the wire will exhibit primarily resistive characteristics at DC and low frequencies, and as frequency increases, the impedance of the wire may change, increase or decrease, based on the contributions of the inductive and capacitive components of the wire.

FIGS. 23M and 23N are schematic block diagrams of embodiments of methods 2313 and 2314 for execution by one or more devices in accordance with the present disclosure.

The method 2313 operates similar to the method 2108 of FIG. 21H yet does so to determine a first voltage, V_1, that is at a first point that is proximate to a terminal of the battery along a wire connecting the terminal of the battery to a terminal of a load and also for a second voltage, V_2, that is at a second point that is proximate to a terminal of the load.

The method 2313 operates in step 2180a by setting a first DSC reference voltage, Vref_1, to a first value to produce a first reference current, Iref_1. For example, the first value of the DSC reference voltage, Vref_1, may be set to an estimated voltage of a battery (e.g., an estimate of V_1). The voltage, V_1, is at a point that is proximate to a terminal of the battery along a wire connecting the terminal of the battery to a terminal of a load.

The method 2313 also operates in step 2182a by tuning the DSC reference voltage, Vref_1, to compare favorably with the voltage, V_1, at the point along the wire that is proximate to the terminal of the battery. The method 2313 also operates in step 2184a by determining whether the DSC reference voltage, Vref_1, to compare favorably with the voltage, V_1, based on the tuning. For example, this may be determined based on the operational amplifier or comparator output being zero, the dependent current source of a DSC not needing to provide any current, I_d1, or some other basis, etc.

Based on the DSC reference voltage, Vref_1, comparing favorably with the voltage, V_1, based on the tuning, as determined in step 2186a, the method 2313 branches to step 2188a operates by determining with the voltage, V_1. This is determined based on the tuned value of the DSC reference voltage, Vref_1. Referring back to certain of the previous diagrams, this corresponds to the situation that the output of the comparator or operational amplifier is zero, DSC reference voltage, Vref_1, is equal to V_1 (Vref_1=V_1), the dependent current source of a DSC no longer provides any current, I_d1, such that I_d1=0 and Iref_1=I_1. The value of the DSC reference voltage, Vref_1, is known, and therefore V_1 is also known based on Vref_1=V_1.

Alternatively, based on the DSC reference voltage, Vref_2, comparing unfavorably with the voltage, V_2, as determined in step 2186b, the method 2313 branches back to step 2182b and continues to perform tuning of the DSC reference voltage, Vref_2. The tuning continues until the DSC reference voltage, Vref_2, compares favorably with the voltage, Vref_2, which facilitates the determination of voltage, V_2.

Along the other branch of the method 2313 that serves to determine V_2, the method 2313 operates in step 2180b by setting a first DSC reference voltage, Vref_2, to a first value to produce a first reference current, Iref_2. For example, the first value of the DSC reference voltage, Vref_2, may be set to an estimated voltage of a load (e.g., an estimate of V_2). The voltage, V_2, is at a point that is proximate to a terminal of the load along a wire connecting the terminal of the battery to a terminal of a load.

The method 2313 also operates in step 2182b by tuning the DSC reference voltage, Vref_2, to compare favorably with the voltage, V_2, at the point along the wire that is proximate to the terminal of the load. The method 2313 also operates in step 2184b by determining whether the DSC reference voltage, Vref_2, to compare favorably with the voltage, V_2, based on the tuning. For example, this may be determined based on the operational amplifier or comparator output being zero, the dependent current source of a DSC not needing to provide any current, I_d2, or some other basis, etc.

Based on the DSC reference voltage, Vref_2, comparing favorably with the voltage, V_2, based on the tuning, as determined in step 2186b, the method 2313 branches to step 2188b operates by determining with the voltage, V_2. This is determined based on the tuned value of the DSC reference voltage, Vref_2. Referring back to certain of the previous diagrams, this corresponds to the situation that the output of the comparator or operational amplifier is zero, DSC reference voltage, Vref_2, is equal to V_2 (Vref_2=V_2), the dependent current source of a DSC no longer provides any current, I_d2, such that I_d2=0 and Iref_2=I_2. The value of the DSC reference voltage, Vref_2, is known, and therefore V_2 is also known based on Vref_2=V_2.

Alternatively, based on the DSC reference voltage, Vref_2, comparing unfavorably with the voltage, V_2, as determined in step 2186b, the method 2313 branches back to step 2182b and continues to perform tuning of the DSC reference voltage, Vref_2. The tuning continues until the DSC reference voltage, Vref_2, compares favorably with the voltage, V_2, which facilitates the determination of voltage, V_2.

Referring to FIG. 23N, the method 2314 operates in step 2370 by sweeping the frequency of the first DSC reference voltage, Vref_1(AC component), across a range of frequencies (e.g., f1 through fx). The frequencies within this range may be uniformly spaced such as based on a common increment, or non-uniformly spaced in various examples. For example, considering substantially uniformly spaced frequencies, consider the range of frequencies may vary between 1 Hz and 1 kHz in increments of 100 Hz (e.g., frequencies of 1 Hz, 100 Hz, 200 Hz, 300 Hz, up to 1 kHz), between 10 Hz and 100 kHz in increments of 10 kHz (e.g., frequencies of 10 kHz, 20 kHz, 30 kHz, up to 100 kHz), or some other frequency range and increment. Alternatively, considering non-uniformly spaced frequencies, consider the range of frequencies may vary between 1 Hz and 1 kHz (e.g., frequencies of 1 Hz, 200 Hz, 500 Hz, 1 kHz), between 10 Hz and 100 kHz (e.g., frequencies of 10 kHz, 50 kHz, 80 kHz, 100 kHz), or some other frequency range and frequencies.

Note that this sweeping of the AC component of the first DSC reference voltage, Vref_1(AC component), is performed after the DC component of the first DSC reference voltage, Vref_1(DC component), has been appropriately tuned so that the DC component of the first DSC reference voltage, Vref_1(DC component), is same as the DC voltage of the point along the wire that is proximate to the terminal of the battery, V_1(DC component). Once the DC component of the first DSC reference voltage, Vref_1(DC component), matches the DC voltage of the point along the wire that is proximate to the terminal of the battery, V_1(DC component), and AC component of the first DSC reference voltage, Vref_1(AC component), may be added to the first DSC reference voltage, Vref_1(AC component), such that the overall first DSC reference voltage, Vref_1(DC+AC components), includes both the DC component and an AC component.

The magnitude and frequency of the AC component are configurable/adjustable. For example, consider an embodiment in which one or more processing modules is configured to provide the first DSC reference voltage, Vref_1(DC+AC components), then the DC component magnitude as well as the magnitude and frequency of the AC component may be configured/adjusted to any desired value by the one or more processing modules. Consider another embodiment in which a signal generator is configured to provide the first DSC reference voltage, Vref_1(DC+AC components), then the DC component magnitude as well as the magnitude and frequency of the AC component may be configured/adjusted to any desired value by the signal generator.

The loop gain of the DSC that operates based on first DSC reference voltage, Vref_1 (AC component), is configured to determine the amount of current, I_d1(AC component), that is provided from the dependent current source within that particular DSC. For example, the amount of current, I_d1 (AC component), that is provided from the dependent current source within the particular DSC will be a function of the loop gain of that DSC and the first DSC reference voltage, Vref_1 (AC component).

In some examples, a very small magnitude AC component in comparison to the magnitude of the DC component is used. For a specific example, consider the magnitude of the DC component of the first DSC reference voltage, Vref_1 (DC component), to be approximately 12 V, then a very small magnitude AC component of the first DSC reference voltage, Vref_1(AC component), may be in the 10s or 100s of millivolts (or smaller or larger values). In even other examples, the magnitude of the AC component of the first DSC reference voltage, Vref_1(AC component), is even smaller in comparison to the DC component of the first DSC reference voltage, Vref_1(DC component).

As such, the AC component of the first DSC reference voltage, Vref_1 (AC component), and the corresponding AC component of the of current, I_d1(AC component), that is provided from the dependent current source of that DSC may be very small. Note that based on the appropriate tuning of the DC component of the first DSC reference voltage, Vref_1(DC component), being same as the DC voltage of the point along the wire that is proximate to the terminal of the battery, V_1(DC component), the DC component of the current, I_d1(DC component), that is provided from the dependent current source will be zero, I_d1(DC component)=0 amps. Again, the AC component of the first DSC reference voltage, Vref_1(AC component), may be very small in comparison to the DC component of the first DSC reference voltage, Vref_1(DC component), thereby having little to no effect on the operation of the system including the battery 2010 that is configured to provide power to the load 2020.

In an example of operation and implementation, consider a loop gain of this particular DSC having an AC peak to peak first DSC reference voltage, Vref_1 (AC component), of 10 millivolts that is configured to generate an AC peak to peak current, I_d1(AC component), of 10 μA from the dependent current source within that particular DSC. In such a case, the particular gain of that loop would be 1/1000 amps/volts, such that an AC peak to peak first DSC reference voltage, Vref_1 (AC component), of X volts is configured to generate an AC peak to peak current, I_d1(AC component), of X/1000 amps that has a magnitude that is 1/1000 the magnitude of the AC peak to peak first DSC reference voltage, Vref_1 (AC component), of X volts. Note that the gain of the loop may be adjusted based on a feedback circuit having a disability/configurability (e.g., such as based on any of those various embodiments described herein). Alternatively, consider an implementation in which the loop of the DSC includes no feedback circuit, then the inherent gain of the loop may be characterized and known and that gain of the loop may be used to determine which amount of AC peak to peak current, I_d1(AC component) is output from the dependent current source within that particular DSC based on a particular AC peak to peak first DSC reference voltage, Vref_1 (AC component).

The AC current provided from the dependent current source within the DSC, current, I_d1(AC component), is then same as the AC current, Isource(AC component), that flows from the point along the wire that is proximate to the terminal of the battery to the point along the wire that is proximate to the terminal of the load. This AC current, which is known and which flows through the wire, may be used in conjunction with the AC component of the first DSC reference voltage, Vref_1 (AC component), which is equal to the AC component of the voltage, V_1(AC component), at the point along the wire that is proximate to the terminal the battery and also the AC component of the voltage, V_2(AC component), at the point along the wire that is proximate to the terminal the load to determine the impedance of the wire, Zwire(AC component), at the particular frequency of the AC component of the first DSC reference voltage, Vref_1 (AC component). Specifically, knowing the AC components of the voltages at both ends of the wire, V_1(AC component) and V_2(AC component), as well as the AC current flowing through the wire, the impedance of the wire, Zwire(AC component), at a particular frequency may be determined. These calculations may be based on the following equations.

$$V\_1(AC\ component) - V\_2(AC\ component) = Isource(AC\ component) \times Zwire(AC\ component)$$

$$Zwire(AC\ component) = [V\_1(AC\ component) - V\_2(AC\ component)] / Isource(AC\ component)$$

Based on the AC component of the first DSC reference voltage, Vref_1 (AC component), being added to the DC component of the first DSC reference voltage, Vref_1 (DC component) thereby facilitating the AC current, Isource(AC component) (e.g., which is same as the AC current provided from the dependent current source within the DSC, current, I_d1(AC component) to flow through the wire, and also based on the determination of the AC component of the voltage, V_2(AC component), impedance of the wire, Zwire (AC component), at each of the respective frequencies may be determined.

The DC component of the second DSC reference voltage, Vref_2(DC component), is tuned to be same as the DC voltage of the point along the wire that is proximate to the terminal of the load, V_2(DC component), thereby facilitating the DC component of the current, I_d2(DC component), that is provided from the dependent current source of the second DSC to be zero, I_d2(DC component)=0 amps.

Then, the second DSC on the right hand side of the diagram is configured to determine the AC component of the current, I_d2(AC component), that is provided from the dependent current source of the second DSC. The loop gain of the second DSC on the right-hand side of the diagram is then used to determine the AC component of the voltage at the point along the wire that is proximate to the terminal of the load, voltage, V_2(AC component). Note that bandpass filtering may be performed on the signal that is output from the comparator or operational amplifier of the second DSC on the right-hand side of the diagram. This bandpass filtering may be performed using analog components, or it may be performed in the digital domain by one or more processing modules. For example, once the output signal from the comparator or operational amplifier of the second DSC on the right-hand side of the diagram is passed through an analog to digital converter (ADC) thereby generating a digital signal, any desired digital signal processing on that digital signal may be performed including bandpass filtering to recover the AC component of the voltage at the point along the wire that is proximate to the terminal of the load, voltage, V_2(AC component) while filtering out the DC component of the voltage at the point along the wire that is proximate to the terminal of the load, voltage, V_2(DC component).

In some examples, the AC component of the second DSC reference voltage, Vref_2(AC component), is tuned to be same as the AC voltage of the point along the wire that is proximate to the terminal of the load, V_2(AC component), and information corresponding to the magnitude of the AC component of the second DSC reference voltage, Vref_2 (AC component), to achieve back condition facilitates the determination of the actual AC voltage of the point along the wire that is proximate to the terminal of the load, V_2(AC component).

As such, the method 2314 operates in step 2372 by determining the AC component of the point along the wire that is proximate to the terminal of the load, V_2(AC component), corresponding to each of the respective frequencies through which the AC component of the first DSC reference voltage, Vref_1 (AC component), has swept through. Again, note that the AC current flowing through the wire, Isource(AC), will be same as the AC current provided from the dependent current source within the first DSC, I_d1(AC component), such that Isource(AC)=I_d1(AC component). Information regarding the AC component of the voltage at the point along the wire that is proximate to the terminal of the battery, V_2(AC component), the AC current flowing through the wire, Isource(AC), as well as the AC voltage of the point along the wire that is proximate to the terminal of the load, V_2(AC component), facilitates determination of the AC impedance of the wire, Zwire(AC component), at the frequency of the AC signals (e.g., as initiated by the AC component of the first DSC reference voltage, Vref_1(AC component)).

The method 2314 also operate in step 2374 by determining the AC impedance of the wire, Zwire(AC component), at the respective frequencies of various AC signals. Note that the determination of the AC impedance of the wire, Zwire (AC component), at the respective frequencies of various AC signals facilitates the determination of an impedance profile of the wire as a function of the respective frequencies of those various AC signals. For example, this involves determining the AC impedance of the wire, Zwire(AC component), at a first frequency, f1, in step 2374a. This also involves determining the AC impedance of the wire, Zwire (AC component), at a second frequency, f2, in step 2374b. This step may group performed with respect to any of a number of desired frequencies within a particular frequency range. For example, this also involves determining the AC impedance of the wire, Zwire(AC component), at an xth frequency, fx, in step 2374x. Generally speaking, these frequencies may be lower frequency signals and relatively closer to DC than higher frequency.

The method 2314 and operates in step 2376 by determining the DC impedance of the wire, Rwire. For example, this is based on identifying flat response of the impedance profile of the wire as a function of the respective frequencies of the various AC signals. Based on multiple AC impedances of the wire, Zwire(AC component), at various frequencies, and determining a flat response of that impedance profile of the wire is a function of frequency, particularly at lower frequencies, including DC, the DC impedance of the wire, Rwire, may be determined.

Once the DC impedance of the wire, Rwire, is known, the method 2314 operates in step 2378 by determining the DC current flowing through the wire, Isource(DC component). For example, this DC current flowing through the wire, Isource(DC component), corresponds to the DC current being provided from a battery to a load. For example, this is determined based on based on information that is known corresponding to the DC voltage at the point along the wire that is proximate to the terminal of the battery, V_1(DC component), the voltage at the point along the wire that is proximate to the terminal of the load, V_2(DC component), and the DC impedance of the wire, Rwire. These calculations may be based on the following equations.

$$V\_1(\text{DC component}) - V\_2(\text{DC component}) = I\text{source}(\text{CC component}) \times R\text{wire}$$

$$I\text{source}(\text{DC component}) = [V\_1(\text{DC component}) - V\_2(\text{DC component})]/R\text{wire}$$

Note that the method 2314 may be performed with respect to several of the various embodiments, diagrams, etc. herein. For example, the method 2014 may be performed by the various architectures describe within any of the FIG. 23A through FIG. 23G. Note that various implementations of DSCs, such as included within the left-hand side and right-hand side of the respective FIGS. 23A through 23G may all be adapted to perform such operations to facilitate the determination DC current flowing through the wire, Isource (DC component). Note that such functionality and operations may be performed with no or minimal adverse effects to the system including the battery that is coupled or connected to the load via a wire. Note also that such functionality and operations may be performed without requiring any additional components to be placed in line with the wire that couples are connects the battery to the load. Such functionality and operations may be performed merely by accessing the wire that couples are connects the battery to load thereby providing much information regarding the overall system.

Note that such architectures, methods, functionality, and operations as described herein facilitate the determination of the overall system in manners that do not incur the adverse effects used by prior art approaches that can significantly interfere with the operation of the overall system.

FIG. 24A is a schematic block diagram showing an embodiment 2401 of a battery that is connected or coupled to a load and multiple DSCs that are implemented to detect voltages in conjunction with a common reference load impedance (Z) in accordance with the present disclosure. This diagram includes a common reference load impedance (Z) that is used by both the first DSC on the left-hand side of the diagram and a second DSC on the right-hand side of the diagram. The common reference load impedance (Z) is switched in to the first DSC on the left-hand side of the diagram at or during a first time and is switched in to the second DSC on the right-hand side of the diagram at or during a second time. The use of a common reference load impedance (Z) operates to ensure the reference load is matched for reference current sensing by the respective DSCs. For example, when measuring the voltage, V_1, at the first point along the wire that is proximate to the terminal of the battery, the common reference load impedance (Z) is switched in to the first DSC on the left-hand side of the diagram and disconnected from the second DSC on the right-hand side of the diagram. Then, when measuring the voltage, V_2, at the second point along the wire that is proximate to the terminal of the load, the common reference load impedance (Z) is switched in to the second DSC on the right-hand side of the diagram and disconnected from the first DSC on the left-hand side of the diagram.

In addition, this diagram includes one or more processing modules 42. The one or more processing modules 42 includes memory and/or is coupled to memory that stores operational instructions. The one or more processing modules 42 is configured to execute the operational instructions to facilitate operation of the DSC. In some examples, the one or more processing modules 42 is configured to provide the reference voltages, Vref_1 and Vref_2, that are respectively provided to one of the input terminals of the comparator or operational amplifier in each DSC. In addition, the one or more processing modules 42 is configured to direct the operation of the feedback circuits 2030, when such feedback circuits 2030 are implemented. Respective feedback circuit control signals (fb ckt ctrls) are provided to the feedback circuits 2030 to direct the manner in which feedback circuits 2030 is to process the output signal the comparator or operational amplifier within the DSCs generate the respective control signaling for the dependent current sources within the DSCs. Also, the one or more processing modules 42 is configured to direct the operation of the switches that facilitate connection or disconnection of the respective DSCs from the common reference load impedance (Z). Switch control signals (sw ctrls) are provided to switches to direct their manner of connectivity, whether connecting the common reference load impedance (Z) to a DSC or disconnecting the common reference load impedance (Z) to a DSC.

In addition, the one or more processing modules 42 is configured to direct the operation of the capacitive switches, when such capacitive switches are implemented. Respective capacitive switch control signals (C sw ctrls) are provided to the capacitive switches to direct their manner of connectivity, whether a straight connection or via capacitive coupling to the points along the wire that couples or connects the battery 2010 to the load 2020. In addition, any other control may be provided from the one or more processing modules 42 to facilitate operation of the first DSC to determine the voltage, V_1, at the point along the wire that is proximate to the first terminal of the battery 2010 and also to facilitate operation of the second DSC to determine the voltage, V_2, at the point along the wire that is proximate to the terminal of the load 2020.

FIG. 24B is a schematic block diagram showing another embodiment 2402 of a battery that is connected or coupled to a load and multiple DSCs that are implemented to detect voltages in conjunction with a common reference load impedance (Z) in accordance with the present disclosure. This diagram is similar to the previous diagram but does not include the switches that facilitate connection or disconnection of the common reference load impedance (Z) as in the previous diagram. In this implementation, the DSCs are operated such that when one of them is operational to perform determination of voltage at a point along the wire, the other operates in such a way that no current is provided to the common reference load impedance (Z). For example, when the first DSC on the left-hand side of the diagram operates to determine the voltage, V_1, at the point along the wire that is proximate to the first terminal of the battery 2010, the second DSC on the right-hand side of the diagram is operated such that the Iref_2 along the connection between that second DSC on the right-hand side of the diagram and the common reference load impedance (Z) is zero. Similarly, when the second DSC on the right-hand side of the diagram operates to determine the voltage, V_2, at the point along the wire that is proximate to the terminal of the load 2020, the first DSC on the left-hand side of the diagram is operated such that the Iref_1 along the connection between that first DSC on the left-hand side of the diagram and the common reference load impedance (Z) is zero. This implementations operates to perform electrical isolation of one of the DSCs from the common reference load impedance (Z) when the other of the DSCs is operating to determine a voltage.

FIG. 24C includes schematic block diagrams showing various embodiments 2403a, 240b, 240c, and 240d of common reference load impedances (Zs) that may be implemented in conjunction within multiple DSCs in accordance with the present disclosure.

Note that each of the respective embodiments 2403a, 240b, 240c, and 240d of common reference load impedances (Zs) may be electrically connected or disconnected using switches such as with respect to FIG. 24A or electrically isolated based on the operation of the DSCs such as a suspect FIG. 24B.

Referring to embodiment 2403a, this common reference load impedance (Z) includes two N-type metal-oxide-semiconductor field-effect transistors (MOSFETs) (NMOSs) having their respective gates connected and provided a bias voltage, Vbias. The respective drains of the NMOSs are configured to receive the reference currents, Iref_1 and Iref_2. Also, the sources of the NMOSs are connected to ground.

Referring to embodiment 2403b, this common reference load impedance (Z) includes two N-type metal-oxide-semiconductor field-effect transistors (MOSFETs) (NMOSs) having their respective sources connected and also connected to the drain of another N-type metal-oxide-semiconductor field-effect transistor (MOSFET) (NMOS) having its source connected to ground. The respective drains of the top two NMOSs are configured to receive the reference currents, Iref_1 and Iref_2. The source of the other NMOS (on the bottom right) is connected to ground.

Referring to embodiment 2403c, this common reference load impedance (Z) is implemented as a configurable impedance (Z) circuit such that any of a number of different impedances may be switched in and configured to receive the reference current, Iref_1, or the reference current, Iref_2.

Referring to embodiment 2403d, this common reference load impedance (Z) generally shows any other high impedance (Z) common reference load that may be using any of a number of different electrical components including transistors, resistors, inductors, capacitors, etc.

FIG. 24D is a schematic block diagram of an embodiment of various examples of impedance (Zs) such as may be implemented within a configurable impedance (Z) circuit in accordance with the present disclosure. This diagram shows a number of possible impedances that may be included within a configurable Z circuit. An impedance Z1 includes a single resistor such that the impedance is as follows: $Z=R$. An impedance Z2 includes a single inductor such that the impedance is as follows: $Z=j\omega L$, where $\omega=2\pi f$. An impedance Z3 includes a single capacitor such that the impedance is as follows: $Z=-j(1/\omega C)$.

Note that when two impedances are in series with another, e.g., Z1 in series with Z2, then totally equivalent impedance is the sum of the two as follows: $Ze=Z1+Z2$.

However, when two impedances are in parallel with another, e.g., Z1 in parallel with Z2, then totally equivalent impedance is as follows: $Ze=(Z1*Z2)/(Z1+Z2)$.

An impedance Z4 includes a resistor in series with an inductor such that the impedance is as follows: $Z=R+j\omega L$. An impedance Z5 includes a resistor in series with an capacitor such that the impedance is as follows: $Z=R-j(1/\omega C)$. An impedance Z6 includes an inductor in series with a capacitor such that the impedance is as follows: $Z=j\omega L-j(1/\omega C)$.

An impedance Z7 includes an inductor in parallel with a capacitor such that the impedance is as follows: $Z=R//j\omega L$, where // indicates parallel connectivity of the two components. An impedance Z8 includes a resistor in parallel with a capacitor such that the impedance is as follows: $Z=R//(-j(1/\omega C))$, where // indicates parallel connectivity of the two components. An impedance Z9 includes an inductor in parallel with a capacitor such that the impedance is as follows: $Z=j\omega L//(-j(1/\omega C))$, where // indicates parallel connectivity of the two components.

Generally speaking, an impedance Z10 such as may be included within a configurable Z circuit may include any other combination of R, L, C in series, parallel, etc. In addition, note that any one or more of the impedances within a given configurable Z circuit may include variability or adjustability (e.g., a variable/tunable capacitor, a variable/tunable inductor, a variable/tunable resistor, etc.).

Note that one or more processing modules may be configured to select an appropriate impedance value within a configurable Z circuit that is implemented in line between the DSC and the battery to facilitate the desired operation of the various components. Examples of some desired operations may include maximizing power transfer of a signal provided from the DSC to the battery or minimizing reflection of the signal provided from the DSC to the battery.

FIG. 24E is a schematic block diagram of an embodiment of a method 2405 for execution by one or more devices in accordance with the present disclosure.

The method 2405 operates in step 2450 by determining a voltage, V_1, at a point along a wire that is proximate to a terminal of the battery (e.g., of an implementation in which a battery is connected to a load via a wire). This determination is based on using a common reference load impedance (Z). For example, this determination is made at or during a time 1. Also, this determination may be made by using electrical isolation of the common reference load impedance (Z) based on appropriately operating switches facilitate electrical connection or disconnection. Alternatively, this determination may be made by using electrical isolation of the common reference load impedance (Z) based on appropriately operating DSCs such one of them is electrically isolated from the common reference load impedance (Z) when the other DSC is determining a voltage.

The method 2405 operates in step 2452 by determining a voltage, V_2, at a point along a wire that is proximate to a terminal of the load (e.g., of the implementation in which battery is connected to the load via the wire). This determination is also based on using the common reference load impedance (Z). Electrical isolation made be achieved for the common reference load impedance (Z) using switches, based on operation of DSCs, etc. as described above.

In some variants of the method 2405, the method 2405 operates in step 2454 by employing the voltages, V_1 and V_2, for one or more subsequent processes, operations, etc. For example, this may involve determining the impedance of the wire connecting the battery to the load, determining the current flowing through the wire connecting the battery to the load, etc.

FIG. 25A is a schematic block diagram of an embodiment 2500 of a battery sensor system that includes a plurality of drive sense circuits 28 and one or more processing module(s) 42. The processing module(s) 42 as described herein, each includes memory and/or are coupled to memory that stores operational instructions. In an embodiment, processing module 42 includes a controller circuit 2525 for controlling operation of one or more of the battery and loads. The drive sense circuits 28 are interactive with (e.g., operably coupled to a wired connection between) a battery and a plurality of loads. The wired connection is illustrated by bolded lines and includes one or more wires operably coupled to provide a low impedance path between the battery and the plurality of loads. As an example, the impedance of the low impedance path is substantially the impedance of a wire (e.g., $$Z = \frac{p*l}{A_{eff}},$$

where p is the resistivity of the wire, l is the length of the wire, and $A_{eff}$ is the effective cross-sectional area). Note two or more of the drive sense circuits 28, the battery 2010, the wired connection, and the loads 2020 may be collectively referred to herein as a battery sensor system. The processing module(s) 42 operates to receive data (e.g., analog signals, digital signals, etc.) from the drive sense circuits 28 and to configure operation of the drive sense circuits 28 (e.g., set reference signals, enable, disable, etc.)

In an example of operation, the battery sensor system determines a voltage at a point(s) of the wired connection as described in FIGS. 21A, 22A, etc. For example, a first drive sense circuit DSC-1 28 determines a voltage $V_{-B1}$ at a first point of the wired connection proximate (e.g., touching, within 0.1 inches, within an inch, etc.), to the battery 2010. As another example, a second drive sense circuit DSC-2 28 determines a voltage $V_{-L1}$ at a second point of the wired connection proximate to a first load 1 2020. As another example, a third drive sense circuit DSC-3 28 determines a voltage $V_{-L2}$ at a third point of the wired connection proximate to a second load 2 2020.

The processing module 42 obtains the voltages (e.g., via a voltage signal, a digital value representative of a voltage, etc.) from the sensors circuits and determines a variance, or voltage drop, between the battery and one or more loads. For example, the processing module 42 determines the point $V_{-B1}$ is at 11.89 volts, the point $V_{-L1}$ is at 11.87 volts and determines the point $V_{-L2}$ is at 11.86 volts. The processing module 42 determines the variance (e.g., difference via a subtraction function) between point $V_{-B1}$ and $V_{-L1}$ is 0.02 volts, the variance between point $V_{-B1}$ and $V_{-L2}$ is 0.03 volts, and the variance between point $V_{-L1}$ and $V_{-L2}$ is 0.01 volts.

In an embodiment, the processing module compares one or more of the voltages to one or more voltage thresholds for the battery sensor system and generates and sends (e.g., to a controller (e.g., to change function of the battery and/or loads), to another processing module, etc.) an alert message when a voltage exceeds a threshold and/or is outside a voltage threshold range. For example, when the variance between $V_{-B1}$ and $V_{-L2}$ exceeds 0.01155 volts, the processing module generates and sends an alert message to the controller.

The processing module further functions to control operation of the drive sense circuits 28. For example, the processing modules determines and/or provides a voltage reference signal for each drive sense circuit to utilize in determining a voltage at each respective point where drive sense circuit is operably coupled to the wired connection. As a specific example, the processing module estimates a voltage (e.g., based on previous voltage reading, based on a known desired voltage (e.g., 12V), based on time since last measurement, based on battery rating, etc.) at a particular point, and sets the voltage reference signal of the drive sense circuit to the estimated voltage. For example, the battery is rated as a 48V battery and the processing module 42 estimates the voltage on the first point of the wired connection to be 47.99995 V.

FIG. 25B is a schematic block diagram of an embodiment 2501 of a battery sensor system that includes the plurality of drive sense circuits 28 and the processing module(s) 42 of FIG. 25A.

In an example of operation, the battery sensor system determines an impedance of one or more paths of the wired connection between the battery and the plurality of loads. For example, the battery sensor system operates as described with reference to FIGS. 23A-N to determine a first impedance of a first path (Z_wire_1) of the wired connection and to determine a second impedance of a second path (e.g., Z_wire_2) of the wired connection.

As a specific example, the first drive sense circuit 28 provides a plurality of oscillating signals (e.g., an alternating current (AC) signal) on to the wired connection at or during the same time t1. Each oscillating signal of the plurality of oscillating signals oscillates at a particular frequency (e.g., 20 signals from 5 hertz (Hz) to 195 Hz spaced evenly every 10 Hz, 10 signals from 100 Hz to 1 MHz non-evenly spaced, etc.). The other drive sense circuits 28 (e.g., in this example coupled to the plurality of loads) sense the plurality of oscillating signals and provide a representation of the sensed plurality of oscillating signals to the processing module for processing.

Alternatively, or in addition to, the battery sensor system sweeps through a plurality of oscillating signals as a function of time. For example, at or during time period t1, the first drive sense circuit 28 injects a first number of oscillating signals, and at or during a second time period t2, the first drive sense circuit 28 injects a second number of oscillating signals.

Still alternatively, or in addition to, a first drive sense circuit 28 of the battery sensor system injects a first oscillating signal at or during time t1 at a first frequency, and injects a second oscillating signal at or during time t2 at the first frequency. In a specific example, the processing module determines the temperature of the wire has increased based on an impedance change of the wire (e.g., a frequency response magnitude of second oscillating signal at the first frequency being less than a frequency response magnitude of the first oscillating signal at the first frequency indicating wire has increased in temperature).

FIG. 25C is a schematic block diagram of another embodiment 2502 of a battery sensor system that is interactive with a battery 2010 and a plurality of loads 2020. This diagram is similar to FIG. 25A with at least one difference being that a minus direct current (DC) selector 2505 (e.g., a capacitive switch of FIG. 21A, a switch, etc.) as shown in FIG. 25D is added between a drive sense circuit 28 and the wired connection. As illustrated in FIG. 25D, when the minus DC selector 2505 is in a first position, it provides a very low impedance path (e.g., a short, impedance of a wire, etc.), where signals (e.g., DC, alternate current (AC), etc. signals) generated from a first drive sense circuit 28 flow onto the wire to one or more other drive sense circuits 28. When the minus DC selector 2505 is in a second position, it substantially removes the constant component (e.g., DC) of the signals via capacitor C1 and provides the oscillating component (e.g., AC) of the signals on to the wire.

As a specific example, when a first drive sense circuit 28 generates a first signal that includes a DC component and an AC component, a first minus DC selector 2505 is set (e.g., via selector controls from processing module 42) to the second position to remove the DC component from the first signal to produce a first oscillating signal. The other minus DC selectors 2505 coupled to the wired connection and the other drive sense circuits 28 (e.g., the drive sense circuits receiving the first oscillating signal) are set to the first position to provide a low impedance receive path.

FIG. 25E is a flowchart illustrating an example of a method of determining operational status of a battery sensor system that includes a plurality of drive sense circuits, one or more processing modules, a battery, one or more loads, and a wired connection between the battery and loads. The method begins or continues with step 2510, where a first drive sense circuit of the plurality of drive sense circuits senses a first voltage at a first point of the wired connection, which is proximate to the battery.

The method continues with step 2512, where a second drive sense circuit of the plurality of drive-sense circuits senses a second voltage at a second point of the wired connection, which is proximate to a first load of the plurality of loads. The method continues with step 2514, where a third drive sense circuit of the plurality of drive-sense circuits senses a third voltage at a third point of the wired connection, which is proximate to a second load of the plurality of loads.

The method continues with step 2516, where a processing module of the one or more processing modules determines operational status of the battery and/or loads based on one or more of the first, second and third voltages. The operational status includes one or more of a voltage level (e.g., the voltage at a respective point, the voltage compared to a desired voltage (e.g., full charge voltage, voltage needed to optimal drive a respective load, etc.), etc.), a voltage variance between two sensed voltages, a favorable operational status (e.g., good when a first voltage level exceeds a first voltage level threshold) and an estimated timeframe that the battery is configured to power the loads under current and/or expected conditions.

The method continues to step 2518, where the processing module determines whether the operational status compares unfavorably to a performance threshold (low voltage threshold, voltage threshold range, high voltage threshold, operational status is bad, estimate battery life threshold, etc.). For example, the processing module determines a voltage of 8.499999 V proximate the battery is below a low voltage threshold (e.g., 8.5V) for the battery. As another example, the processing module determines a voltage variance (e.g., 0.004937 V) between a first point and a second point of the wired connection is below a voltage variance threshold (e.g., 0-0.005V).

When the operational status compares unfavorably, the method continues to step 2520, where the processing module generates and sends an alert message to a controller and/or other processing module regarding the operational status issue (e.g., comparing unfavorably (e.g., 8V<8.5V)). Alternatively, or in addition to, the processing module implements an operation status fix process based on the operational status. For example, the processing module instructs a controller to modify operation of one or more of the battery and the load such that the operational status issue is rectified. For example, the processing module instructs the controller to turn off a load. As another example, the processing module instructs the controller to turn on or add a battery cell to the battery. When the operational status compares favorably, the method continues back to step 2510. For example, the processing module determines the voltage variance in within the voltage variance threshold (e.g., compares favorably).

FIG. 26A is a schematic block diagram of another embodiment 2601 of a battery sensor system that is interactive with a wired connection between a battery 2010 and a plurality of loads 2020. The battery sensor system includes the plurality of drive sense circuits 28 and the processing module(s) 42 of FIG. 25A.

In an example of operation, the battery sensor system determines the currents (e.g., I_source, I_load 1, I_load 2, etc.) flowing on the wired connection based on the voltages sensed (e.g., in FIG. 25A) and the resistance (e.g., based on the impedances determined (e.g., in FIG. 25B) on the wired connection. The first load current is determined in accordance with Ohm's law V=IR, based on the voltage difference between the first and second drive sense circuits and the resistance of the wired connection between the first drive-sense circuit and the second drive-sense circuit. The second load current is determined based on the voltage difference between the first and third drive sense circuits and the resistance of the wired connection between the first and third drive sense circuits.

This continues until the xth load current is determined based on the voltage difference between the first and Yth drive sense circuits and the resistance of the wired connection between the first and xth drive sense circuits. Having determined the first through xth load currents, the processing module determines I source current being generated by the battery by summing the first through xth load currents.

FIG. 26B is a schematic block diagram of another embodiment 2603 of a battery sensor system that is interactive with a battery 2010 and a plurality of loads 2020. This diagram is similar to FIG. 26A with at least one difference being that the battery sensor system includes a plurality of other sensors that sense characteristics of the environment at and/or around the battery, the wired connection and the plurality of loads. The other sensors include one or more of a vibration sensor, an acoustic sensor, a pressure sensor, an environmental sensor (e.g., temperature, moisture, etc.), a global positioning system (GPS) sensor, an accelerometer, and a gyroscope. In an example, the other sensors are in direct contact with one or more of the battery, the wired connection, and the load. As another example, the other sensors are within the environment (e.g., same room, same module, coupled to a common structure (e.g., a chassis), etc.) of one or more of the battery, the wired connection, and the load.

The other sensors may be operably coupled to the processing module(s) 42 via the same connections as the drive sense circuits and/or may have a separate connection (e.g., different bus, different wire, coupled via a radio frequency identification (RFID) communication, Bluetooth communication, or near field communication (NFC), etc.) either wired and/or wireless to the processing module(s) 42.

FIG. 26C is a schematic block diagram of another embodiment 2605 of a battery sensor system that is interactive with a battery 2010 and a plurality of loads 2020. This diagram is similar to FIG. 26A with at least one difference being that additional drive sense circuits 28 (e.g., $5^{th}$ and $6^{th}$ drive sense circuits) are placed throughout the wired connection at points of interest. A point of interest can be any beginning or end point of a path segment of the wired connection, or any point where sensed data improves the accuracy, speed, reliability, amount of data needed, etc. to determine operational status of the battery sensor system.

In this embodiment, I_source can be derived by determining the voltages at the first and fifth sensor connection points (e.g., where the drive-sense circuit connects to the wired connection), and by determining the impedance of the wired connection between the first and fifth drive sense circuits 28 connection points as discussed in the previous Figures. Further, characteristics (e.g., voltage, impedance, current, temperature, etc.) of each section (e.g., portion of the wired connection between two drive-sense circuits) may be determined by the processing module 42, which allows the processing module 42 to make adjustments to the battery sensor system based on one or more sensed data.

Based on the sensing information gathered by the drive sense circuits 28, the processing module determines overall operating status (e.g., performance based on comparison of sensed data to desired values of the data) of the battery 2010, the wired connection, and/or the plurality of loads 2020. For example, the processing module 42 determines operating performance is below a performance threshold when the voltage sensed by the fourth drive sense circuit 28 is below a voltage threshold. As another example, the processing module 42 determines operating performance is below a performance threshold when the i_load 2 is above a current threshold. As another example, the processing module 42 determines operating performance is above the performance threshold when the impedances on the wired connection stay within an impedance range threshold.

In an example, the processing module 42 generates and sends an alert (e.g., to a computing device, to a controller, to another processing module, etc.) when the processing module determines operating performance is below a performance threshold and/or outside a desired performance range.

FIG. 26D is a flowchart illustrating an example of a method of determining currents on a wired connection of a battery sensor system. The method begins or continues with step 2600, where a processing module of the battery sensor system determines a first impedance of a first portion of a wired connection between a battery and a first load of a plurality of loads. The method continues with step 2602, where the processing module determines a second impedance of a second portion of a wired connection between the battery and a second load of a plurality of loads.

The method continues with step 2604, where the processing module determines a first current to the first load and a second current to the second load based on the first and second impedances and voltages of the first and second portions. The method continues with step 2606, where the processing module determines a total current from the battery based on the first and second currents. For example, the processing module sums the first and second currents to obtain the total current from the battery.

FIG. 27A is a schematic block diagram of another embodiment of a battery sensor system 2701 that is interactive with a battery 2010, a wired connection, and a plurality of loads 2020. This diagram is similar to FIG. 26B with at least one difference being that the battery sensor system includes a plurality of selectors 2750 operably coupled to the wired connection between the battery 2010 and the plurality of loads 2020. A selector 2750 may be one or more of a single pole, single throw (SPST) switch, a single pole, double throw (SPDT) switch, double pole, single throw (DPST) switch, double pole, double throw (DPDT) switch, a pressure switch, a reed switch, a float switch, a trembler switch, key switch, a limit switch, a sail switch, a proximity switch, a silicon-controlled rectifier, an analogue switch, a transistor, a logic gate, etc. Note that the selector 2750 may function as an on/off switch or as a dynamic adjustable selector to modify an electrical characteristic (e.g., voltage, current, impedance) to a desired range. For example, the processing module provides selector controls to a selector 2750 which causes the selector to reduce a first current by 50% (e.g., from 50 milliamps to 25 milliamps).

In an example of operation, the processing module 42 monitors operation one or more of the battery 2010, the wired connection and the loads 2020. The processing module 42 obtains battery, wired connection, load, and/or environment data from the plurality of drive sense circuits 28 and the plurality of other sensors. The processing module 42 determines operational characteristics (voltage, impedance, current, temperature, etc.) of the battery 2010, the wired connection, and/or loads 2020 based on the obtained data. Having determined the operational characteristics, the processing module manages operation of the loads (e.g., keeps loads operating in desired performance range, keeps battery life within desired life range, etc.) via selectors 2750.

For example, the processing module 42 determines current i_load 1 is 2.254 Amperes (A), which is within a desired operational range of load 1 of 1.5 A-3.5 A, and determines current i_load 2 is 2.501, which is outside a desired operational range of 2.25 A-2.5 A. The processing module sends selector controls to selector 2 2750 such that i_load 2 is reduced to a level within the desired operational range. For example, selector 2 includes a resistive ladder circuit and the selector controls cause the resistive ladder to increase resistance, which decreases current i_load 2 to 2.4 A, which is within the desired operational range.

In another example, the processing module 42 controls operation of the selectors 2750 to perform load balancing across each of the loads (e.g., loads 1-3). For example, processing module 42 instructs selectors 1-3 2750 to provide 2 mA of current for each of i_load 1 through 1_load 3. In another example, the processing module 42 controls operation of the selectors 2750 to perform load balancing across each of the loads (e.g., loads 1-3). For example, processing module 42 instructs selectors 1-3 2750 to provide a voltage 3V to each of i_load 1 through 1_load 3. In another example, the processing module 42 controls operation of the selectors 2750 to perform load balancing across each of the loads (e.g., loads 1-3). For example, processing module 42 instructs selectors 1-3 2750 to an impedance of 1 MΩ to each of i_load 1 through 1_load 3.

In another example of operation, the processing module 42 controls operation of the selectors 2750 to control operation (e.g., load balancing, on/off, cycling, power reduction, etc.) of the loads (e.g., loads 1-3) based on load priority. For example, load 1 has a first priority, load 2 has a second priority, and load 3 has a third priority. The processing module obtains (e.g., generates, receives) priority data assigned to each load. For example, load 1 is assigned a priority score of 55 of a range of 1-100, load 2 is assigned a priority score of 23, and load 3 is assigned a priority score of 77.

The priority may be a scoring system based on one or more of a power score, cycling ability score, an importance score, a need factor, a historic performance score, an amount of use score, a current score, and a voltage score. For example, the importance score is based on an importance of the load (e.g., for operational performance of a system powered by the battery (e.g., in a car system, power steering, lidar sensing, etc. being more important than floor lighting, seat warmer, etc. being less important). The cycling ability score is based on whether the load may be power non-continuously (e.g., intermittently). The historical data score is based on how often the load is consuming power. The need factor score is based on an immediate need of load to the system. For example, when the battery sensor system senses an exterior ambient light is above a threshold, need factor of headlights is reduced. As another example, when the battery sensor system senses a temperature is below a threshold, the need factor for heated mirrors is increased.

As a specific example, the battery sensor system is within a motor vehicle (e.g., electric vehicle, hybrid vehicle, internal combusting engine vehicle, hydrogen powered vehicle, etc.). The vehicle includes a plurality of loads 2020 powered by battery 2010. The first load is a windshield wiper motor, the second load is a light emitting diode (LED) interior lighting system, and the third load is headlights. The first load is assigned a priority score of 14 based on a level of importance score of 20, power requirements score of 15, historical data score of 7 and an immediate need of 0.3 based on a priority score function of:

$$\text{Priority score} = (\text{level of importance score} + \text{power requirements score} + \text{historical data score}) * \text{immediate need factor score}$$

As such, the first loads' priority score=(20+15+7) *0.3=14. The second load is assigned a priority score based on a level of importance score of 8, power requirements score of 3, historical data score of 44 and an immediate need of 0.1. As such, the second load priority score is (8+3+44) *0.1=5.5. The third load is assigned a priority score based on a level of importance score of 95, power requirements score of 35, historical data score of 10 and an immediate need of 0.7. As such the second load priority score is (95+35+10) *0.7=98

Based on the priority scores, the processing module determines load 3 has a higher priority than load 1, and load 1 has a higher priority than load 2. As such, the processing module controls operation of loads 1-3 based on the level of priority of the loads. For example, the processing module determines that battery 2010 will not have enough power for the vehicle to maintain its current state (e.g., power consumption) before the vehicle arrives at a scheduled recharging/refueling station. Thus, at or during a first time, t1, processing module determines to turn off the lowest priority load, load 2 to save battery power. Note the processing module continues monitoring the operation of the battery and the loads and may recalculate priority based on one or more of a change to sensed data, based on a schedule (e.g., every 5 seconds, every 10 milliseconds, etc.) and based on receiving a command.

As another example, the processing module 42 determines a temperature associated with load 3 is above a temperature threshold and the processing module controls the operation of selector 3 to turn load 3 off. As yet another example, the processing module cycles power to one or more loads at an interval. For instance, when load 2 only needs power intermittently, the processing module controls selector 2 to provide power intermittently (e.g., on for 10 milliseconds (ms), off for 10 ms).

As another specific example, load 1 is a vehicle window heating system and has a desired operating power need of 120 watts from the battery. Thus load 1 has a power score of 40 on a scale of 0 to 100. Load 1 is assigned an importance score of 20 on a 0-100 scale (e.g., based on a temperature (e.g., sensed by a temperature sensor) being above 45 degrees Fahrenheit). The processing module determines the overall priority score for load 1 based on the importance score and the power source (e.g., averages, multiplies with a score type coefficient (e.g., power score weighted higher than importance score), etc.). For example, the processing module determines the priority score is 30 by averaging the importance and power scores. Continuing with this example, load 2 is vehicle driving lights that has a desired operating power need of 50 watts. Thus, load 2 has a power score of 18 on a scale of 0 to 100.

Load 2 is assigned an importance score of 5 on a 0-100 scale (based on vehicle location (from GPS sensor), weather data (received by processing module 42), sensed exterior ambient light, and time of day) as the processing module determines the vehicle lights won't be needed (e.g., no tunnels on driving path, time of day 10:14 am, weather sunny, etc.). As such, the processing module determines a priority score of load 2 to be 11.5. As such, the processing module determines load 1 is of higher priority than load 2.

Based on the priority, the processing module manages (e.g., controls) performance of the battery and loads. For example, during time t1, i_load 2 and i_load 3 are both outside a desired operational performance range and load 2 has a higher priority than load 3. Further, the processing module determines that current i source cannot be adjusted to power i_load 2 and i_load 3 optimally during t1. However, the processing module determines that by turning off one of i_load 3 and i_load 2, the other current will be back inside the desired operational performance range. Since i load 2 has the higher priority, the processing module turns off (e.g., via selector 3) load 3. Note that the priority may change from timeframe to timeframe. For example, during time t1 load 2 has a higher priority than load 3, and during time t2 load 3 has a higher priority than load 2.

FIG. 27B is a schematic block diagram of another embodiment 2703 of a battery sensor system that is interactive with a battery 2010, a wired connection, and a plurality of loads 2020. This diagram is similar to FIG. 27A with at least one difference being that the battery sensor system includes a plurality of fuses 1-$x$ operably coupled to the wired connection between the battery and the plurality of loads. Note in one embodiment, a combination of fuses and selectors are operably coupled within the wired connection between the battery and the plurality of loads.

In an example of operation, the processing module 42 obtains battery, wired connection, load, and environment data/other data (e.g., GPS data, vibration data, etc.) from the plurality of drive sense circuits 28 and the plurality of other sensors. The processing module 42 determines an error condition associated with load 2 that indicates load 2 needs replacement. The processing module 42 sends a fuse control signal to the second fuse to blow the fuse. The fuse is then replaced by a repair person when servicing replacement of load 2. Alternatively, or in addition to, the fuse is set (e.g., based on physical properties) to blow when a condition occurs (e.g., current above a threshold).

FIG. 27C is a flowchart illustrating an example of a method of determining a load management operation for a plurality of loads in a battery sensor system. The method begins or continues with step 2700, where the processing module of the battery sensor system obtains battery and load information of the battery sensor system (e.g., battery, load, wired connection, drive sense circuits, environment of the battery, load, etc.). The battery and load information includes one or more of a voltage, an impedance, a current, a temperature, a pressure, a battery life expectancy, power, battery capability information (full charge data, current supply capabilities, etc.), load operating parameter information (e.g., power needed, rating, etc.).

The method continues with step 2702, where the processing module of the battery sensor system determines a performance level (e.g., an operational status, a performance score, etc.) based on the battery and load information. The method continues with step 2704, where the processing module determines whether the level of performance compares favorably (e.g., over, within range) to a performance threshold. When the level of performance compares favorably, the method continues to step 2700. When the level of performance compares unfavorably, the method continues to step 2706, where the processing module determines a load management operation based on the battery and load information. For example, the processing module determines the load management operation is to utilize a priority score associated with each load to determine how to power and prioritize the loads.

The method continues with step 2708, where the processing module implements the load management operation. For example, the processing module determines priority scores for each load and determines the priority of the loads based on the priority scores. The processing module then controls operation of the loads in accordance with the priority scores. For example, the processing module keeps a first amount of voltage on a first load for as long as possible. As another example, the processing module turns off load 2 when detecting an error condition. As yet another example, the processing module reduces current to load 3 when determining load 3 is associated with a lowest priority score and loads 1 and 2 need more current to keep within a desired performance range during a time period.

FIG. 28A is a schematic block diagram of another embodiment 2801 of a battery sensor system interactive with a plurality of batteries 2010 operably coupled via a wired connection to a load 2020. The battery sensor system includes processing module 42 and a plurality of drive sense circuits. The wired connection is illustrated by bolded lines and includes one or more wires operably coupled to provide a low impedance path between the plurality of batteries 2010 and the load 2020. Note the term battery as used herein may indicate a plurality of battery cells, a battery stack (e.g., combination of batteries arranged in series), a battery module (stacks arranged in parallel) and/or a battery cell. As a specific example, battery 1 2010 is a lead-acid battery that includes plurality of battery cells and battery 2 2010 is a lithium-ion battery module that includes 48 lithium-ion batteries, which are arranged in two parallel stacks of 24 batteries. Note a battery may be any type of battery (e.g., lead acid, lithium ion, alkaline, dry cell, lithium air, solid state, zinc carbon, nickel iron, galvanic cell, etc.).

In an example of operation, the drive sense circuits 28 of the battery sensor system sense one or more voltages on the wired connection. For example, a first drive sense circuit DSC-1 28 senses a voltage V_B1 at a first point of the wired connection, a second drive sense circuit DSC-2 28 senses a voltage V_B2 at a second point of the wired connection, a third drive sense circuit DSC-3 28 senses a voltage V_L at a third point of the wired connection, and so on up to a "y"th drive sense circuit DSC-Y 28 senses a voltage V_BY at a zth point on the wired connection.

The processing module 42 obtains the voltages (e.g., via a voltage signal, a digital value representative of a voltage, etc.) from the drive sense circuits 28 and determines a variance, or voltage drop, between the load and one or more of the batteries. For example, the processing module determines the point V_B1 is at 48 volts, the point V_B2 is at 47.98 volts and determines the point V_L is at 47.2 volts. The processing module 42 determines the variance between point V_B1 and V_L is 0.8 volts, the variance between point V_B2 and V_L is 0.78 volts, and the variance between point V_B1 and V_B2 is 0.02 volts.

The processing module 42 further functions to control operation of the drive sense circuits 28. For example, the processing modules 42 determines and/or provides a voltage reference signal for each drive sense circuit 28 to utilize in determining a voltage at each respective point where the drive sense circuit 28 is operably coupled to the wired connection. As a specific example, the processing module 42 estimates a voltage (e.g., based on previous voltage reading, based on a known desired voltage (e.g., 48V) in a lookup table, based on time since last measurement, pre-programmed, etc.) at a particular point, and sets the voltage reference signal of the drive sense circuit 28 to the estimated voltage. As another example, the processing module 42 compares the voltages to one or more voltage thresholds for the batteries and load and generates and sends (e.g., to a controller (e.g., to change function of the battery and/or loads), to another processing module, etc.) an alert message when a voltage is outside a voltage threshold.

FIG. 28B is a schematic block diagram of another embodiment 2803 of a battery sensor system interactive with a plurality of batteries 2010 operably coupled via a wired connection to a load 2020. The battery sensor system includes processing module(s) 42, the wired connection, a selector, a plurality of drive sense circuits 28.

In an example of operation, the processing modules 42 controls operation of batteries 2010 based on sensed data from the drive sense circuits 28 that represent the operation of the batteries 2010 and the load 2020. For example, with only battery 1 enabled (e.g., via the selector), the processing module determines (e.g., based on signal from a fourth drive sense circuit 28) a voltage V_L is 1.9V, which is below a voltage threshold of 2.0V. The processing module 42 provides a control signal to the selector to enable battery 2 (e.g., when battery 1 and 2 are in a series configuration) to bring the voltage V_L back above the voltage threshold.

FIG. 28C is a schematic block diagram of another embodiment 2805 of a battery sensor system that is interactive with batteries 2010 and a load 2020. This diagram is similar to FIG. 28B with at least one difference being that an independent selector is integrated within or operably coupled to the wired connection for each battery 2010.

FIG. 28D is a schematic block diagram of an embodiment 2807 of a battery sensor system that is interacting with a plurality of batteries 2010, a wired connection, and a load 2020. In this example, a fourth drive sense circuit 28 (e.g., DSC-4) injects a plurality of oscillating signals onto the wired connection. Other sensor circuits (e.g., drive sense circuit 1, drive sense circuit 2, drive sense circuit 3) receive the plurality of oscillating signals and produce signals representing a frequency response (e.g., magnitude at one or more frequencies) of the plurality of oscillating signals.

The processing module 42 determines an impedance (e.g., resistance at zero frequency (e.g., direct current value)) of a portion of the wired connection based on the frequency response of the plurality of oscillating signals. For example, the processing module maps a function (e.g., y=mx+b) based on the magnitudes to determine (e.g., estimate (e.g., to 99.9999% accuracy)) a y-intercept magnitude (e.g., 0 Hertz) of an x-y cartesian coordinate system, where the y axis represents the magnitude and x axis represents a frequency in Hertz of the oscillating signals. Thus, the estimated impedance of a portion of the wired connection at 0 Hertz is substantially equal to a resistance of the portion of the wired connection, which is determined without adding any resistive element on the wired connection between a battery and a load. Being able to determine voltage, current and impedance of a portion of the wired connection between the bather and the load without adding the resistive element, increases the battery performance, battery life, heat dissipation, cost, etc. of the battery and/or loads. Further, the drive sense circuits' ability to sense microvolts, nanovolts or smaller changes with a low power drive signal increases the accuracy of sensing and thus the performance of the battery based on more accurate charging, discharging, which reduces the likelihood of an overcharge, an undercharge and other battery damaging events. Further this increases the performance of the load as the optimal power can be delivered to the load resulting in less power wasted, longer load run times per battery charge, and increased life expectancy of the load.

FIG. 28E is a flowchart illustrating an example of a method of determining operational status of a battery sensor system that includes a plurality of drive sense circuits 28, one or more processing modules 42, one or more batteries 2010, a load 2020, and a wired connection between the batteries 2010 and the load 2020. The method begins or continues with step 2800, where a first drive sense circuit of the plurality of drive sense circuits senses a first voltage at a first point of the wired connection, which is proximate to a first battery of the plurality of batteries.

The method continues with step 2802, where a second drive sense circuit of the plurality of drive sense circuits senses a second voltage at a second point of the wired connection, which is proximate to a second battery of the plurality of batteries. The method continues with step 2804, where a third drive sense circuit of the plurality of drive sense circuits senses a third voltage at a third point of the wired connection, which is proximate to the load.

The method continues with step 2806, where a processing module of the one or more processing modules determines operational status of the batteries and/or load based on one or more of the first, second and third voltages. The operational status includes one or more of a voltage level, a voltage variance, an estimated battery health (e.g., amount of charge remaining, percentage of total charge, operating temperature, etc.), and an estimated timeframe that the batteries are configured to power the load under current conditions.

The method continues to step 2808, where the processing module determines whether the operational status compares unfavorably to a performance threshold (low voltage threshold, voltage threshold range, high voltage threshold, estimate battery life threshold, etc.). For example, the processing module determines a voltage of 39.98V proximate the first battery is below a low voltage threshold (e.g., 40 V) for the battery. As another example, the processing module determines a voltage variance (e.g., 0.000012V) between a first point and a second point of the wired connection is below a voltage variance threshold (e.g., 0-0.00002V).

When the operational status compares unfavorably, the method continues to step 2810, where the processing module generates and sends an alert message to a controller and/or other processing module regarding the operational status issue (e.g., comparing unfavorably (e.g., 39.98V<40 V)). When the operational status compares favorably, the method continues back to step 2800. For example, the processing module determines the voltage variance in within the voltage variance threshold (e.g., compares favorably). As another example, the processing module determines a battery health (e.g., charge) is low and sends an alert message indicating the battery will need charging within a timeframe based on current conditions.

FIG. 29A is a schematic block diagram of another embodiment 2901 of battery sensor system interactive with a plurality of batteries 2010 operably coupled via a wired connection to a load 2020. The battery sensor system includes processing module(s) 42 and a plurality of drive sense circuits 28.

In an example of operation, the battery sensor system determines the currents (e.g., I_batt 1, I_batt 2, I_load, etc.) flowing on the wired connection based on the voltages sensed (e.g., in FIG. 28A) and the resistance (e.g., based on the impedances determined (e.g., in FIG. 28D) on the wired connection. The first battery current is determined in accordance with Ohm's law V=IR, based on the voltage difference between the first and third drive sense circuits and the resistance of the wired connection between the first drive sense circuit 28 and the third drive sense circuit 28. The second battery current is determined based on the voltage difference between the second and third drive sense circuits 28 and the resistance of the wired connection between the second and third drive sense circuits 28.

This continues until the yth battery current is determined based on the voltage difference between the third and yth drive sense circuits and the resistance of the wired connection between the third and yth drive sense circuits. Having determined the first through yth battery currents, the processing module determines I_load current being generated by the batteries by summing the first and yth battery currents.

FIG. 29B is a schematic block diagram of another embodiment 2903 of battery sensor system interactive with a plurality of batteries operably coupled via a wired connection to a load. The battery sensor system includes processing module(s) 42 and a plurality of drive-sense circuits. This diagram is similar to FIG. 29A with at least one difference being that additional drive-sense circuits (e.g., a fourth and fifth drive-sense circuit) are placed throughout the wired connection at points of interest. A point of interest can be any beginning or end point of a path segment of the wired connection, or any point where sensed data improves the accuracy, speed, amount of data needed, etc. to determine operational status of the battery sensor system. For example, the placement of drive-sense circuit 5 allows determination of i batt 2 in conjunction with drive-sense circuit 2. As another example, the placement of drive-sense circuit 4 allows for determination of i_load in conjunction with drive-sense circuit 3.

FIG. 29C is a flowchart illustrating an example of another method of determining currents on a wired connection of a battery sensor system. The method begins or continues with step 2900, where the battery sensor system determines a first impedance of a first portion of a wired connection between a load and a first battery of a plurality of batteries. The method continues with step 2902, where the battery sensor system determines a second impedance of a second portion of a wired connection between the load and a second battery of the plurality of batteries.

The method continues with step 2904, where the processing module determines a first current to the load and a second current to the load based on the first and second impedances and voltages of the first and second portions. The method continues with step 2906, where the processing module determines a load current from the first and second batteries based on the first and second currents. For example, the processing module sums the first and second currents to obtain the load current from the first and second batteries.

FIG. 30A is a schematic block diagram of another embodiment 3001 of battery sensor system interactive with a plurality of batteries 2010 operably coupled via a wired connection to a load 2020. The battery sensor system includes processing module 42, a selector and a plurality of drive sense circuits 28. Note that each drive sense circuit may have a separate connection to the processing module or may share a connection. In this example, the battery sensor system manages battery operation to power the load via one selector on the wired connection such that current is enabled from a battery 2010 of batteries 1-*y* to the load 2020. Note for ease of illustration, a parallel configuration of batteries is shown, however, a battery or batteries in all embodiments may be implicitly in one or more of an independent, series and/or parallel combination.

In an example of operation, the processing module determines a load current is 2.1 amps. The processing module further determines that for a timeframe t2, a load current of 3 amps is needed. As such, the processing module sets the selector controls to produce an i load from the plurality of batteries to be substantially 3 amps.

FIG. 30B is a schematic block diagram of another embodiment 3003 of battery sensor system interactive with a plurality of battery cells operably coupled via a wired connection to a load 2020. The wired connection includes a battery bus 3005. Each battery cell has a controlled fuse and current regulator circuit, which may be a silicon controlled rectifier, relay and fuse, or other circuit (e.g., selector) that is configured to control (e.g., reduce, stop) current on the wired connection.

In an example of operation, the drive sense circuits 28 sense electrical characteristics of the wired connection and provide signals representative of the characteristics to the processing module 42 for processing. The processing module 42 determines operational status (voltages of battery cells, current from each battery cell, temperature of wired connection portion, etc.) of the battery sensor system based on the processed signals. For example, the processing module determines that a portion (e.g., between two drive-sense circuits) of the wired connection has changed temperature based on a same current but different voltage (e.g., mV difference, nanovolt difference, etc.) being sensed from time t1 to time t2. As another example, the processing module determines the load can be adequately powered using 3 cells (e.g., load needs 3 A minimum and each cells provides up to 1.5 A such that the 3 cells provide up to 4.5 A of current to the load).

Having determined the operational status, the processing module 42 controls (via fuse controls) which battery cells are utilized to drive the load 2020 via a controlled fuse circuit. For example, the processing module rotates 3 cells on at time t1 (e.g., battery cell 1, 3 and 5), and battery cell 2, 4, and 6 for time t2. This can decrease the likelihood a battery cell will need to be cooled or will overheat as adjacent cells are not on concurrently, and thus do not transfer heat to one another.

FIG. 30C is a schematic block diagram of another embodiment 3007 of a battery sensor system interactive with a plurality of battery cells 1-5 and a load 2020. The battery sensor system includes processing module 42, a plurality of controlled fuse and current regulator circuits and a plurality of drive sense circuits 28.

In an example of operation, the processing module 42 of the battery sensor system determines that battery cell 1 has an issue. The issue includes one or more of an undesired (e.g., outside threshold range) temperature, voltage, current, and impedance of wired connection connecting to battery cell 1, the battery cell not needed during a timeframe to power the load, determining to turn off the battery cell according to a set rotation scheme, and receiving a command to turn off the battery cell. In this example, the battery sensor system determines the issue is a voltage (e.g., sensed by drive sense circuit DSC-A1 proximate to battery cell 1) is below a voltage threshold. Having determined the issue, the battery sensor system removes battery cell 1 from driving the load via the controlled fuse and current regulator circuit. The processing module 42 may further generate a message indicating the voltage issue and send the message to another processing module 42 or computing device (e.g., associated with control of battery cell 1, user computing device associated with ownership of device that includes battery cell 1, etc.).

FIG. 30D is a schematic block diagram of another embodiment 3011 of a battery sensor system interactive with a plurality of battery cells operably coupled to a load or loads 2020 via a wired connection. The battery sensor system includes processing module(s) 42, a plurality of selectors 1-*x*, a plurality of drive sense circuits 28, and a plurality of batteries 1-*x*. Each battery includes a plurality of battery cells in series. For example, battery 1 includes battery cell 1-1, battery cell 1-2, battery cell 1-3, and battery cell 1-4 in series. A battery bus 3005 of the wired connection couples the batteries 1-*x* in parallel to drive the load 2020.

In an example of operation, the processing module 42 receives sensor signals from the plurality of drive sense circuits A-B. The sensor signals represent one or more of a sensed voltage, a frequency response magnitude, a current, and a temperature on the wired connection. The processing module also receives system data. The system data may indicate operating parameters for a battery 1-*x*, a battery cell, and a load 2020, and battery layout information (e.g., how the batteries are arranged and location within a structure), battery coolant information (type of cooling system, capabilities of cooling system, direction of coolant flow, etc.), battery type (e.g., lead-acid, lithium ion, etc.), and expected environmental parameters (e.g., in liquid, expected temperature, etc.). The processing module 42 is configured to modify selector and/or sensor controls (ctrls) based on the sensor signals and the system data to manage battery use and life.

FIG. 30E is a schematic block diagram of another embodiment 3013 of a battery sensor system interactive with a plurality of batteries 1-*x* operably coupled via a wired connection to a load 2020. The wired connection includes battery bus 3005. A first battery 1 includes battery cells 1-1 through 1-4, a second battery includes battery cells 2-1 through 2-4, and so on up to a xth battery includes battery cells x-1 through x-4. Note from battery to battery the number of battery cells may vary. The battery sensor system includes processing module(s) 42, a plurality of sensors (e.g., drive sense circuits 28 and other sensors) placed throughout the wired connection and the environment of the batteries 1-*x*, wired connection and/or loads 2020.

In this example, the processing module 42 determines based on sensor signals and system data, that cell 2-1 has a voltage that is below a second desired voltage range, and cells 2-2 and 2-3 have a voltage that is above the second desired voltage range, but below a first desired voltage range. The processing module 42 further determines that temperature data from other sensor 2 indicates the temperature of battery 2 is over a first desired temperature range. As such, the processing module determines a load management operation to bring the battery back within optimal desired operation. For example, the processing module determines to rotate battery 2 out from powering the load (e.g., via selector 2) the next 3 timeframes in order to cool the battery. As another example, the processing module generates and sends a charge message to a controller computing device to charge battery 2 to bring cell voltages back within the first desired voltage range. The charge message may include any information the processing module has regarding battery 2 (e.g., historic sensor data, last sensed voltage, last sensed temperature, etc.).

FIG. 30F is a schematic block diagram of an embodiment 3015 of a battery sensor system interactive with a plurality of batteries 2010 operably coupled via a wired connection to a plurality of loads 2020. In this embodiment, the processing module 42 controls operation of the loads 2020 and the batteries 2010 via selector circuits to maintain or optimize operational performance, life, and/or efficiency of the batteries and/or loads. The processing module 42 also controls operation of the drive sense circuits 28 via sensor controls (e.g., setting drive sense circuit reference signals).

FIG. 30G is a flowchart illustrating an example of a method of battery cell management in a battery sensor system. The method begins or continues with step 3000, where a processing module of the battery sensor system obtains sensor data regarding battery and load information of the battery sensor system (e.g., battery, load, wired connection, drive sense circuits, environment of the battery, load, etc.). The sensor data includes one or more of a voltage, an impedance, a current, magnitude at a frequency data, a temperature, a pressure, a battery life expectancy, power, battery capability information (full charge data, current supply capabilities, etc.), and load operating parameter information (e.g., power needed, rating, etc.).

The method continues with step 3002, where the processing module of the battery sensor system determines a performance level (e.g., a battery operational status, a battery performance score, etc.) of a battery based on the battery and load information. The method continues with step 3004, where the processing module determines whether the level of performance compares favorably (e.g., over, within range) to a performance threshold. When the level of performance compares favorably (e.g., voltage level of a battery above a voltage threshold), the method continues to step 3000. When the level of performance compares unfavorably (e.g., voltage level of a battery below a voltage threshold), the method continues to step 3006, where the processing module determines a battery cell management operation based on the performance level and/or the battery and load information. The battery cell management operation includes one or more of battery cell stack (e.g., series) rotation, turning a battery cell/stack on, turning a battery cell/stack off, adding a new battery cell/stack to existing battery cell/stack, etc.

For example, the processing module determines the battery cell management operation is to utilize rotating battery cell stack scheme such that adjacent battery cell stacks are not on during the same timeframe to reduce overheating issues. As another example, the processing module determines the battery cell management operation is to remove a battery cell stack from driving the load when the battery cell stack has a voltage below a voltage threshold. As another example, the processing module determines to rotate battery cell stacks to even out remaining charge across the battery cell stacks. As yet another example, the processing module determines the battery cell management operation is to add a battery cell stack for driving the load when the load need addition current.

Having determined the battery cell management operation, the method continues at step 3008, where the processing module implements the battery cell management operation. For example, the processing module generates selector controls to cause a battery cell stack to be removed from driving the load during timeframe t1.

As used in the preceding figures, a drive sense circuit has the general reference number of 28. When, in a particular figure, the drive sense circuit's reference number has a suffix (e.g., -a, -b, -c, etc.), the reference number with a suffix is referring to a specific embodiment of a drive sense circuit. A specific embodiment of a drive sense circuit includes some or all of the features and/or functions of drive sense circuits having no suffix to its reference number. Further, when a drive sense circuit has a suffix with a letter and a number, this is representative of different sub-embodiments of an embodiment of the drive sense circuit. The same applies for other components in the figures that have a reference number with a suffix.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., indicates an advantageous relationship that would be evident to one skilled in the art in light of the present disclosure, and based, for example, on the nature of the signals/items that are being compared. As may be used herein, the term "compares unfavorably", indicates that a comparison between two or more items, signals, etc., fails to provide such an advantageous relationship and/or that provides a disadvantageous relationship. Such an item/signal can correspond to one or more numeric values, one or more measurements, one or more counts and/or proportions, one or more types of data, and/or other information with attributes that can be compared to a threshold, to each other and/or to attributes of other information to determine whether a favorable or unfavorable comparison exists. Examples of such a advantageous relationship can include: one item/signal being greater than (or greater than or equal to) a threshold value, one item/signal being less than (or less than or equal to) a threshold value, one item/signal being greater than (or greater than or equal to) another item/signal, one item/signal being less than (or less than or equal to) another item/signal, one item/signal matching another item/signal, one item/signal substantially matching another item/signal within a predefined or industry accepted tolerance such as 1%, 5%, 10% or some other margin, etc. Furthermore, one skilled in the art will recognize that such a comparison between two items/signals can be performed in different ways. For example, when the advantageous relationship is that signal 1 has a greater magnitude than signal 2, a favorable comparison may be achieved when the magnitude of signal 1 is greater than that of signal 2 or when the magnitude of signal 2 is less than that of signal 1. Similarly, one skilled in the art will recognize that the comparison of the inverse or opposite of items/signals and/or other forms of mathematical or logical equivalence can likewise be used in an equivalent fashion. For example, the comparison to determine if a signal X>5 is equivalent to determining if −X<−5, and the comparison to determine if signal A matches signal B can likewise be performed by determining −A matches −B or not(A) matches not(B). As may be discussed herein, the determination that a particular relationship is present (either favorable or unfavorable) can be utilized to automatically trigger a particular action. Unless expressly stated to the contrary, the absence of that particular condition may be assumed to imply that the particular action will not automatically be triggered. In other examples, the determination that a particular relationship is present (either favorable or unfavorable) can be utilized as a basis or consideration to determine whether to perform one or more actions. Note that such a basis or consideration can be considered alone or in combination with one or more other bases or considerations to determine whether to perform the one or more actions. In one example where multiple bases or considerations are used to determine whether to perform one or more actions, the respective bases or considerations are given equal weight in such determination. In another example where multiple bases or considerations are used to determine whether to perform one or more actions, the respective bases or considerations are given unequal weight in such determination.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, a quantum register or other quantum memory and/or any other device that stores data in a non-transitory manner. Furthermore, the memory device may be in a form of a solid-state memory, a hard drive memory or other disk storage, cloud memory, thumb drive, server memory, computing device memory, and/or other non-transitory medium for storing data. The storage of data includes temporary storage (i.e., data is lost when power is removed from the memory element) and/or persistent storage (i.e., data is retained when power is removed from the memory element). As used herein, a transitory medium shall mean one or more of: (a) a wired or wireless medium for the transportation of data as a signal from one computing device to another computing device for temporary storage or persistent storage; (b) a wired or wireless medium for the transportation of data as a signal within a computing device from one element of the computing device to another element of the computing device for temporary storage or persistent storage; (c) a wired or wireless medium for the transportation of data as a signal from one computing device to another computing device for processing the data by the other computing device; and (d) a wired or wireless medium for the transportation of data as a signal within a computing device from one element of the computing device to another element of the computing device for processing the data by the other element of the computing device. As may be used herein, a non-transitory computer readable memory is substantially equivalent to a computer readable memory. A non-transitory computer readable memory can also be referred to as a non-transitory computer readable storage medium.

One or more functions associated with the methods and/or processes described herein can be implemented via a processing module that operates via the non-human "artificial" intelligence (AI) of a machine. Examples of such AI include machines that operate via anomaly detection techniques, decision trees, association rules, expert systems and other knowledge-based systems, computer vision models, artificial neural networks, convolutional neural networks, support vector machines (SVMs), Bayesian networks, genetic algorithms, feature learning, sparse dictionary learning, preference learning, deep learning and other machine learning techniques that are trained using training data via unsupervised, semi-supervised, supervised and/or reinforcement learning, and/or other AI. The human mind is not equipped to perform such AI techniques, not only due to the complexity of these techniques, but also due to the fact that artificial intelligence, by its very definition—requires "artificial" intelligence—i.e., machine/non-human intelligence.

One or more functions associated with the methods and/or processes described herein can be implemented as a large-scale system that is operable to receive, transmit and/or process data on a large-scale. As used herein, a large-scale refers to a large number of data, such as one or more kilobytes, megabytes, gigabytes, terabytes or more of data that are received, transmitted and/or processed. Such receiving, transmitting and/or processing of data cannot practically be performed by the human mind on a large-scale within a reasonable period of time, such as within a second, a millisecond, microsecond, a real-time basis or other high speed required by the machines that generate the data, receive the data, convey the data, store the data and/or use the data.

One or more functions associated with the methods and/or processes described herein can require data to be manipulated in different ways within overlapping time spans. The human mind is not equipped to perform such different data manipulations independently, contemporaneously, in parallel, and/or on a coordinated basis within a reasonable period of time, such as within a second, a millisecond, microsecond, a real-time basis or other high speed required by the machines that generate the data, receive the data, convey the data, store the data and/or use the data.

One or more functions associated with the methods and/or processes described herein can be implemented in a system that is operable to electronically receive digital data via a wired or wireless communication network and/or to electronically transmit digital data via a wired or wireless communication network. Such receiving and transmitting cannot practically be performed by the human mind because the human mind is not equipped to electronically transmit or receive digital data, let alone to transmit and receive digital data via a wired or wireless communication network.

One or more functions associated with the methods and/or processes described herein can be implemented in a system that is operable to electronically store digital data in a memory device. Such storage cannot practically be performed by the human mind because the human mind is not equipped to electronically store digital data.

One or more functions associated with the methods and/or processes described herein may operate to cause an action by a processing module directly in response to a triggering event—without any intervening human interaction between the triggering event and the action. Any such actions may be identified as being performed "automatically", "automatically based on" and/or "automatically in response to" such a triggering event. Furthermore, any such actions identified in such a fashion specifically preclude the operation of human activity with respect to these actions—even if the triggering event itself may be causally connected to a human activity of some kind.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A voltage sensor comprising:
a drive-sense circuit (DSC) operably coupled to a point along a wire that is proximate to a terminal of a battery, wherein the wire connects the terminal of the battery to a load, wherein, when enabled, the DSC configured to:
generate a signal based on a reference signal, wherein the reference signal is based on an estimate of a voltage at the point along the wire that is proximate to the terminal of the battery;
provide the signal to the point along the wire that is proximate to the terminal of the battery;
generate an output signal that corresponds to a difference between the signal and the reference signal;
tune the reference signal until the signal compares favorably to the voltage at the point along the wire that is proximate to the terminal of the battery thereby generating a tuned reference signal; and
determine the voltage at the point along the wire that is proximate to the terminal of the battery based on the tuned reference signal; and
a reference load operably coupled to the DSC and the point along a wire that is proximate to a terminal of the battery.

2. The voltage sensor of claim 1 further comprising:
memory that stores operational instructions; and
one or more processing modules operably coupled to the DSC and the memory, wherein, when enabled, the one or more processing modules configured to execute the operational instructions to:
process a digital signal that is representative of the difference between the signal and the reference signal; and
direct the DSC to tune the reference signal until the signal compares favorably to the voltage at the point along the wire that is proximate to the terminal of the battery.

3. The voltage sensor of claim 1 further comprising:
memory that stores operational instructions; and
one or more processing modules operably coupled to the DSC and the memory, wherein, when enabled, the one or more processing modules configured to execute the operational instructions to:
generate the reference signal; and
provide the reference signal to the DSC.

4. The voltage sensor of claim 1, wherein a first terminal of the reference load is operably coupled to the DSC and the point along the wire that is proximate to the terminal of the battery, and a second terminal of the reference load is operably coupled to ground.

5. The voltage sensor of claim 1, wherein the reference load is at least one of a real resistance load or a reactive impedance load.

6. The voltage sensor of claim 1, wherein, when enabled, the DSC configured to stop outputting any current based on the reference signal being tuned to the voltage at the point along the wire that is proximate to the terminal of the battery.

7. The voltage sensor of claim 1, wherein the voltage sensor further comprising:
another DSC operably coupled to another point along the wire that connects the terminal of the battery to the load, wherein, when enabled, the another DSC configured to:
generate another signal based on another reference signal, wherein the another reference signal is based on another estimate of another voltage at the another point along the wire that connects the terminal of the battery to the load;
provide the another signal to the another point along the wire that connects the terminal of the battery to the load;
generate another output signal that corresponds to another difference between the another signal and the another reference signal; and
tune the another reference signal until the another signal compares favorably to another voltage at the another point along the wire that connects the terminal of the battery to the load thereby generating another tuned reference signal;
determine the another voltage at the another point along the wire that connects the terminal of the battery to the load based on the another tuned reference signal; and
another reference load operably coupled to the another DSC and the another point along the wire that connects the terminal of the battery to the load.

8. The voltage sensor of claim 1, wherein the DSC further comprises:
a comparator configured to:
receive the reference signal at a first comparator input and to provide the signal via a single line to an electrical node corresponding to the point along the wire that is proximate to the terminal of the battery; and
generate an output comparator signal based on the reference signal and the signal;
a dependent current source operably coupled to source a current to the terminal of the battery via the single line to the electrical node corresponding to the point along the wire that is proximate to the terminal of the battery based on the output comparator signal; and
an analog to digital converter (ADC) operably coupled to an output of the comparator, wherein, when enabled, the ADC configured to process the output comparator signal to generate a digital signal that is representative of an effect on the signal that is provided via the single line to the electrical node corresponding to the point along the wire that is proximate to the terminal of the battery.

9. The voltage sensor of claim 1, wherein the DSC further comprises:
a comparator configured to:
receive the reference signal at a first comparator input and to provide the signal via a single line to an electrical node corresponding to the point along the wire that is proximate to the terminal of the battery; and
generate an output comparator signal based on the reference signal and the signal;
an analog to digital converter (ADC) operably coupled to an output of the comparator, wherein, when enabled, the ADC configured to process the output comparator signal to generate a digital signal that is representative of an effect on the signal that is provided via the single line to the electrical node corresponding to the point along the wire that is proximate to the terminal of the battery;
a digital to analog converter (DAC) operably coupled to an output of the ADC, wherein, when enabled, the DAC configured to process digital signal that is representative of an effect on the signal that is provided via the single line to the electrical node corresponding to the point along the wire that is proximate to the terminal of the battery to generate a control signal; and
a dependent current source operably coupled to source a current to the terminal of the battery via the single line to the electrical node corresponding to the point along the wire that is proximate to the terminal of the battery based on the control signal.

10. The voltage sensor of claim 1, wherein the DSC further comprises:
a power source circuit operably coupled via a single line to an electrical node corresponding to the point along the wire that is proximate to the terminal of the battery, wherein, when enabled, the power source circuit is configured to provide an analog signal via the single line coupling to the electrical node, and wherein the analog signal includes at least one of a DC (direct current) component or an oscillating component; and
a power source change detection circuit operably coupled to the power source circuit, wherein, when enabled, the power source change detection circuit is configured to:
detect an effect on the analog signal that is based on an electrical characteristic of the electrical node; and
generate a digital signal that is representative of a change of impedance of the electrical node.

11. The voltage sensor of claim 10 further comprising:
the power source circuit including a power source to source at least one of a voltage or a current via the single line to the electrical node; and
the power source change detection circuit including:
a power source reference circuit configured to provide at least one of a voltage reference or a current reference; and
a comparator configured to compare the at least one of the voltage or the current provided via the single line to the electrical node to the at least one of the voltage reference or the current reference to produce the analog signal.

12. A voltage sensor comprising:
a drive-sense circuit (DSC) operably coupled to a point along a wire that is proximate to a terminal of a battery, wherein the wire connects the terminal of the battery to a load, wherein, when enabled, the DSC configured to:
generate a signal based on a reference signal, wherein the reference signal is based on an estimate of a voltage at the point along the wire that is proximate to the terminal of the battery;
provide the signal to the point along the wire that is proximate to the terminal of the battery;
generate an output signal that corresponds to a difference between the signal and the reference signal;
tune the reference signal until the signal compares favorably to the voltage at the point along the wire that is proximate to the terminal of the battery thereby generating a tuned reference signal; and
determine the voltage at the point along the wire that is proximate to the terminal of the battery based on the tuned reference signal;
a reference load operably coupled to the DSC and the point along a wire that is proximate to a terminal of the battery;
memory that stores operational instructions; and
one or more processing modules operably coupled to the DSC and the memory, wherein, when enabled, the one or more processing modules configured to execute the operational instructions to:
generate the reference signal;
provide the reference signal to the DSC;
process a digital signal that is representative of the difference between the signal and the reference signal; and
direct the DSC to tune the reference signal until the signal compares favorably to the voltage at the point along the wire that is proximate to the terminal of the battery.

13. The voltage sensor of claim 12, wherein a first terminal of the reference load is operably coupled to the DSC and the point along the wire that is proximate to the terminal of the battery, and a second terminal of the reference load is operably coupled to ground.

14. The voltage sensor of claim 12, wherein the reference load is at least one of a real resistance load or a reactive impedance load.

15. The voltage sensor of claim 12, wherein, when enabled, the DSC configured to stop outputting any current based on the reference signal being tuned to the voltage at the point along the wire that is proximate to the terminal of the battery.

16. The voltage sensor of claim 12, wherein the voltage sensor further comprising:
  another DSC operably coupled to another point along the wire that connects the terminal of the battery to the load, wherein, when enabled, the another DSC configured to:
    generate another signal based on another reference signal, wherein the another reference signal is based on another estimate of another voltage at the another point along the wire that connects the terminal of the battery to the load;
    provide the another signal to the another point along the wire that connects the terminal of the battery to the load;
    generate another output signal that corresponds to another difference between the another signal and the another reference signal; and
    tune the another reference signal until the another signal compares favorably to another voltage at the another point along the wire that connects the terminal of the battery to the load thereby generating another tuned reference signal;
  determine the another voltage at the another point along the wire that connects the terminal of the battery to the load based on the another tuned reference signal; and
  another reference load operably coupled to the another DSC and the another point along the wire that connects the terminal of the battery to the load.

17. The voltage sensor of claim 12, wherein the DSC further comprises:
  a comparator configured to:
    receive the reference signal at a first comparator input and to provide the signal via a single line to an electrical node corresponding to the point along the wire that is proximate to the terminal of the battery; and
    generate an output comparator signal based on the reference signal and the signal;
  a dependent current source operably coupled to source a current to the terminal of the battery via the single line to the electrical node corresponding to the point along the wire that is proximate to the terminal of the battery based on the output comparator signal; and
  an analog to digital converter (ADC) operably coupled to an output of the comparator, wherein, when enabled, the ADC configured to process the output comparator signal to generate a digital signal that is representative of an effect on the signal that is provided via the single line to the electrical node corresponding to the point along the wire that is proximate to the terminal of the battery.

18. The voltage sensor of claim 12, wherein the DSC further comprises:
  a comparator configured to:
    receive the reference signal at a first comparator input and to provide the signal via a single line to an electrical node corresponding to the point along the wire that is proximate to the terminal of the battery; and
    generate an output comparator signal based on the reference signal and the signal;
  an analog to digital converter (ADC) operably coupled to an output of the comparator, wherein, when enabled, the ADC configured to process the output comparator signal to generate a digital signal that is representative of an effect on the signal that is provided via the single line to the electrical node corresponding to the point along the wire that is proximate to the terminal of the battery;
  a digital to analog converter (DAC) operably coupled to an output of the ADC, wherein, when enabled, the DAC configured to process digital signal that is representative of an effect on the signal that is provided via the single line to the electrical node corresponding to the point along the wire that is proximate to the terminal of the battery to generate a control signal; and
  a dependent current source operably coupled to source a current to the terminal of the battery via the single line to the electrical node corresponding to the point along the wire that is proximate to the terminal of the battery based on the control signal.

19. The voltage sensor of claim 12, wherein the DSC further comprises:
  a power source circuit operably coupled via a single line to an electrical node corresponding to the point along the wire that is proximate to the terminal of the battery, wherein, when enabled, the power source circuit is configured to provide an analog signal via the single line coupling to the electrical node, and wherein the analog signal includes at least one of a DC (direct current) component or an oscillating component; and
  a power source change detection circuit operably coupled to the power source circuit, wherein, when enabled, the power source change detection circuit is configured to:
    detect an effect on the analog signal that is based on an electrical characteristic of the electrical node; and
    generate a digital signal that is representative of a change of impedance of the electrical node.

20. The voltage sensor of claim 19 further comprising:
  the power source circuit including a power source to source at least one of a voltage or a current via the single line to the electrical node; and
  the power source change detection circuit including:
    a power source reference circuit configured to provide at least one of a voltage reference or a current reference; and
    a comparator configured to compare the at least one of the voltage or the current provided via the single line to the electrical node to the at least one of the voltage reference or the current reference to produce the analog signal.

* * * * *